(12) United States Patent
Takahashi et al.

(10) Patent No.: US 8,852,845 B2
(45) Date of Patent: Oct. 7, 2014

(54) ACTINIC RAY-SENSITIVE OR RADIATION-SENSITIVE RESIN COMPOSITION, RESIST FILM, PATTERN FORMING METHOD USING THE SAME, AND RESIN

(75) Inventors: Hidenori Takahashi, Haibara-gun (JP); Tomotaka Tsuchimura, Haibara-gun (JP); Toru Tsuchihashi, Haibara-gun (JP); Katsuhiro Yamashita, Haibara-gun (JP); Hideaki Tsubaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 286 days.

(21) Appl. No.: 12/641,877

(22) Filed: Dec. 18, 2009

(65) Prior Publication Data

US 2010/0183975 A1      Jul. 22, 2010

(30) Foreign Application Priority Data

Dec. 18, 2008   (JP) ................................ 2008-322678

(51) Int. Cl.
*G03F 7/004*   (2006.01)
*G03F 7/028*   (2006.01)
*G03F 7/039*   (2006.01)

(52) U.S. Cl.
CPC ............ *G06F 7/0392* (2013.01); *G03F 7/0397* (2013.01); *G03F 7/0045* (2013.01); *Y10S 430/122* (2013.01); *Y10S 430/123* (2013.01)
USPC ......... 430/270.1; 430/326; 430/921; 430/922

(58) Field of Classification Search
USPC .............. 430/270.1, 913, 914, 921, 925, 325, 430/326, 922; 526/275, 276, 243; 560/221, 560/222; 525/276
See application file for complete search history.

(56) References Cited

U.S. PATENT DOCUMENTS

| | | | |
|---|---|---|---|
| 5,260,410 A | 11/1993 | Schwalm | |
| 5,453,341 A | 9/1995 | Schwalm | |
| 5,945,250 A | 8/1999 | Aoai | |
| 6,680,157 B1 | 1/2004 | Fedynyshyn | |
| 8,057,985 B2 * | 11/2011 | Ohashi et al. | 430/270.1 |
| 2004/0091817 A1 | 5/2004 | Komatsu | |
| 2006/0194147 A1 * | 8/2006 | Kawanishi | 430/270.1 |
| 2007/0184384 A1 * | 8/2007 | Kawanishi | 430/270.1 |
| 2008/0085468 A1 * | 4/2008 | Kamimura et al. | 430/286.1 |
| 2008/0102407 A1 * | 5/2008 | Ohsawa et al. | 430/286.1 |
| 2010/0233617 A1 * | 9/2010 | Wada | 430/270.1 |

FOREIGN PATENT DOCUMENTS

| | | |
|---|---|---|
| CA | 2049772 A1 | 2/1992 |
| EP | 1480078 A1 | 11/2004 |
| JP | 2-302758 A | 12/1990 |
| JP | 4-230645 A | 8/1992 |
| JP | 9-325497 A | 12/1997 |
| JP | 10-221852 A | 8/1998 |
| JP | 2004-158287 A | 6/2004 |
| JP | 2006-178317 * | 7/2006 |
| JP | 2006-178317 A | 7/2006 |
| JP | 2007-210904 A | 8/2007 |
| JP | 2008-162101 A | 7/2008 |
| WO | WO 2009/038148 * | 3/2009 |

OTHER PUBLICATIONS

M. Wang, "Synthesis and Properties of New Anionic Photoacid Generators Bound Polymer Resists for e-beam and EUV lithography," *Proc. of SPIE*, vol. 6923, No. 692312 (2008).
Y. Hirai, *Science and New Technology in Nanoimprint*, Frontier Publishing (2006).

* cited by examiner

*Primary Examiner* — Anca Eoff
(74) *Attorney, Agent, or Firm* — Sughrue Mion, PLLC

(57) ABSTRACT

Provided is a actinic ray-sensitive or radiation-sensitive resin composition including (P) a resin containing (A) a repeating unit having an ionic structure moiety that contains a cation represented by formula (Ia) and is capable of producing an acid anion on the side chain upon irradiation with an actinic ray or radiation:

(Ia)

[Chemical structure showing a thianthrene-like tricyclic structure with a central sulfur cation ($S^{\oplus}$), with substituents $R_{1a}$ through $R_{13a}$ on the aromatic rings, and Z as a linking group]

wherein each of $R_{1a}$ to $R_{13a}$ independently represents a hydrogen atom or a monovalent substituent and may combine together to form a ring, and Z represents a single bond or a divalent linking group.

10 Claims, No Drawings

ACTINIC RAY-SENSITIVE OR RADIATION-SENSITIVE RESIN COMPOSITION, RESIST FILM, PATTERN FORMING METHOD USING THE SAME, AND RESIN

BACKGROUND OF THE INVENTION

1. Field of the Invention

The present invention relates to: an actinic ray-sensitive or radiation-sensitive resin composition suitable for use in the ultramicrolithography process such as production of VLSI or a high-capacity microchip or in other photofabrication processes; a resist film formed of the composition; a pattern forming method using the same; and a resin for use in the actinic ray-sensitive or radiation-sensitive resin composition. More specifically, the present invention relates to an actinic ray-sensitive or radiation-sensitive resin composition for an electron beam, X-ray or EUV light, a resist film formed of the composition, a pattern forming method using the same, and a resin for use in the actinic ray-sensitive or radiation-sensitive resin composition.

2. Description of the Related Art

In the process of producing a semiconductor device such as IC and LSI, microprocessing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using an electron beam, an X ray or EUV light is proceeding.

The electron beam lithography is positioned as the next or next-next generation pattern formation technique, and a positive resist having high sensitivity and high resolution is demanded. Particularly, in order to shorten the wafer processing time, elevation of the sensitivity is very important, but when higher sensitivity is sought for, not only reduction of resolution but also worsening of line edge roughness are brought about, and development of a resist satisfying these properties at the same time is strongly demanded. The line edge roughness as used herein means that the resist edge at the interface between the pattern and the substrate irregularly fluctuates in the direction perpendicular to the line direction due to the resist property and when the pattern is viewed from right above, the edge gives an uneven appearance. This unevenness is transferred by the etching step using the resist as a mask and causes deterioration of electric property, giving rise to decrease in the yield. Above all, in the ultrafine region of 0.25 μm or less, the improvement of line edge roughness is a very important problem to be solved. The high sensitivity is in a trade-off relationship with high resolution, good pattern profile and good line edge roughness, and it is very important how satisfy these requirements at the same time.

In the lithography using X-ray or EUV light, it is also similarly very important to satisfy high sensitivity, high resolution, good pattern profile and good line edge roughness at the same time, and this problem needs to be solved.

As one of the methods for solving these problems, use of a resin having a photo-acid generator (sulfonium group) on the polymer main or side chain is being studied (see, JP-A-2-302758 (the term "JP-A" as used herein means an "unexamined published Japanese patent application"), JP-A-4-230645 and U.S. Pat. No. 5,260,410). However, in the studies of these documents, since the acid generated upon exposure is itself a low molecular monomer, there is a problem in the diffusibility of acid in the resist film, and high resolution and good line edge roughness can be hardly achieved. On the other hand, a polymer combined with an acid that is generated upon exposure is being also studied (see, JP-A-9-325497, JP-A-10-221852, JP-A-2006-178317 and Proc. of SPIE, Vol. 6923, 692312, 2008), but it has not succeeded at present in satisfying all of high sensitivity, high resolution, good pattern profile and good line edge roughness in the ultrafine region.

Furthermore, unlike a conventional light source, in the case of using a light source emitting EUV light, the wavelength of light belongs to an extreme-ultraviolet region and high energy of the light brings about such a prominent outgassing problem that a compound in the resist film is destroyed by fragmentation and volatizes as a low molecular component during exposure to contaminate the environment in the exposure apparatus. Various studies are being made for the reduction of outgassing, and various techniques have been attempted, such as a technique of providing a topcoat layer to suppress volatilization of a low molecular compound (see, for example, European Patent 1,480,078) or a technique of adding a radical trapping agent to suppress decomposition of a polymer (see, for example, U.S. Pat. No. 6,680,157). Efforts for reducing the outgassing are being also exerted in terms of an acid generator (see, JP-A-2007-210904).

In recent years, development of lithography using electron beam, X-ray or EUV light other than excimer laser light is proceeding. Furthermore, the microfabrication using a resist composition is not only used directly for the production of an integrated circuit but is recently also applied to the production or the like of a so-called imprint mold structure (see, for example, JP-A-2004-158287, JP-A-2008-162101 and Yoshihiko Hirai (compiler), *Science and New Technology in Nanoimprint*, Frontier Publishing (June, 2006)). Accordingly, it is an important task also in using X-ray, soft X-ray or electron beam as an exposure light source to satisfy high sensitivity, high resolution, good pattern profile and good performance in terms of roughness all at the same time, and this task needs to be solved.

SUMMARY OF THE INVENTION

An object of the present invention is to provide an actinic ray-sensitive or radiation-sensitive resin composition satisfying all of high sensitivity, high resolution, good pattern profile and good line edge roughness in the ultrafine region, particularly in the electron beam, X-ray or EUV light lithography, and causing no outgassing problem at the exposure; a resist film formed of the composition; a pattern forming method using the same; and a resin for use in the actinic ray-sensitive or radiation-sensitive resin composition.

(1) An actinic ray-sensitive or radiation-sensitive resin composition comprising (P) a resin containing (A) a repeating unit having an ionic structure moiety that contains a cation represented by formula (Ia) and is capable of producing an acid anion on the side chain upon irradiation with an actinic ray or radiation:

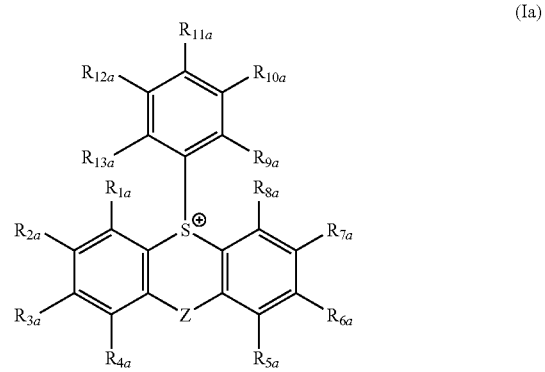

(Ia)

wherein each of $R_{1a}$ to $R_{13a}$ independently represents a hydrogen atom or a monovalent substituent and may combine together to form a ring, and Z represents a single bond or a divalent linking group.

(2) The actinic ray-sensitive or radiation-sensitive resin composition as described in (1) above, wherein the resin (P) further contains (B) a repeating unit containing a group capable of decomposing by the action of an acid to produce an alkali-soluble group.

(3) The actinic ray-sensitive or radiation-sensitive resin composition as described in (1) or (2) above, wherein the resin (P) further contains (C) a repeating unit represented by the following formula (VI):

$$\begin{array}{c} R_{01} \ R_{02} \\ | \ \ | \\ *\!-\!(\!C\!-\!C\!)\!-\!* \\ | \ \ | \\ R_{03} \ Ar_1 \\ \phantom{R_{03} \ Ar}_{\diagdown(OH)_n} \end{array} \quad (VI)$$

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, and n represents an integer of 1 to 4.

(4) The actinic ray-sensitive or radiation-sensitive resin composition as described in any one of (1) to (3) above, wherein at least one of $R_{1a}$ to $R_{13a}$ in formula (Ia) is a monovalent substituent containing a hydroxyl group.

(5) The actinic ray-sensitive or radiation-sensitive resin composition as described in any one of (2) to (4) above, wherein the repeating unit (B) is a repeating unit represented by the following formula (I) or (X):

$$\begin{array}{c} R_{01} \ R_{02} \\ | \ \ | \\ *\!-\!(\!C\!-\!C\!)\!-\!* \\ | \ \ | \\ R_{03} \ Ar_1 \\ \phantom{R_{03} \ Ar}_{\diagdown(O\!-\!Y)_n} \end{array} \quad (I)$$

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, each of n Ys independently represents a hydrogen atom or a group capable of leaving by the action of an acid, provided that at least one Y represents a group capable of leaving by the action of and acid, and n represents an integer of 1 to 4;

$$\begin{array}{c} Xa_1 \\ | \\ \diagup\!\!\diagdown \\ | \\ T \quad Rx_1 \\ | \quad | \\ O\!=\!\!\!\!=\!\!O\!-\!C\!-\!Rx_2 \\ \phantom{O\!=\!\!\!\!=\!\!O\!-\!C\!-\!}| \\ \phantom{O\!=\!\!\!\!=\!\!O\!-\!C\!-\!}Rx_3 \end{array} \quad (X)$$

wherein $Xa_1$ represents a hydrogen atom, a methyl group, a trifluoromethyl group or a hydroxymethyl group, T represents a single bond or a divalent linking group, each of $Rx_1$ to $Rx_3$ independently represents a hydrogen atom, an alkyl group, a cycloalkyl group or a monovalent aromatic ring group, and two members out of $Rx_1$ to $Rx_3$ may combine to form a cycloalkyl group, provided that two or more of $Rx_1$ to $Rx_3$ are not a hydrogen atom at the same time.

(6) The actinic ray-sensitive or radiation-sensitive resin composition as described in (5) above, wherein Y in formula (I) is represented by the following formula (II):

$$\begin{array}{c} L_1 \\ | \\ -\!C\!-\!O\!-\!M\text{-}Q \\ | \\ L_2 \end{array} \quad (II)$$

wherein each of $L_1$ and $L_2$ independently represents a hydrogen atom, an alkyl group, a cycloalkyl group, an aryl group or an aralkyl group, M represents a single bond or a divalent linking group, Q represents an alkyl group, a cycloalkyl group, an alicyclic group that may contain a heteroatom, an aromatic ring group that may contain a heteroatom, an amino group, an ammonium group, a mercapto group, a cyano group or an aldehyde group, and at least two members of Q, M and $L_1$ may combine to form a 5- or 6-membered ring.

(7) The actinic ray-sensitive or radiation-sensitive resin composition as described in any one of (1) to (6) above, wherein the resin (P) has a weight average molecular weight of from 1,000 to 100,000.

(8) The actinic ray-sensitive or radiation-sensitive resin composition as described in any one of (3) to (7) above, wherein the resin (P) contains from 0.5 to 80 mol % of the repeating unit (A), from 3 to 90 mol % of the repeating unit (B) and from 3 to 90 mol % of the repeating unit (C).

(9) The actinic ray-sensitive or radiation-sensitive resin composition as described in any one of (1) to (8) above, further comprising:

a basic compound.

(10) The actinic ray-sensitive or radiation-sensitive resin composition as described in any one of (1) to (9) above, which is exposed to an electron beam, X-ray or EUV light.

(11) A resist film formed using the actinic ray-sensitive or radiation-sensitive resin composition described in any one of (1) to (10) above.

(12) A pattern forming method comprising steps of exposing and developing the resist film described in (11) above.

(13) A resin (P) comprising:

(A) a repeating unit having an ionic structure moiety and being capable of decomposing upon irradiation with an actinic ray or radiation to generate an acid;

(B) a repeating unit containing a group capable of decomposing by the action of an acid to produce an alkali-soluble group, and (C) a repeating unit represented by the following formula (VI):

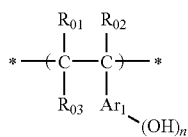

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, and n represents an integer of 1 to 4, wherein the ionic structure moiety of the repeating unit (A) is a structure capable of producing an acid anion on the resin side chain upon irradiation with an actinic ray or radiation and the counter cation is represented by the following formula (Ia):

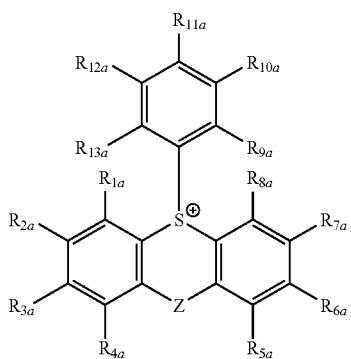

wherein each of $R_{1a}$ to $R_{13a}$ independently represents a hydrogen atom or a monovalent substituent and may combine together to form a ring, and Z represents a single bond or a divalent linking group.

In the present invention, the following embodiments are also preferred.

(14) The actinic ray-sensitive or radiation-sensitive resin composition as described in any one of (1) to (10) above, wherein in formula (Ia), at least one of $R_{1a}$ to $R_{13a}$ is a monovalent substituent containing an alcoholic hydroxyl group.

(15) The actinic ray-sensitive or radiation-sensitive resin composition as described in (14) above, wherein in formula (Ia), at least one of $R_{9a}$ to $R_{13a}$ is a monovalent substituent containing an alcoholic hydroxyl group.

(16) The resist film as described in (11) above, wherein in formula (Ia), at least one of $R_{9a}$ to $R_{13a}$ is a monovalent substituent containing an alcoholic hydroxyl group.

(17) The actinic ray-sensitive or radiation-sensitive resin composition as described in any one of (1) to (10) and (14) above, wherein in formula (Ia), each of $R_{1a}$ to $R_{10a}$, $R_{12a}$ and $R_{13a}$ represents a hydrogen atom and $R_{11a}$ is a monovalent substituent.

(18) The resist film as described in (11) above, wherein in formula (Ia), each of $R_{1a}$ to $R_{10a}$, $R_{12a}$ and $R_{13a}$ represents a hydrogen atom and $R_{11a}$ is a monovalent substituent.

DETAILED DESCRIPTION OF THE INVENTION

The present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of a mercury lamp, a far ultraviolet ray typified by an excimer laser, an extreme-ultraviolet ray (EUV light), an X-ray or an electron beam. Also, in the present invention, the "light" means an actinic ray or radiation. Furthermore, in the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition (preferably positive resist composition) of the present invention contains a resin (P).

[1] Resin (P)

The resin (P) contained in the actinic ray-sensitive or radiation-sensitive resin composition is a resin containing (A) a repeating unit having an ionic structure moiety capable of producing an acid anion on the side chain upon irradiation with an actinic ray or radiation, where the cation of the ionic structure moiety has a structure represented by formula (Ia).

That is, the ionic structure moiety contained in the repeating unit (A) has anion and cation, where the cation represented by formula (Ia) is capable of decomposing upon irradiation with an actinic ray or radiation to produce an acid anion on the side chain of the repeating unit.

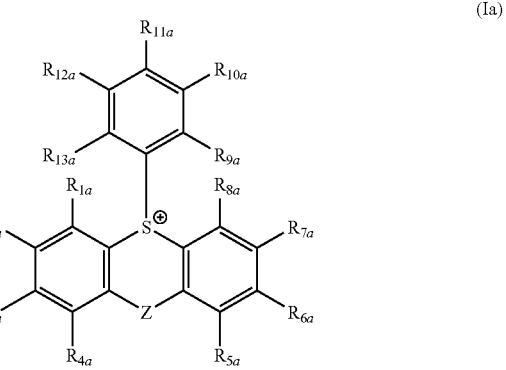

In formula (Ia), each of $R_{1a}$ to $R_{13a}$ independently represents a hydrogen atom or a monovalent substituent and may combine together to form a ring, and Z represents a single bond or a divalent linking group.

(1) Repeating Unit (A)

As for the repeating unit (A), any repeating unit may be used as long as it is a repeating unit having an ionic structure moiety capable of producing an acid anion on the side chain upon irradiation with an actinic ray or radiation, where the cation of the ionic structure moiety has a structure represented by formula (Ia).

The molecular weight of the structure represented by formula (Ia) is generally from 260 to 2,000, preferably from 260 to 1,000, more preferably from 270 to 600.

Each of $R_{1a}$ to $R_{13a}$ is independently a hydrogen atom or a monovalent substituent, and the monovalent substituent is not particularly limited, but examples thereof include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may be called a hetero ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group ($-B(OH)_2$), a phosphato group ($-OPO(OH)_2$), a sulfato group ($-OSO_3H$), and other known substituents.

Each of $R_{1a}$ to $R_{13a}$ is preferably a hydrogen atom, a halogen atom, an alkyl group, a cycloalkyl group (including a bicycloalkyl group and a tricycloalkyl group), an alkenyl group (including a cycloalkenyl group and a bicycloalkenyl group), an alkynyl group, an aryl group, a cyano group, a hydroxyl group, a carboxyl group, an alkoxy group (including a cycloalkoxy group), an aryloxy group, an acyloxy group, a carbamoyloxy group, an acylamino group, an aminocarbonylamino group, an alkoxycarbonylamino group (including a cycloalkoxycarbonylamino group), an aryloxycarbonylamino group, a sulfamoylamino group, an alkyl-, cycloalkyl- or aryl-sulfonylamino group, an alkylthio group (including a cycloalkylthio group), an arylthio group, a sulfamoyl group, an alkyl-, cycloalkyl- or aryl-sulfonyl group, an aryloxycarbonyl group, an alkoxycarbonyl group (including a cycloalkoxycarbonyl group), a carbamoyl group, an imido group, a silyl group or a ureido group.

Each of $R_{1a}$ to $R_{13a}$ is more preferably a hydrogen atom, a halogen atom, an alkyl group, a cycloalkyl group (including a bicycloalkyl group and a tricycloalkyl group), a cyano group, a hydroxyl group, an alkoxy group (including a cycloalkoxy group), an acyloxy group, an acylamino group, an aminocarbonylamino group, an alkoxycarbonylamino group (including a cycloalkoxycarbonylamino group), an alkyl-, cycloalkyl- or aryl-sulfonylamino group, an alkylthio group (including a cycloalkylthio group), a sulfamoyl group, an alkyl-, cycloalkyl- or aryl-sulfonyl group, an alkoxycarbonyl group (including a cycloalkoxycarbonyl group) or a carbamoyl group.

Each of $R_{1a}$ to $R_{13a}$ is still more preferably a hydrogen atom, an alkyl group, a cycloalkyl group (including a bicycloalkyl group and a tricycloalkyl group), a cyano group, a hydroxyl group, an alkoxy group (including a cycloalkoxy group) or an alkylsulfonyl group.

A case where at least one or more members out of $R_{1a}$ to $R_{13a}$ are a monovalent substituent containing a hydroxyl group is preferred, a case where at least one or more members out of $R_{1a}$ to $R_{13a}$ are a monovalent substituent containing an alcoholic hydroxyl group is more preferred, and a case where at least one or more members out of $R_{9a}$ to $R_{13a}$ are a monovalent substituent containing an alcoholic hydroxyl group is most preferred.

The alcoholic hydroxyl group indicates a hydroxyl group bonded to a carbon atom of an alkyl group. By having a monovalent substituent containing an alcoholic hydroxyl group, as described later, the boiling point of the decomposition product becomes high, and this is preferred in view of outgassing suppression.

In the case where each of $R_{1a}$ to $R_{13a}$ is a substituent containing an alcoholic hydroxyl group, the number of carbon atoms contained in the substituent is preferably from 1 to 10, more preferably from 2 to 6, still more preferably from 2 to 4.

The alcoholic hydroxyl group-containing substituent as $R_{1a}$ to $R_{13a}$ may have two or more alcoholic hydroxyl groups. The number of alcoholic hydroxyl groups in the alcoholic hydroxyl group-containing substituent as $R_{1a}$ to $R_{13a}$ is from 1 to 6, preferably from 1 to 3, more preferably 1.

The number of alcoholic hydroxyl groups in the compound represented by formula (Ia) is, as a total number of $R_{1a}$ to $R_{13a}$, preferably from 1 to 10, more preferably from 1 to 6, still more preferably from 1 to 3.

The monovalent substituent above may be bonded through a divalent organic linking group. Examples of the divalent organic linking group include an alkylene group (e.g., methylene, ethylene, propylene, butylene, hexylene, octylene), a cycloalkylene group (e.g., cyclopentylene, cyclohexylene), an alkenylene group (e.g., ethylene, propenylene, butenylene), an arylene group (e.g., phenylene, tolylene, naphthylene), an azo group, $-S-$, $-O-$, $-CO-$, $-SO-$, $-SO_2-$, $-N(R_0)-$ (wherein $R_0$ represents a hydrogen atom or an alkyl group having a carbon number of 1 to 8), and a divalent linking group formed by combining a plurality of these groups.

The total carbon number of the divalent organic linking group is preferably from 1 to 20, more preferably from 1 to 15, still more preferably from 1 to 10.

Two members out of $R_{1a}$ to $R_{13a}$ may form a ring (for example, an aromatic or non-aromatic hydrocarbon ring or a heterocyclic ring) in cooperation. Examples of the combination of two or more members out of $R_{1a}$ to $R_{13a}$ include the pair of $R_{1a}$ and $R_{13a}$ and the pair of $R_{8a}$ and $R_{9a}$.

The ring formed may be a polycyclic condensed ring. Specific examples of the ring include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

The monovalent substituent as $R_{1a}$ to $R_{13a}$ and the ring which may be formed by two members out of $R_{1a}$ to $R_{13a}$ may further have a substituent, and specific examples of the substituent which they may further have are the same as specific examples of the above-described monovalent substituent.

The monovalent substituent as $R_{1a}$ to $R_{13a}$ preferably has a carbon number of 20 or less, more preferably 15 or less.

Z represents a single bond or a divalent linking group. Examples of the divalent linking group include an alkylene group, an arylene group, a carbonyl group, a sulfide group, a sulfone group, —COO—, —CONR— (wherein R represents a hydrogen atom or an alkyl group), —SO—, —SO$_2$—, —SO$_3$—, —SO$_2$NR'— (wherein R' represents a hydrogen atom or an alkyl group), —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO—, —OSO$_2$O—, an ether group, a thioether group, an amino group, an acyl group, an alkylsulfonyl group, —CH═CH—, an aminocarbonylamino group and an aminosulfonylamino group, and each of these groups may have a substituent. Examples of the substituent include the substituents as $R_{1a}$ to $R_{13a}$.

The divalent linking group as Z preferably has a carbon number of 15 or less, more preferably 10 or less.

Z is preferably a single bond, a carbonyl group, a sulfide group, a sulfonyl group, —COO—, —CONH—, —SO$_2$NH—, —CF$_2$—, —CF$_2$CF$_2$—, —OCF$_2$O—, —CF$_2$OCF$_2$—, —SS—, —CH$_2$SO$_2$CH$_2$—, —CH$_2$COCH$_2$—, —COCF$_2$CO—, —COCO—, —OCOO— or —OSO$_2$O—, more preferably a single bond, a carbonyl group, a sulfide group, a sulfonyl group, —COO—, —CONH—, —SO$_2$NH—, —CF$_2$—, —CF$_2$CF$_2$— or —COCO—, still more preferably a single bond, a carbonyl group, a sulfide group or a sulfonyl group, and most preferably a single bond or a sulfonyl group.

Specific examples of the cation represented by formula (Ia) are set forth below, but the present invention is not limited thereto.

(B1-1)
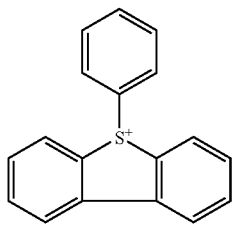

(B1-2)
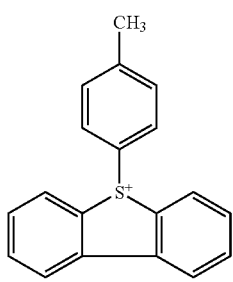

(B1-3)
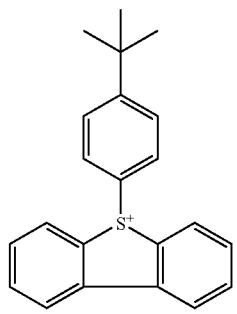

(B1-4)
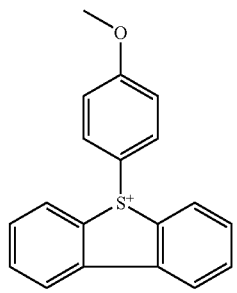

(B1-5)
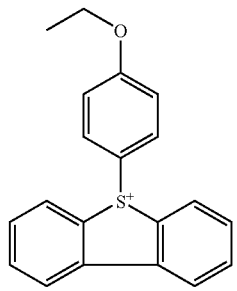

(B1-6)
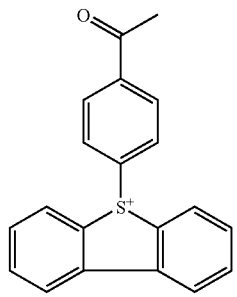

(B1-7)
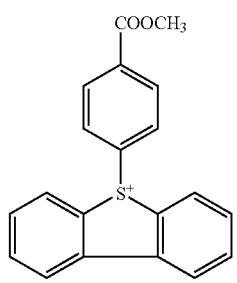

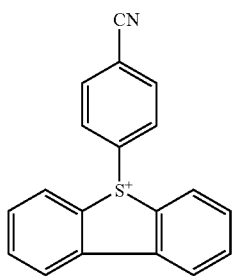 (B1-8)
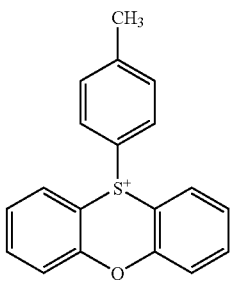 (B1-13)
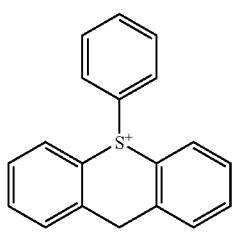 (B1-9)
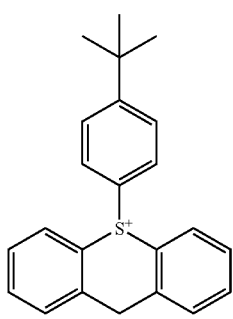 (B1-10)
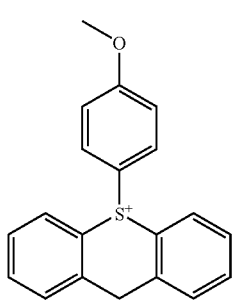 (B1-11)
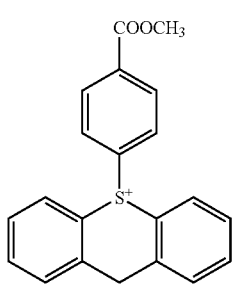 (B1-12)
(B1-14)
(B1-15)
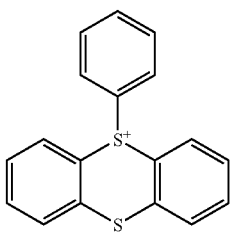 (B1-16)
(B1-17)

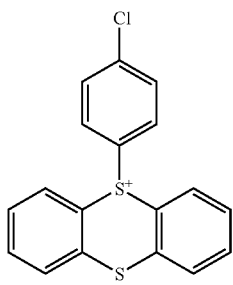 (B1-18)
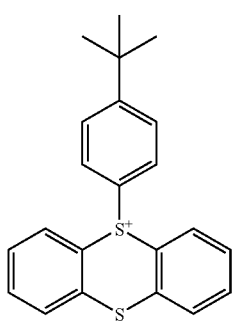 (B1-19)
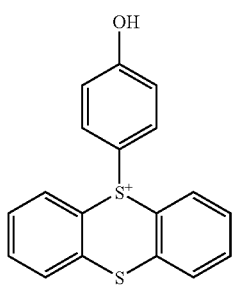 (B1-20)
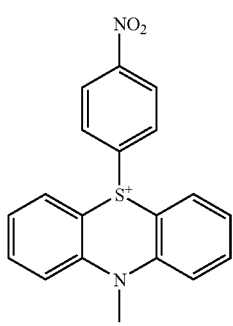 (B1-21)
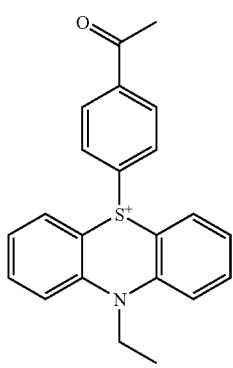 (B1-22)
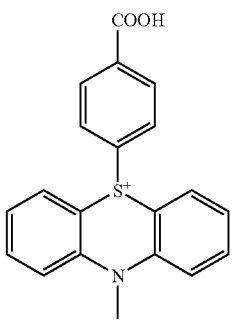 (B1-23)
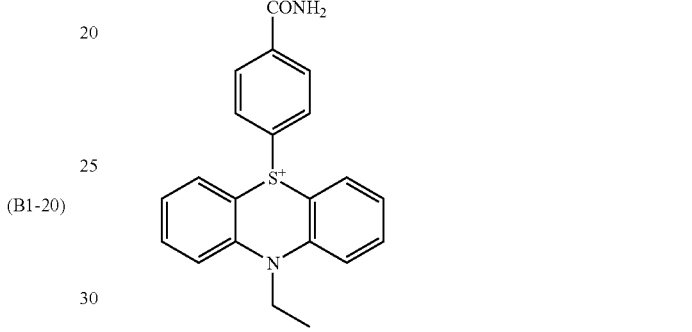 (B1-24)
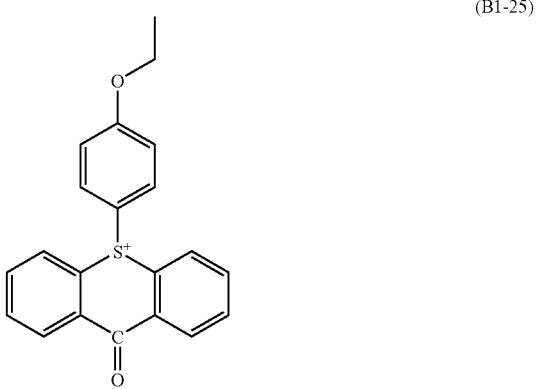 (B1-25)
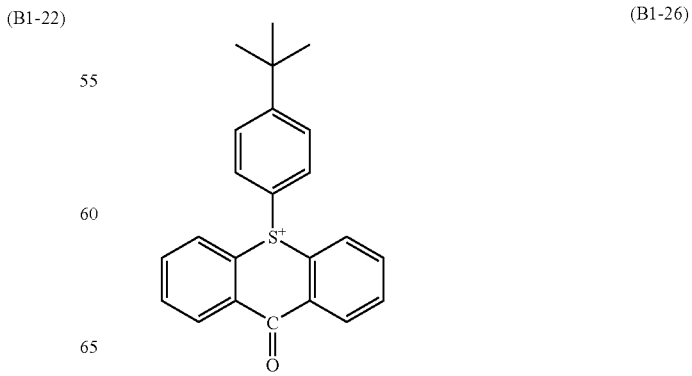 (B1-26)

(B1-27)
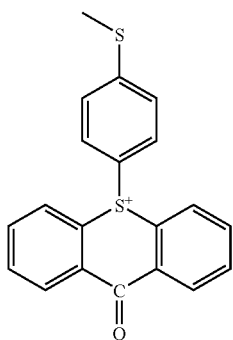
(B1-28)
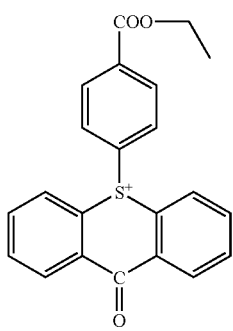
(B1-29)
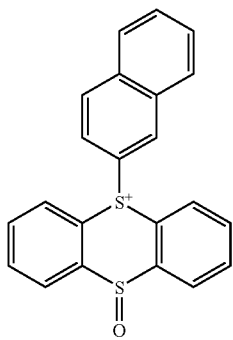
(B1-30)
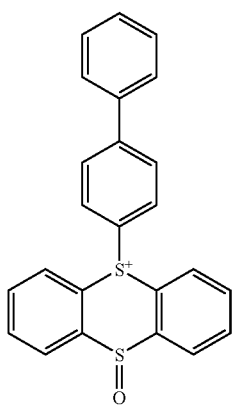
(B1-31)
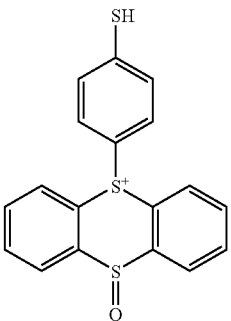
(B1-32)
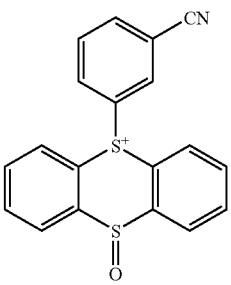
(B1-33)
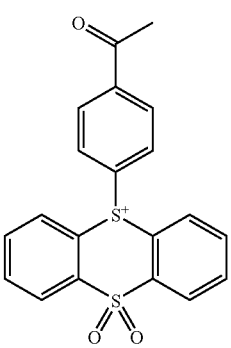
(B1-34)
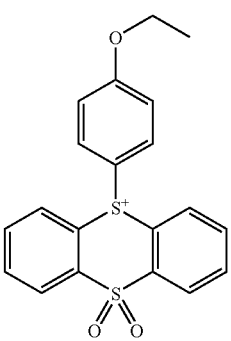
(B1-35)
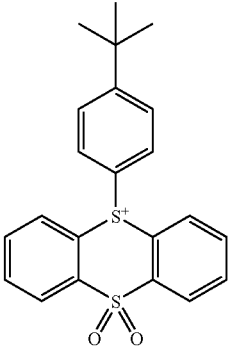

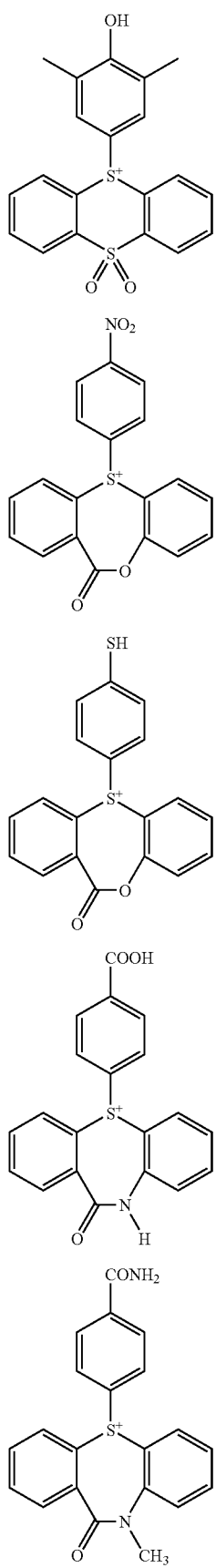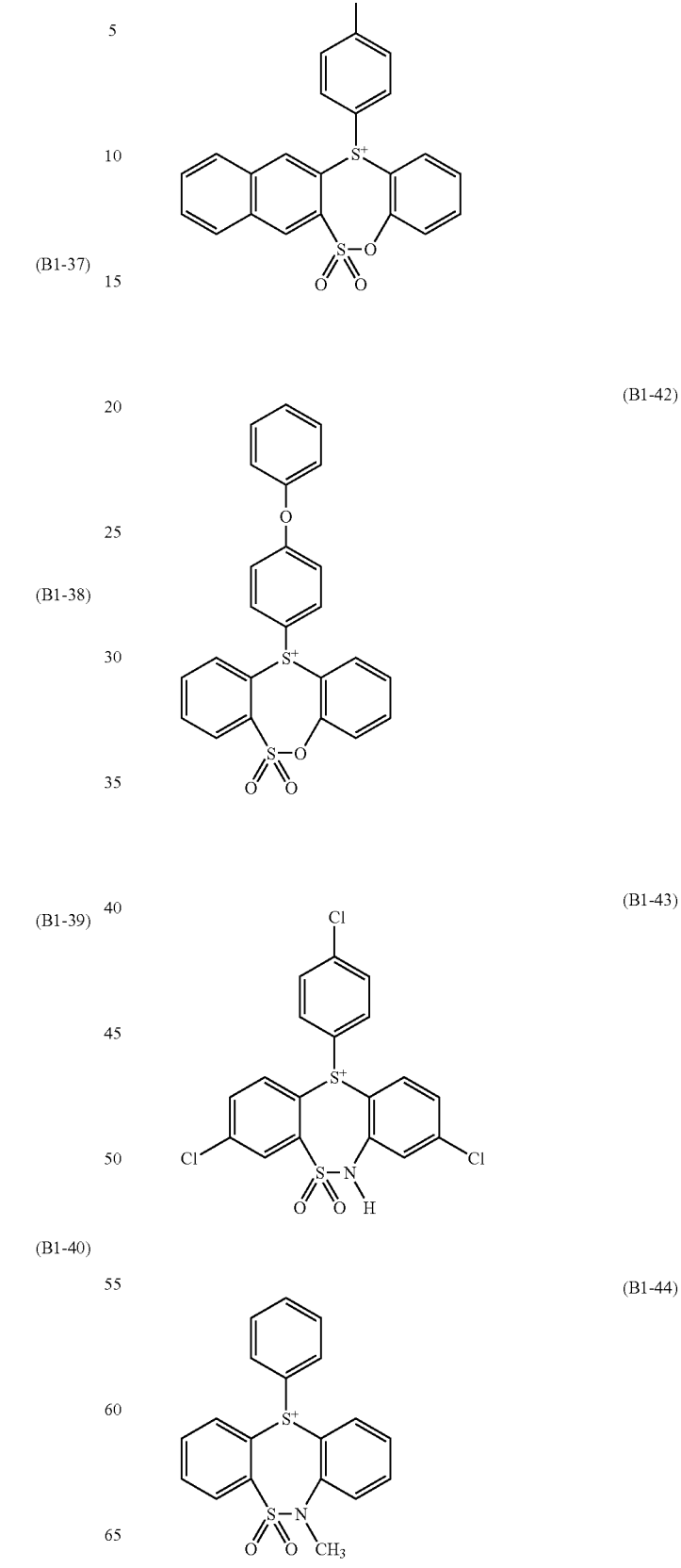

(B1-45)
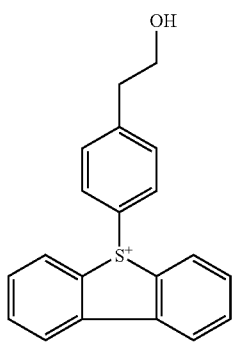
(B1-46)
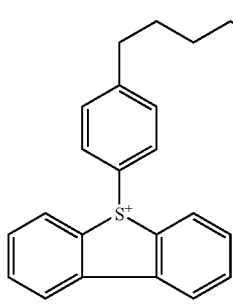
(B1-47)
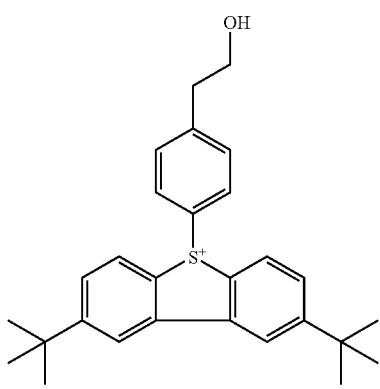
(B1-48)
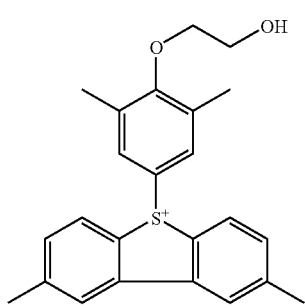
(B1-49)
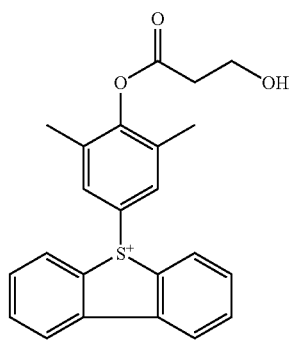
(B1-50)
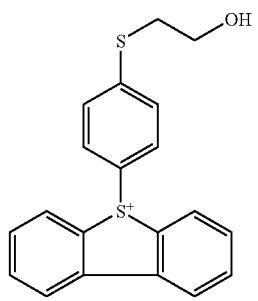
(B1-51)
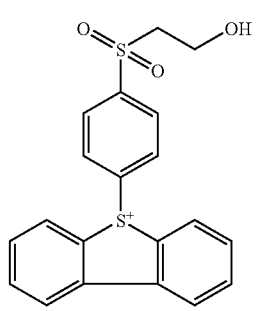
(B1-52)
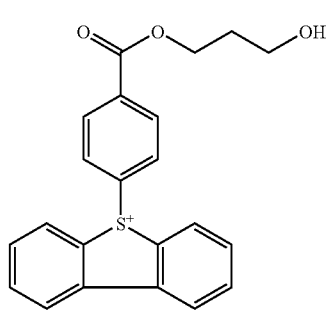
(B1-53)
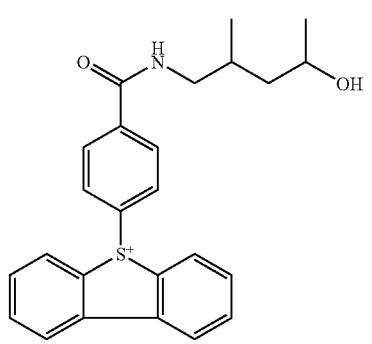

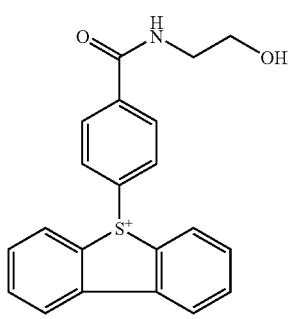
(B1-54)
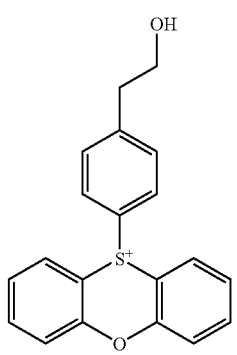
(B1-58)
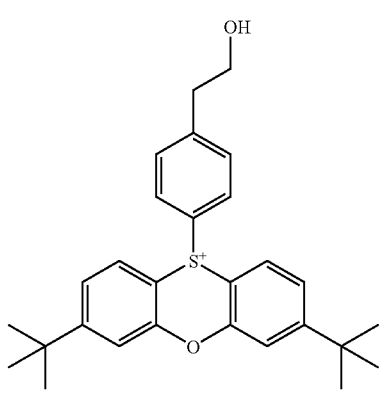
(B1-55)
(B1-59)
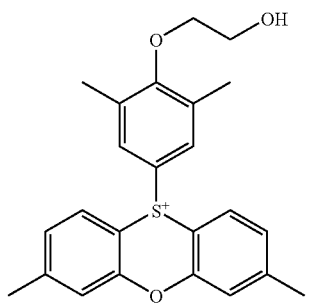
(B1-56)
(B1-60)
(B1-61)
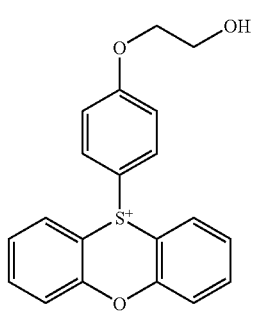
(B1-57)
(B1-62)
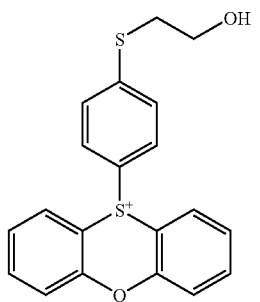

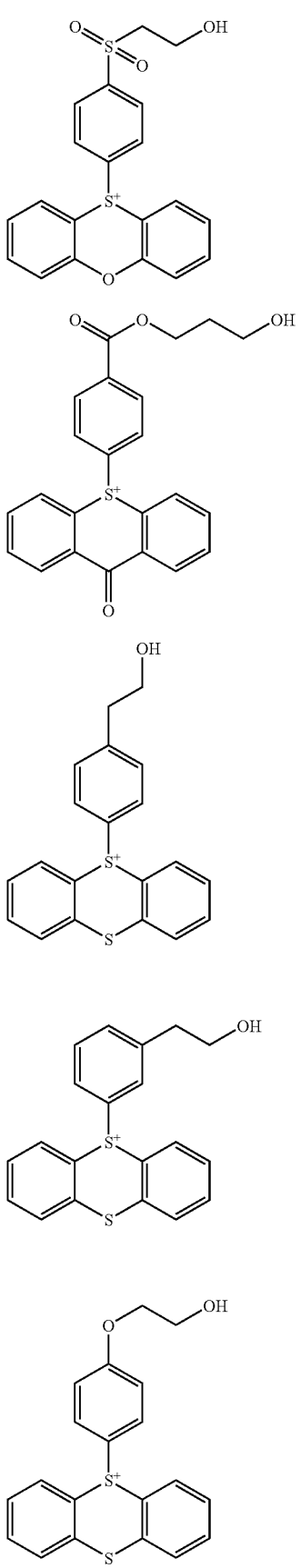
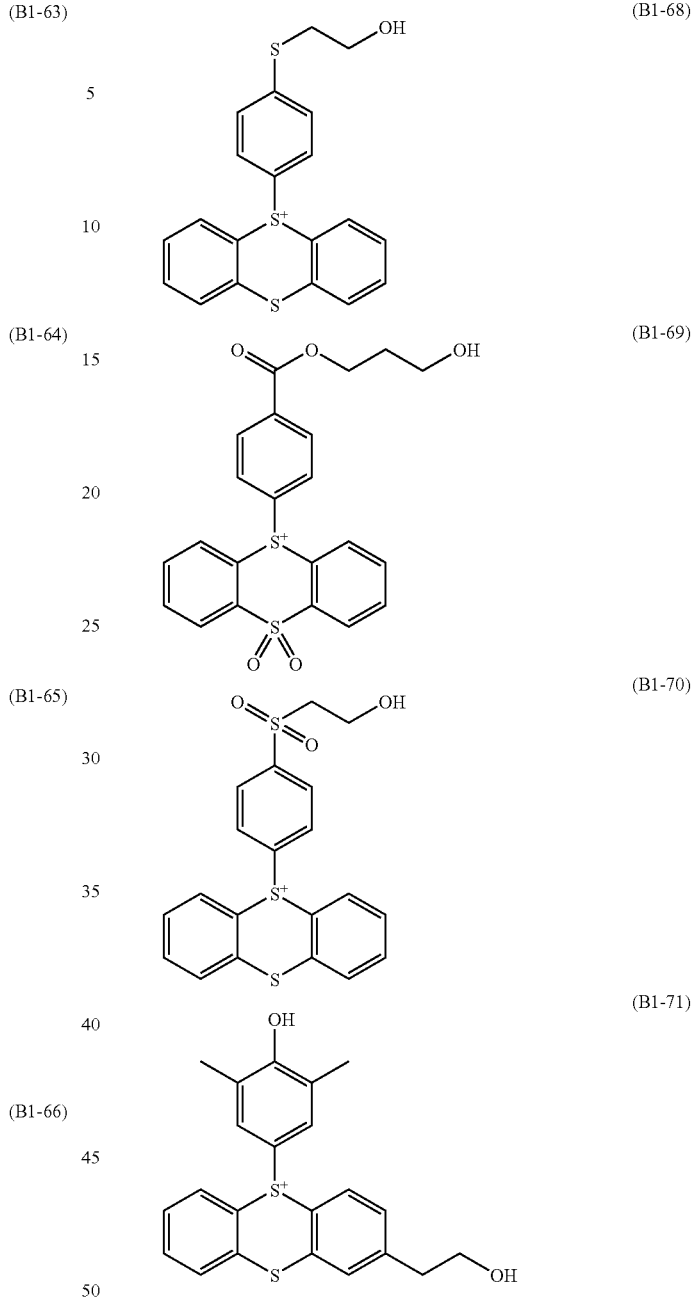

In the cation represented by formula (Ia), at least one of $R_{9a}$ to $R_{13a}$ is preferably a monovalent substituent that is not a hydrogen atom. Specific examples thereof include (B1-2) to (B1-8), (B1-10) to (B1-16) and (B1-18) to (B1-43). It is more preferred that each of $R_{1a}$ to $R_{8a}$ represents a hydrogen atom and at the same time, each of $R_{9a}$ to $R_{13a}$ independently represents a monovalent substituent, and it is still more preferred that each of $R_{1a}$ to $R_{10a}$, $R_{12a}$ and $R_{13a}$ represents a hydrogen atom and at the same time, $R_{11a}$ represents a monovalent substituent.

The compound represented by formula (Ia) preferably has the substituents $R_{9a}$ to $R_{13a}$ such that the boiling point at 1 atm of the compound represented by the following formula (K) corresponding to a decomposition product considered to be produced when generating an acid upon irradiation with an actinic ray or radiation is 160° C. or more, preferably 180° C. or more, more preferably 190° C. or more, still more preferably 200° C. or more.

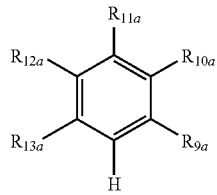

(K)

Specific examples of the decomposition product (K) in the cation represented by formula (Ia) are set forth below, but the present invention is not limited thereto.

Specific examples of the decomposition product (K), the boiling point of the decomposition product, and the literature value of the boiling point are shown in Table 1. As for the literature value, *Kagoubutsu no Jiten* (*Dictionary of Compounds*), 1st ed., Asakura Shoten (Nov. 20, 1997) is referred to. Also, as for the boiling point, the boiling point of the decomposition product is measured by the method described in *Dai 4-Han Jikken Kagaku Koza* (*Experimental Chemistry Lecture, 4th Edition*), The Chemical Society of Japan (editor), Maruzen (publisher) (Feb. 5, 1992).

TABLE 1

| Decomposition product | OH | *t*-Bu | OCH$_2$CH$_3$ | CN | NO$_2$ |
|---|---|---|---|---|---|
| Boiling point (° C.) | 182 | 169 | 169 | 191 | 210 |
| Boiling point (° C.), literature value | 181.8 | 168.5 | 170 | 191.1 | 211.03 |
| Decomposition product | COCH$_3$ | OH (2,6-dimethyl) | CONH$_2$ | COOH | SH |
| Boiling point (° C.) | 202 | 203 | >250 | >250 | 169 |
| Boiling point (° C.), literature value | 202 | 201 | 290 | 250 | 169.5 |
| Decomposition product | SCH$_3$ | biphenyl | diphenyl ether | CH$_3$ | OCH$_3$ |
| Boiling point (° C.) | 188 | 255 | 259 | 110 | 154 |
| Boiling point (° C.), literature value | 193 | 255.3 | 259 | 110.8 | 153.9 |
| Decomposition product | Cl | COOCH$_2$CH$_3$ | COOCH$_3$ | naphthalene | |
| Boiling point (° C.) | 132 | 212 | 199 | 218 | |
| Boiling point (° C.), literature value | 132 | 212-213 | 199.6 | 218 | |

TABLE 1-continued

| Decomposition product | 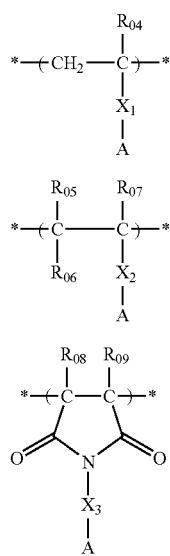 | | | |
|---|---|---|---|---|
| Boiling point (° C.) | 219 | 290 | 370 | 237 |
| Boiling point (° C.), literature value | 218.9 | — | — | 237 |

The repeating unit (A) is preferably, for example, a repeating unit represented by any one of the following formulae (III) to (V):

(III)

\*—(CH$_2$—C)—\*
         |
         R$_{04}$
         |
         X$_1$
         |
         A (IV)

\*—(C—C)—\*
   |   |
   R$_{05}$ R$_{07}$
   |   |
   R$_{06}$ X$_2$
         |
         A (V)

\*—(C—C)—\*
   ‖   ‖
   O   O
    \ /
     N
     |
     X$_3$
     |
     A (with R$_{08}$, R$_{09}$ on the ring carbons)

In the formulae above, each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxyl group, —CO—OR$_{25}$ or —CO—N(R$_{26}$)(R$_{27}$). $R_{26}$ and $R_{27}$ may combine to form a ring together with the nitrogen atom.

Each of $X_1$ to $X_3$ independently represents a single bond, an arylene group, an alkylene group, a cycloalkylene group, —O—, —SO$_2$—, —CO—, —N(R$_{33}$)— or a divalent linking group formed by combining a plurality of these groups.

$R_{25}$ represents an alkyl group, a cycloalkyl group, an alkenyl group, an aryl group or an aralkyl group.

Each of $R_{26}$, $R_{27}$ and $R_{33}$ independently represents a hydrogen atom, an alkyl group, a cycloalkyl group, an alkenyl group, an aryl group or an aralkyl group.

A represents an ionic structure moiety capable of decomposing upon irradiation with an actinic ray or radiation, in which the counter cation is represented by formula (Ia).

In formulae (III) to (V), the alkyl group of $R_{04}$, $R_{05}$ and $R_{07}$ to $R_{09}$ is preferably an alkyl group having a carbon number of 20 or less which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less. The cycloalkyl group includes a cycloalkyl group which may be either monocyclic or polycyclic and is preferably a monocyclic cycloalkyl group having a carbon number of 3 to 8 which may have a substituent, such as cyclopropyl group, cyclopentyl group and cyclohexyl group.

The halogen atom includes a fluorine atom, a chlorine atom, a bromine atom or an iodine atom and is preferably a fluorine atom.

As for the alkyl group contained in the alkoxycarbonyl group, the same as those for the alkyl group in $R_{04}$, $R_{05}$ and $R_{07}$ to $R_{09}$ are preferred.

The alkyl group of $R_{25}$ to $R_{27}$ and $R_{33}$ is preferably an alkyl group having a carbon number of 20 or less which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

The cycloalkyl group includes a cycloalkyl group which may be either monocyclic or polycyclic and is preferably a monocyclic cycloalkyl group having a carbon number of 3 to 8 which may have a substituent, such as cyclopropyl group, cyclopentyl group and cyclohexyl group.

The alkenyl group is preferably an alkenyl group having a carbon number of 2 to 6 which may have a substituent, such as vinyl group, propenyl group, allyl group, butenyl group, pentenyl group, hexenyl group and cyclohexenyl group.

The aryl group is preferably a monocyclic or polycyclic aromatic group having a carbon number of 6 to 14 which may have a substituent, and specific examples thereof include a phenyl group, a tolyl group, a chlorophenyl group, a methoxyphenyl group. The aryl groups may combine with each other to form a heterocyclic ring.

The aralkyl group is an aralkyl group having a carbon number of 7 to 15 which may have a substituent, such as benzyl group, phenethyl group and cumyl group.

The ring formed together with the nitrogen atom by combining $R_{26}$ and $R_{27}$ is preferably a 5- to 8-membered ring, and specific examples thereof include pyrrolidine, piperidine and piperazine.

The arylene group of $X_1$ to $X_3$ is preferably an arylene group having a carbon number of 6 to 14 which may have a substituent, and specific examples thereof include a phenylene group, a tolylene group and a naphthylene group.

The alkylene group is preferably an alkylene group having a carbon number of 1 to 8, such as methylene group, ethylene group, propylene group, butylene group, hexylene group and octylene group.

The cycloalkylene group is preferably a cycloalkylene group having a carbon number of 5 to 8 which may have a substituent, such as cyclopentylene group and cyclohexylene group.

Each of the groups in formulae (III) to (V) may have a substituent, and preferred examples of the substituent include a hydroxyl group, a halogen atom (e.g., fluorine, chlorine, bromine, iodine), a nitro group, a cyano group, an amido group, a sulfonamido group, the alkyl group described for $R_{04}$ to $R_{09}$, $R_{25}$ to $R_{27}$ and $R_{33}$, an alkoxy group (e.g., methoxy, ethoxy, hydroxyethoxy, propoxy, hydroxypropoxy, butoxy), an alkoxycarbonyl group (e.g., methoxycarbonyl, ethoxycarbonyl), an acyl group (e.g., formyl, acetyl, benzoyl), an acyloxy group (e.g., acetoxy, butyryloxy), and a carboxy group. The carbon number of the substituent is preferably 8 or less.

A represents an ionic structure moiety capable of decomposing upon irradiation with an actinic ray or radiation to produce an acid anion on the resin side chain, in which the counter cation is represented by formula (Ia). More specifically, A is preferably a group represented by the following formula (ZI):

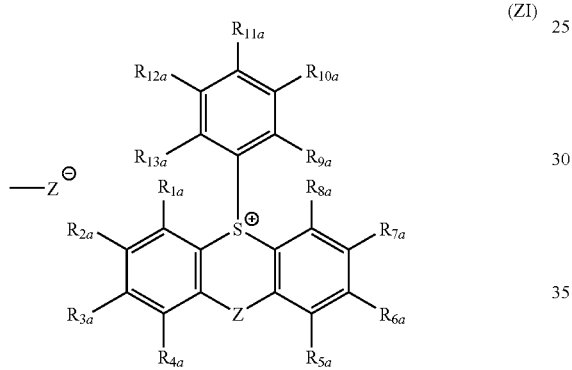

In formula (ZI), $R_{1a}$ to $R_{13a}$ and Z are the same as $R_{1a}$ to $R_{13a}$ and Z in formula (Ia).

$Z^-$ represents an acid anion generated as a result of decomposition upon irradiation with an actinic ray or radiation and is preferably a non-nucleophilic anion. Examples of the non-nucleophilic anion include a sulfonate anion, a carboxylate anion, a sulfonylimide anion, a bis(alkylsulfonyl)imide anion, and a tris(alkylsulfonyl)methide anion. Among these, a sulfonate anion, a bis(alkylsulfonyl)imide anion and a tris(alkylsulfonyl)methide anion are preferred, and a sulfonate anion is more preferred.

The non-nucleophilic anion is an anion having an extremely low ability of causing a nucleophilic reaction, and this anion can suppress the decomposition with aging due to intramolecular nucleophilic reaction. Thanks to this anion, the aging stability of the resin and in turn, the aging stability of the resist are enhanced.

Incidentally, the straight line extending from $Z^-$ indicates a bond extending toward the main chain of the repeating unit (A).

Specific preferred examples of A include, but are not limited to, an ionic structure moiety formed by each of (B1-1) to (B1-71) as the cation and —$SO_3^-$ as the anion.

The repeating unit represented by any one of formulae (III) to (V) effectively used in the present invention is more preferably a repeating unit represented by any one of the following formulae (III-1) to (III-3), formulae (IV-1) and (IV-2), and formula (V-1).

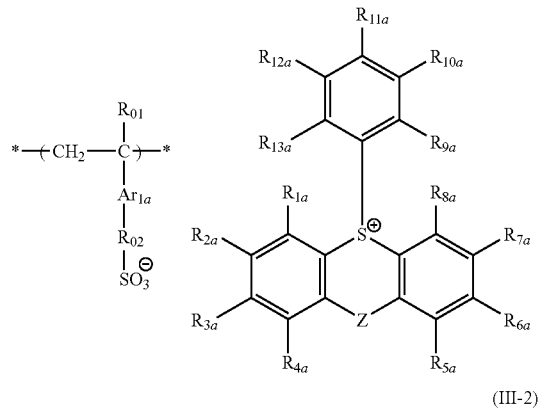

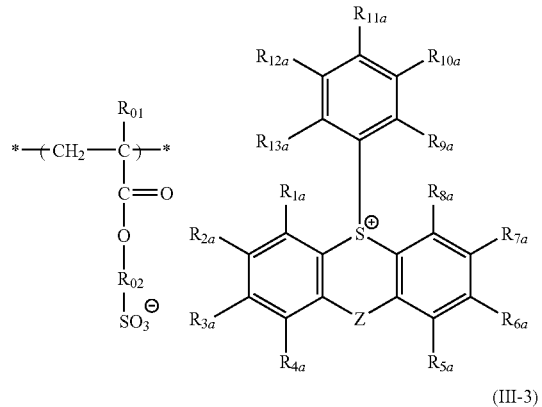

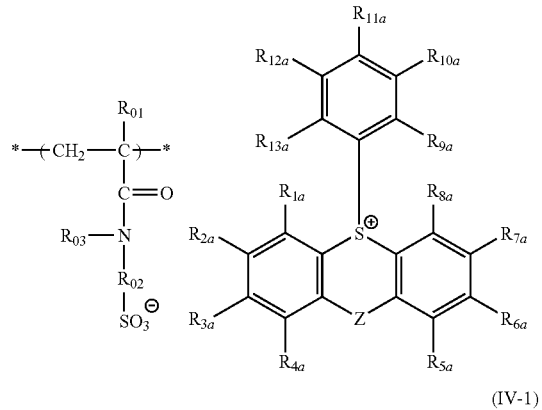

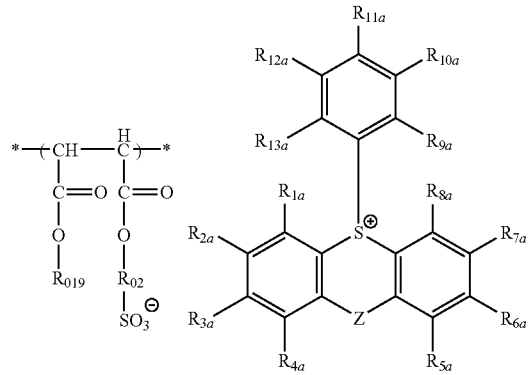

-continued (IV-2)

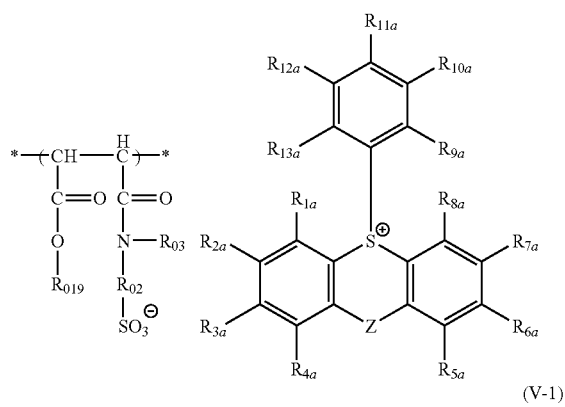

(V-1)

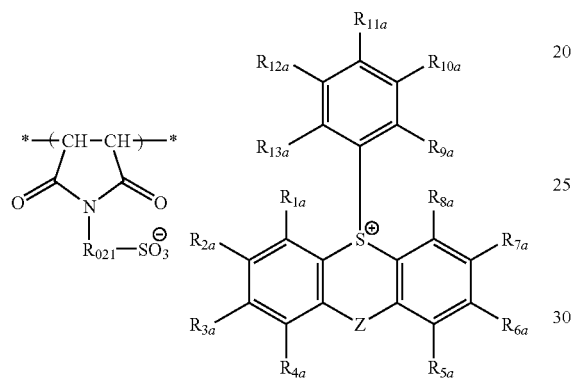

In the formulae above, $Ar_{1a}$ represents an arylene group which may have a substituent, similar to the arylene group of $X_1$ to $X_3$.

$R_{01}$ represents a hydrogen atom, a methyl group, a chloromethyl group, a trifluoromethyl group or a cyano group.

Each of $R_{02}$ and $R_{021}$ represents a single bond, an arylene group, an alkylene group, a cycloalkylene group, —O—, —SO$_2$—, —CO—, —N(R$_{33}$)— or a divalent linking group formed by combining a plurality of these groups, similar to those of $X_1$ to $X_3$.

Each of $R_{03}$ and $R_{019}$ independently represents a hydrogen atom, an alkyl group, a cycloalkyl group, an aryl group or an aralkyl group. Examples of the alkyl group and cycloalkyl group are the same as those of the alkyl group and cycloalkyl group as $R_{01}$ to $R_{03}$ in formula (I) described later, and examples of the aryl group and aralkyl group are the same as those of the aryl group and aralkyl group as $L_1$ and $L_2$ in formula (II) described later.

$R_{1a}$ to $R_{13a}$ and Z are the same as those in formula (Ia).

The content of the repeating unit (A) in the resin of the present invention is preferably from 0.5 to 80 mol %, more preferably from 1 to 60 mol %, still more preferably from 3 to 40 mol %, based on all repeating units.

The method for synthesizing a monomer corresponding to the repeating unit (A) is not particularly limited, but examples thereof include a method of exchanging a polymerizable unsaturated bond-containing acid anion corresponding to the repeating unit with halide of a known onium salt.

More specifically, the metal ion salt (e.g., sodium ion, potassium ion) or ammonium salt (e.g., ammonium, triethylammonium) of a polymerizable unsaturated bond-containing acid corresponding to the repeating unit is subjected to an anion exchange reaction with an onium salt having halogen ion (e.g., chloride ion, bromide ion, iodide ion) under stirring in the presence of water or methanol and then to a liquid separation/washing operation using an organic solvent such as dichloromethane, chloroform, ethyl acetate, methyl isobutyl ketone and tetrahydroxyfuran, and water, whereby a monomer corresponding to the objective repeating unit (A) can be synthesized.

The monomer may also be synthesized by performing the anion exchange reaction under stirring in the presence of an organic solvent separable from water, such as dichloromethane, chloroform, ethyl acetate, methyl isobutyl ketone and tetrahydroxyfuran, and water, and then performing a liquid separation/washing operation using water.

Specific examples of the repeating unit represented by any one of formulae (III) to (V) are set forth below, but the present invention is not limited thereto.

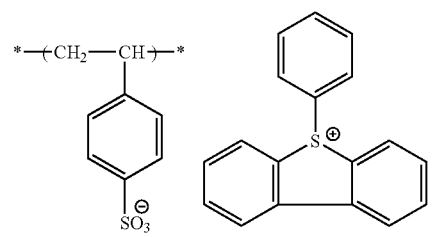

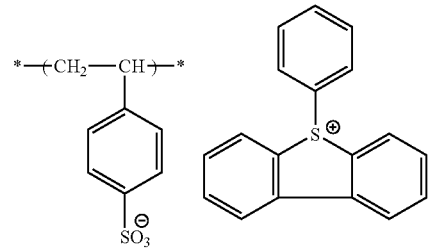

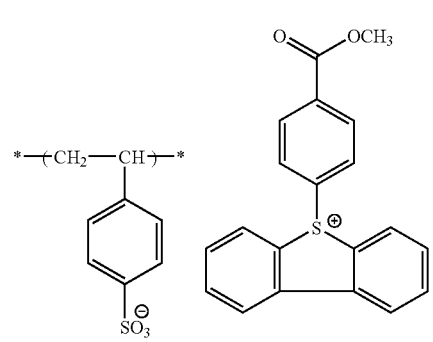

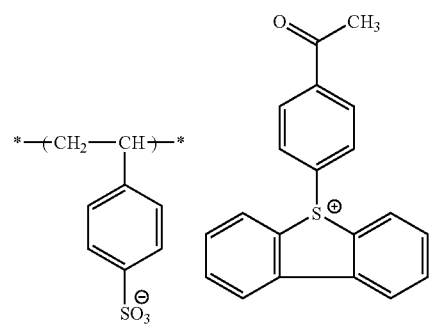

33
-continued
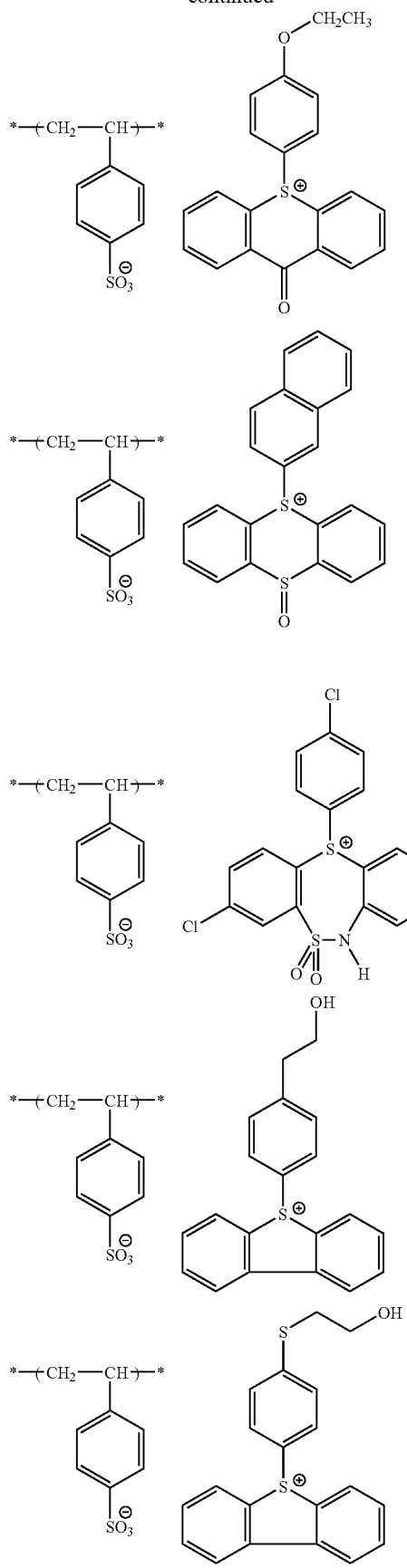
34
-continued
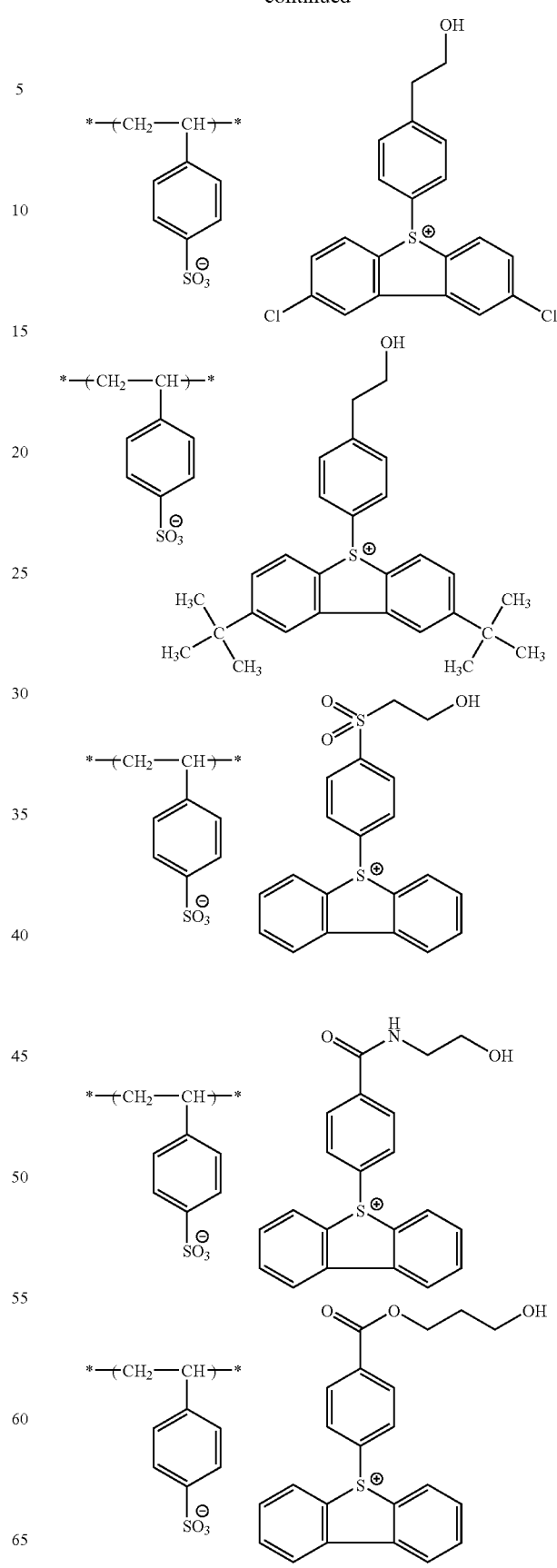

35
-continued
36
-continued
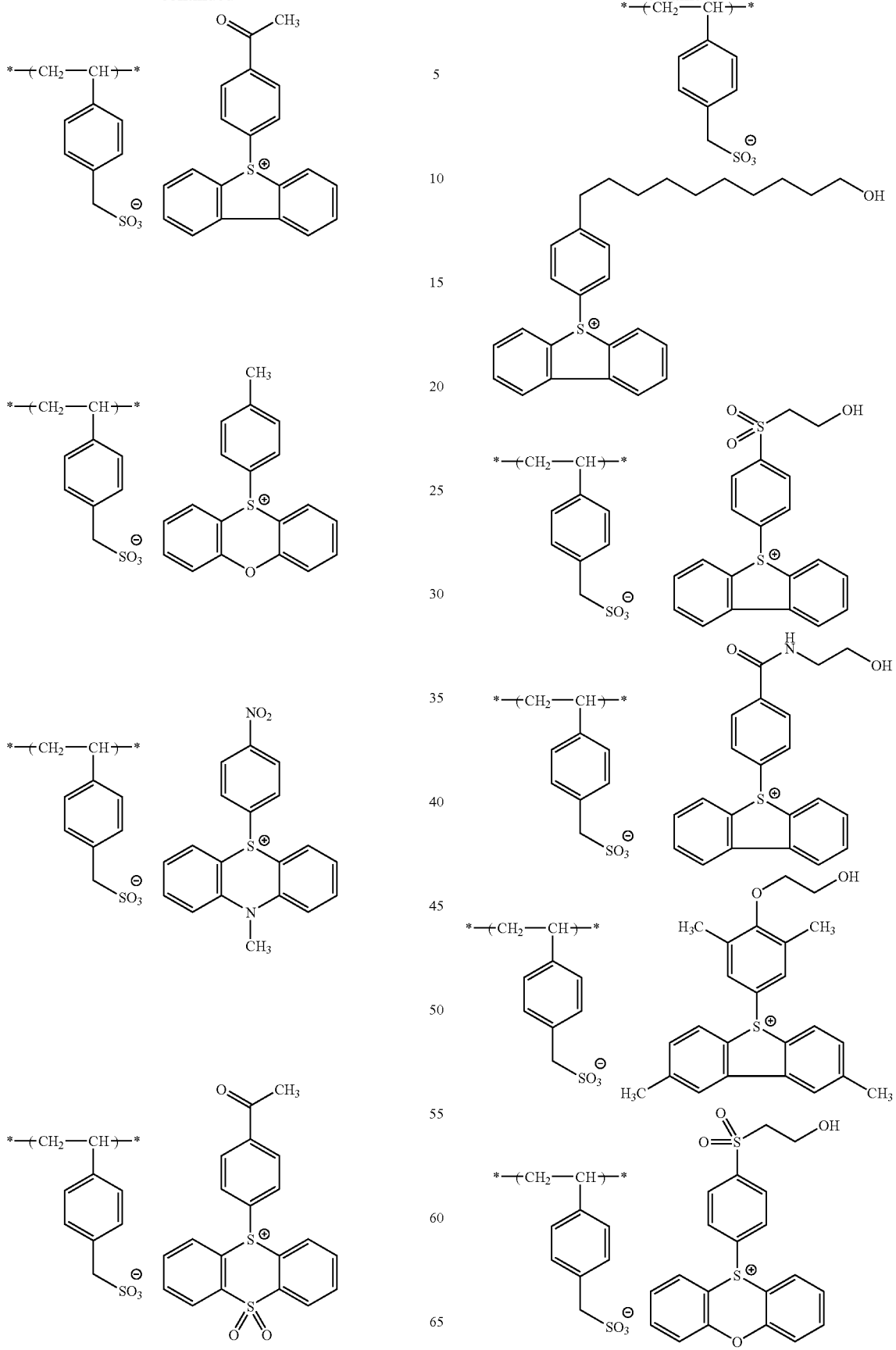

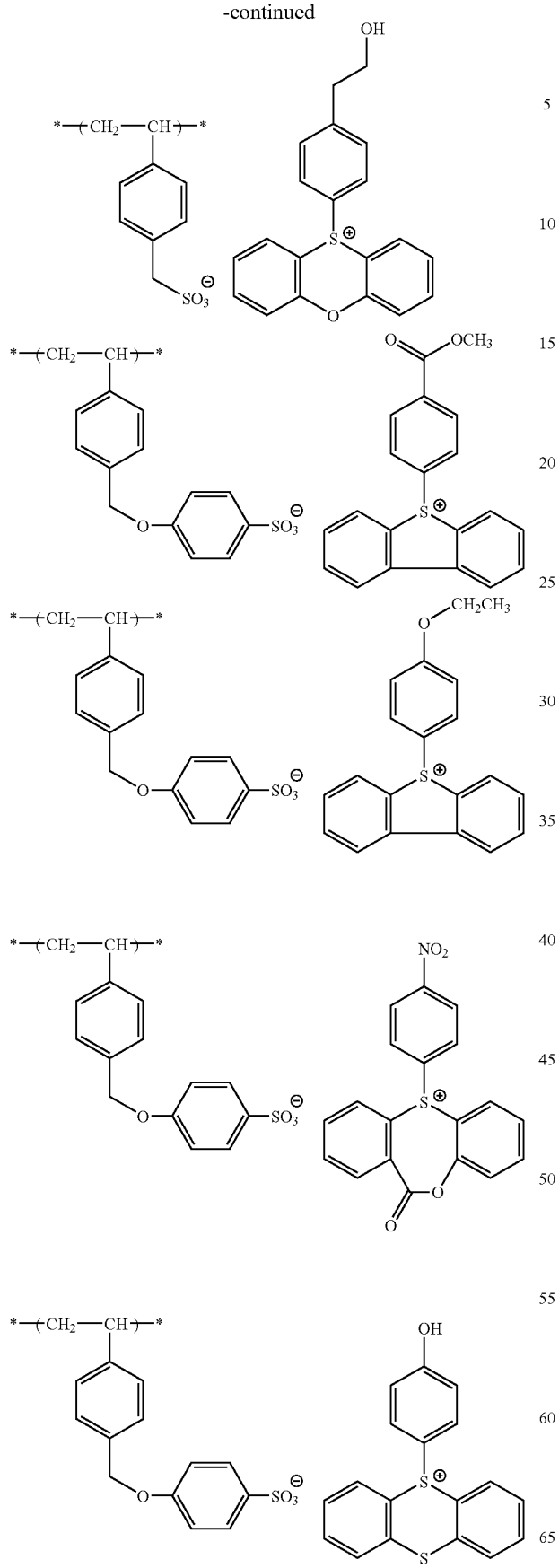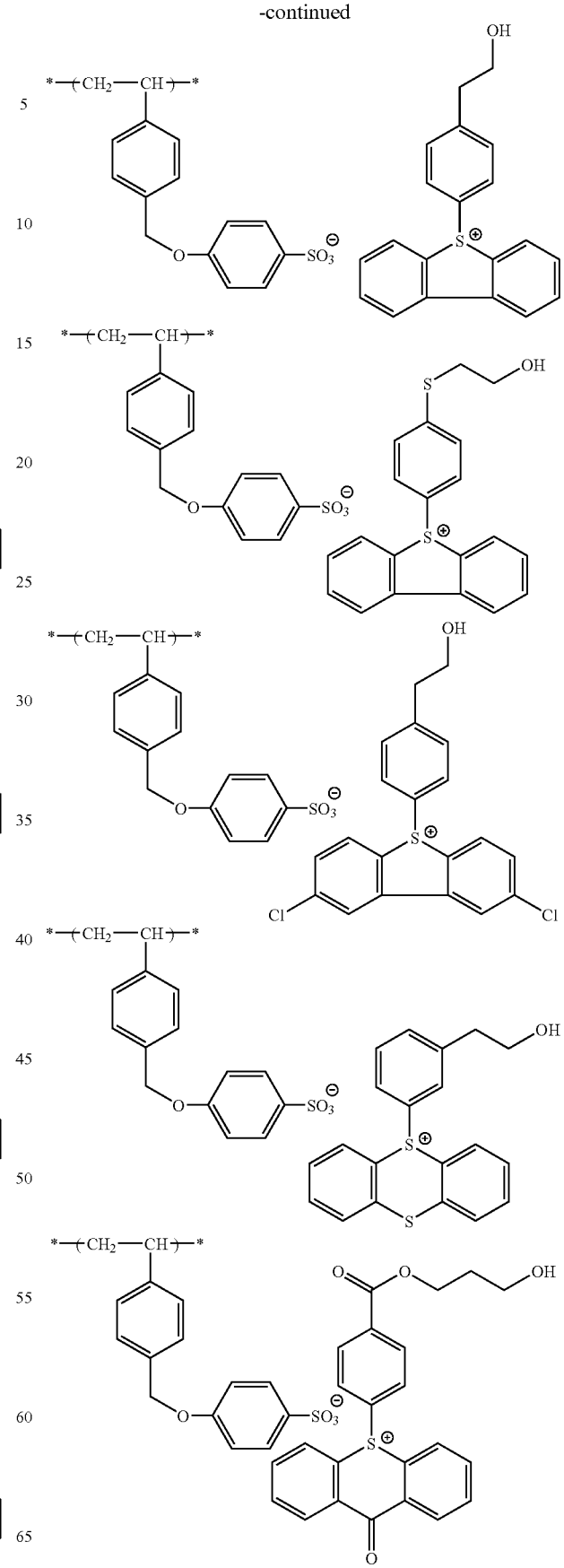

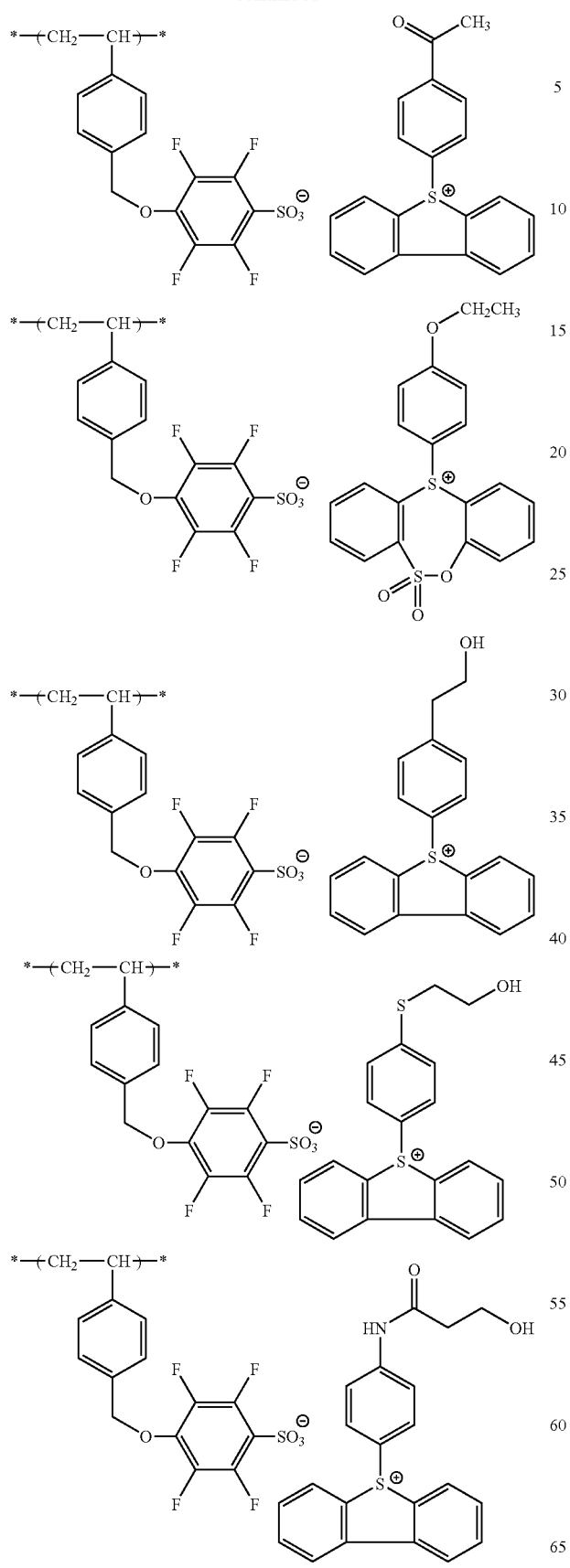
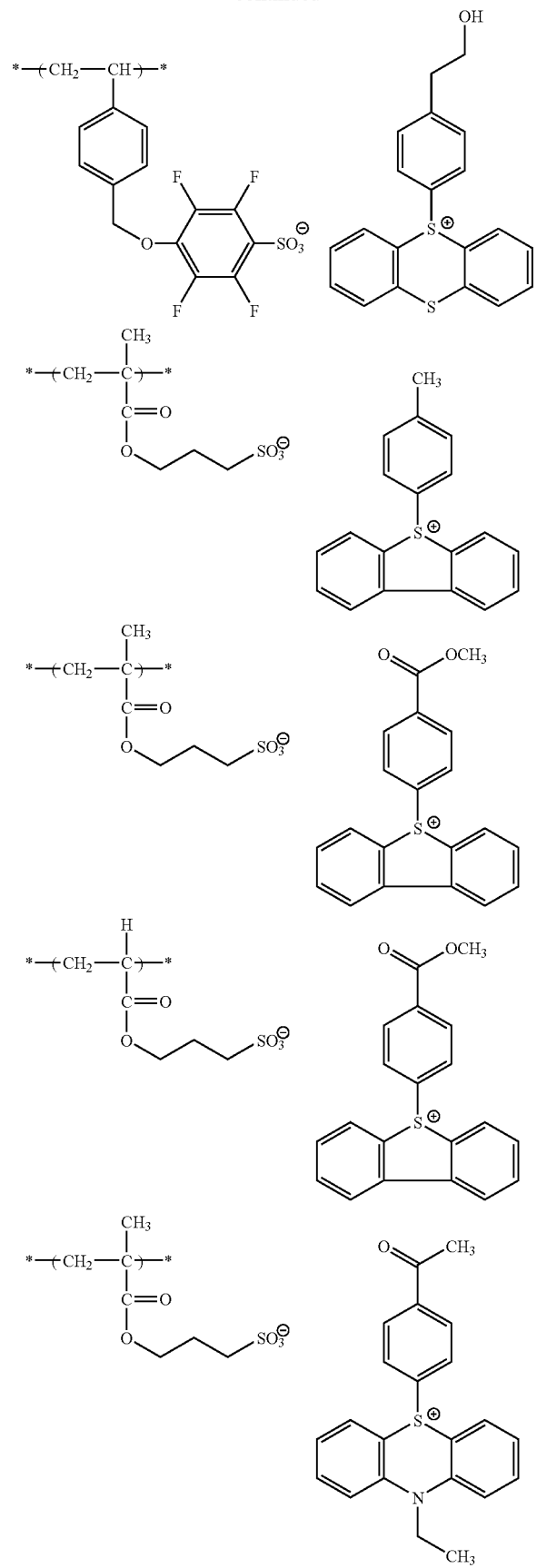

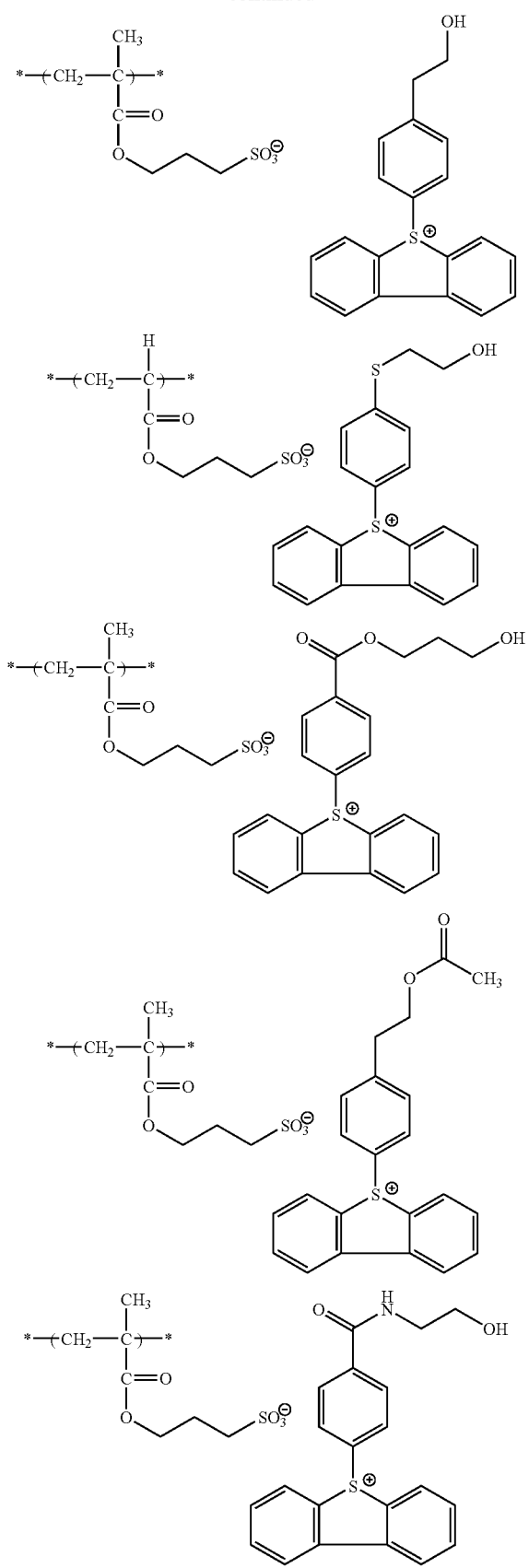
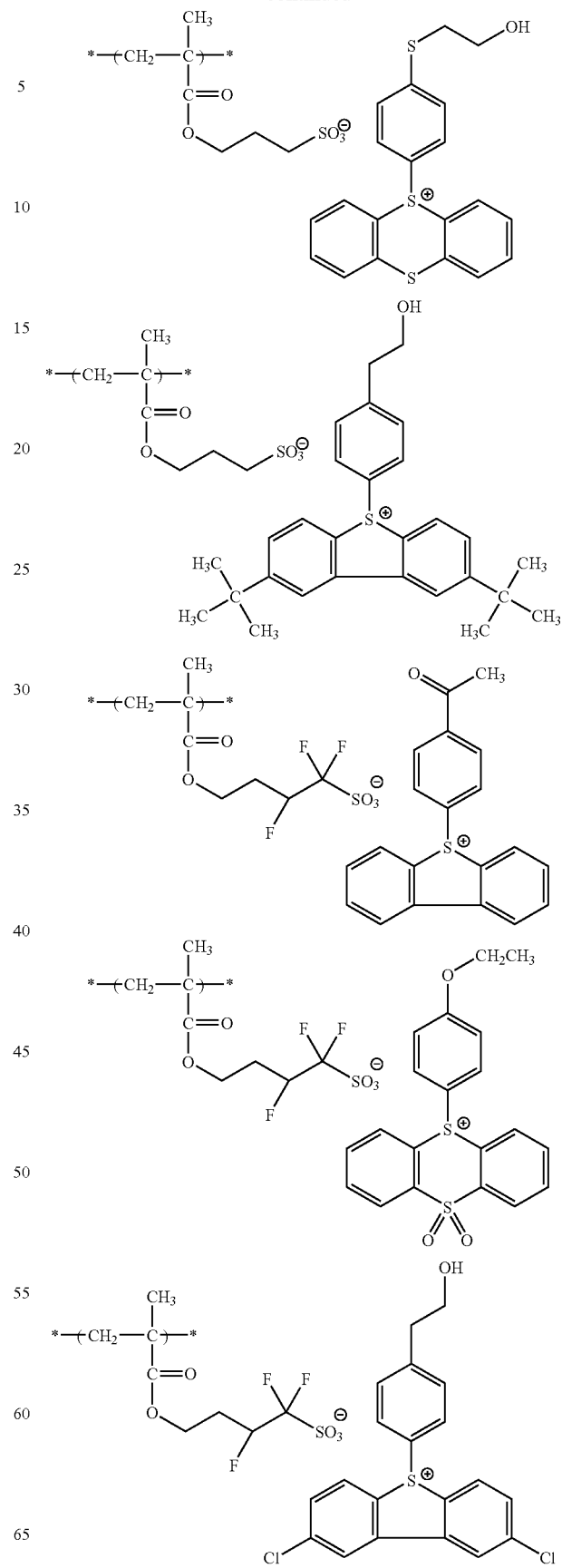

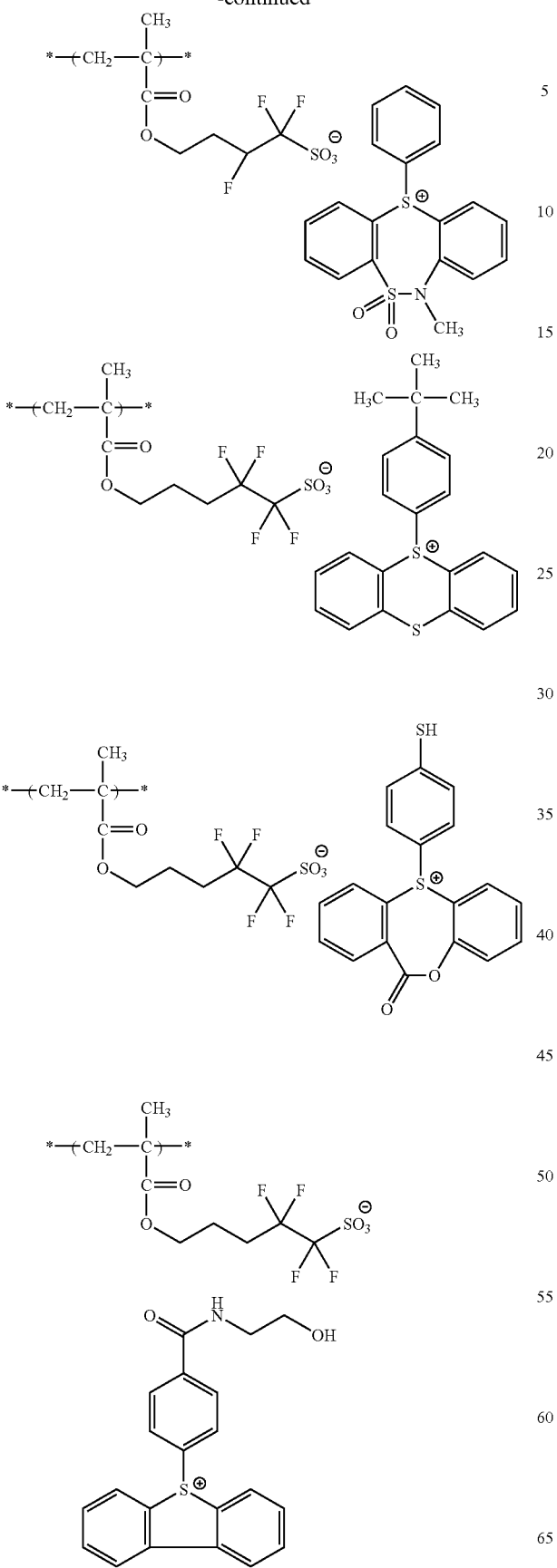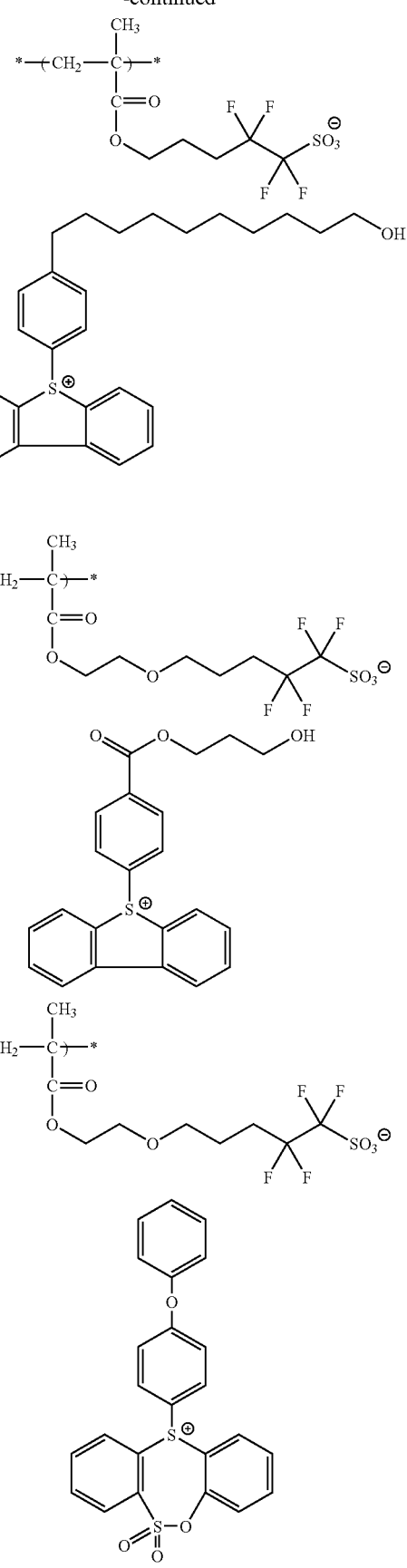

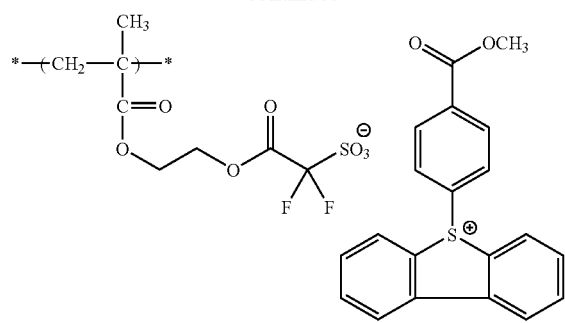
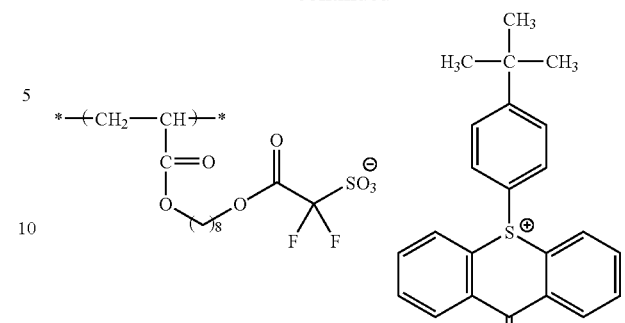
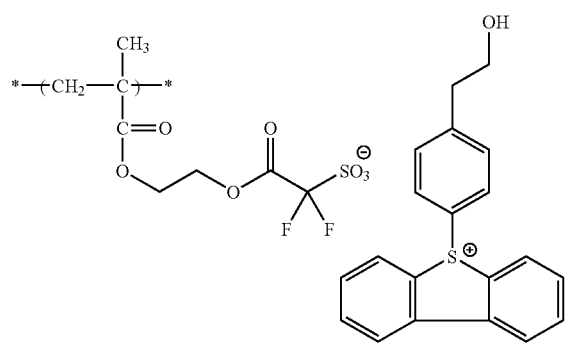
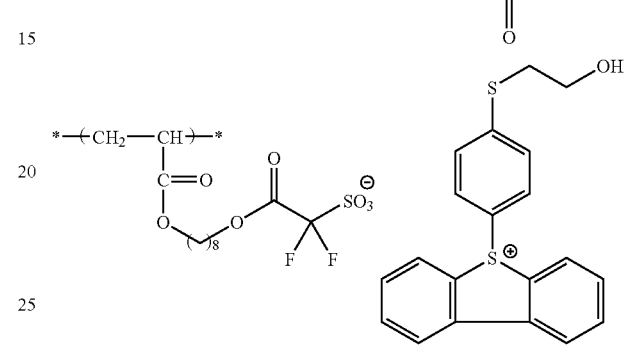
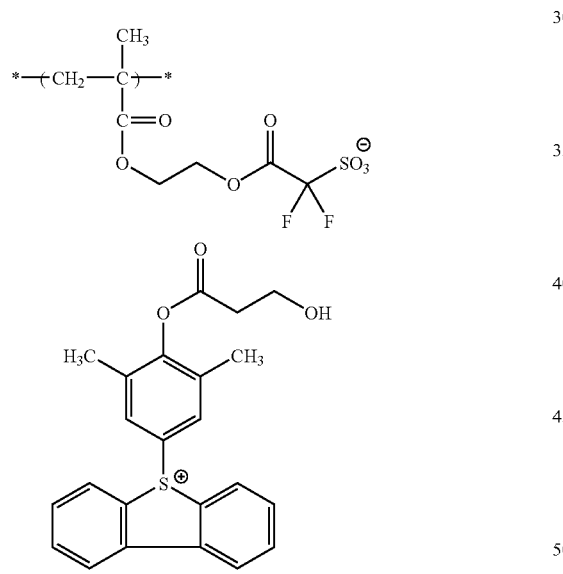
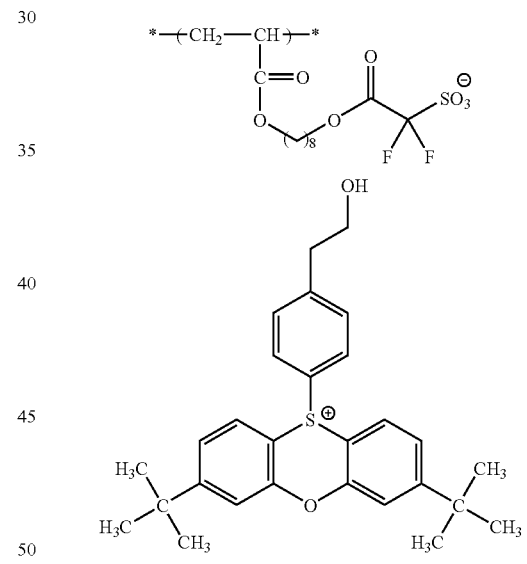
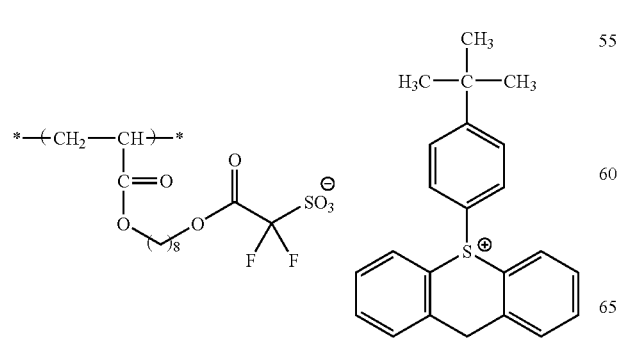
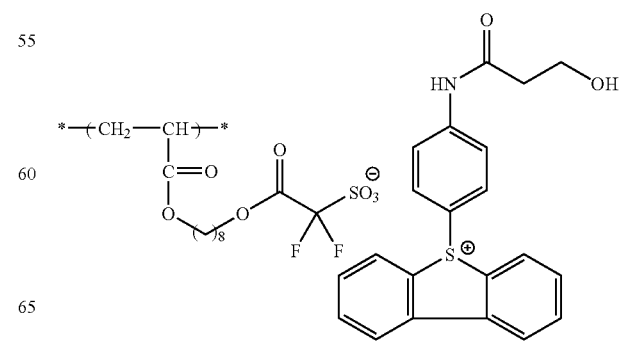

47
-continued
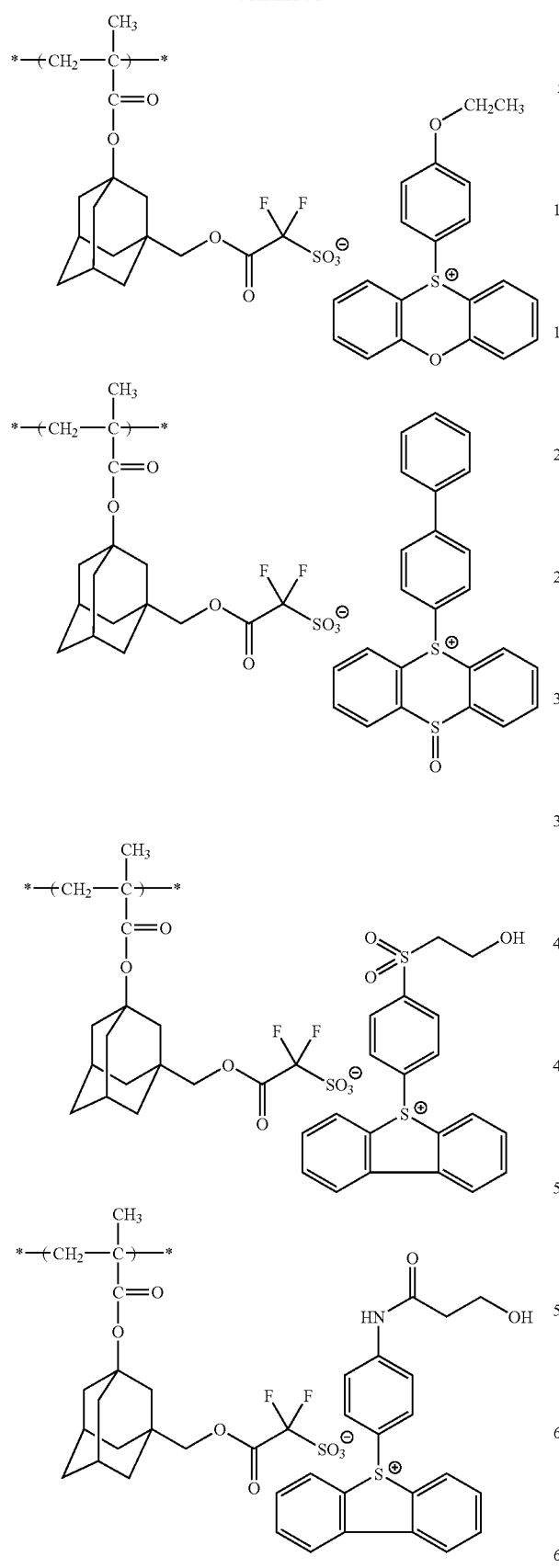
48
-continued
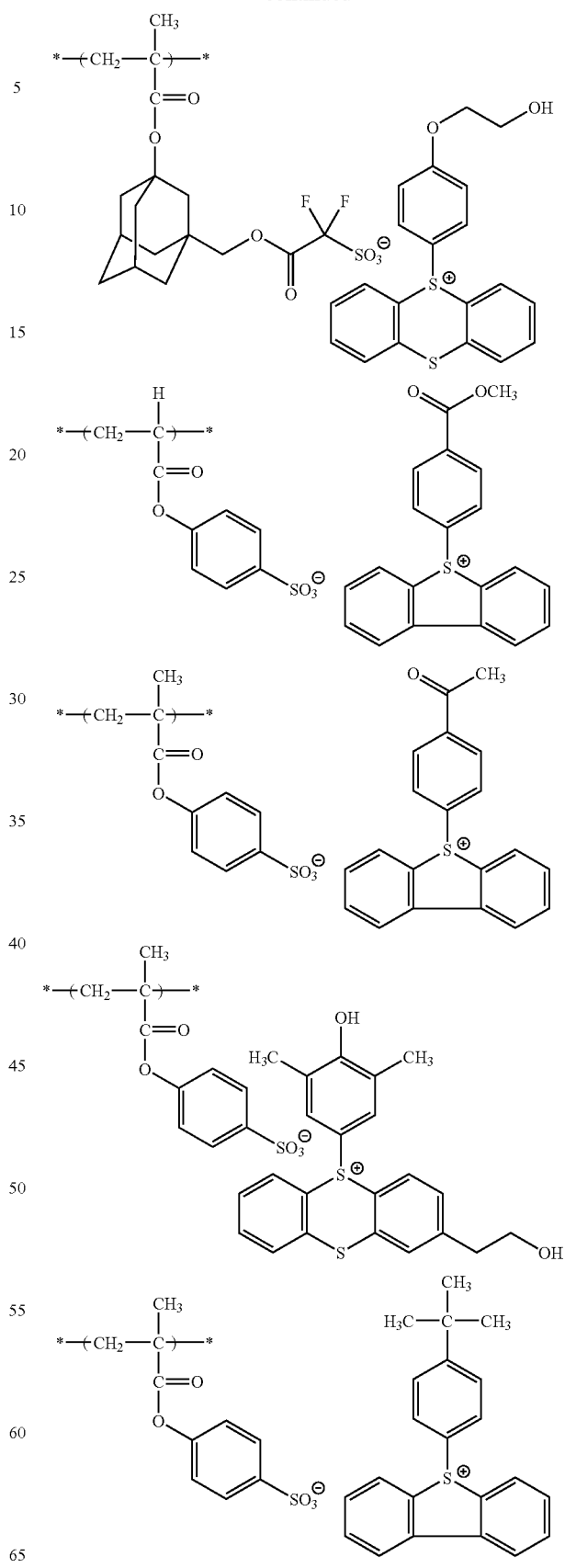

49
-continued
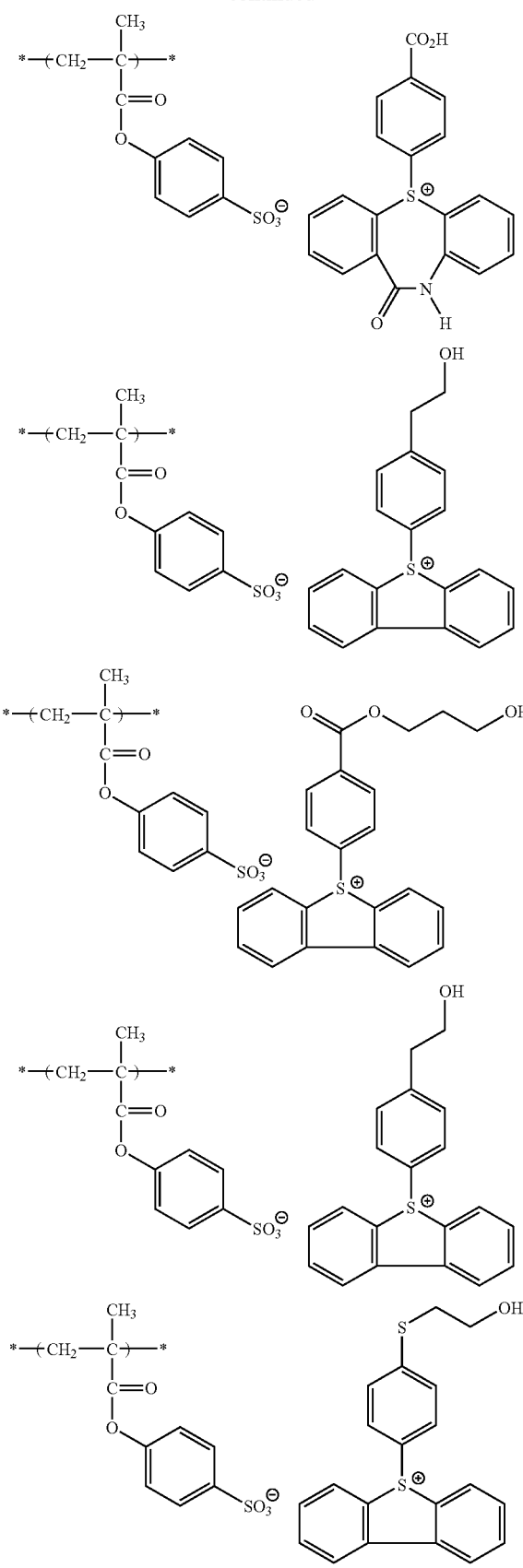
50
-continued
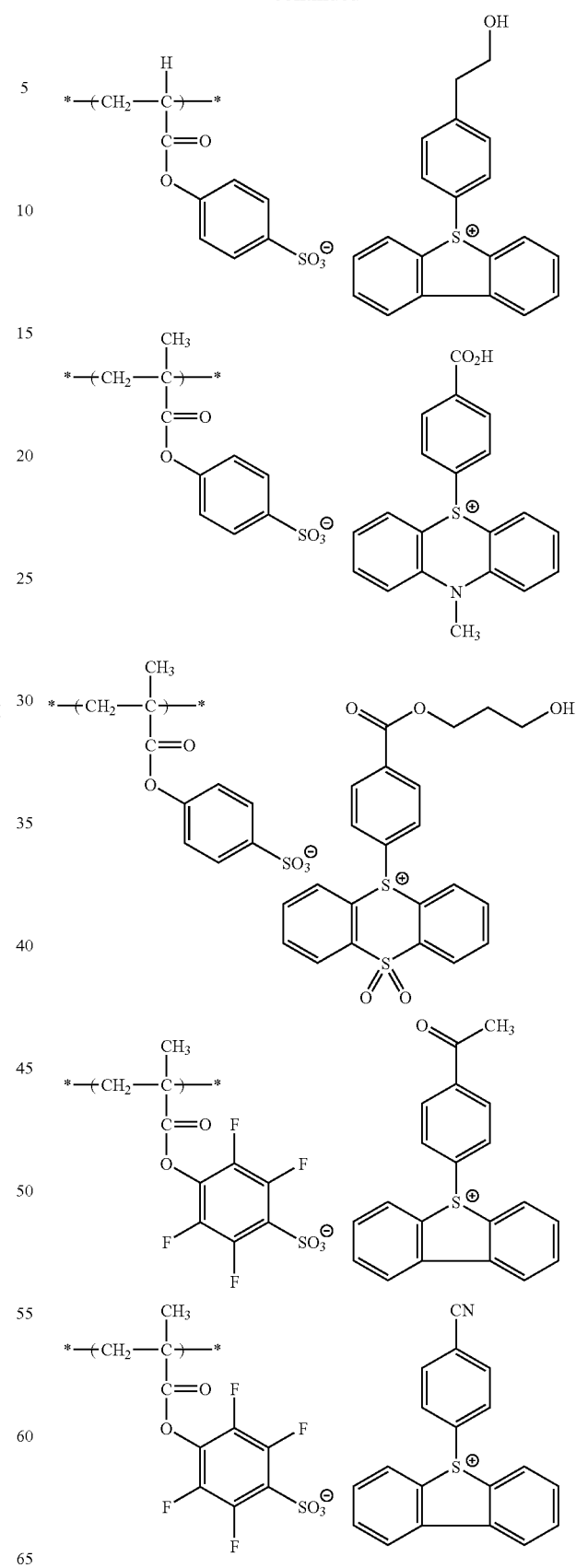

51
-continued
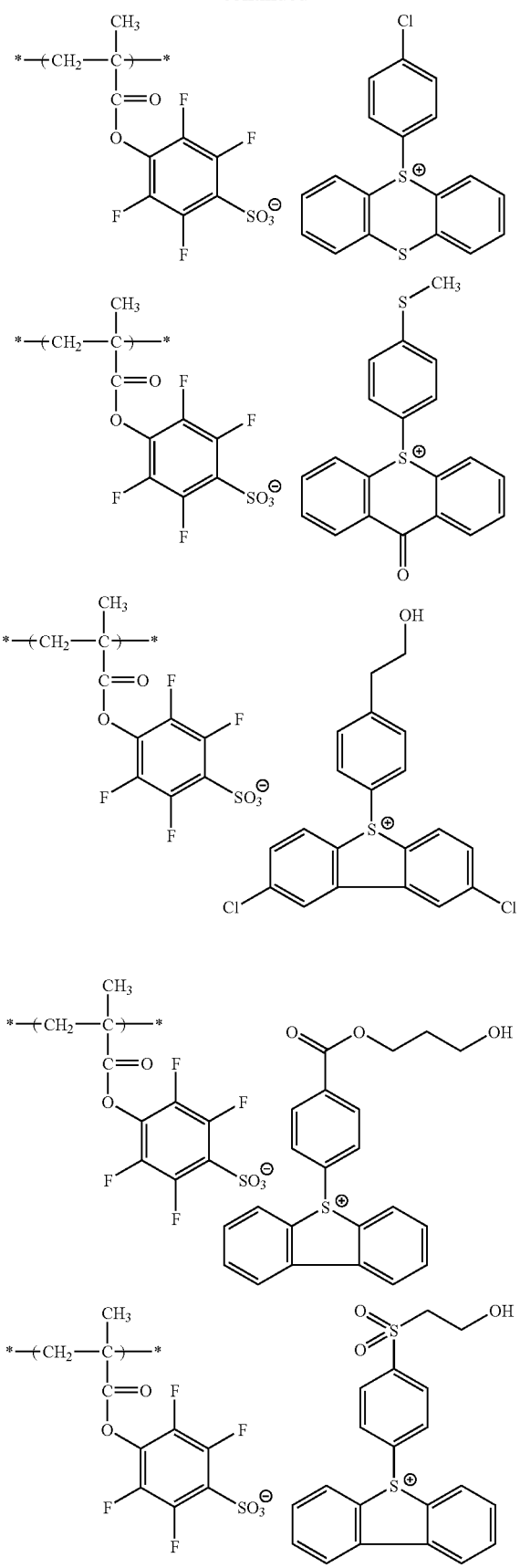
52
-continued
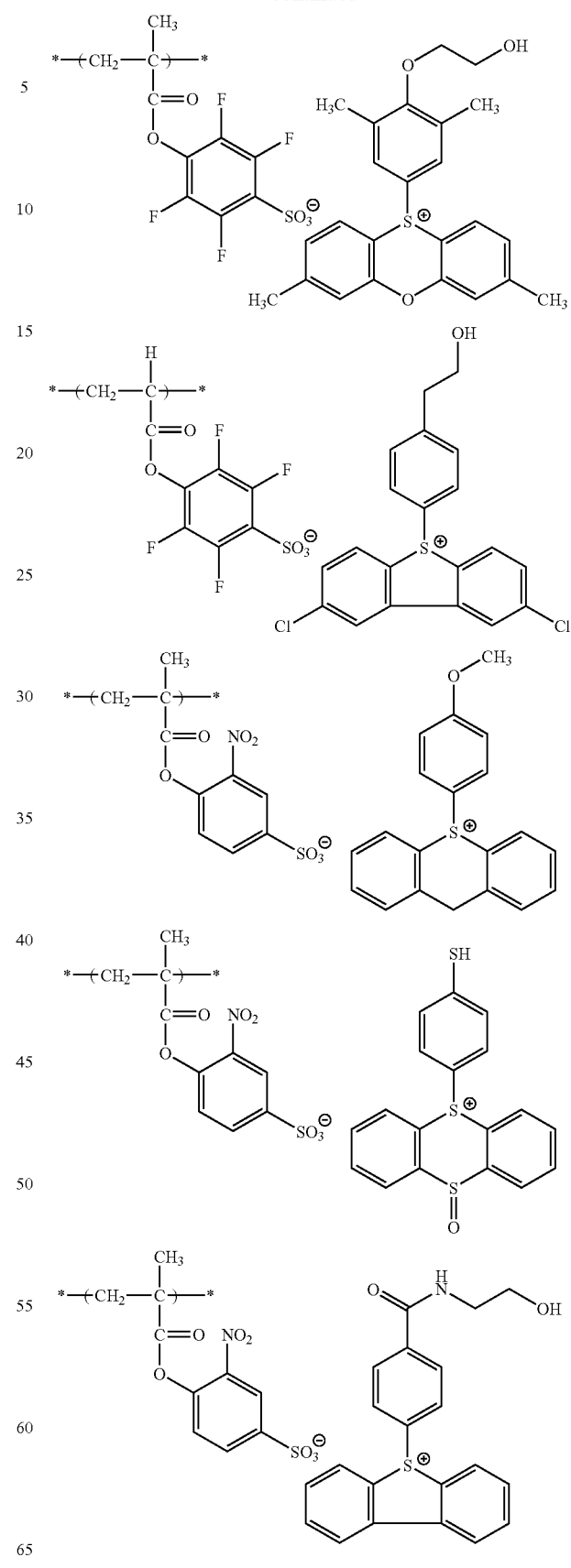

53
-continued
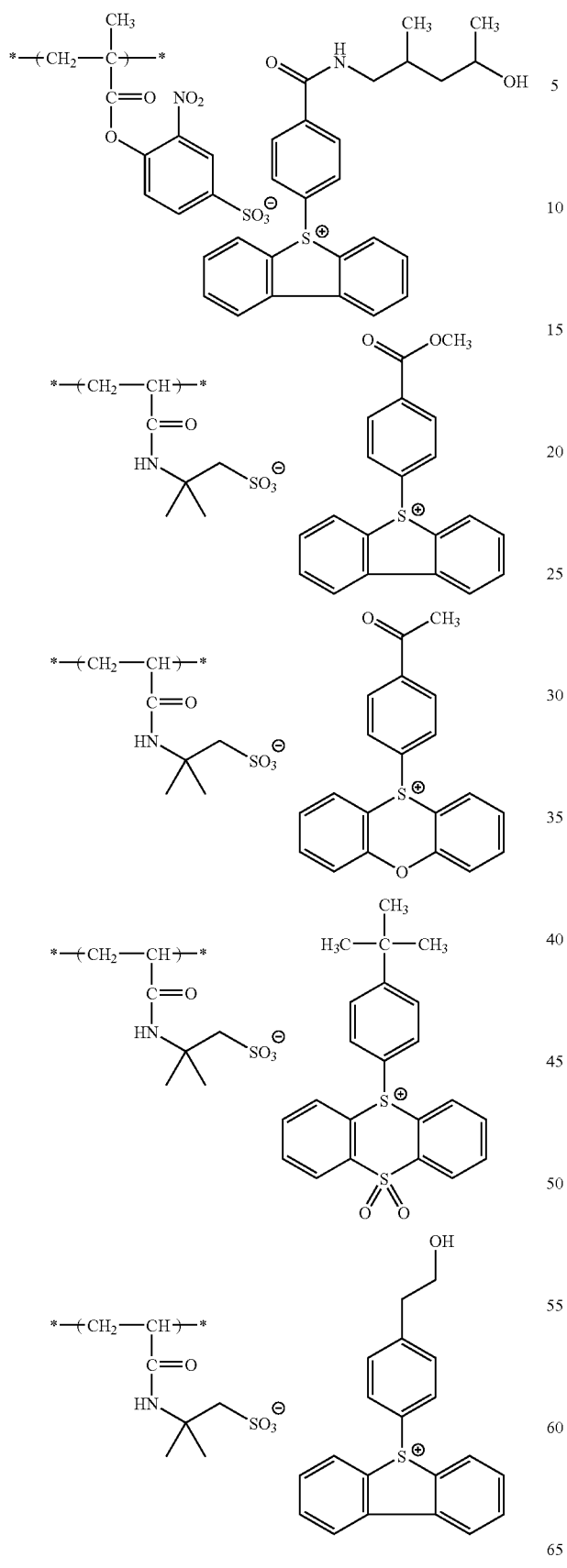
54
-continued
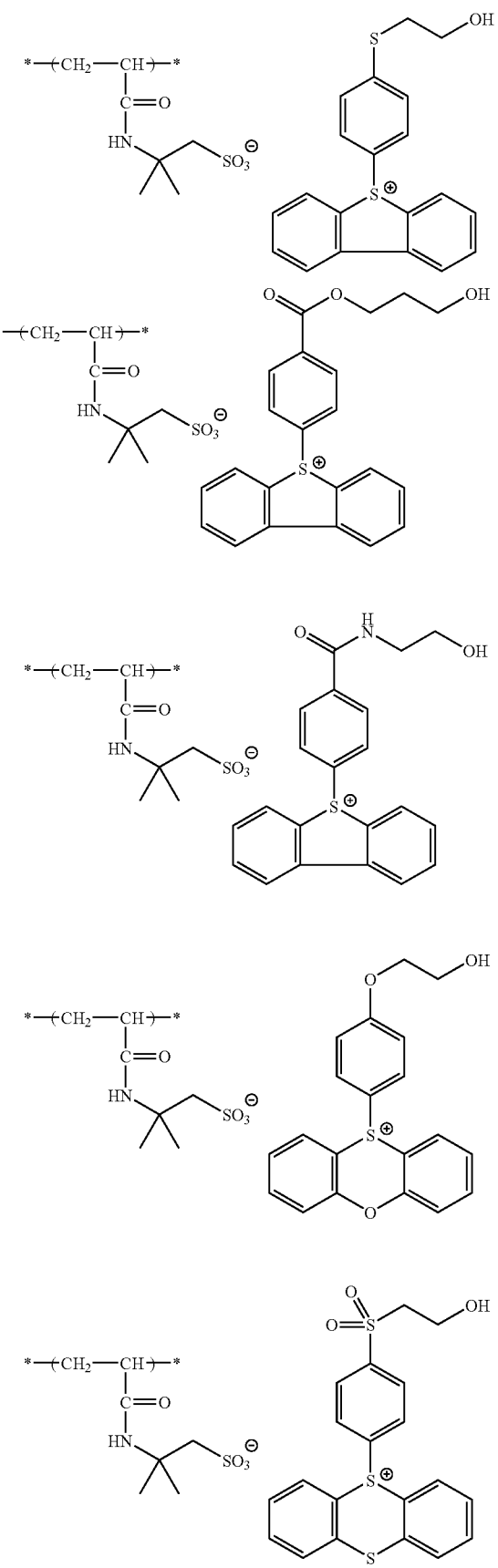

55
-continued
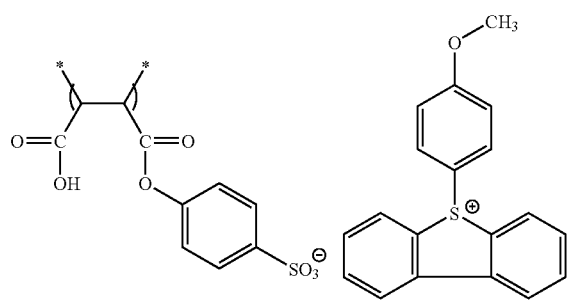
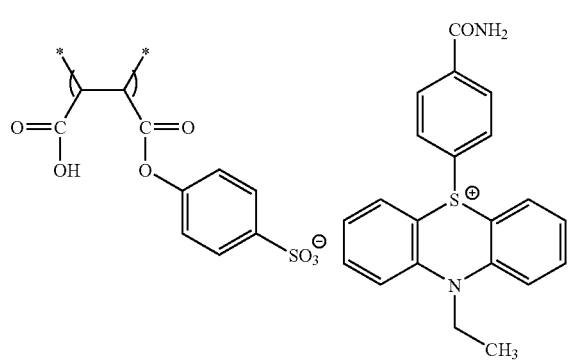
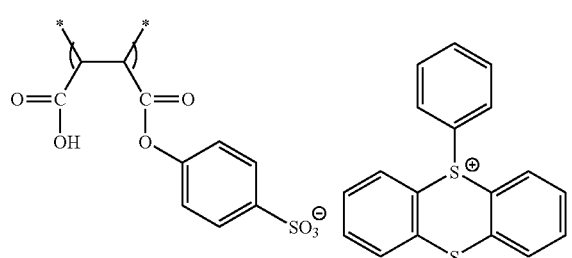
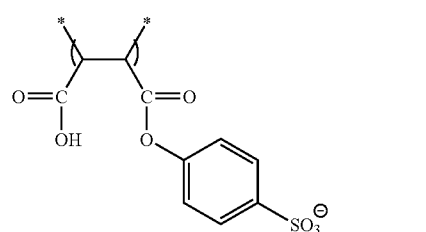
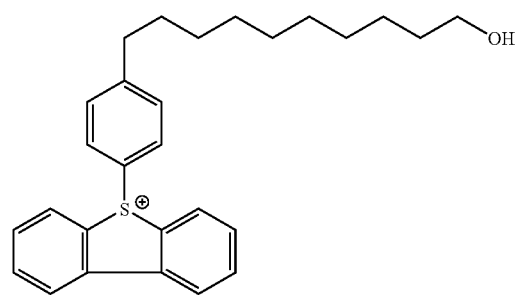
56
-continued
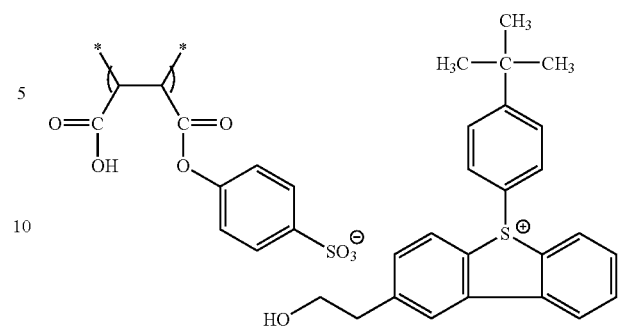
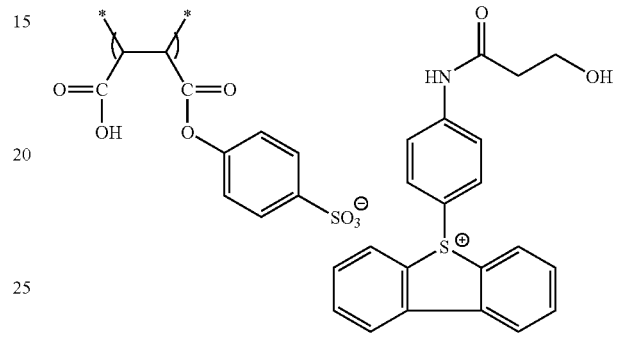
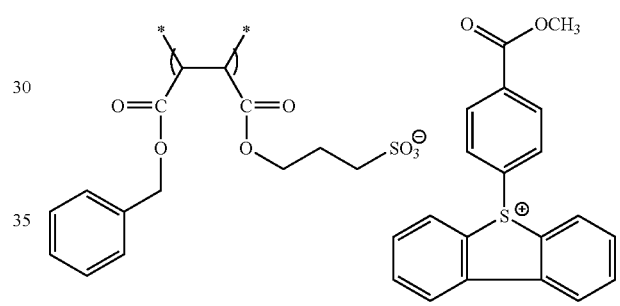
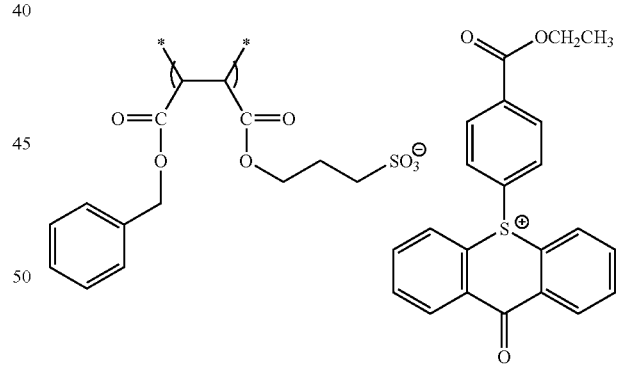
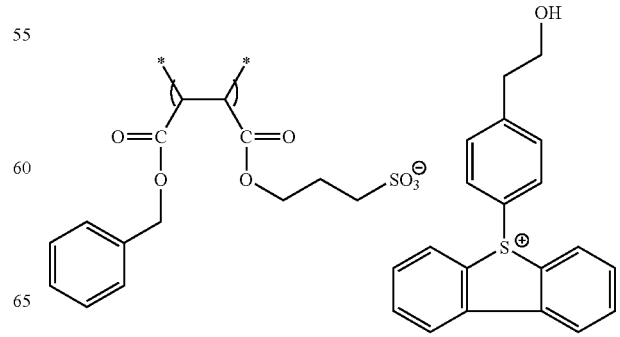

57
-continued
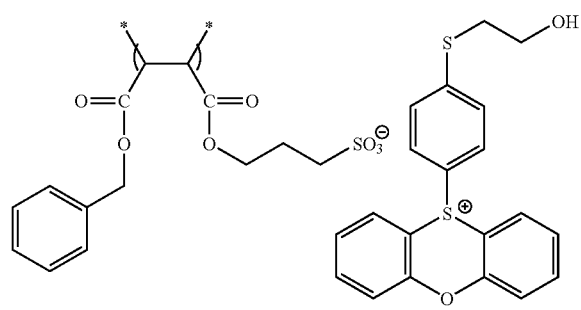
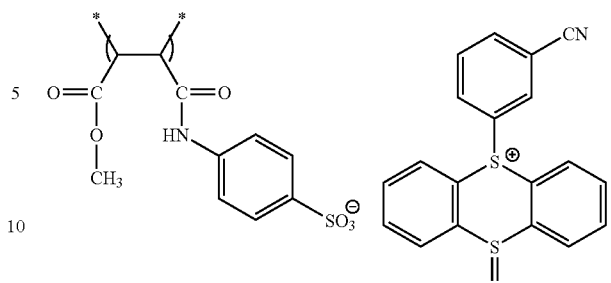
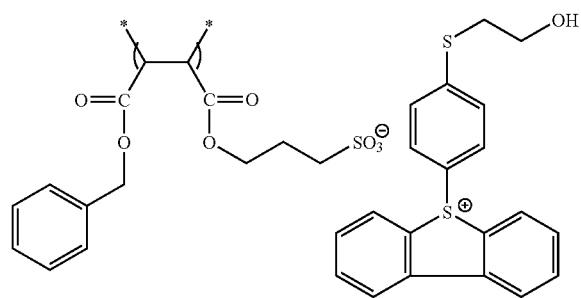
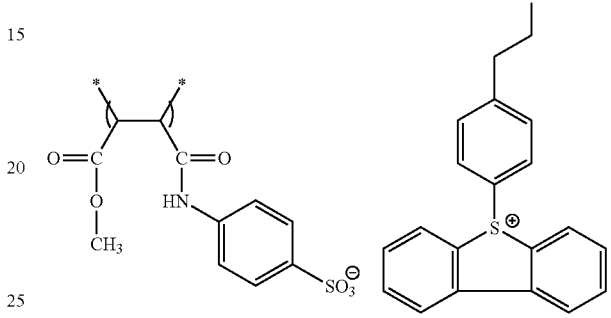
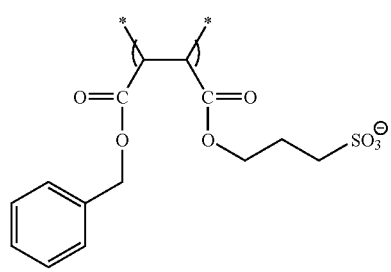
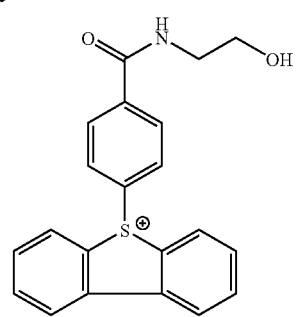
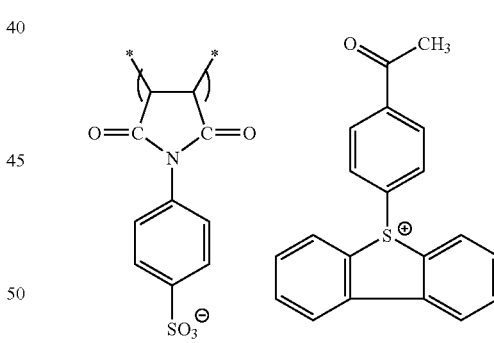
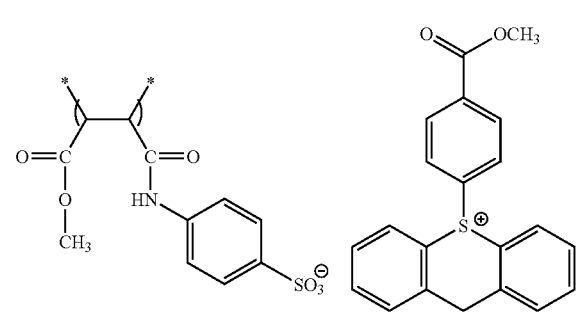
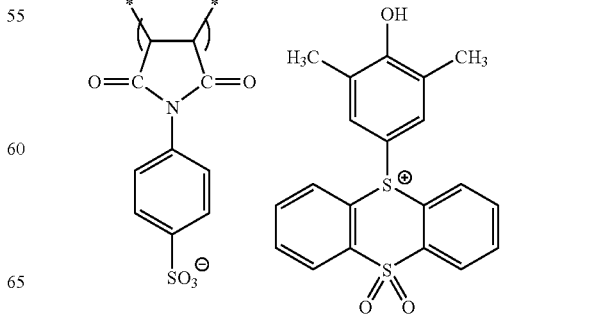
58
-continued
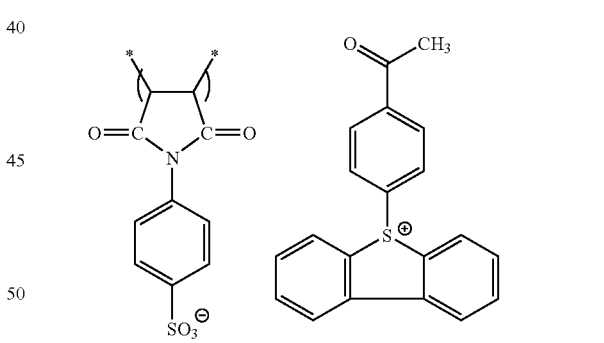
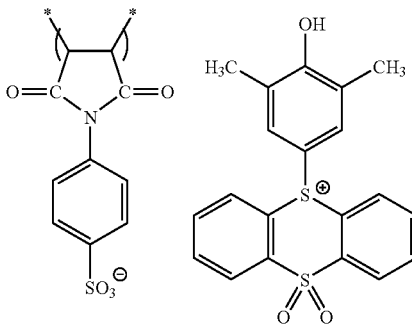

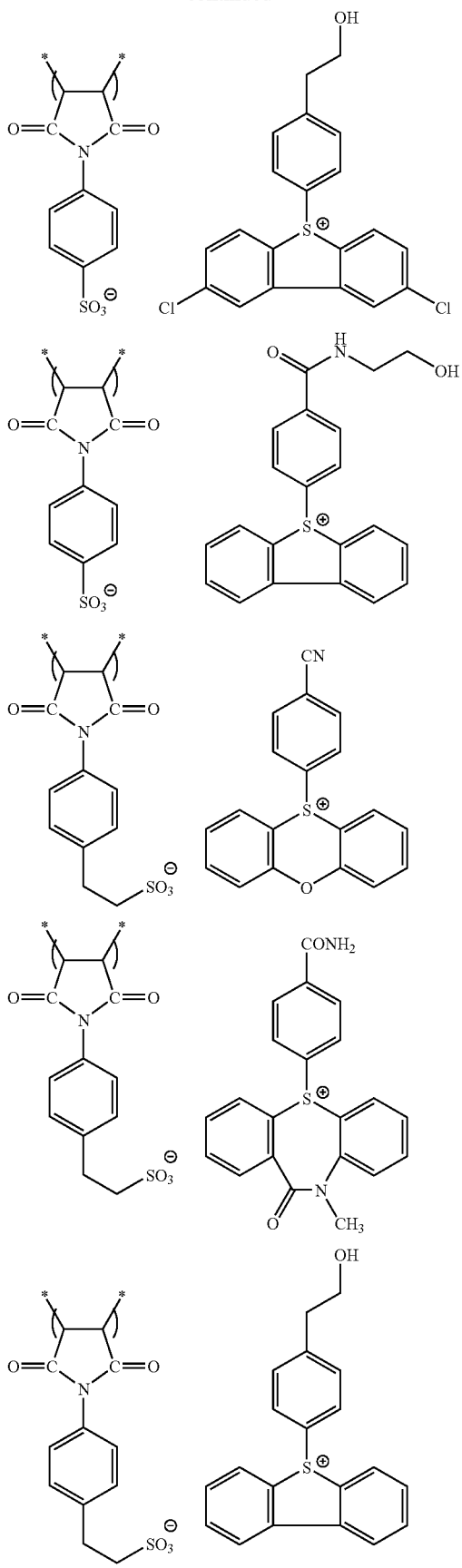
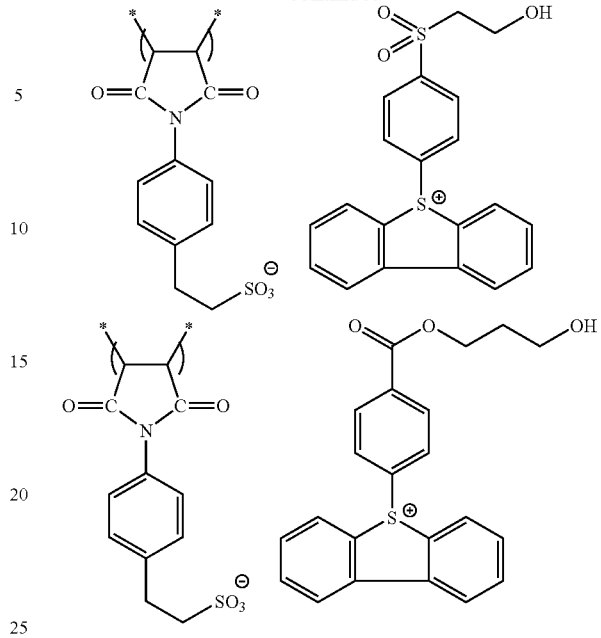

(2) Repeating Unit (B) Having a Group Capable of Decomposing by the Action of an Acid to Produce an Alkali-Soluble Group The resin for use in the present invention preferably contains a repeating unit having a group capable of decomposing by the action of an acid to produce an alkali-soluble group (hereinafter sometimes referred to as an "acid-decomposable group").

The acid-decomposable group is preferably, for example, a group where a hydrogen atom of an alkali-soluble group such as —COOH group and —OH group is substituted by a group capable of leaving by the action of an acid.

Examples of the group capable of leaving by the action of an acid include —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

Ar represents an aryl group.

The repeating unit (B) is preferably, for example, a repeating unit represented by the following formula (I):

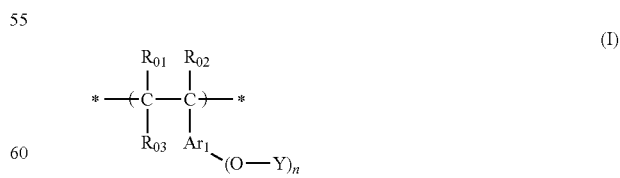

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an (n+1)-valent aromatic ring group, each of n Ys independently represents a hydrogen atom or a group capable of leaving by the action of an acid, provided that at least one Y represents a group capable of leaving by the action of and acid, and n represents an integer of 1 to 4 and is preferably 1 or 2, more preferably 1.

The alkyl group of $R_{01}$ to $R_{03}$ in the formula may have a substituent and is preferably, for example, an alkyl group having a carbon number of 20 or less, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less.

As for the alkyl group contained in the alkoxycarbonyl group, the same as those for the alkyl group in $R_{01}$ to $R_{03}$ are preferred.

The cycloalkyl group includes a cycloalkyl group which may be either monocyclic or polycyclic and may have a substituent. A monocyclic cycloalkyl group having a carbon number of 3 to 8 which may have a substituent, such as cyclopropyl group, cyclopentyl group and cyclohexyl group, is preferred.

The halogen atom includes a fluorine atom, a chlorine atom, a bromine atom and an iodine atom and is preferably a fluorine atom.

In the case where $R_{03}$ represents an alkylene group, the alkylene group is preferably an alkylene group having a carbon number of 1 to 8, such as methylene group, ethylene group, propylene group, butylene group, hexylene group and octylene group.

The aromatic ring group of $Ar_1$ is preferably an aromatic ring group having a carbon number of 6 to 14 which may have a substituent, and specific examples thereof include a benzene ring, a toluene ring and a naphthalene ring.

Each of n Ys independently represents a hydrogen atom or a group capable of leaving by the action of an acid, provided that at least one of n Ys represents a group capable of leaving by the action of and acid.

Examples of the group Y capable of leaving by the action of an acid include —$C(R_{36})(R_{37})(R_{38})$, —$C(=O)$—O—$C(R_{36})(R_{37})(R_{38})$, —$C(R_{01})(R_{02})(OR_{39})$, —$C(R_{01})(R_{02})$—C(=O)—O—$C(R_{36})(R_{37})(R_{38})$ and —$CH(R_{36})(Ar)$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be either monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl, a norbornyl group, an isobornyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted by a heteroatom such as oxygen atom.

The aryl group of $R_{36}$ to $R_{39}$, $R_{01}$, $R_{02}$ and Ar is preferably an aryl group having a carbon number of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ with each other may be either monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of carbon atoms in the cycloalkane may be substituted by a heteroatom such as oxygen atom.

Each of the groups as $R_{36}$ to $R_{39}$, $R_{01}$, $R_{02}$, $R_{03}$, Ar and $Ar_1$ may have a substituent, and examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group. The carbon number of the substituent is preferably 8 or less.

The group Y capable of leaving by the action of an acid is more preferably a structure represented by the following formula (II):

wherein each of $L_1$ and $L_2$ independently represents a hydrogen atom, an alkyl group, a cycloalkyl group, an aryl group or an aralkyl group, M represents a single bond or a divalent linking group, Q represents an alkyl group, a cycloalkyl group, an alicyclic group that may contain a heteroatom, an aromatic ring group that may contain a heteroatom, an amino group, an ammonium group, a mercapto group, a cyano group or an aldehyde group, and at least two members of Q, M and $L_1$ may combine to form a 5- or 6-membered ring.

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group as $L_1$ and $L_2$ is, for example, an aryl group having a carbon number of 6 to 15, and specific preferred examples thereof include a phenyl group, a tolyl group, a naphthyl group and an anthryl group.

The aralkyl group as $L_1$ and $L_2$ is, for example, an aralkyl group having a carbon number of 6 to 20, and examples thereof include a benzyl group and a phenethyl group.

Examples of the divalent organic linking group as M include an alkylene group (e.g., methylene, ethylene, propylene, butylene, hexylene, octylene), a cycloalkylene group (e.g., cyclopentylene, cyclohexylene), an alkenylene group (e.g., ethylene, propenylene, butenylene), an arylene group (e.g., phenylene, tolylene, naphthylene), —S—, —O—, —CO—, —SO$_2$—, —N(R$_0$)—, and a divalent linking group formed by combining a plurality of these groups. $R_0$ represents a hydrogen atom or an alkyl group (for example, an alkyl group having a carbon number of 1 to 8, specifically, a methyl group, an ethyl group, a propyl group, an n-butyl group, a sec-butyl group, a hexyl group or an octyl group). The total carbon number of the divalent organic linking group is preferably from 1 to 20, more preferably from 1 to 15, still more preferably from 2 to 10.

Examples of the alkyl group and cycloalkyl group as Q are the same as those of the alkyl group and cycloalkyl group of $L_1$ and $L_2$.

Examples of the alicyclic group and aromatic ring group in the alicyclic group that may contain a heteroatom and the aromatic ring group that may contain a heteroatom, as Q, include a cycloalkyl group and an aryl group as $L_1$ and $L_2$, and the carbon number thereof is preferably from 3 to 15.

Examples of the heteroatom-containing alicyclic or aromatic ring group include a group having a heterocyclic structure, such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring structure is not limited thereto and may be sufficient if it is a structure generally called a heterocyclic ring (a ring composed of carbon and heteroatom or a ring composed of heteroatom).

As for the 5- or 6-membered ring that may be formed by combining at least two members out of Q, M and $L_1$, there is included a case where at least two members of Q, M and $L_1$ combine to form, for example, a propylene group or a butylene group, thereby forming a 5- or 6-membered ring containing an oxygen atom.

Each of the groups represented by $L_1$, $L_2$, M and Q in formula (II) may have a substituent, and examples of the substituent include those described above for the substituent which $R_{36}$ to $R_{39}$, $R_{01}$, $R_{02}$, $R_{03}$, Ar and Ar$_1$ may have. The carbon number of the substituent is preferably 8 or less.

The group represented by -M-Q is preferably a group composed of 1 to 30 carbons, more preferably a group composed of 5 to 20 carbons.

Specific examples of the repeating unit represented by formula (I) are set forth below, but the present invention is not limited thereto.

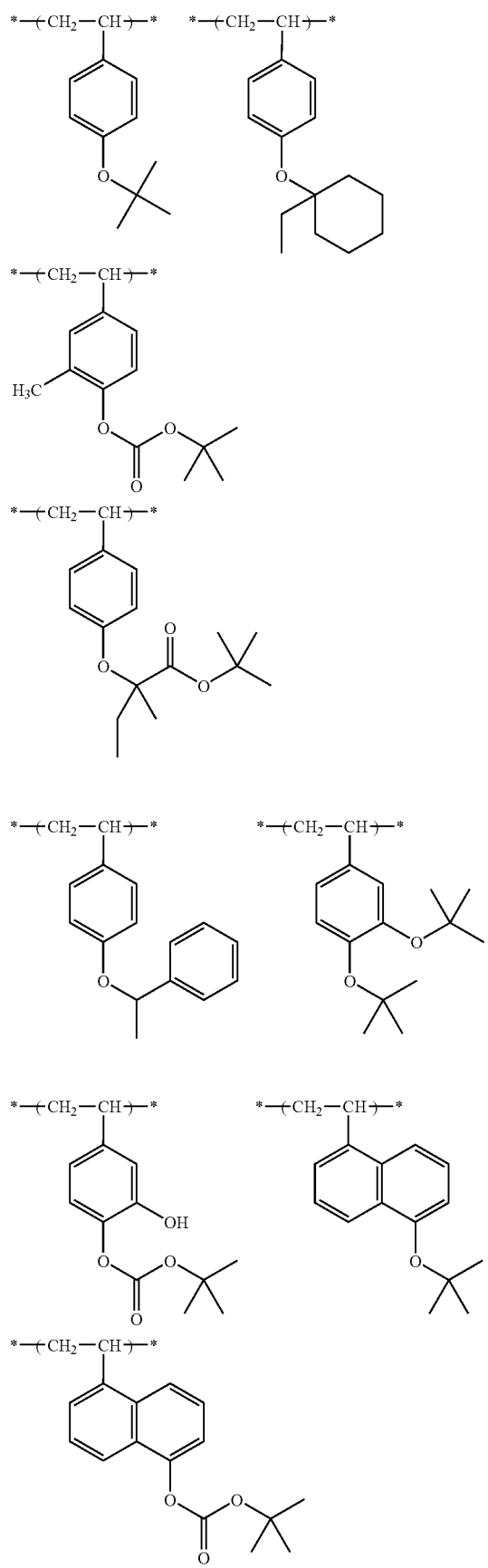

65
-continued
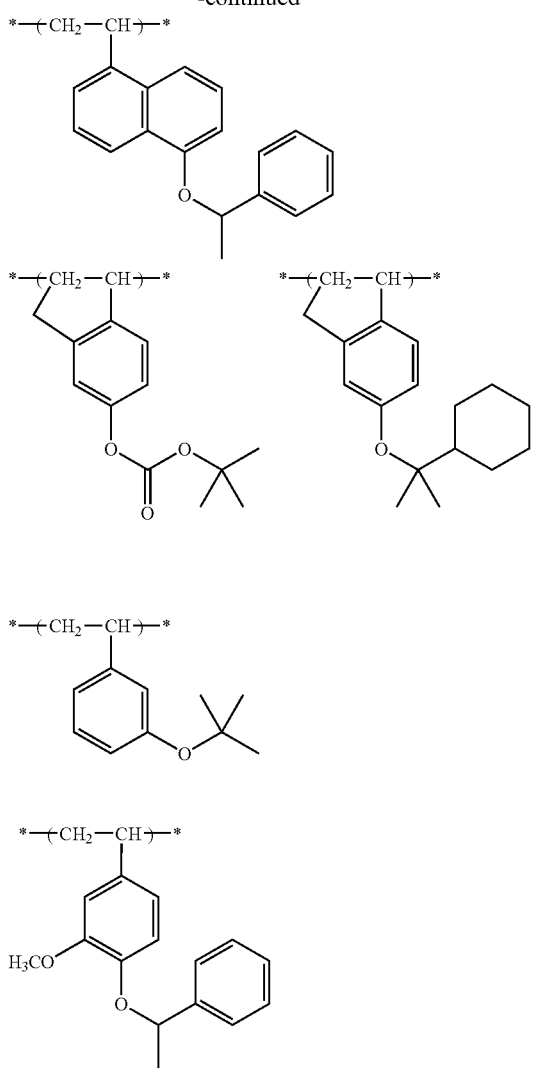
66
-continued
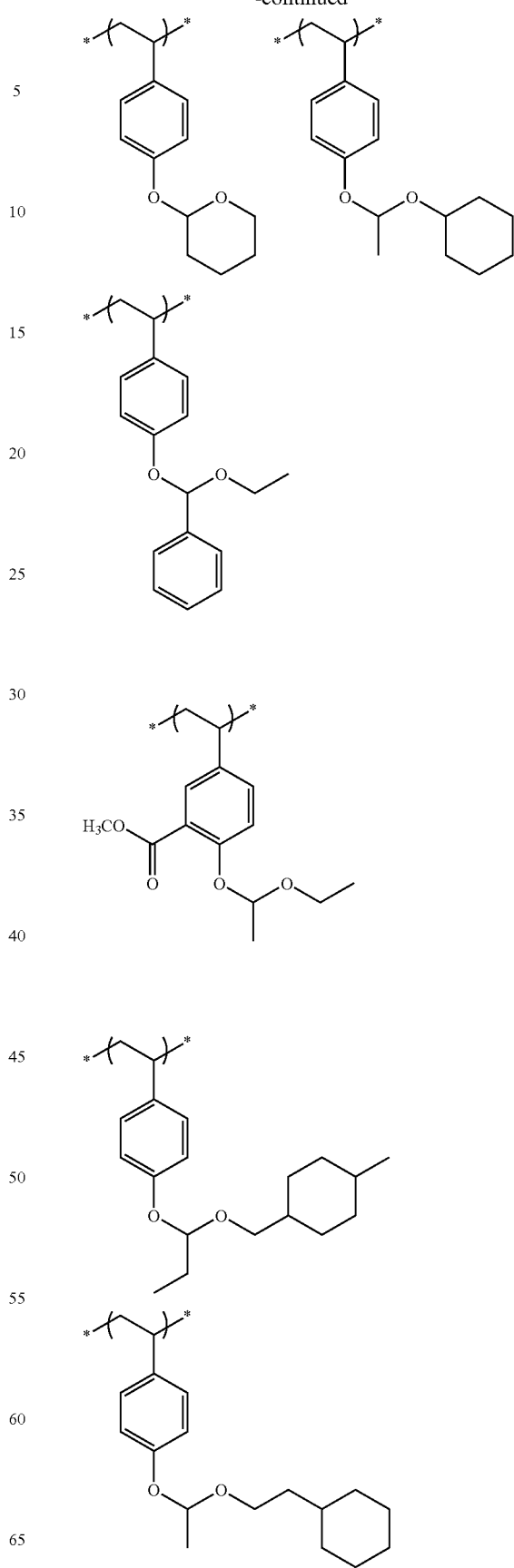

67
-continued
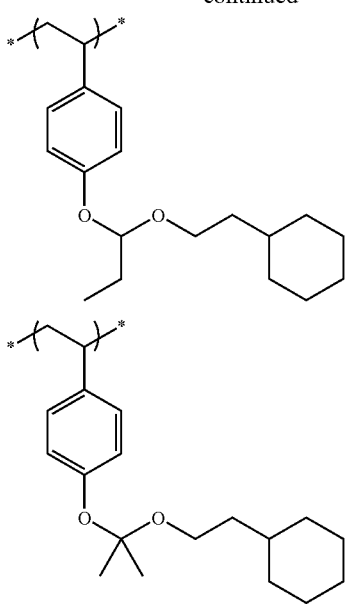
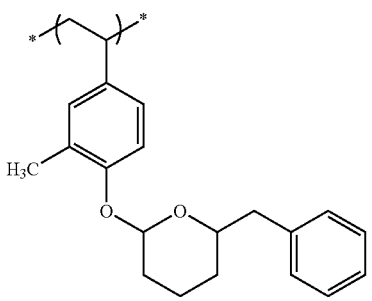
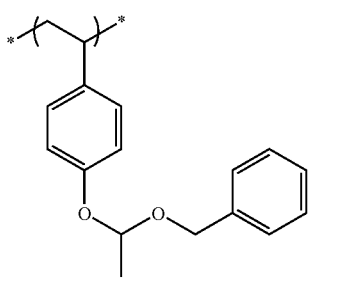
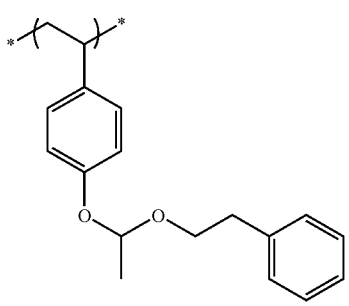
68
-continued
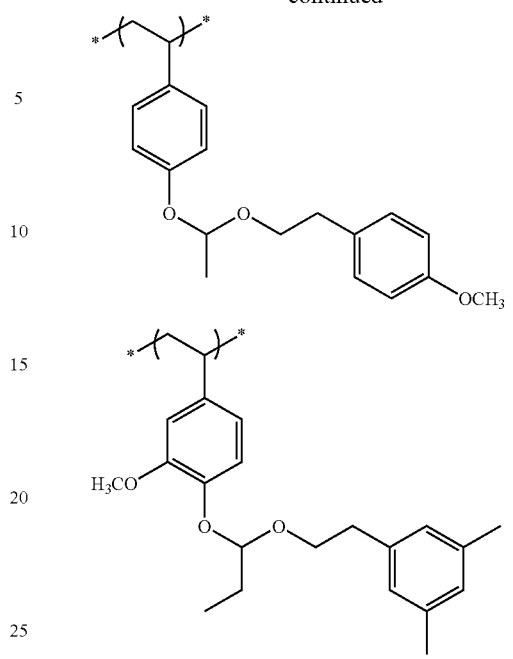
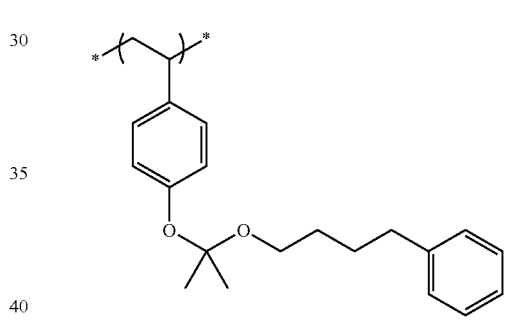
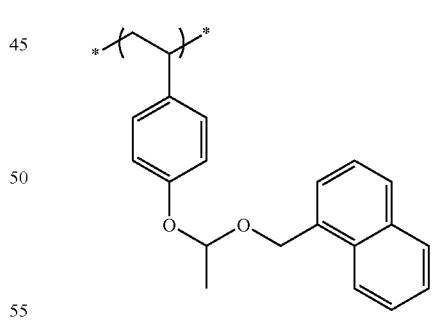
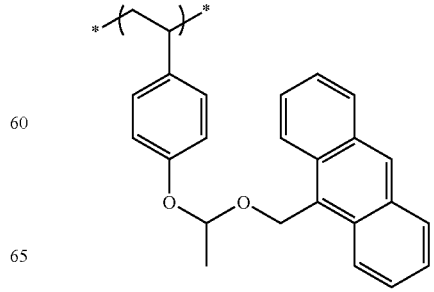

69
-continued
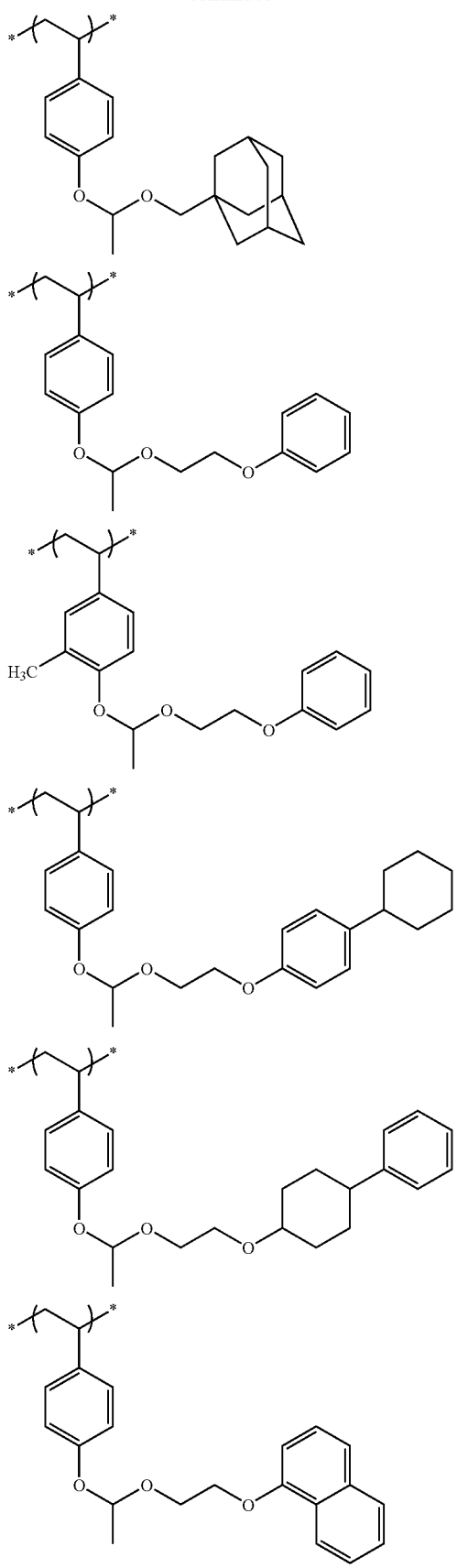
70
-continued
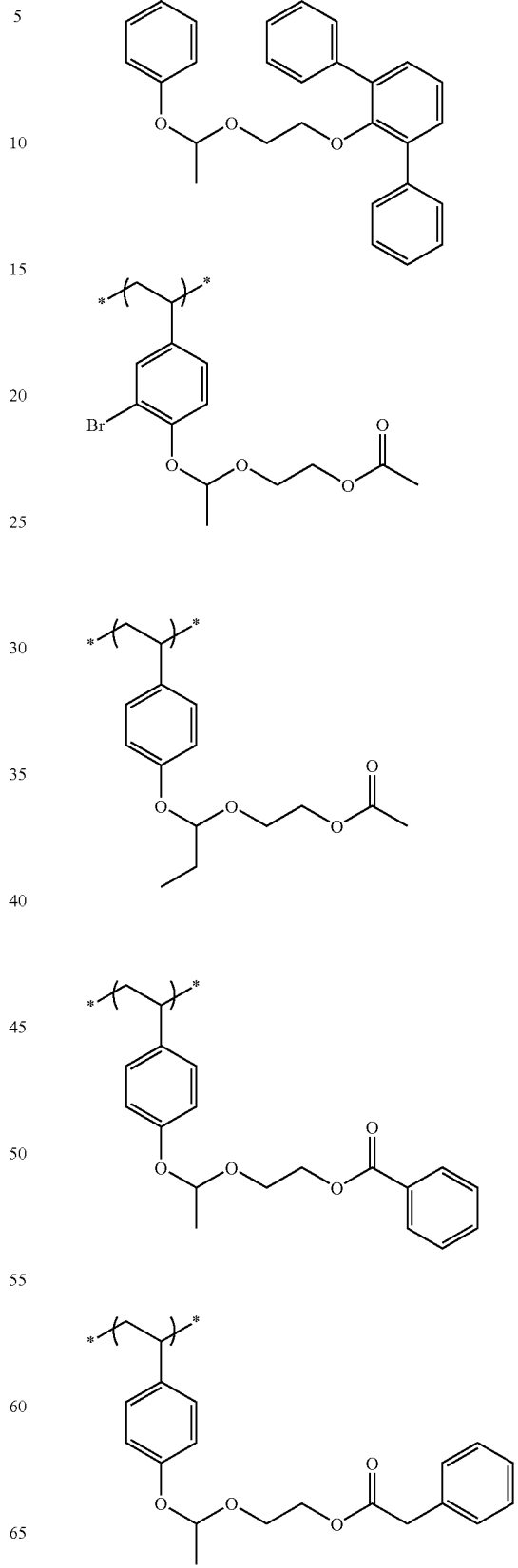

71
-continued
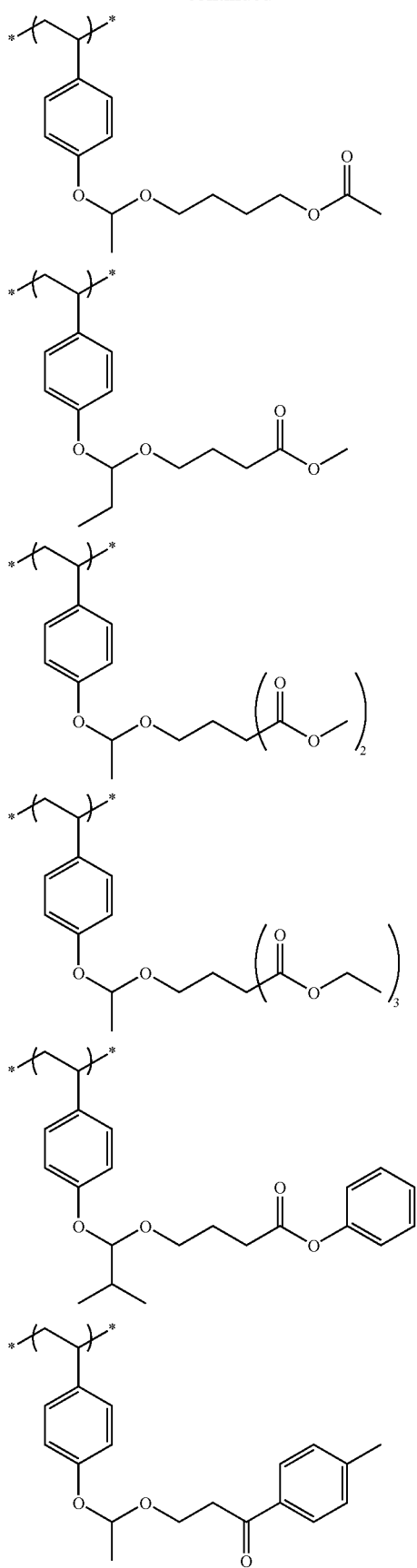
72
-continued
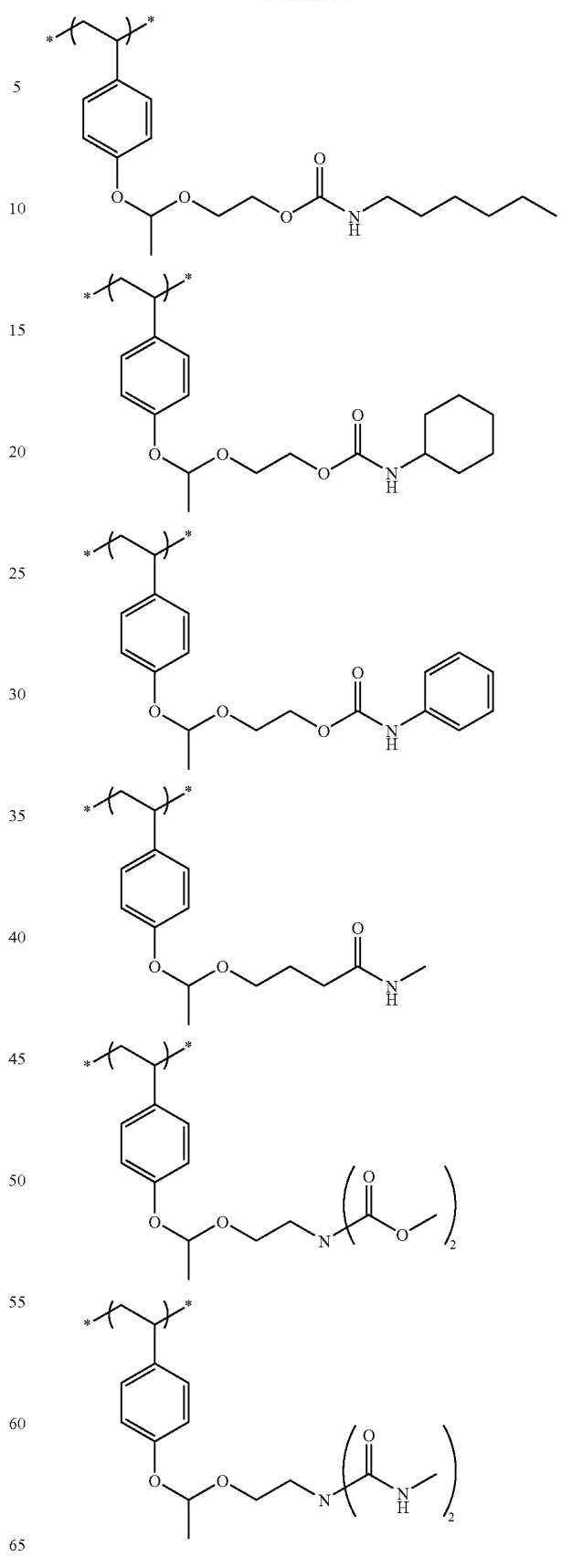

73
-continued
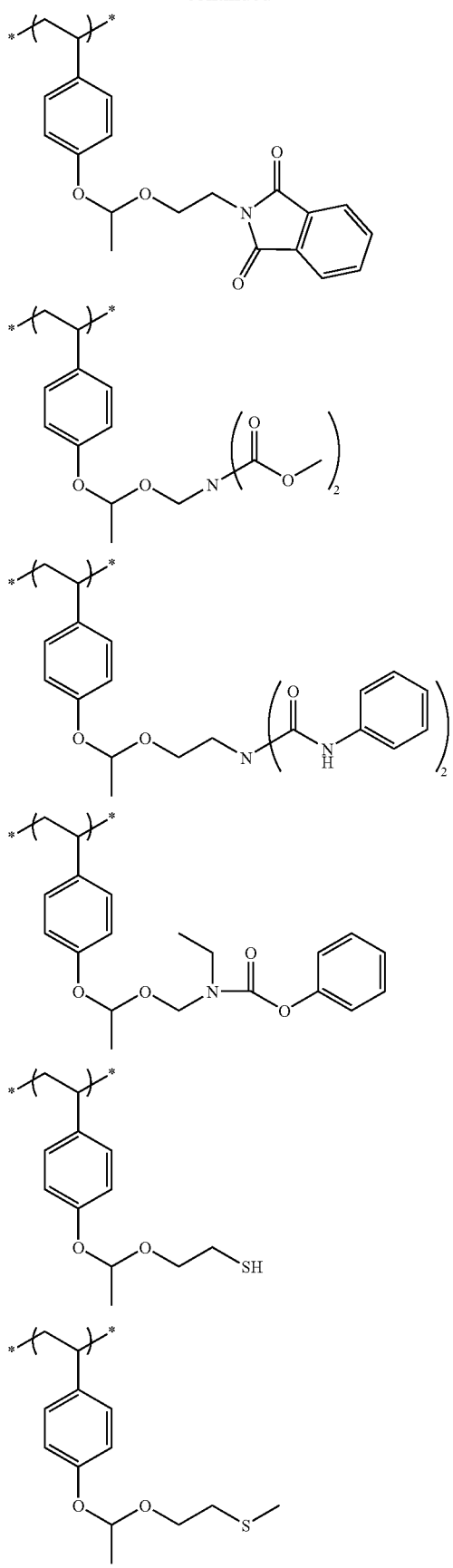
74
-continued
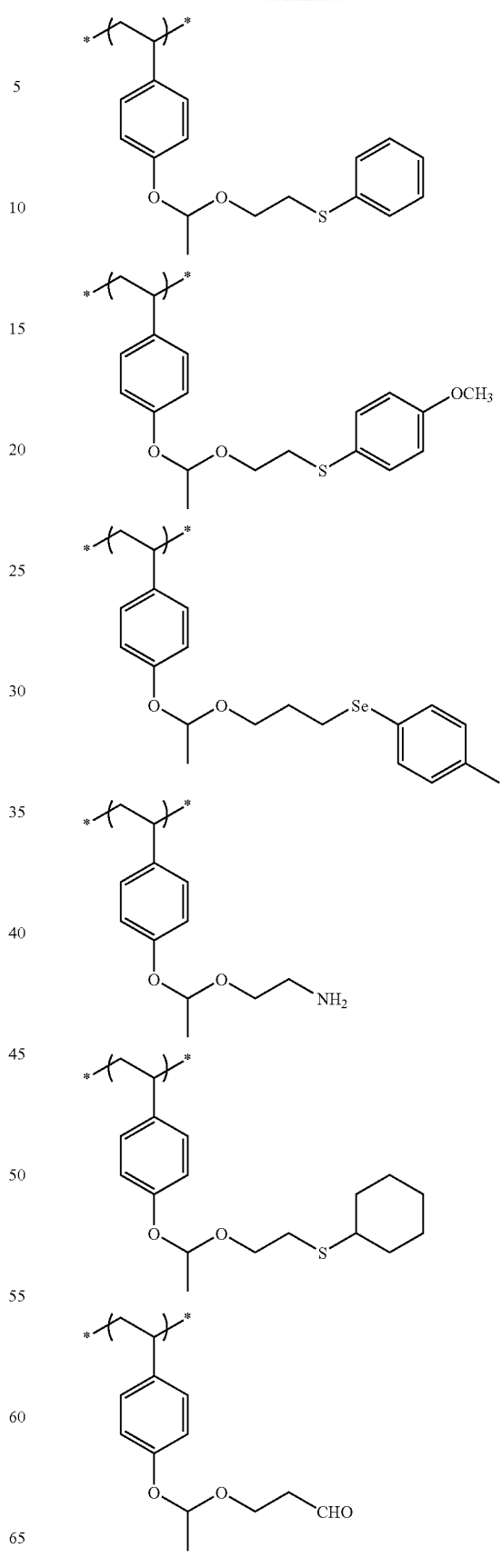

75
-continued
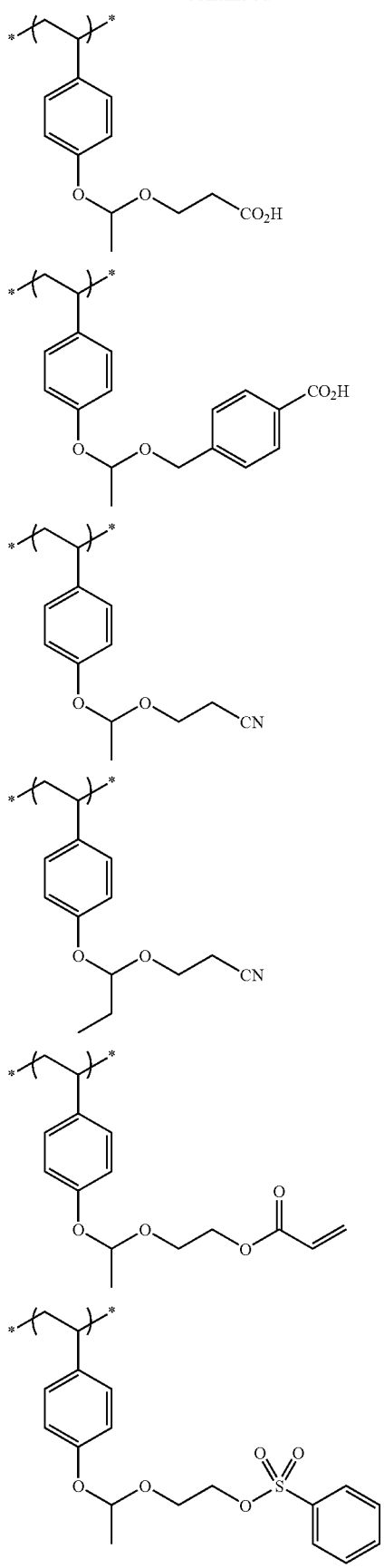
76
-continued
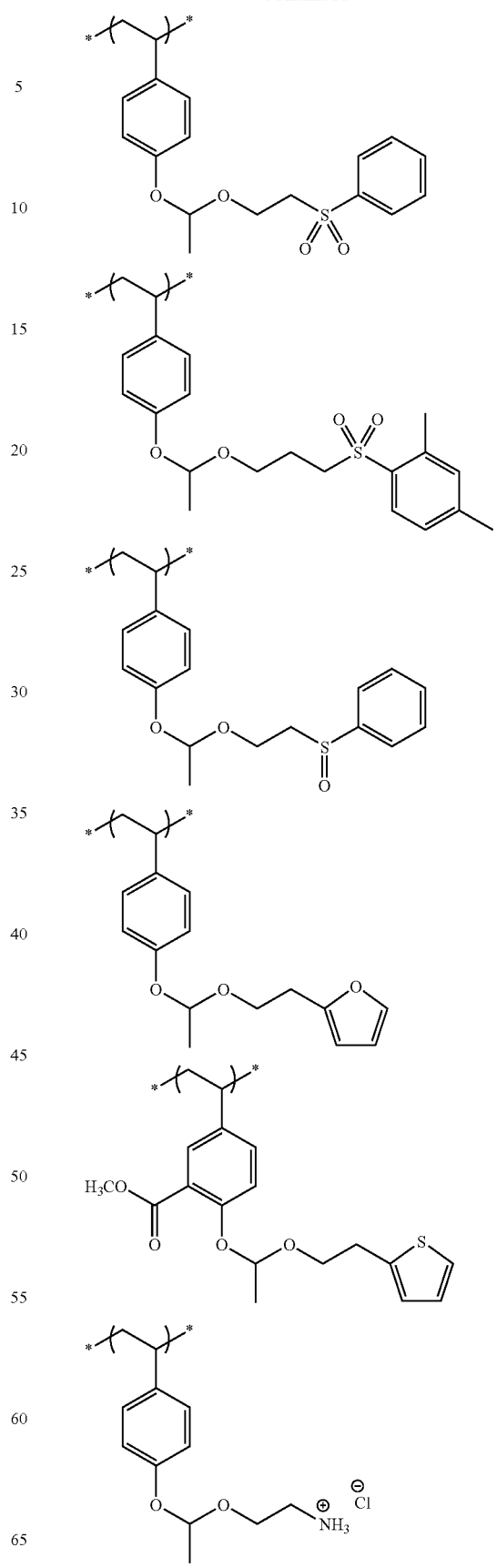

77
-continued
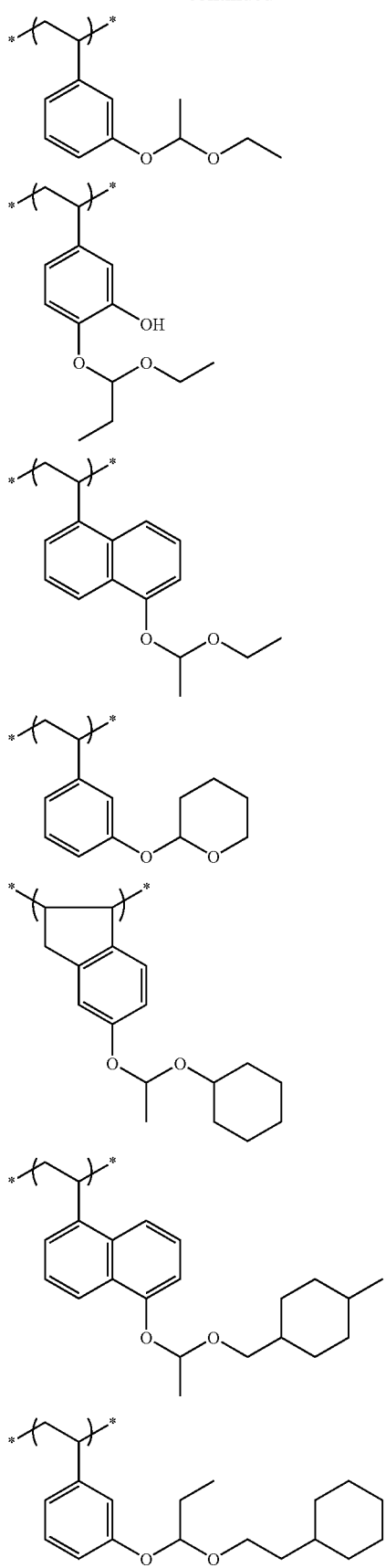
78
-continued
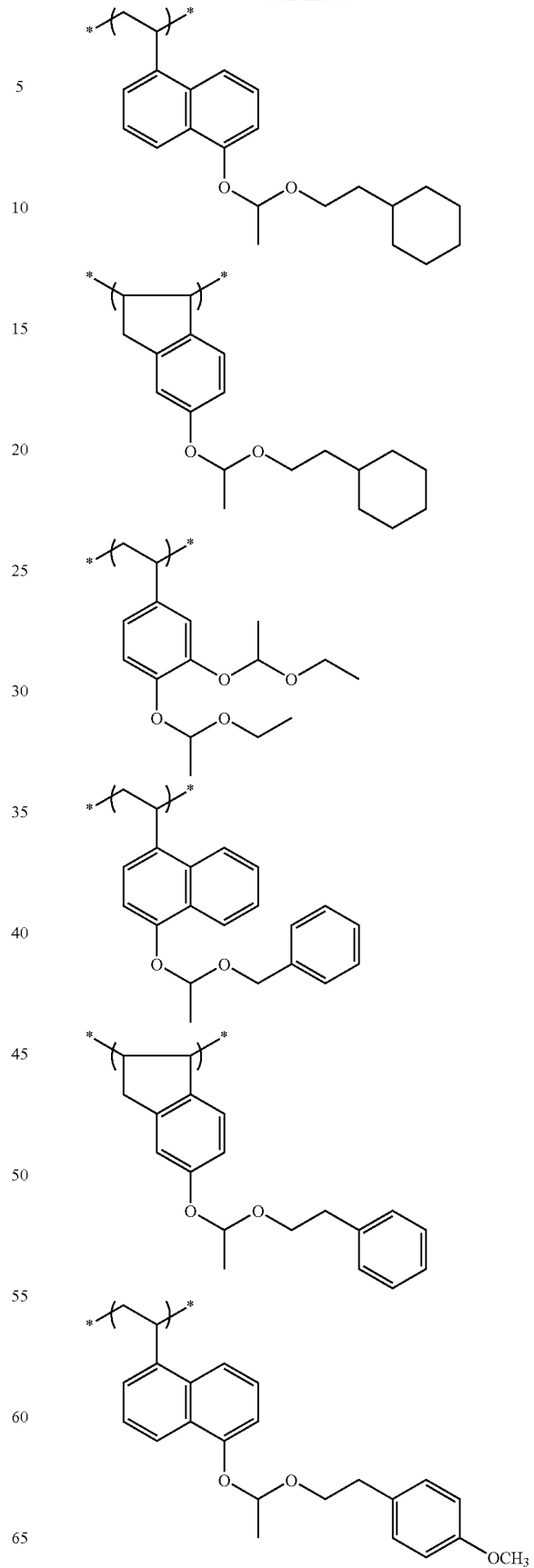

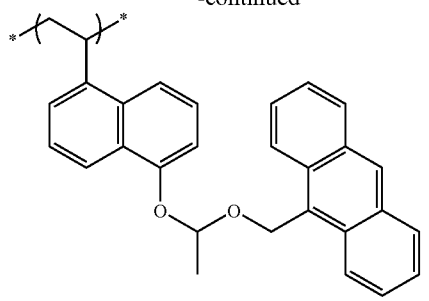
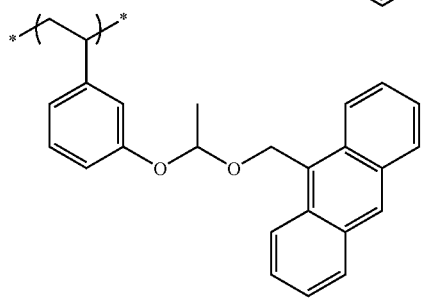
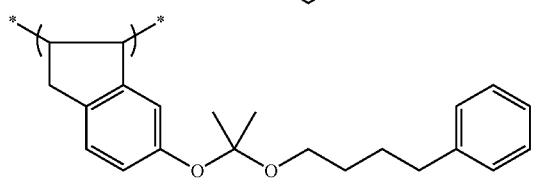
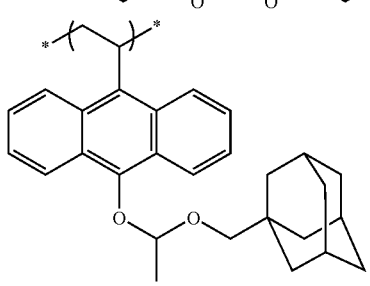
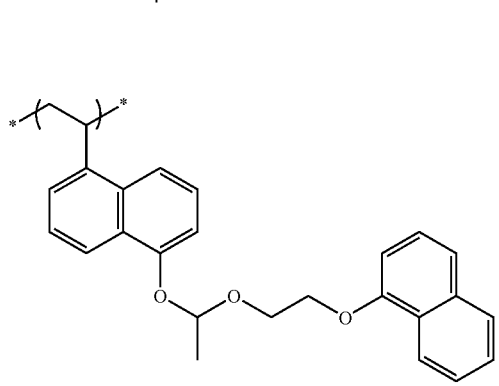
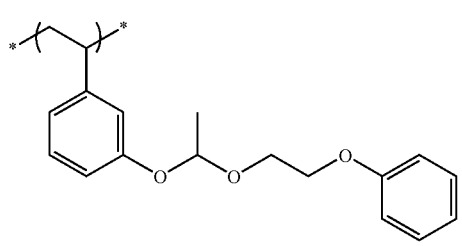
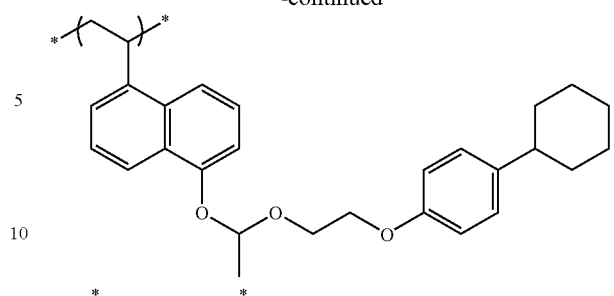
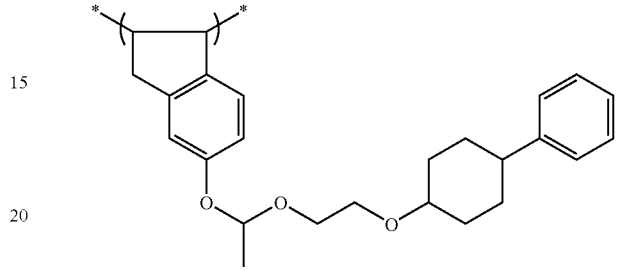
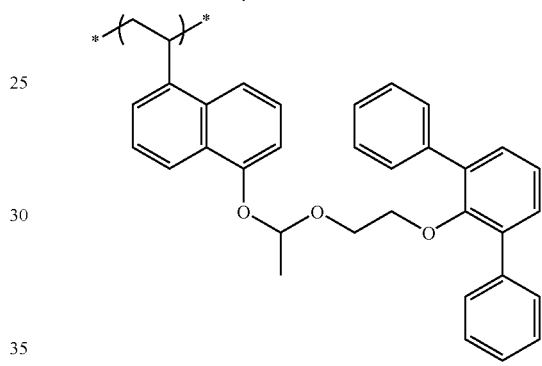
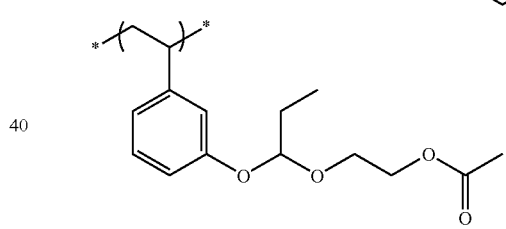
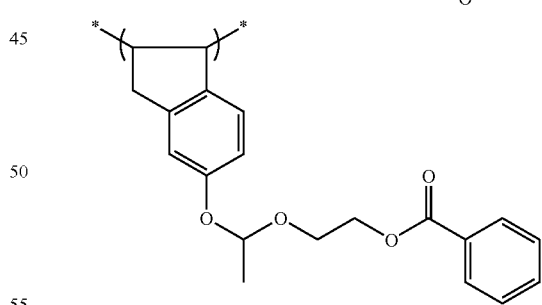
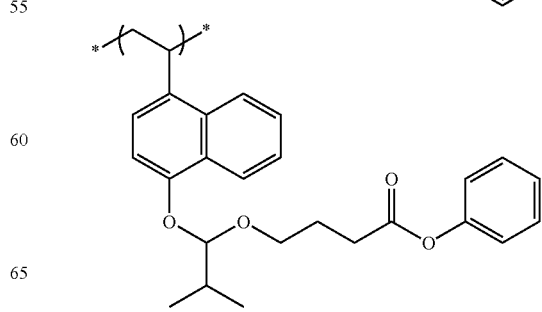

-continued

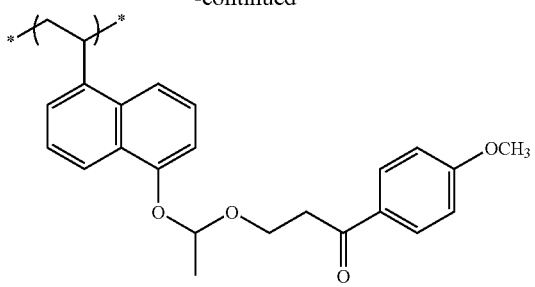

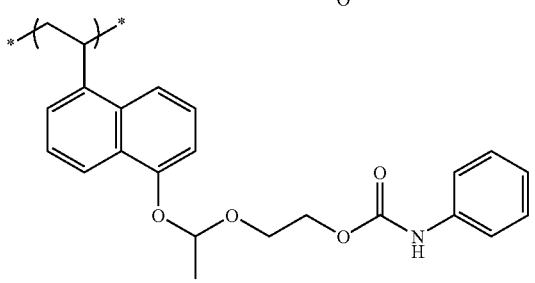

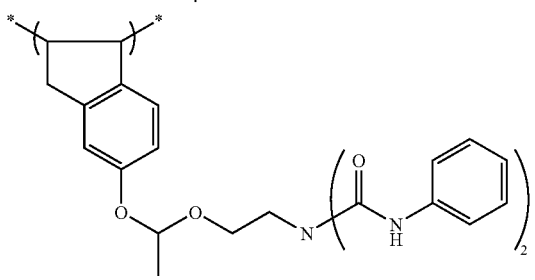

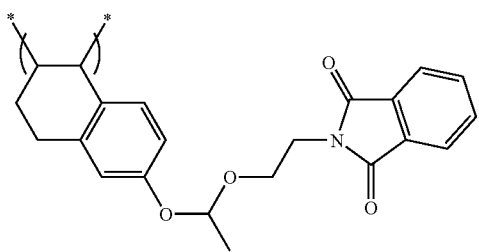

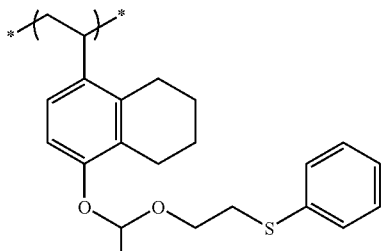

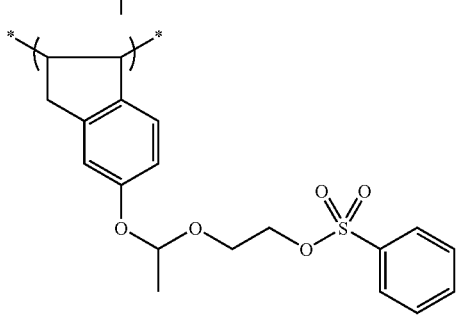

As for the repeating unit (B), a repeating unit represented by the following formula (X) is also applicable.

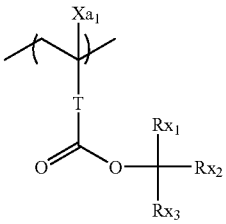

(X)

In formula (X), $Xa_1$ represents a hydrogen atom, a methyl group, a trifluoromethyl group or a hydroxymethyl group.

T represents a single bond or a divalent linking group.

Each of $Rx_1$ to $Rx_3$ independently represents a hydrogen atom, an alkyl group (linear or branched), a cycloalkyl group (monocyclic or polycyclic) or a monovalent aromatic ring group.

Two members out of $Rx_1$ to $Rx_3$ may combine to form a cycloalkyl group (monocyclic or polycyclic). However, it does not occur that two or more of $Rx_1$ to $Rx_3$ are a hydrogen atom at the same time.

Examples of the divalent linking group of T include an alkylene group, a —COO-Rt- group, a —O-Rt- group, a divalent aromatic ring group, and a group formed by combining two or more of these groups, wherein Rt represents an alkylene group, a cycloalkylene group, a divalent aromatic ring group, or a group formed by combining an alkylene group and a divalent aromatic ring group. The total carbon number of the divalent linking group of T is preferably from 1 to 20, more preferably from 1 to 15, still more preferably from 2 to 10.

The alkylene group of T and Rt may be linear or branched, and preferred examples thereof include an alkylene group having a carbon number of 1 to 8, such as methylene group, ethylene group, propylene group, butylene group, hexylene group and octylene group. An alkylene group having a carbon number of 1 to 5 is more preferred.

The cycloalkylene group of Rt may be either monocyclic or polycyclic, and preferred examples thereof include a cycloalkylene group having a carbon number of 3 to 17, such as cyclobutylene, cyclopentylene, cyclohexylene, norbornanylene, adamantylene and diamantanylene.

Examples of the divalent aromatic ring group of T and Rt include an anylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole. An arylene group having a carbon number of 6 to 14, which may have a substituent, such as phenylene group and naphthylene group, is preferred.

T is preferably a single bond, a —COO-Rt- group or a divalent aromatic ring group. Rt is preferably an alkylene group having a carbon number of 1 to 5, more preferably a —$CH_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining at least two members out of Rx$_1$ to Rx$_3$ is preferably a cycloalkyl group having a carbon number of 3 to 20 and is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The monovalent aromatic ring group of Rx$_1$ to Rx$_3$ is preferably a monovalent aromatic ring group having a carbon number of 6 to 20, and examples thereof include a phenyl group and a naphthyl group. In the case where one of Rx$_1$ to Rx$_3$ represents a hydrogen atom, at least either one of other groups is preferably a monovalent aromatic ring group.

An embodiment where Rx$_1$ is a methyl group or an ethyl group and Rx$_2$ and Rx$_3$ are combined to form the above-described cycloalkyl group, or an embodiment where each of Rx$_1$ and Rx$_2$ is independently a methyl group or an ethyl group and Rx$_3$ is the above-described cycloalkyl group, is preferred.

Specific examples of the repeating unit (B) are set forth below, but the present invention is not limited thereto.

(In formulae, Rx represents H, CH$_3$, CF$_3$ or CH$_2$OH, and each of Rxa and Rxb represents an alkyl group having a carbon number of 1 to 4.)

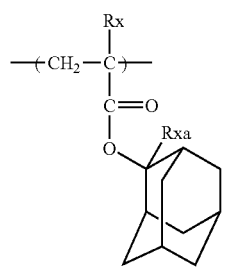

1

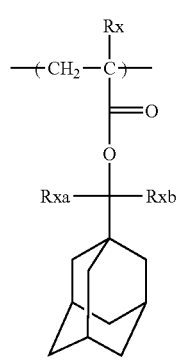

2

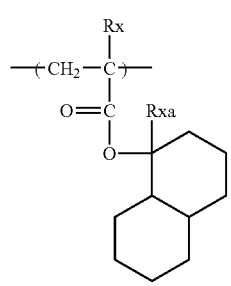

3

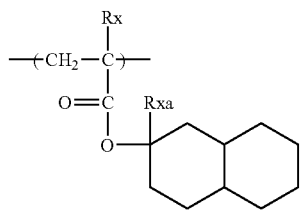

4

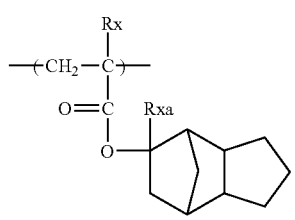

5

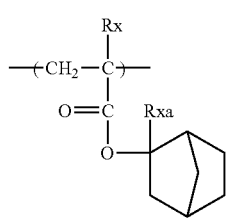

6

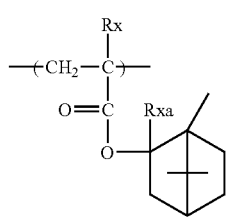

7

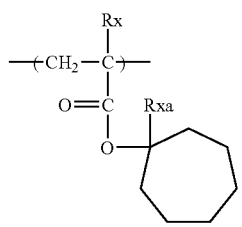

8

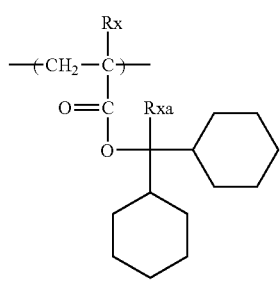

9

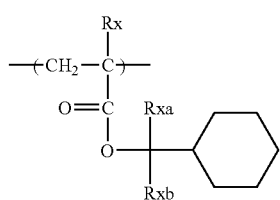

10

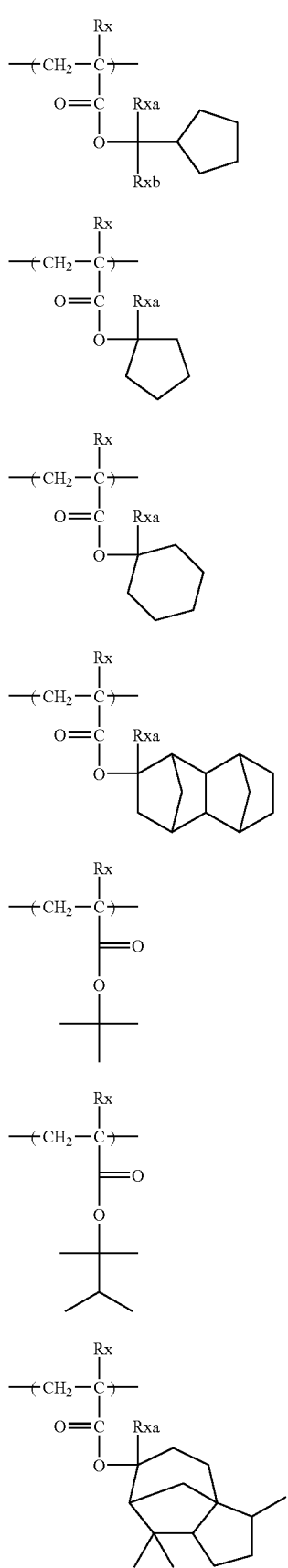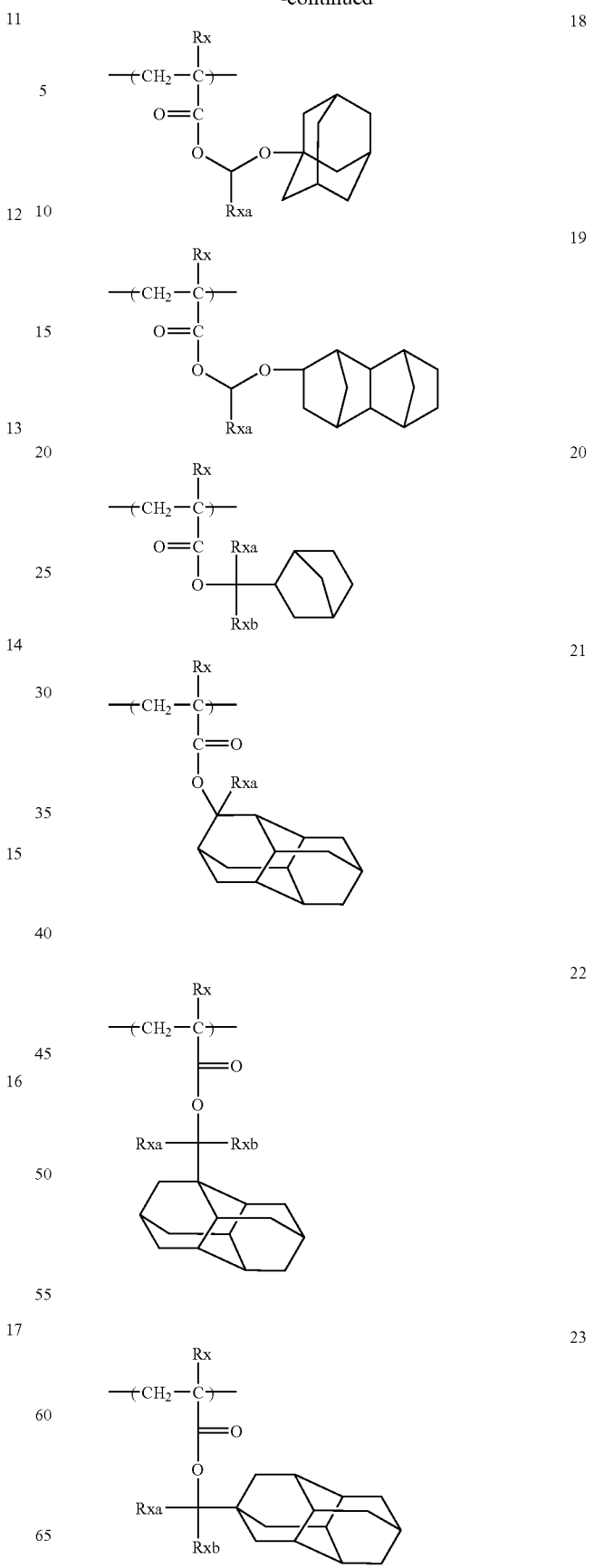

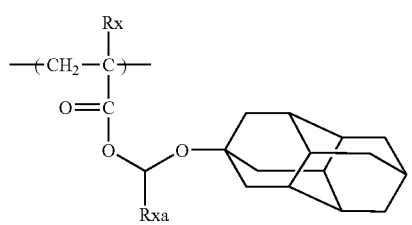
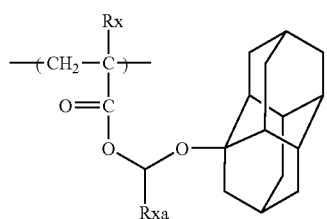
Furthermore, specific preferred examples of the repeating unit represented by formula (X) are set forth below.
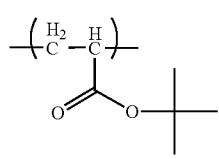
(V-1)
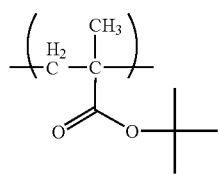
(V-2)
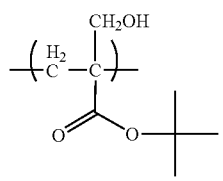
(V-3)
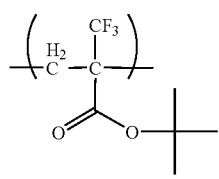
(V-4)
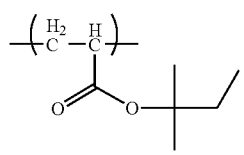
(V-5)
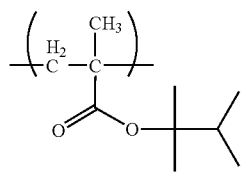
(V-6)
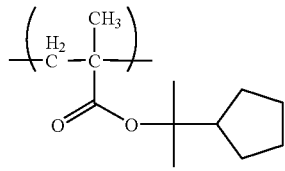
(V-7)
(V-8)
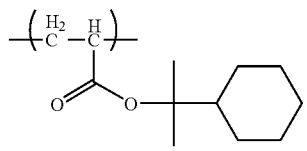
(V-9)
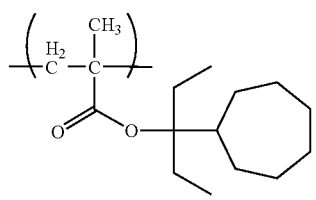
(V-10)
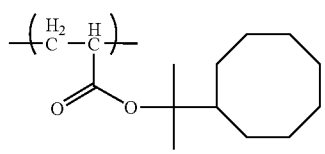
(V-11)
(V-12)
(V-13)
(V-14)

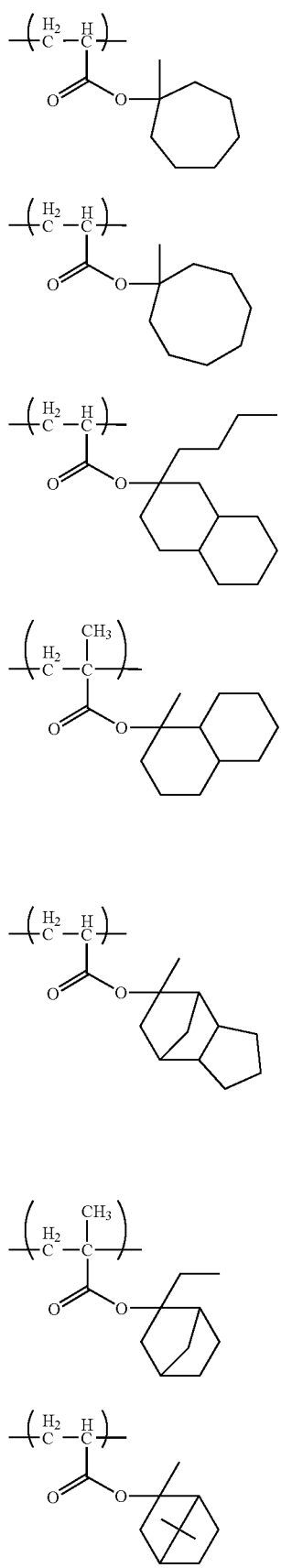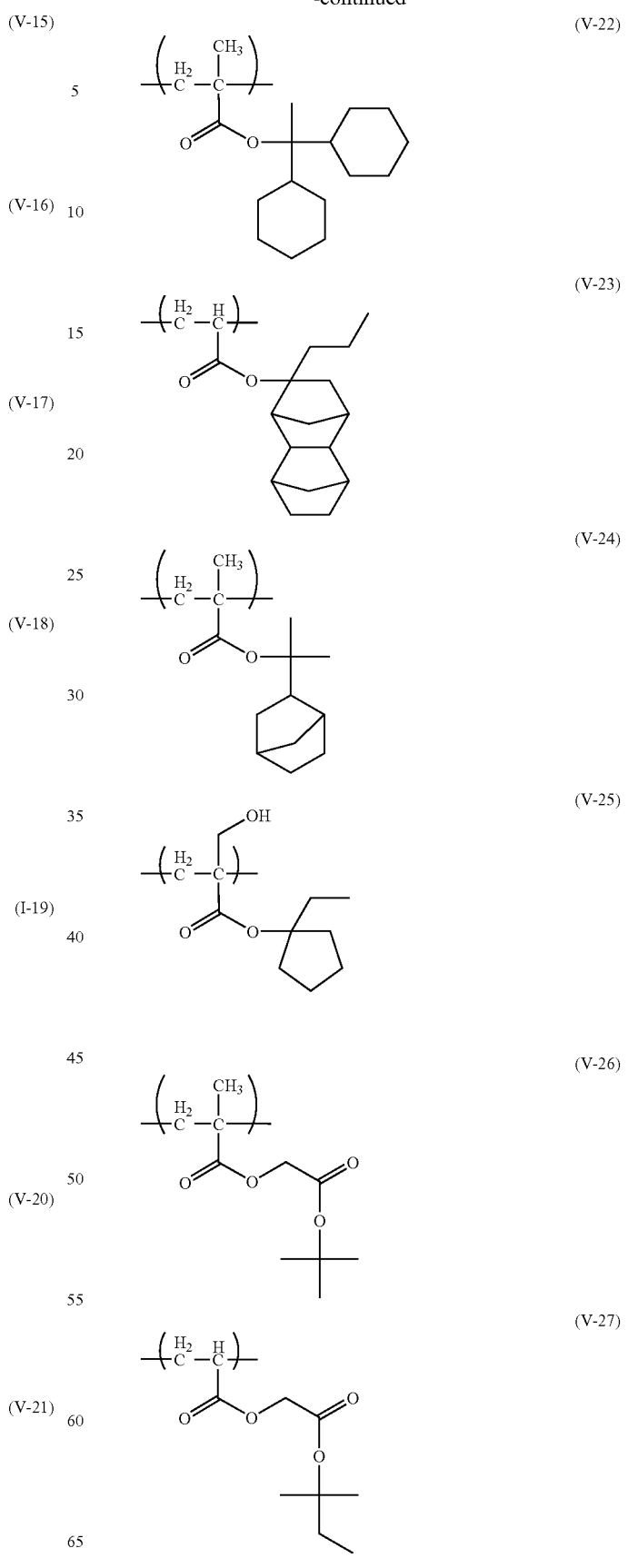

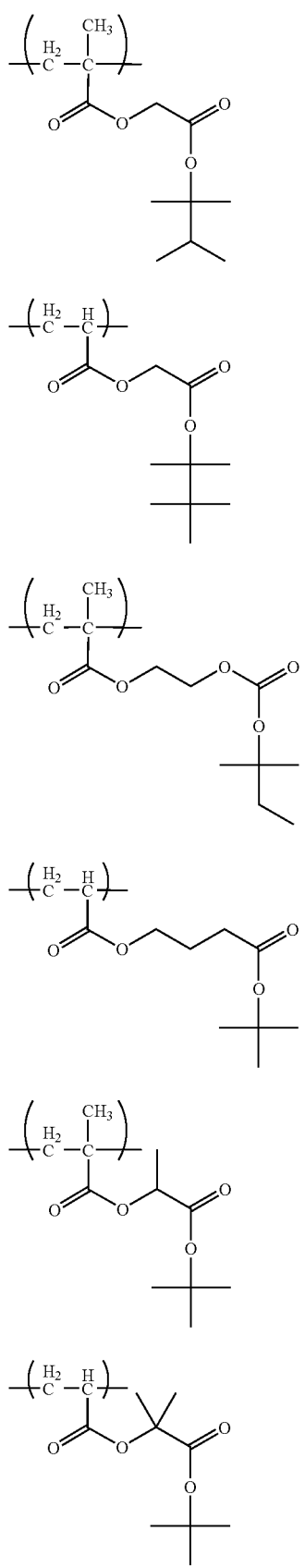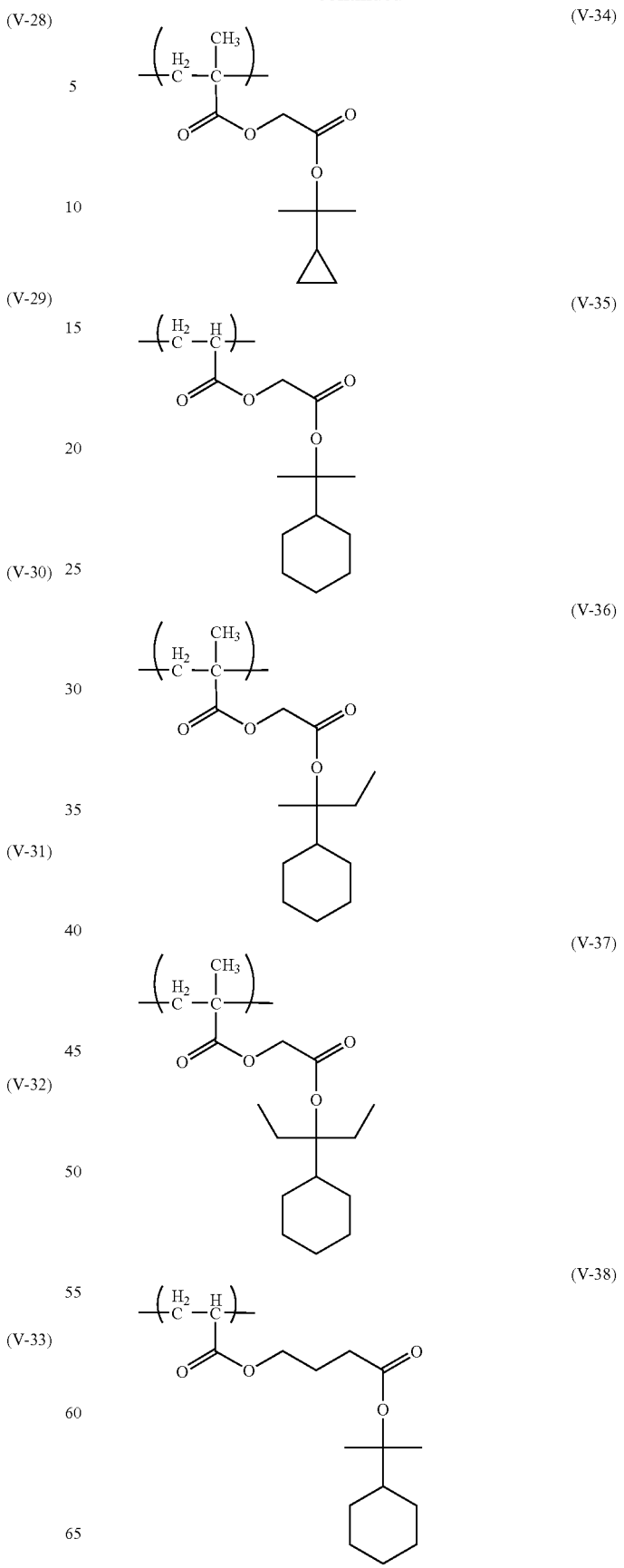

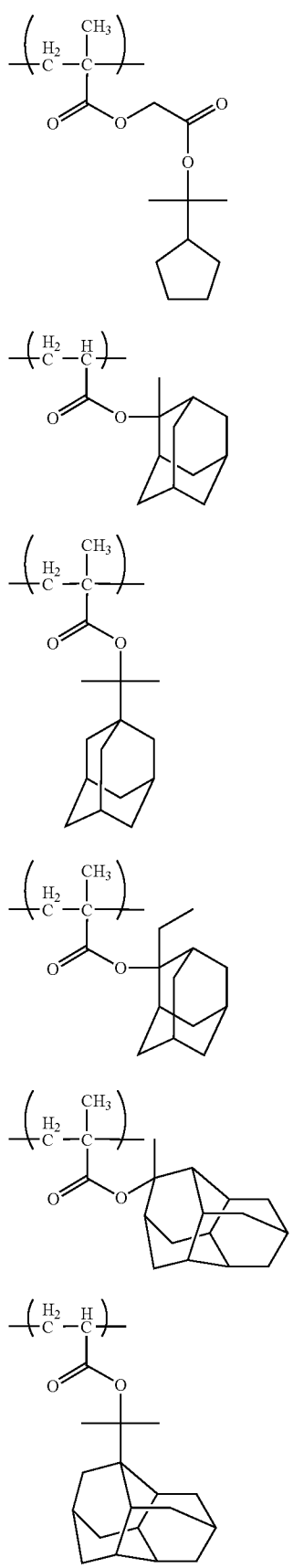
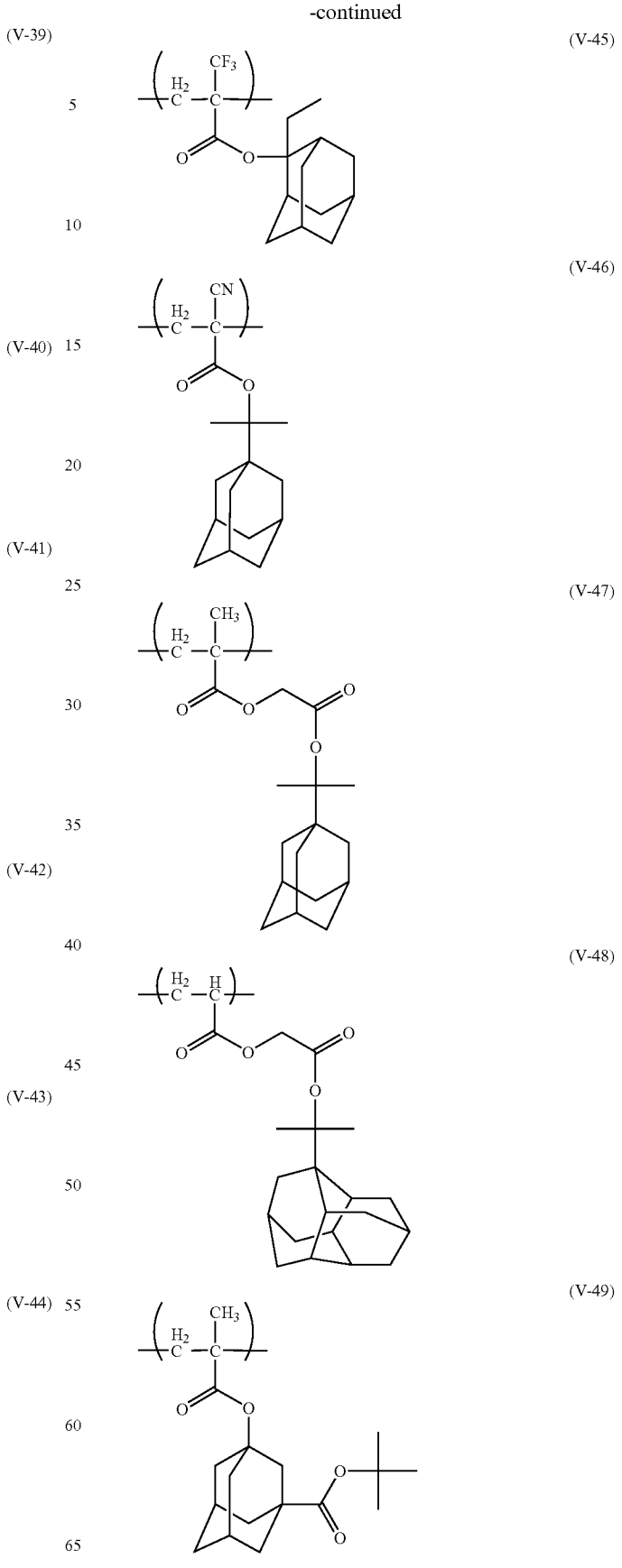

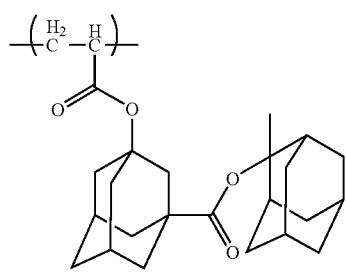
(V-50)
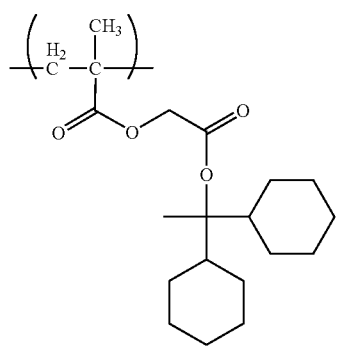
(V-51)
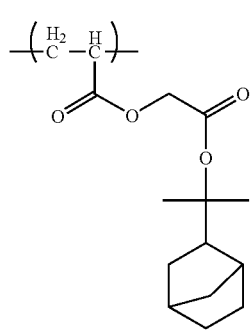
(V-52)
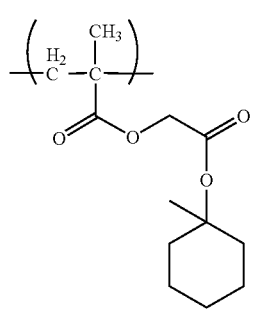
(V-53)
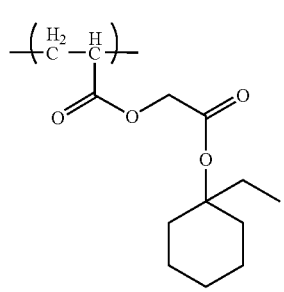
(V-54)
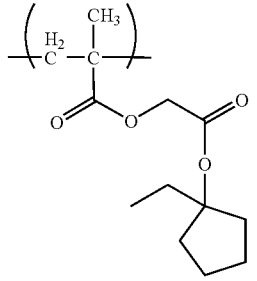
(V-55)
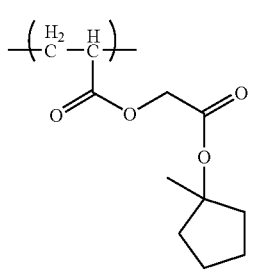
(V-56)
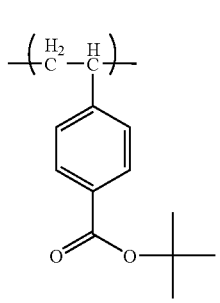
(V-57)
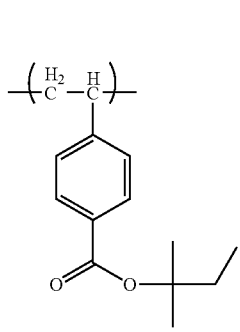
(V-58)
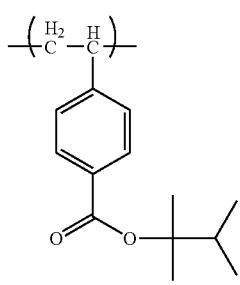
(V-59)

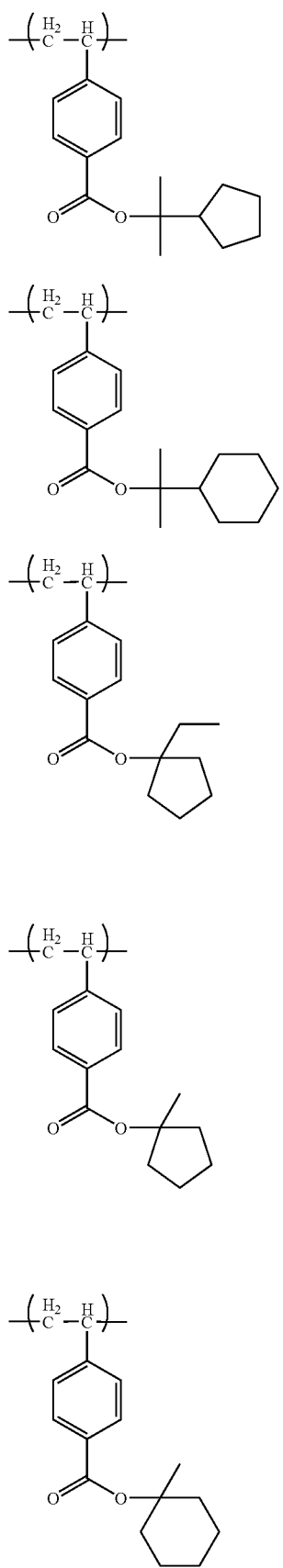
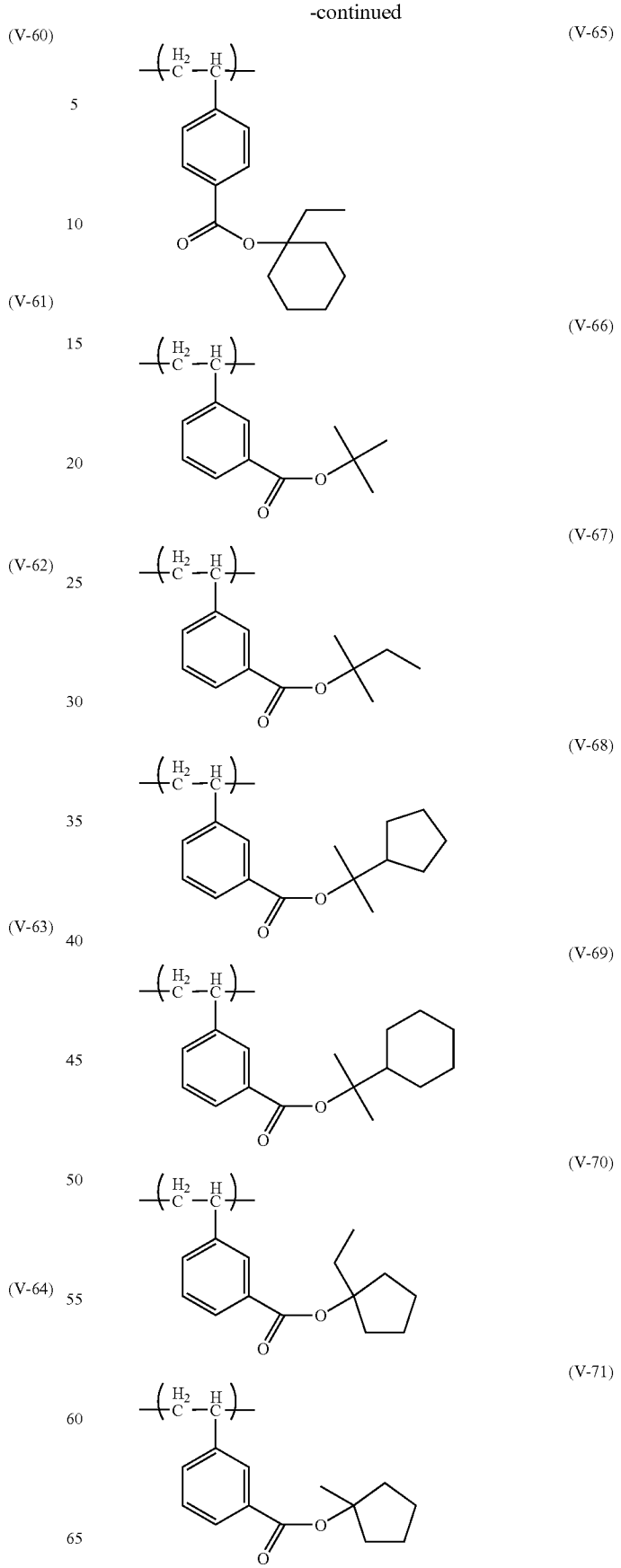

(V-72) (V-73) (V-74) (V-75) (V-76) (V-77) (V-78) (V-79) (V-80) (V-81)

-continued
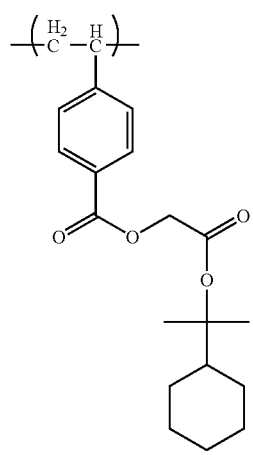
(V-82)
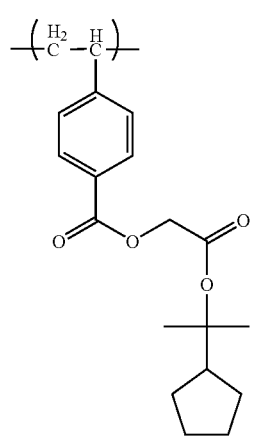
(V-83)
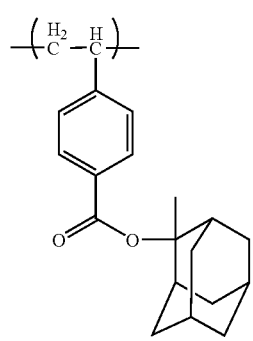
(V-84)
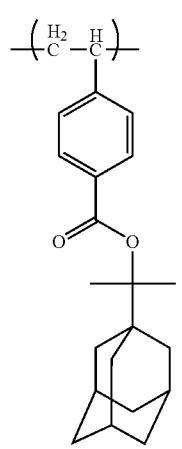
(V-85)
-continued
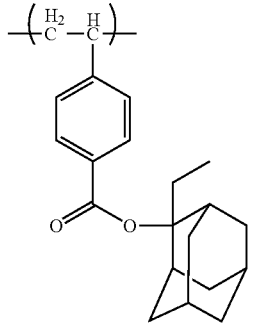
(V-86)
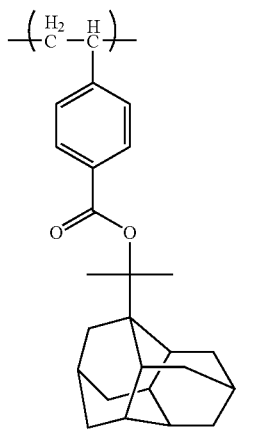
(V-87)
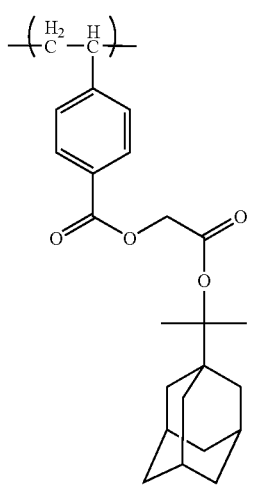
(V-88)
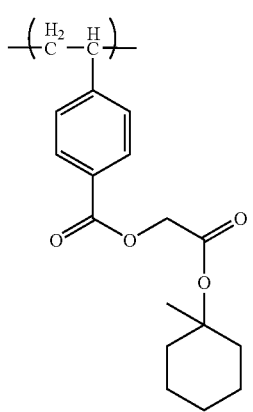
(V-89)

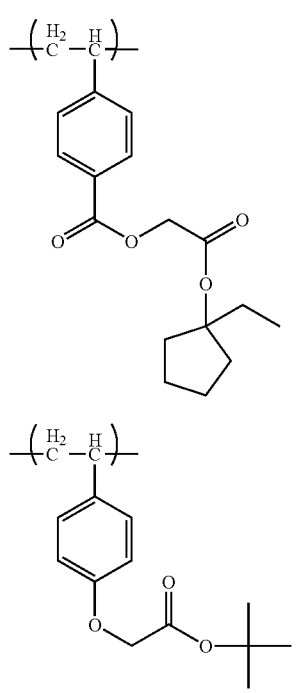
(V-90)
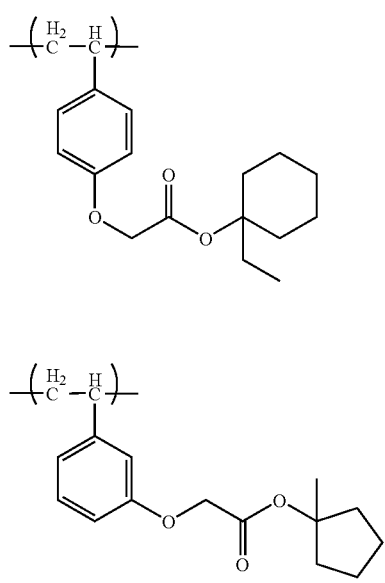
(V-91)
(V-92)
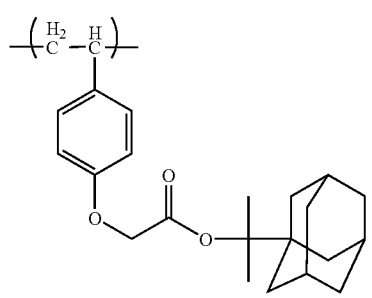
(V-93)
(V-94)
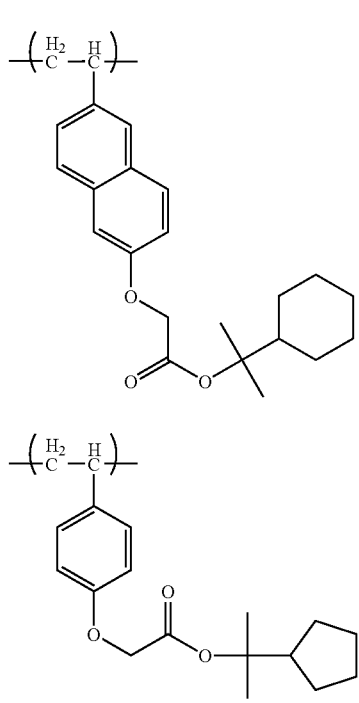
(V-95)
(V-96)
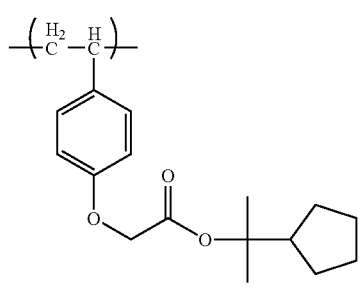
(V-97)
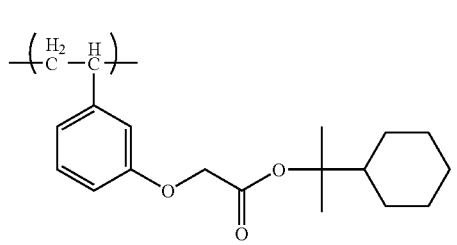
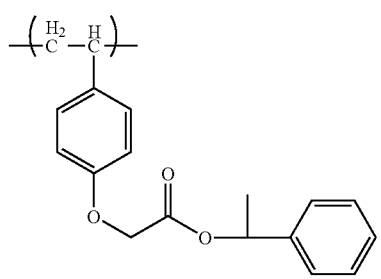
(V-98)
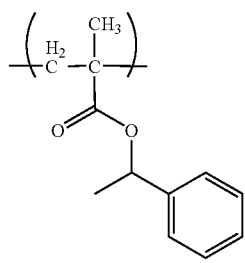
(V-99)

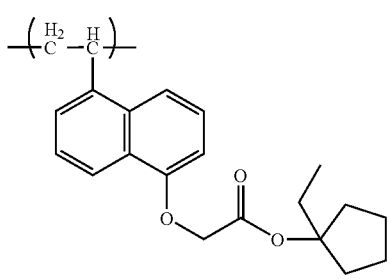

(V-100)

The content of the repeating unit (B) in the resin of the present invention is preferably from 3 to 90 mol %, more preferably from 5 to 80 mol %, still more preferably from 7 to 70 mol %, based on all repeating units.

The ratio of the repeating unit (A) to the repeating unit (B) in the resin (mole number of A/mole number of B) is preferably 0.04 to 1.0, more preferably from 0.05 to 0.9, still more preferably from 0.06 to 0.8.

(3) Repeating Unit (C)

The resin of the present invention preferably further contains (C) a repeating unit represented by the following formula (VI):

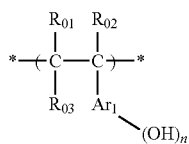

(VI)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, and n represents an integer of 1 to 4.

Specific examples of $R_{01}$, $R_{02}$, $R_{03}$ and $Ar_1$ in formula (VI) are the same as those for $R_{01}$, $R_{02}$, $R_{03}$ and $Ar_1$ in formula (I).

Specific examples of the repeating unit represented by formula (VI) are set forth below, but the present invention is not limited thereto.

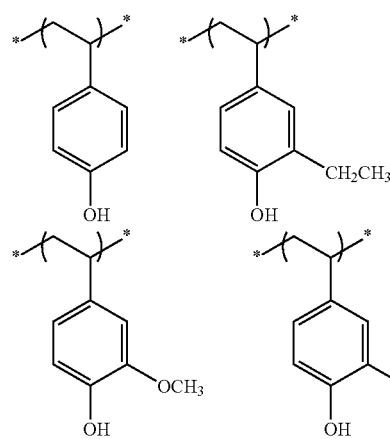

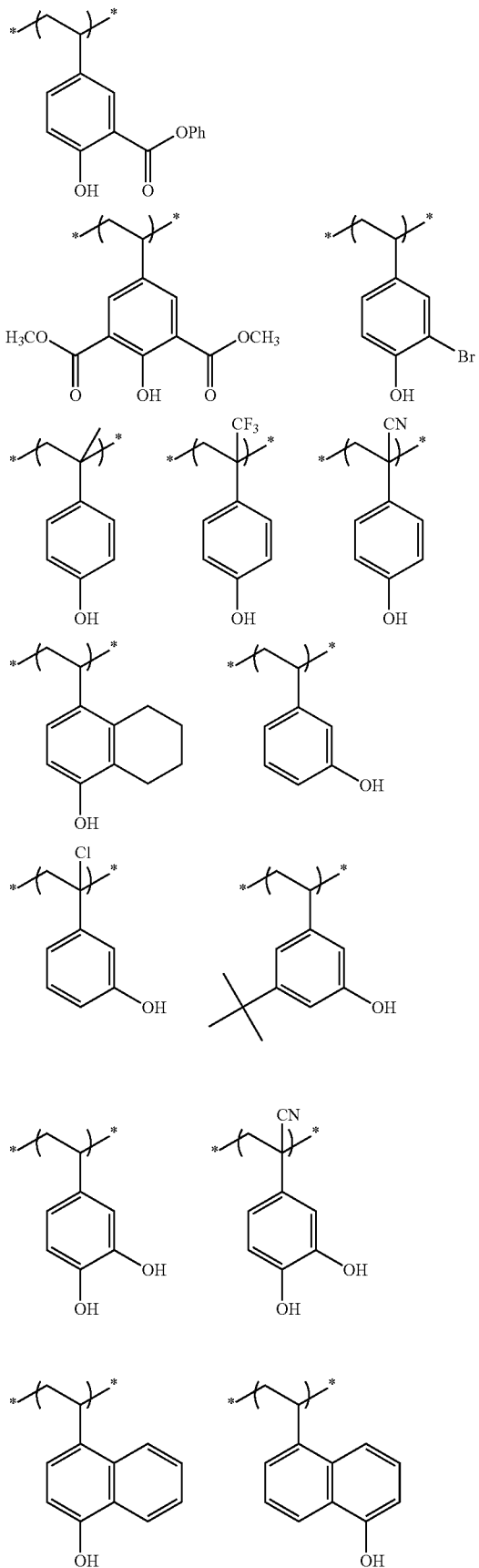

-continued

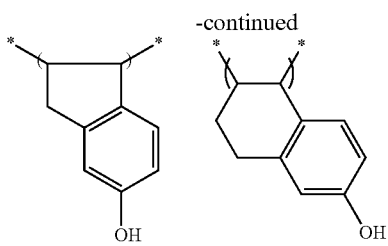

The content of the repeating unit (C) in the resin of the present invention is preferably from 3 to 90 mol %, more preferably from 5 to 80 mol %, still more preferably from 7 to 70 mol %, based on all repeating units.

(4) Form, Polymerization Method, Molecular Weight, Etc. of the Resin (P) of the Present Invention The form of the resin (P) may be any of random, block, comb and star forms.

The resin (P) of the present invention containing the repeating units (A) and (B) or the resin (P) of the present invention containing the repeating units (A), (B) and (C) can be synthesized, for example, by radical, cationic or anionic polymerization of unsaturated monomers corresponding to respective structures. The objective resin may also be obtained by performing a polymer reaction after polymerization using unsaturated monomers corresponding precursors of respective structures The resin of the present invention preferably contains from 0.5 to 80 mol % of the repeating unit (A), from 3 to 90 mol % of the repeating unit (B) and from 3 to 90 mol % of the repeating unit (C), based on all repeating units constituting the resin.

The resin (P) of the present invention is not particularly limited in its molecular weight, but the weight average molecular weight thereof is preferably from 1,000 to 100,000, more preferably from 1,500 to 70,000, still more preferably from 2,000 to 50,000. Here, the weight average molecular weight of the resin indicates a polystyrene-equivalent molecular weight measured by GPC (carrier: THF or N-methyl-2-pyrrolidone (NMP)).

The polydispersity (Mw/Mn) is preferably from 1.00 to 5.00, more preferably from 1.03 to 3.50, still more preferably from 1.05 to 2.50.

For the purpose of enhancing the performance of the resin of the present invention, a repeating unit derived from other polymerizable monomers may be contained within the range not seriously impairing the dry etching resistance.

The content of the repeating unit derived from other polymerizable monomers in the resin is generally 50 mol % or less, preferably 30 mol % or less, based on all repeating units. Other polymerizable monomers which can be used include, for example, a compound having one addition-polymerizable unsaturated bond selected from (meth)acrylic acid esters, (meth)acrylamides, allyl compounds, vinyl ethers, vinyl esters, styrenes and crotonic acid esters.

Specifically, examples of the (meth)acrylic acid esters include methyl(meth)acrylate, ethyl(meth)acrylate, propyl (meth)acrylate, tert-butyl(meth)acrylate, amyl(meth)acrylate, cyclohexyl(meth)acrylate, ethylhexyl(meth)acrylate, octyl(meth)acrylate, tert-octyl(meth)acrylate, 2-chloroethyl (meth)acrylate, 2-hydroxyethyl(meth)acrylate, glycidyl (meth)acrylate, benzyl(meth)acrylate and phenyl(meth)acrylate.

Examples of the (meth)acrylamides include (meth)acrylamide, N-alkyl(meth)acrylamide (the alkyl group is an alkyl group having a carbon number of 1 to 10, such as methyl group, ethyl group, propyl group, butyl group, tert-butyl group, heptyl group, octyl group, cyclohexyl group, benzyl group and hydroxyethyl group), N-aryl(meth)acrylamide (the aryl group is, for example, a phenyl group, a tolyl group, a nitrophenyl group, a naphthyl group, a cyanophenyl group, a hydroxyphenyl group or a carboxyphenyl group), N,N-dialkyl(meth)acrylamide (the alkyl group is an alkyl group having a carbon number of 1 to 10, such as methyl group, ethyl group, butyl group, isobutyl group, ethylhexyl group and cyclohexyl group), N,N-aryl(meth)acrylamide (the aryl group is, for example, a phenyl group), N-methyl-N-phenylacrylamide, N-hydroxyethyl-N-methylacrylamide and N-2-acetamidoethyl-N-acetylacrylamide.

Examples of the allyl compounds include allyl esters (e.g., allyl acetate, allyl caproate, allyl caprylate, allyl laurate, allyl palmitate, allyl stearate, allyl benzoate, allyl acetoacetate, allyl lactate), and allyloxyethanol.

Examples of vinyl ethers include alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), and vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether).

Examples of vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl cyclohexylcarboxylate, vinyl benzoate, vinyl salicylate, vinyl chlorobenzoate, vinyl tetrachlorobenzoate and vinyl naphthoate.

Examples of the styrenes include styrene, alkylstyrene (e.g., methylstyrene, dimethylstyrene, trimethylstyrene, ethylstyrene, diethylstyrene, isoproylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrene (e.g., methoxystyrene, 4-methoxy-3-methylstyrene, dimethoxystyrene), alkylcarbonyloxystyrene (e.g., 4-acetoxystyrene, 4-cyclohexylcarbonyloxystyrene), arylcarbonyloxystyrene (e.g., 4-phenylcarbonyloxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), cyanostyrene and carboxystyrene.

Examples of the crotonic acid esters include alkyl crotonate (e.g., butyl crotonate, hexyl crotonate, glycerin monocrotonate).

Examples of the dialkyl itaconates include dimethyl itaconate, diethyl itaconate and dibutyl itaconate.

Examples of the dialkyl esters of maleic acid or fumaric acid include dimethyl maleate and dibutyl fumarate.

Other examples include maleic anhydride, maleimide, acrylonitrile, methacrylonitrile and maleylonitrile. Also, an addition-polymerizable unsaturated compound generally copolymerizable with the repeating unit for use in the present invention may be used without any particular limitation.

The resin (P) for use in the present invention may further contain (D) a repeating unit having a group capable of decomposing by the action of an alkali developer to increase the dissolution rate in an alkali developer.

Examples of the group capable of decomposing by the action of an alkali developer to increase the dissolution rate in an alkali developer include a lactone structure and a phenyl ester structure.

The repeating unit (D) is preferably a repeating unit represented by the following formula (AII):

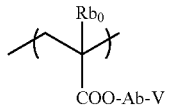

(AII)

In formula (AII), $Rb_0$ represents a hydrogen atom, a halogen atom or an alkyl group (preferably having a carbon number of 1 to 4) which may have a substituent.

Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic aliphatic hydrocarbon ring structure, an ether group, an ester group, a carbonyl group, or a divalent linking group formed by a combination thereof and is preferably a single bond or a divalent linking group represented by $-Ab_1-CO_2-$.

$Ab_1$ represents a linear or branched alkylene group or a monocyclic or polycyclic aliphatic hydrocarbon ring group and is preferably a methylene group, an ethylene group, a cyclohexylene group, an adamantylene group or a norbornylene group.

V represents a group capable of decomposing by the action of an alkali developer to increase the dissolution rate in an alkali developer and is preferably a group having an ester bond, more preferably a group having a lactone structure.

As for the group having a lactone structure, any group may be used as long as it has a lactone structure, but the lactone structure is preferably a 5- to 7-membered ring lactone structure, and a structure where another ring structure is condensed to a 5- to 7-membered ring lactone structure in the form of forming a bicyclo or spiro structure is preferred. V is more preferably a group having a lactone structure represented by any one of the following formulae (LC1-1) to (LC1-17). Also, the resin (P) may contain a repeating unit where a lactone structure is bonded directly to the main chain. Among these lactone structures, preferred are (LC1-1), (LC1-4), (LC1-5), (LC1-6), (LC1-13) and (LC1-14).

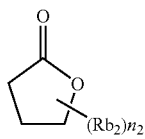

LC1-1

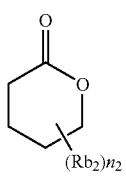

LC1-2

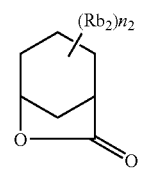

LC1-3

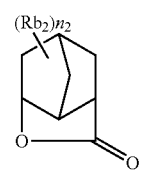

LC1-4

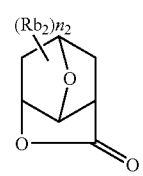

LC1-5

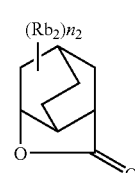

LC1-6

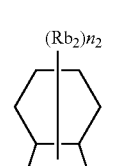

LC1-7

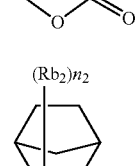

LC1-8

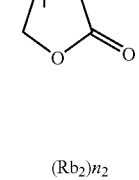

LC1-9

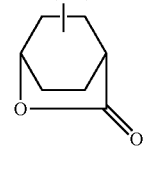

LC1-10

-continued

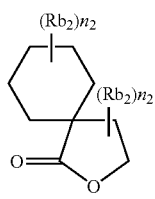

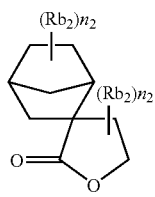

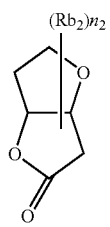

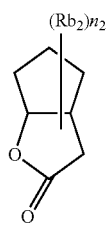

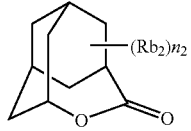

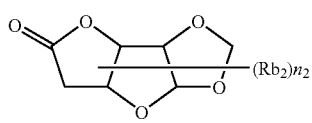

The lactone structure moiety may or may not have a substituent ($Rb_2$). Preferred examples of the substituent ($Rb_2$) include an alkyl group having a carbon number of 1 to 8, a monovalent aliphatic hydrocarbon ring group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$) and also, the plurality of substituents ($Rb_2$) may combine with each other to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

Specific examples of the repeating unit (D) in the resin (P) are set forth below, but the present invention is not limited thereto. In the formulae, Rx represents H, $CH_3$, $CH_2OH$ or $CF_3$.

LC1-11

LC1-12

LC1-13

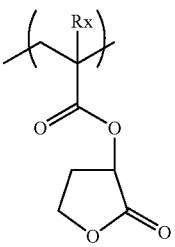 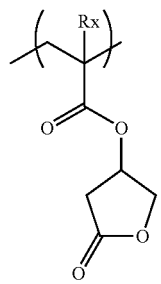

LC1-14

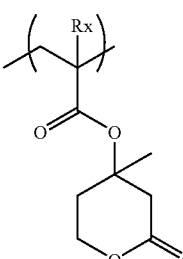 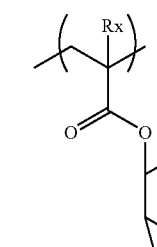

LC1-15

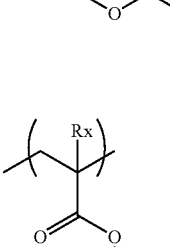 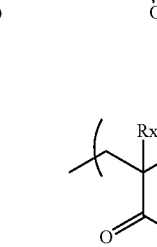

LC1-16

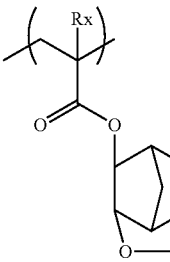 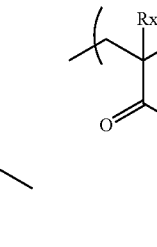

LC1-17

 

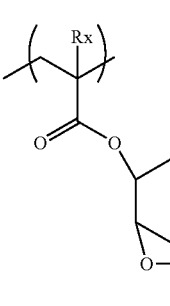 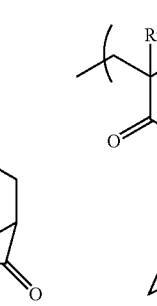

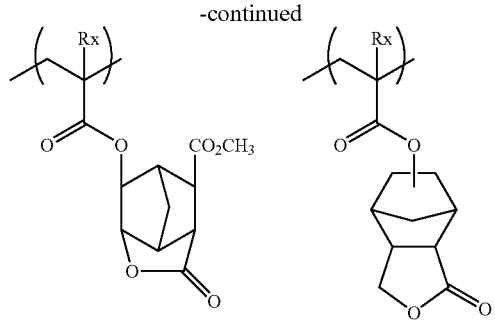
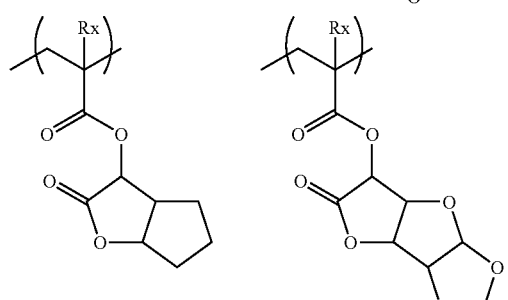
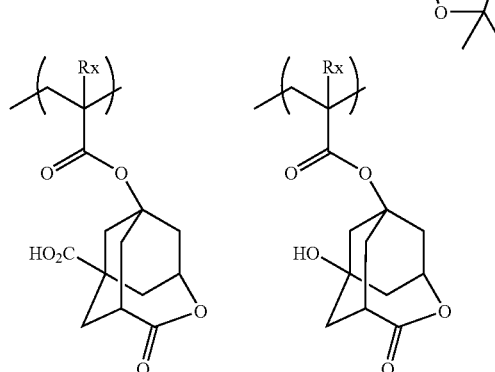
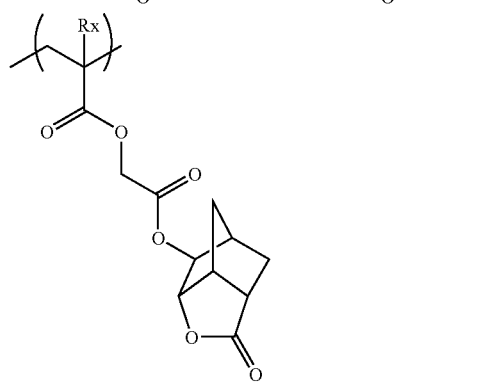
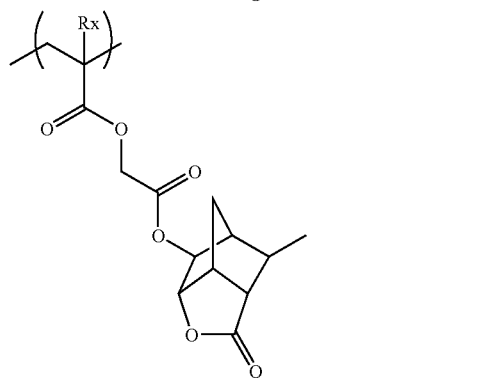
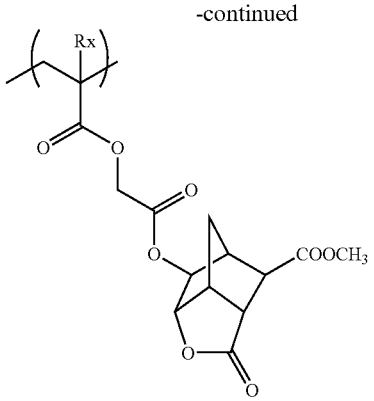
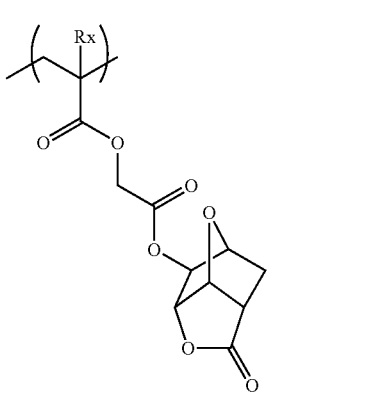
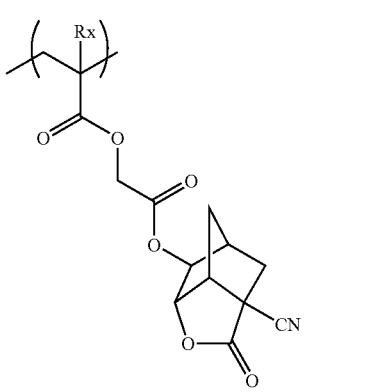
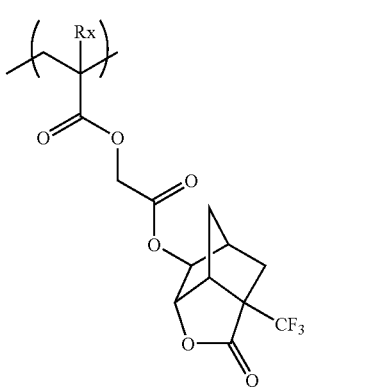

115
-continued
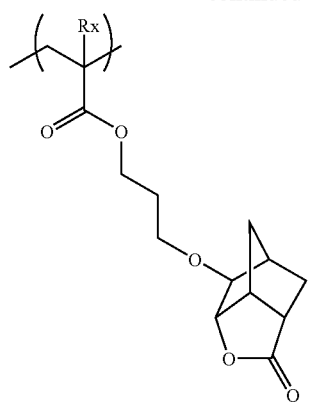
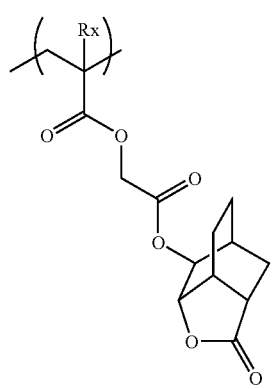
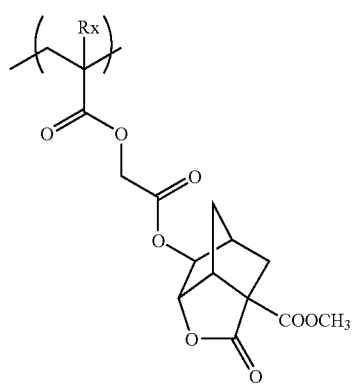
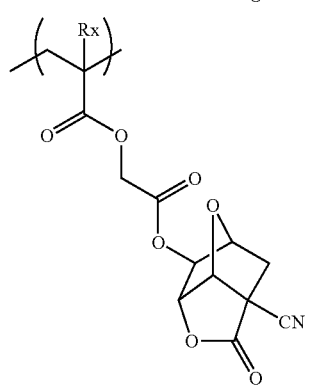
116
-continued
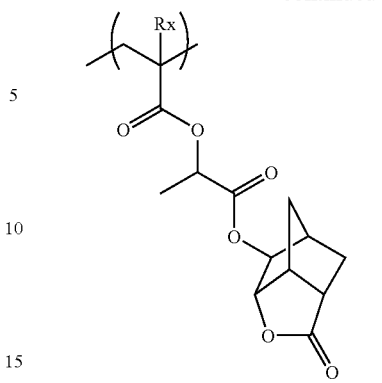
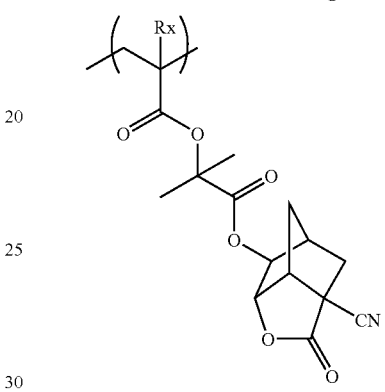
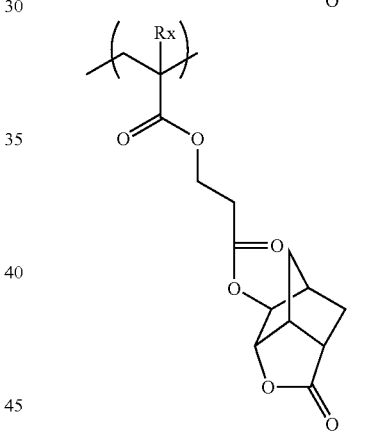
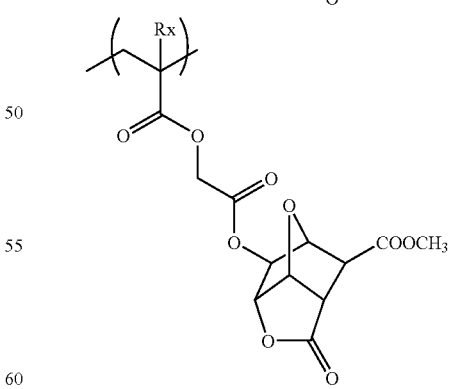
In the case where the resin (P) contains the repeating unit (D), the content of the repeating unit (D) is preferably from 0.5 to 80 mol %, more preferably from 1 to 60 mol %, still more preferably from 2 to 40 mol %, based on all repeating units in the resin (P).

The resin (P) may contain a repeating unit having a hydroxyl group or a cyano group, other than the above-described repeating unit (A), repeating unit (B), repeating unit (C) and repeating unit (D). Thanks to this repeating unit, the adherence to substrate and the affinity for developer can be enhanced. The repeating unit having a hydroxyl group or a cyano group is preferably a repeating unit having an alicyclic hydrocarbon structure substituted by a hydroxyl group or a cyano group and preferably has no acid-decomposable group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by the following formulae (VIIa) to (VIId):

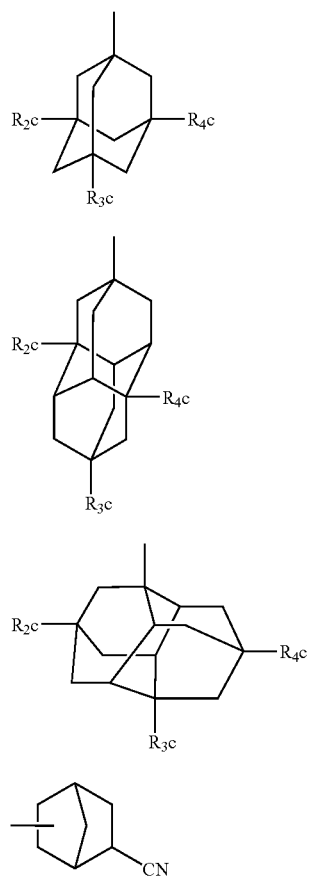

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

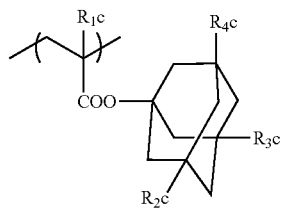

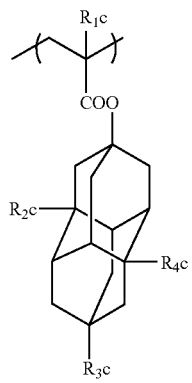

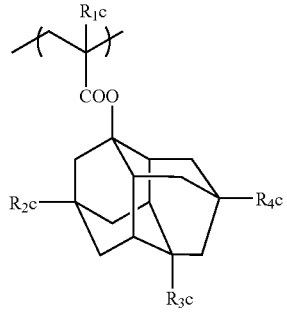

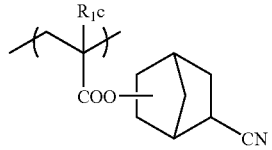

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

In the case where the resin (P) contains a repeating unit having a hydroxyl group or a cyano group, the content thereof is preferably from 0.5 to 80 mol %, more preferably from 1 to 60 mol %, still more preferably from 2 to 40 mol %, based on all repeating units in the resin (P).

Specific examples of the repeating unit having a hydroxyl group or a cyano group are set forth below, but the present invention is not limited thereto.

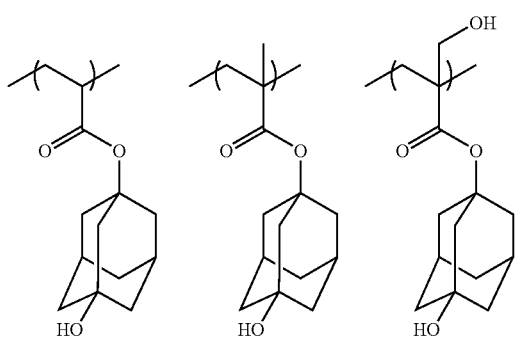
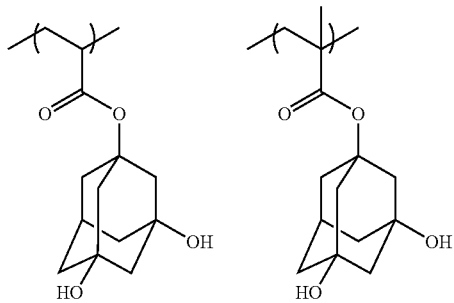
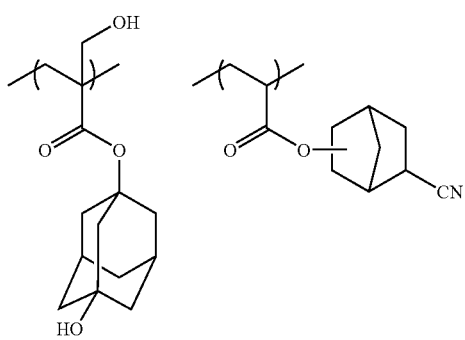
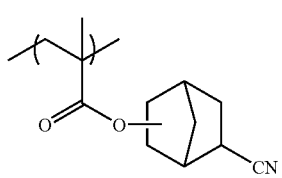
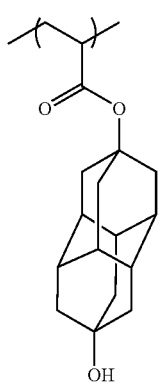
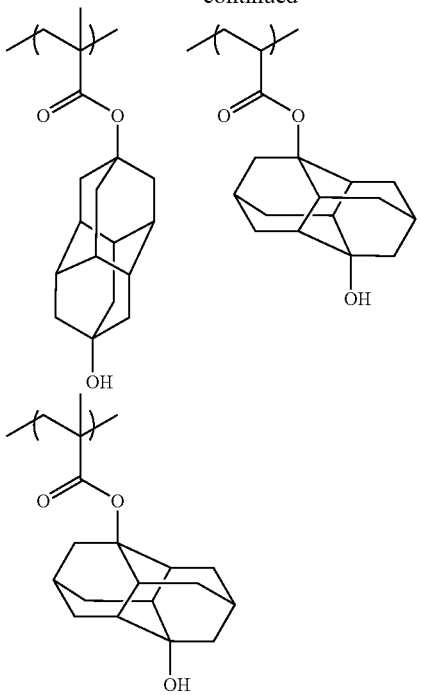

The resin (P) may further contain a repeating unit having a polar group-free cyclic hydrocarbon structure and not exhibiting acid decomposability. This repeating unit includes a repeating unit represented by formula (VII):

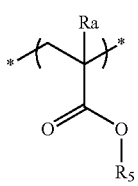

(VII)

In formula (VII), $R_5$ represents a hydrocarbon group having at least one cyclic hydrocarbon structure and having no polar group (e.g., hydroxyl group, cyano group).

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic hydrocarbon structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, a cycloalkenyl group having a carbon number of 3 to 12, such as cyclohexenyl group, and a phenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group, a perhydronaphthalenyl group, a biphenyl group and a 4-cyclohexylphenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$]undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Among these crosslinked cyclic hydrocarbon rings, a norbornyl group and an adamantyl group are more preferred.

These cyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a monovalent aliphatic hydrocarbon ring group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group includes, for example, an alkoxycarbonyl group having a carbon number of 1 to 4.

Specific examples of the repeating unit having a polar group-free cyclic hydrocarbon structure and not exhibiting acid decomposability are set forth below, but the present invention is not limited thereto. In the formulae, Ra represents H, CH$_3$, CH$_2$OH or CF$_3$.

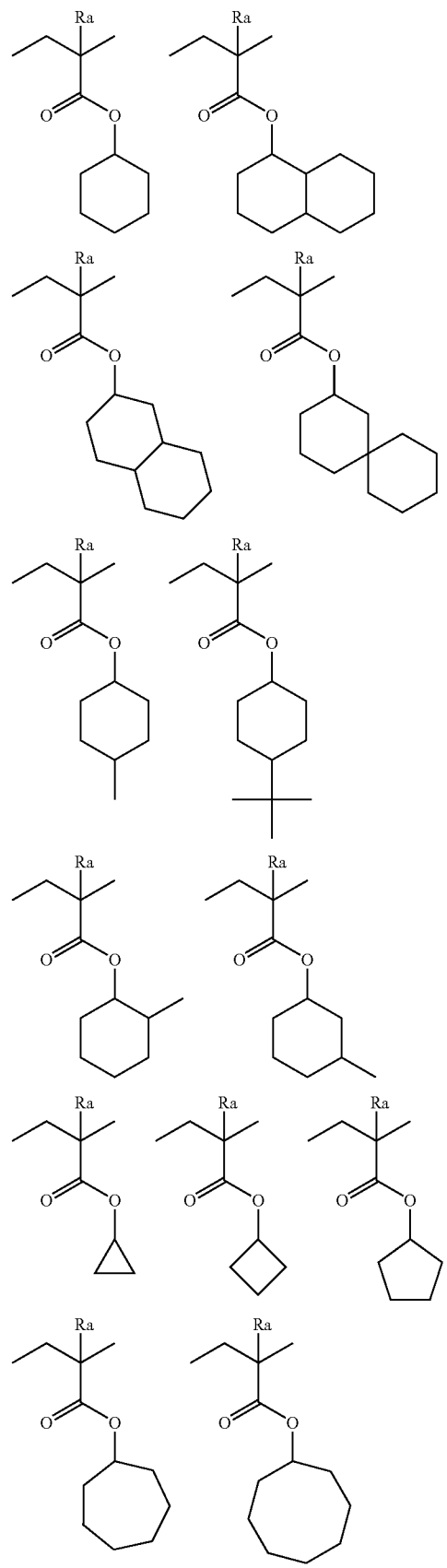

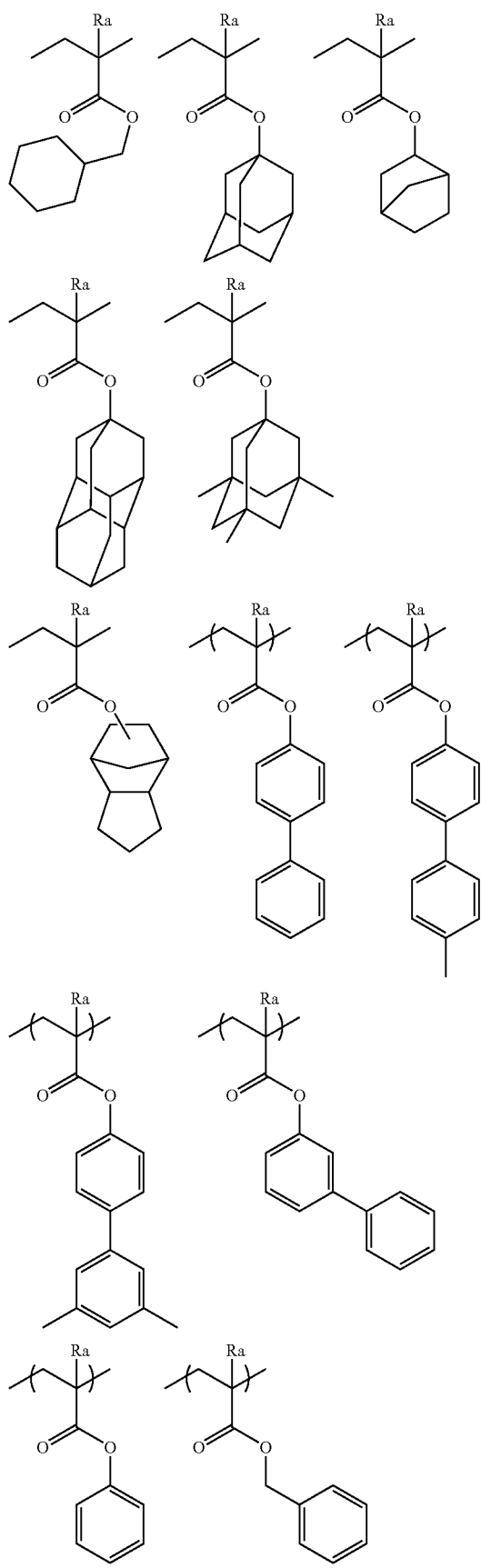
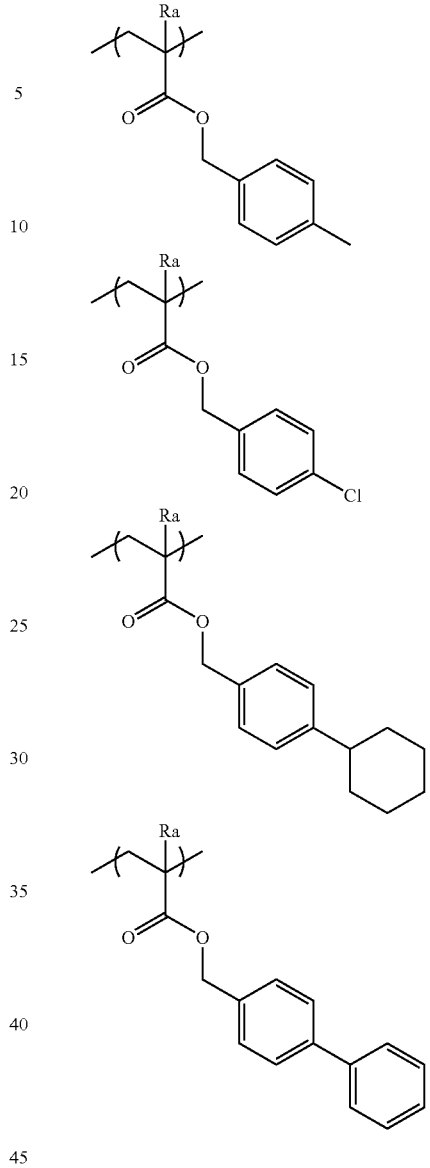

The resin (P) may or may not contain a repeating unit having a polar group-free cyclic hydrocarbon structure and not exhibiting acid decomposability, but in the case of containing this repeating unit, the content thereof is preferably from 10 to 40 mol %; more preferably from 3 to 20 mol %, based on all repeating units in the resin (A).

As for the resin (P) of the present invention, one kind may be used alone, or two or more kinds may be used in combination. The content of the resin (P) is preferably from 30 to 100 mass %, more preferably from 50 to 100 mass %, still more preferably from 70 to 100 mass %, based on the entire solid content in the actinic ray-sensitive or radiation-sensitive resin composition of the present invention.

Specific examples of the resin (P) include, but are not limited to, the followings.

Specific examples of the resin (P) include a resin containing one or more kinds of repeating units selected from specific examples of formulae (III) to (IV)/one or more kinds of repeating units selected from specific examples of formula (VI), a resin containing one or more kinds of repeating units selected from specific examples of formulae (III) to (IV)/one or more kinds of repeating units selected from specific examples of formula (VI)/one or more kinds of repeating units selected from specific examples of formula (I), and a resin containing one or more kinds of repeating units selected from specific examples of formulae (III) to (IV)/one or more kinds of repeating units selected from specific examples of formula (VI)/one or more kinds of repeating units selected from specific examples of formula (X).

More preferred specific examples include resins of the following structures.

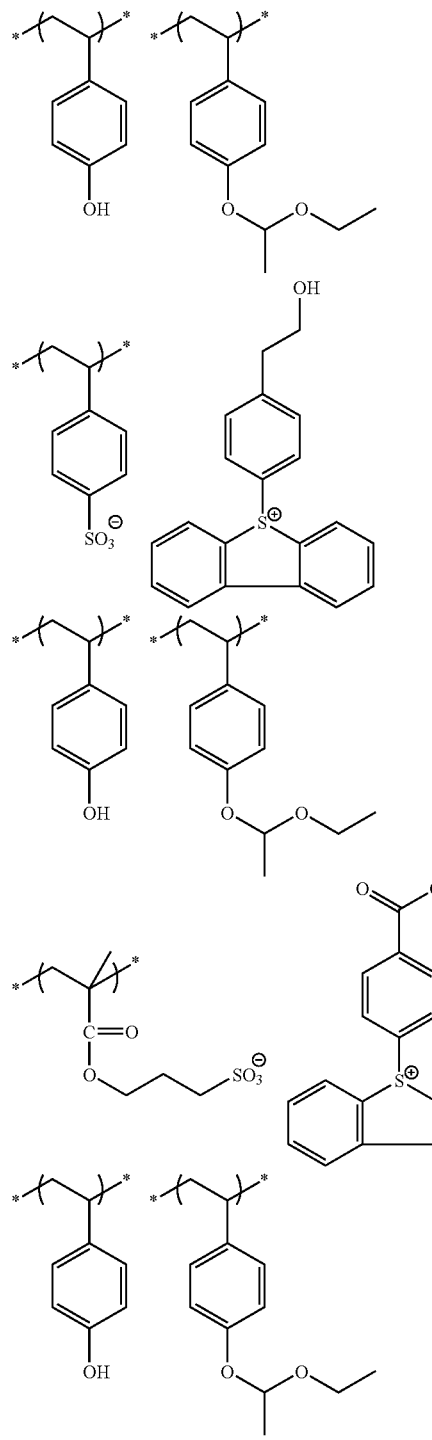

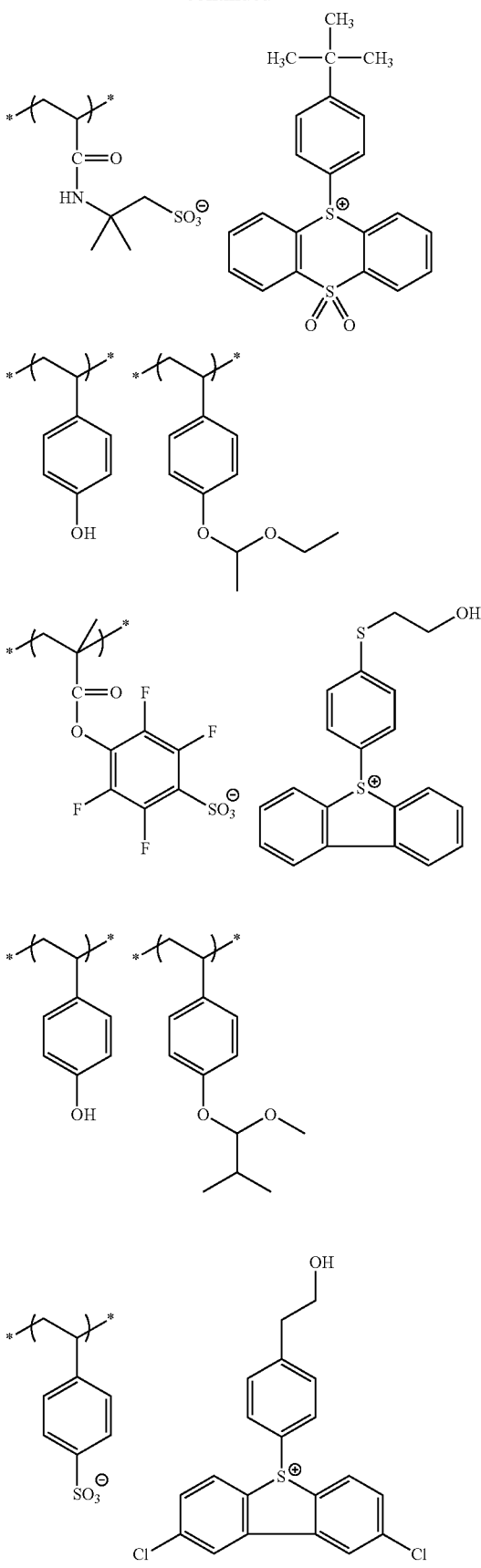

127
-continued
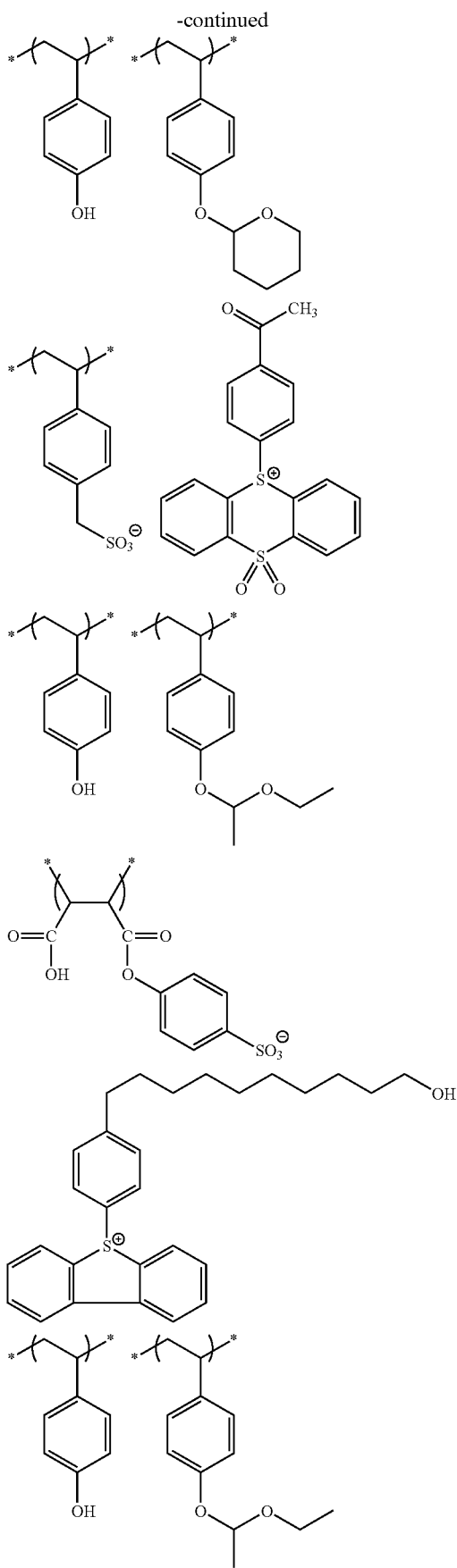
128
-continued
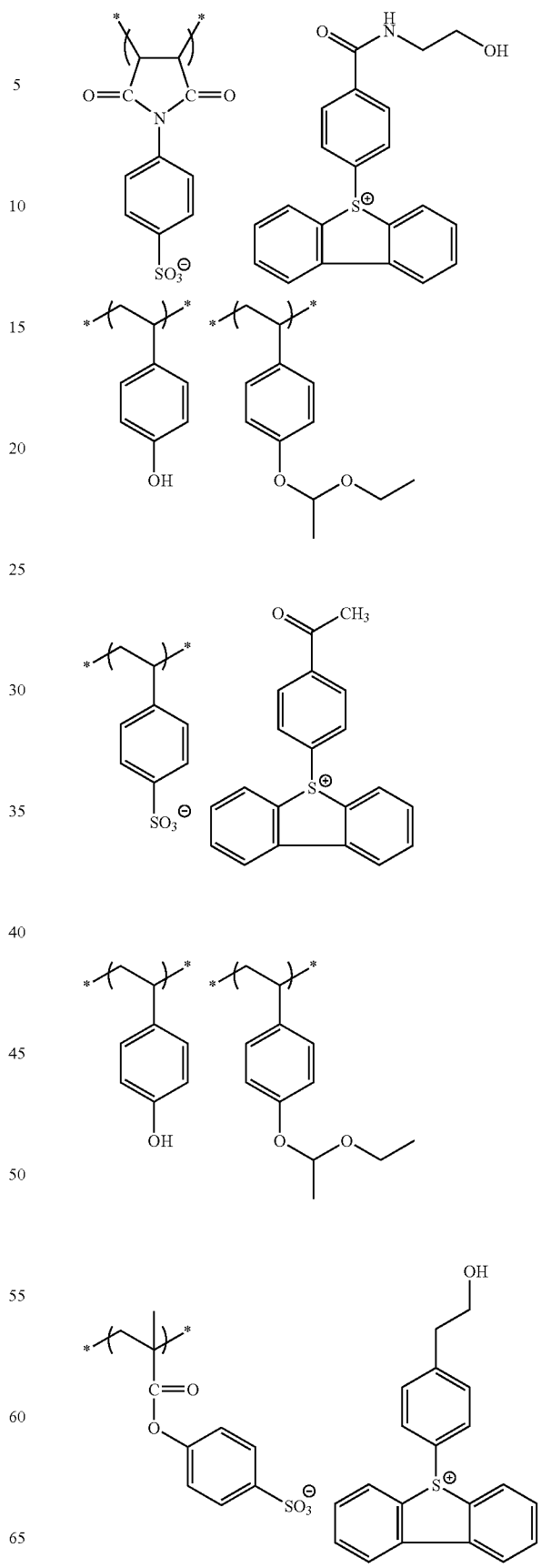

129
-continued
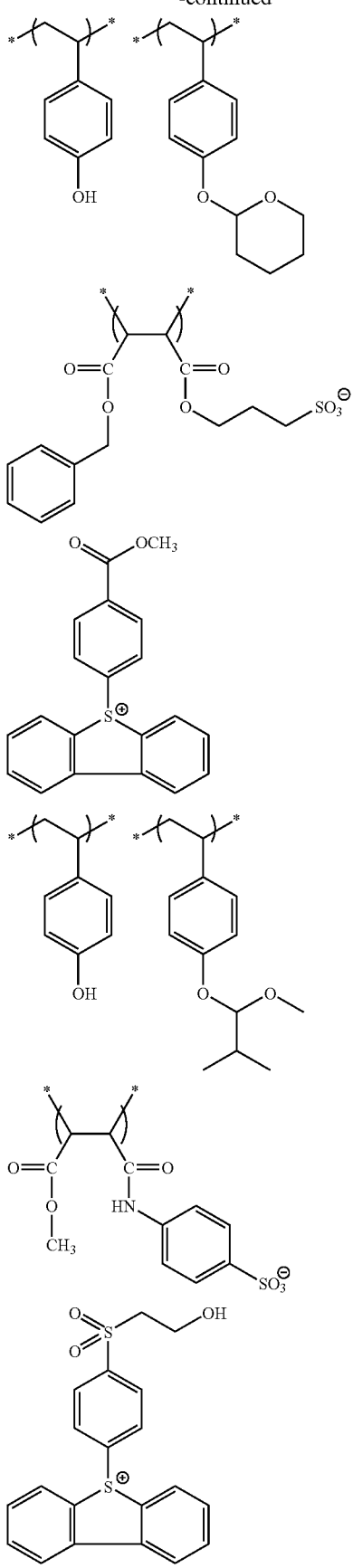
130
-continued
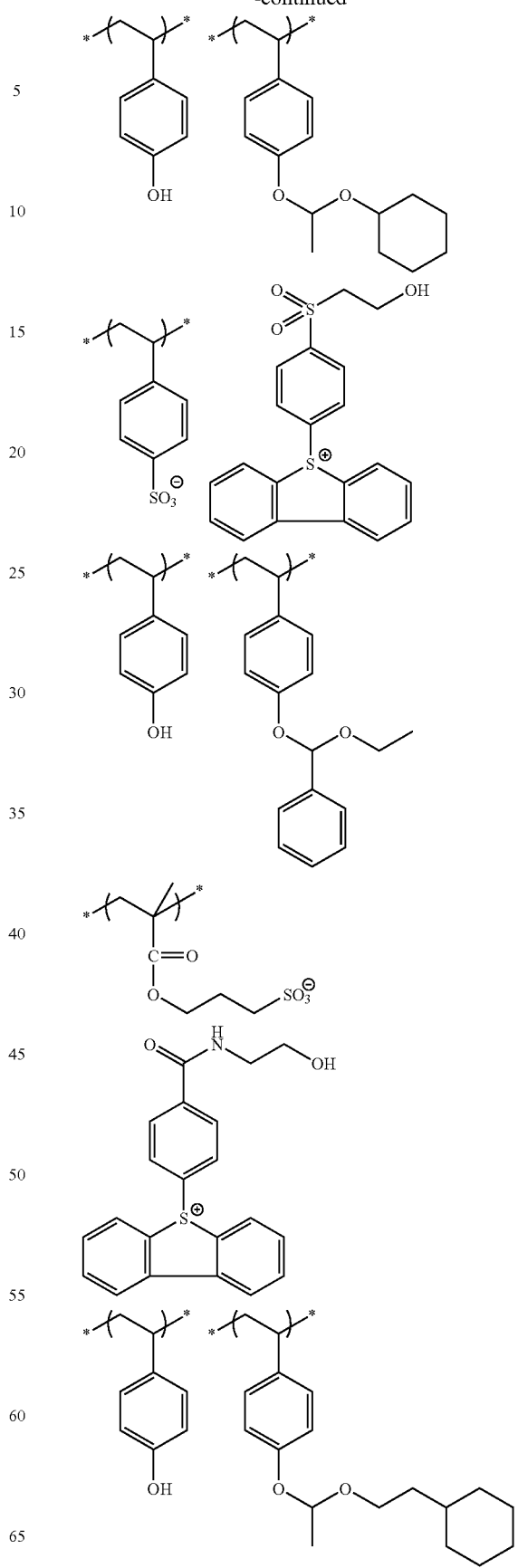

131
-continued
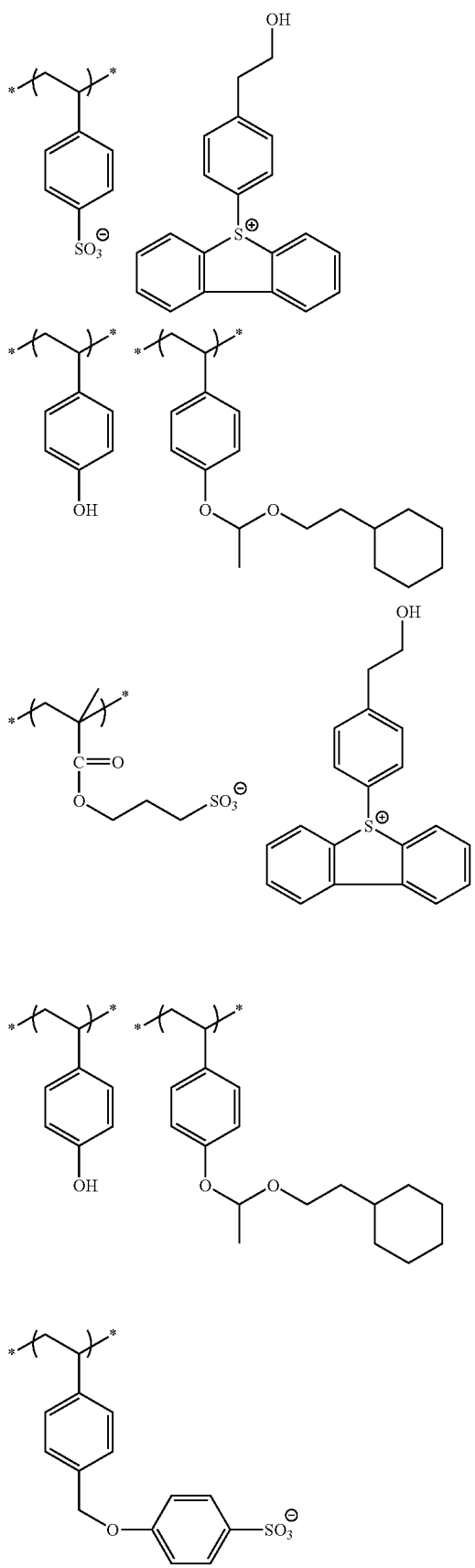
132
-continued
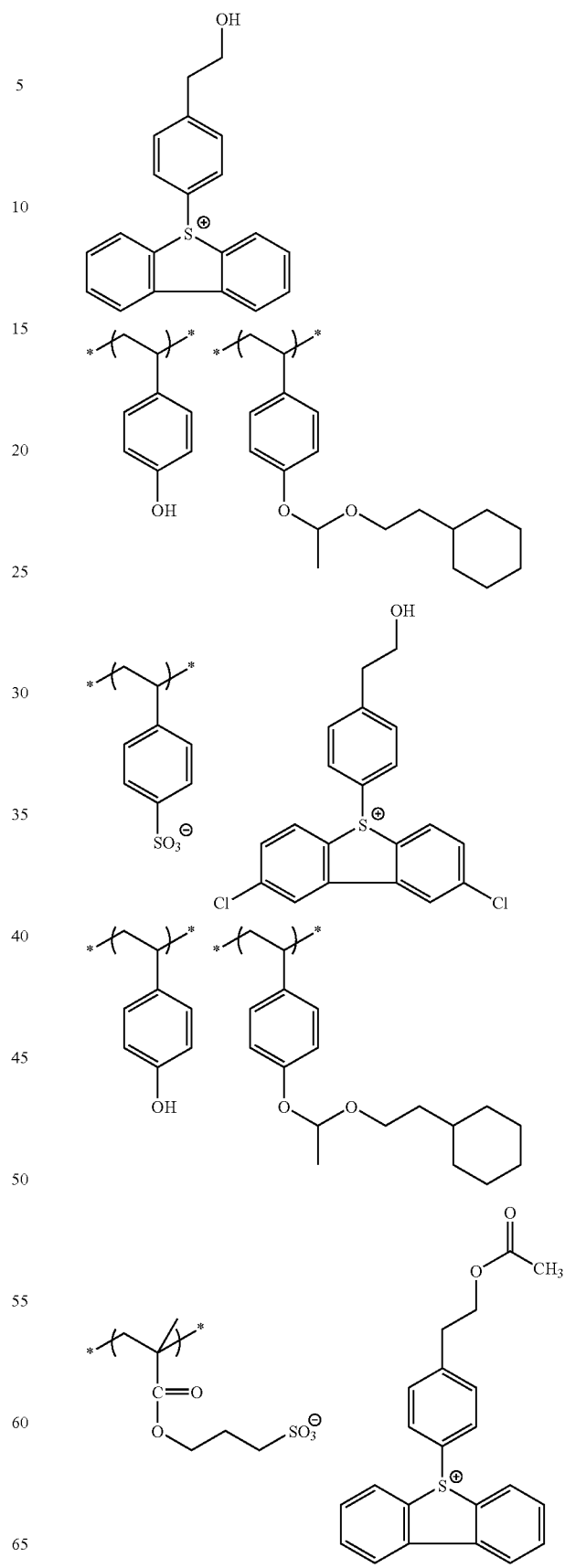

133
-continued
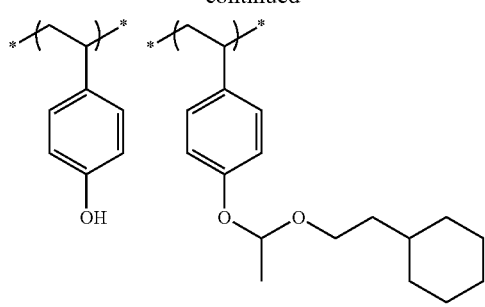
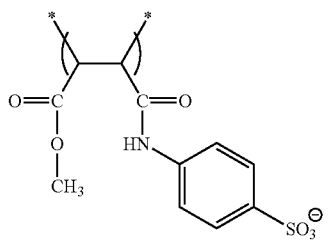
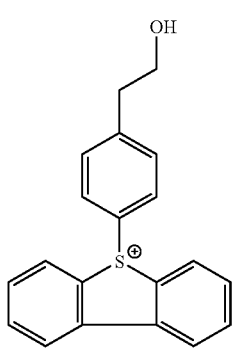
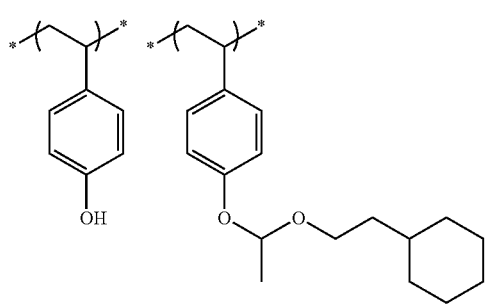
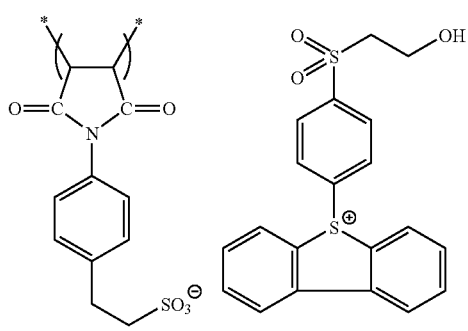
134
-continued
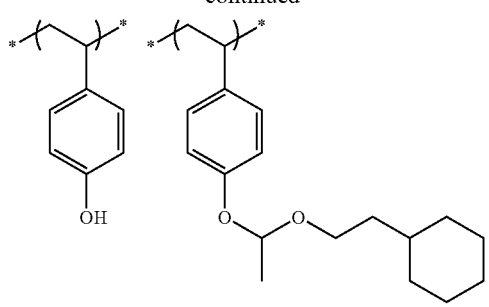
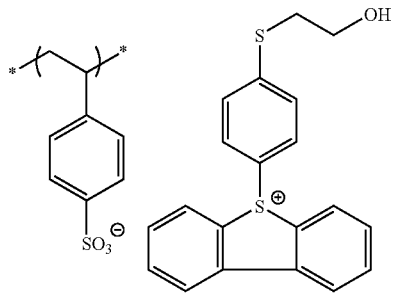
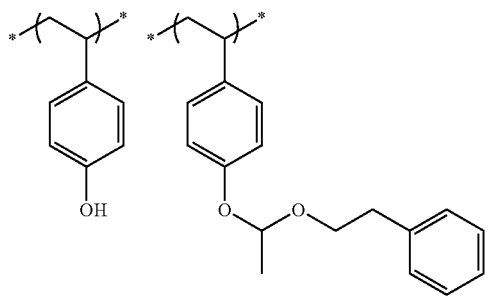
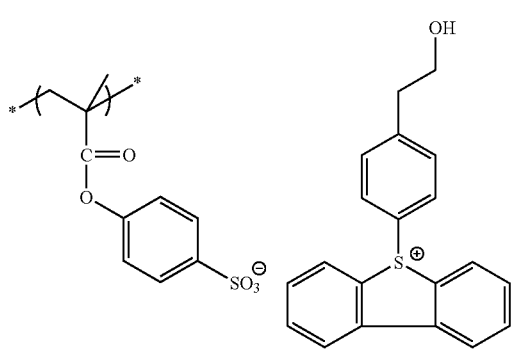
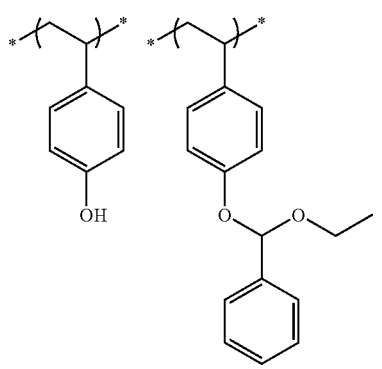

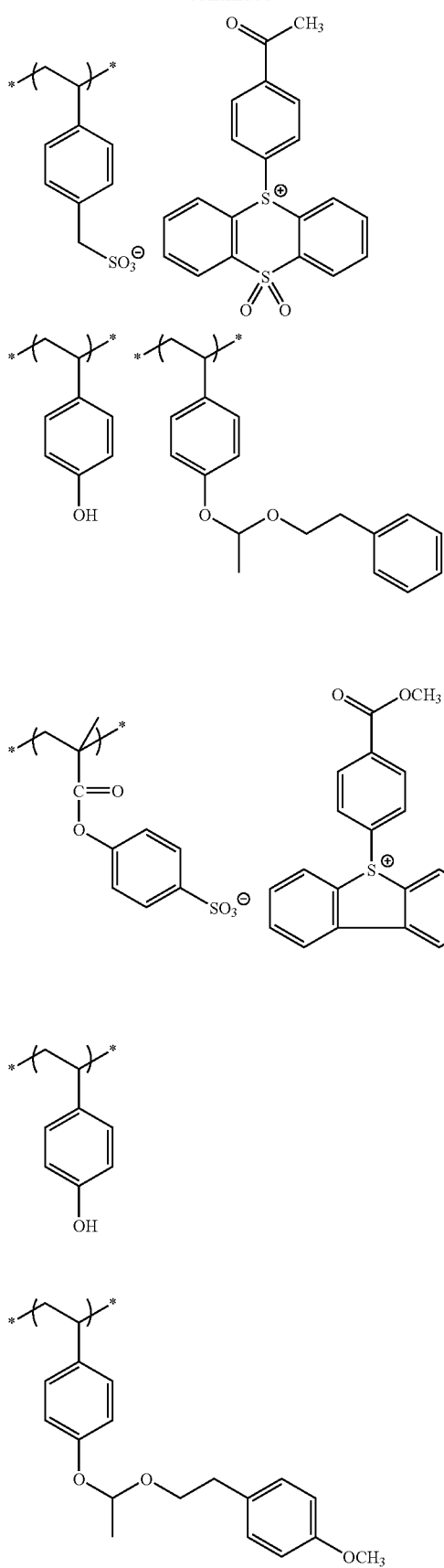
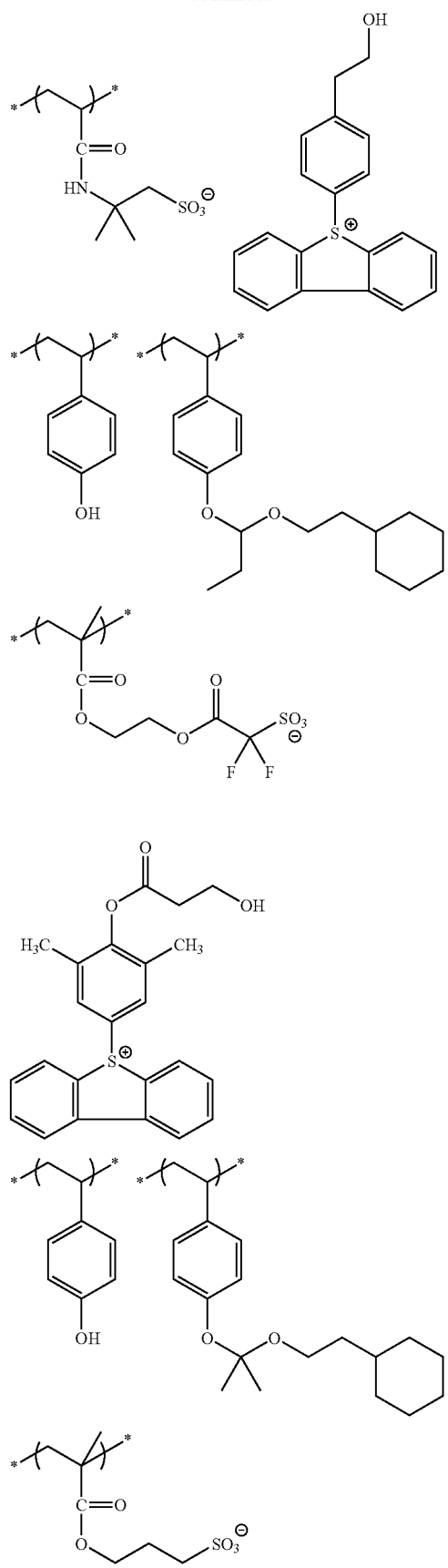

137
-continued
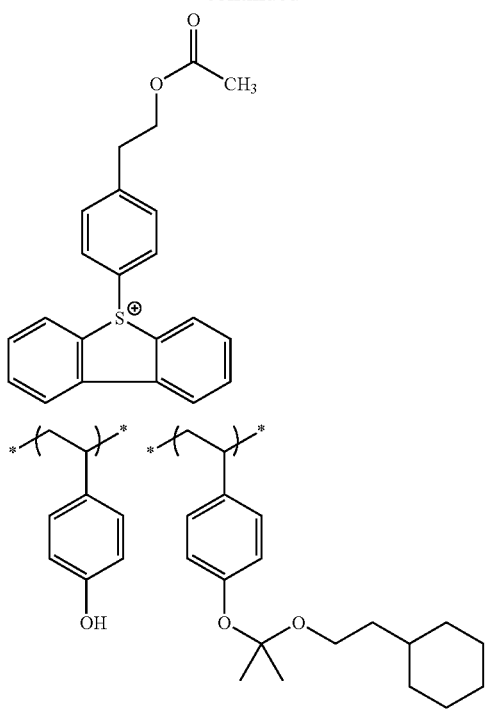
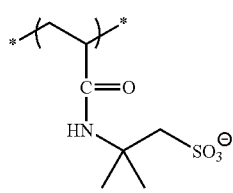
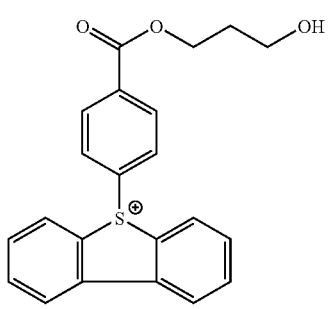
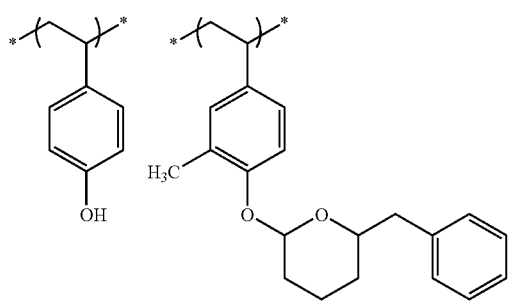
138
-continued
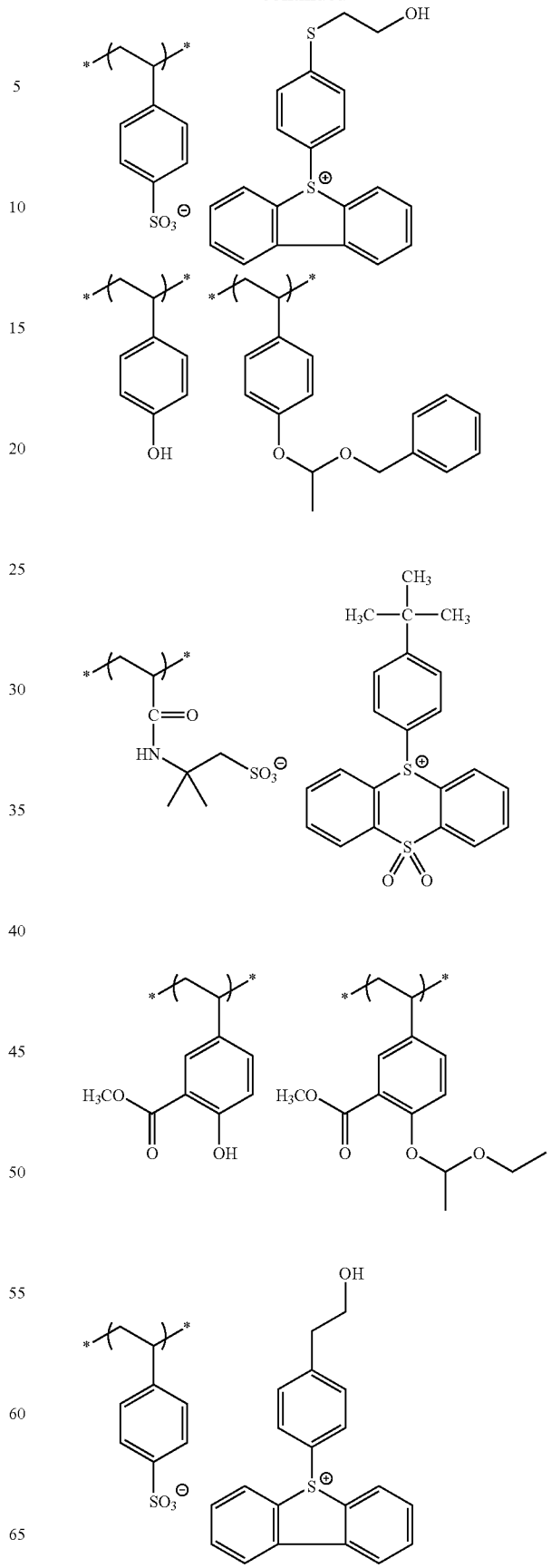

139
-continued
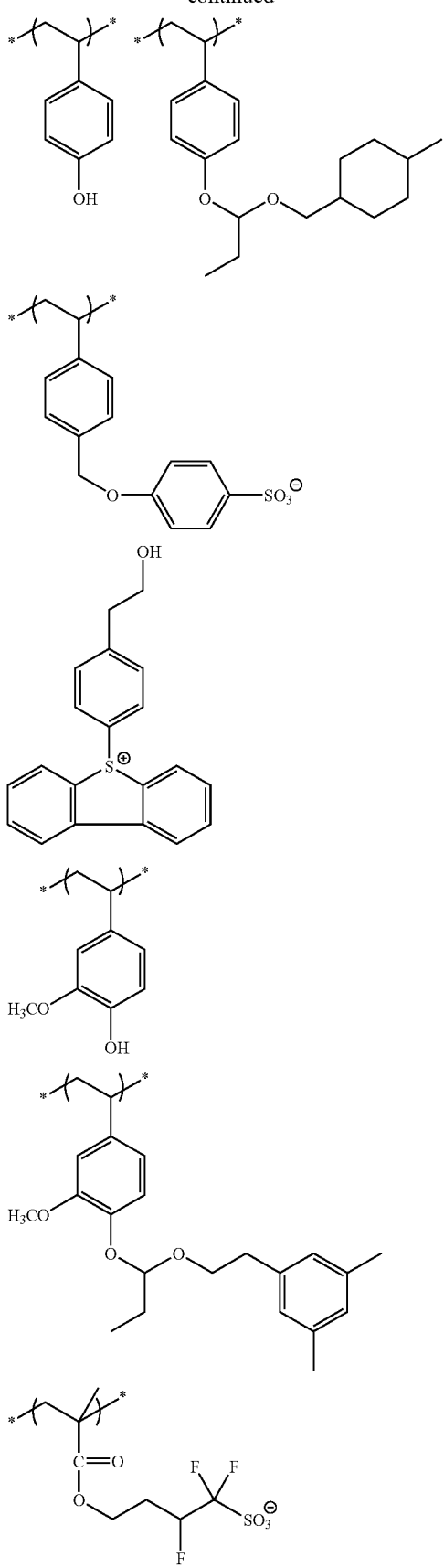
140
-continued
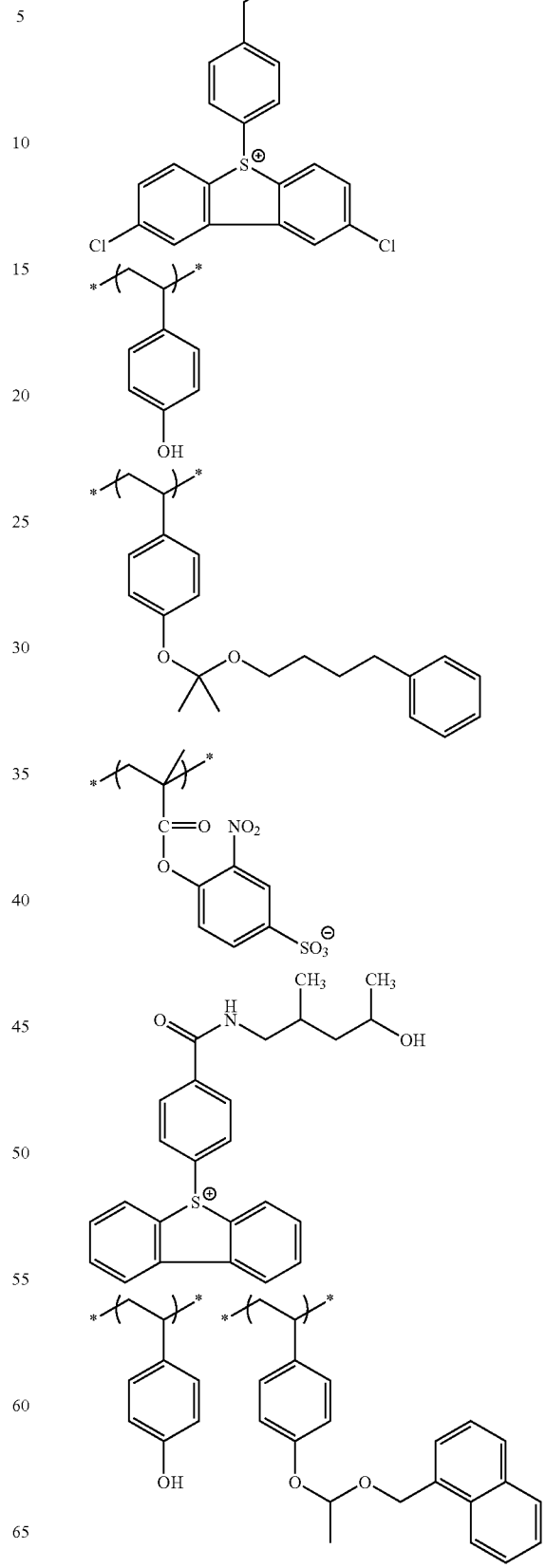

141
-continued
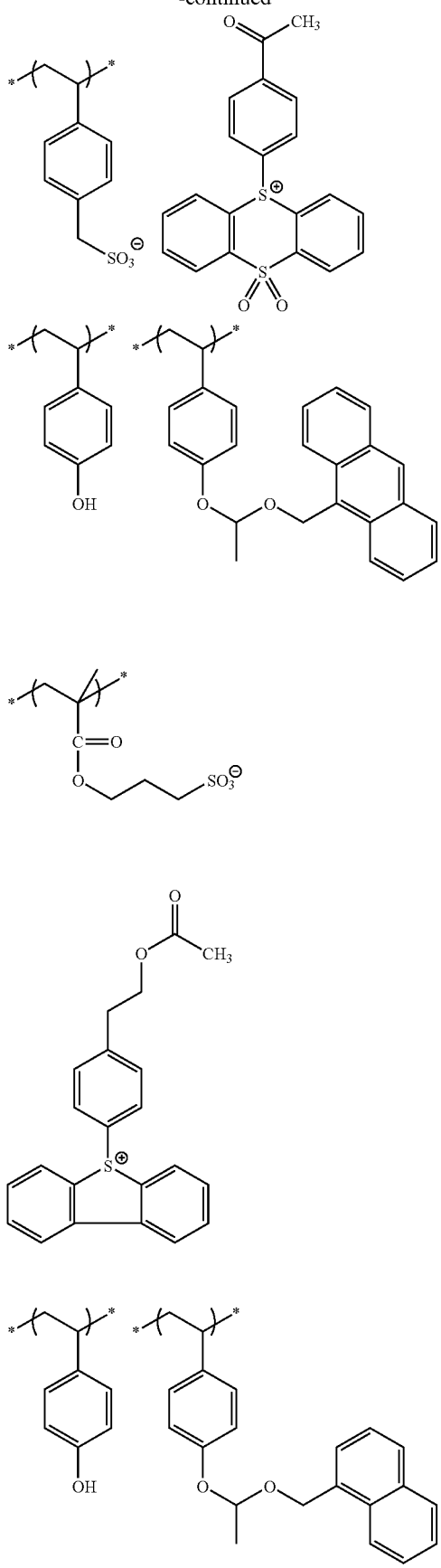
142
-continued
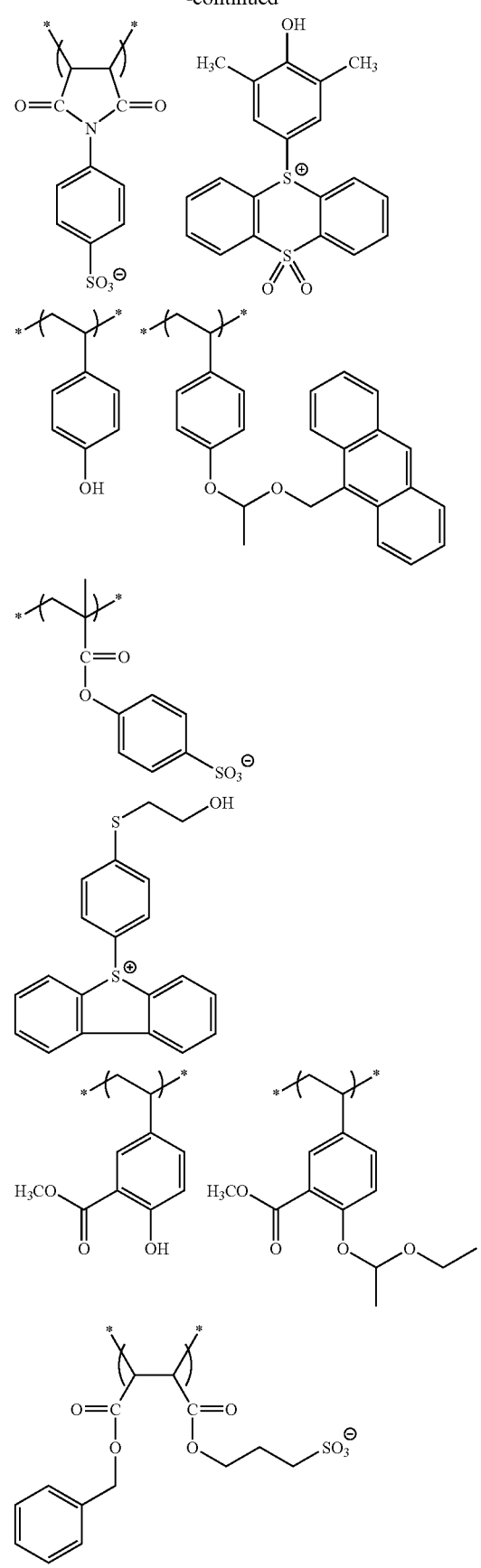

143
-continued
144
-continued
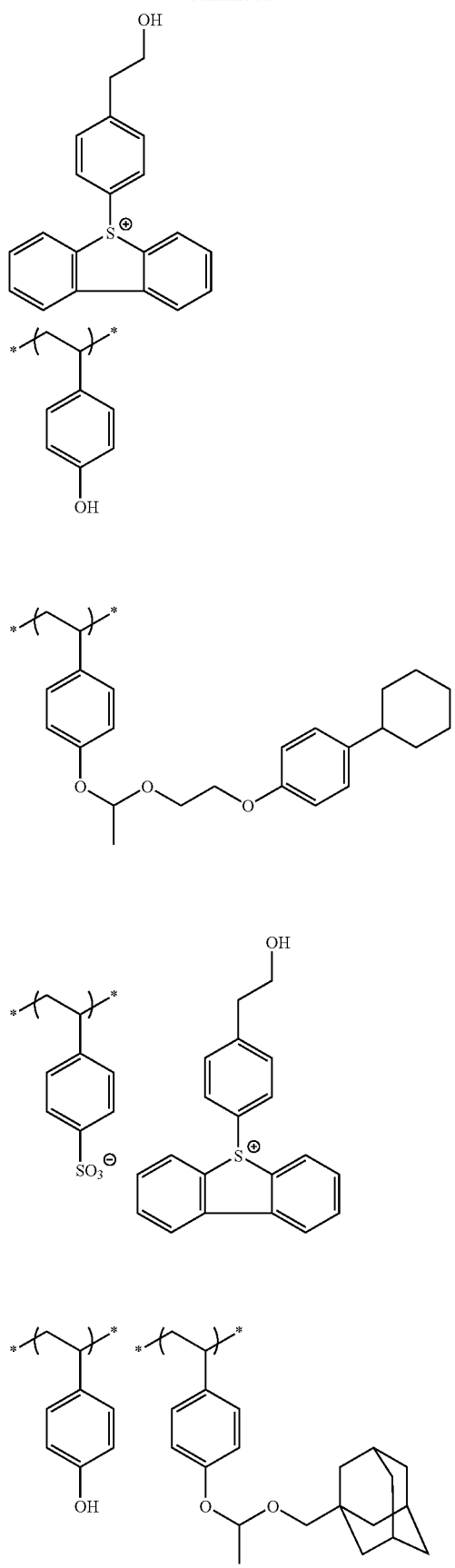
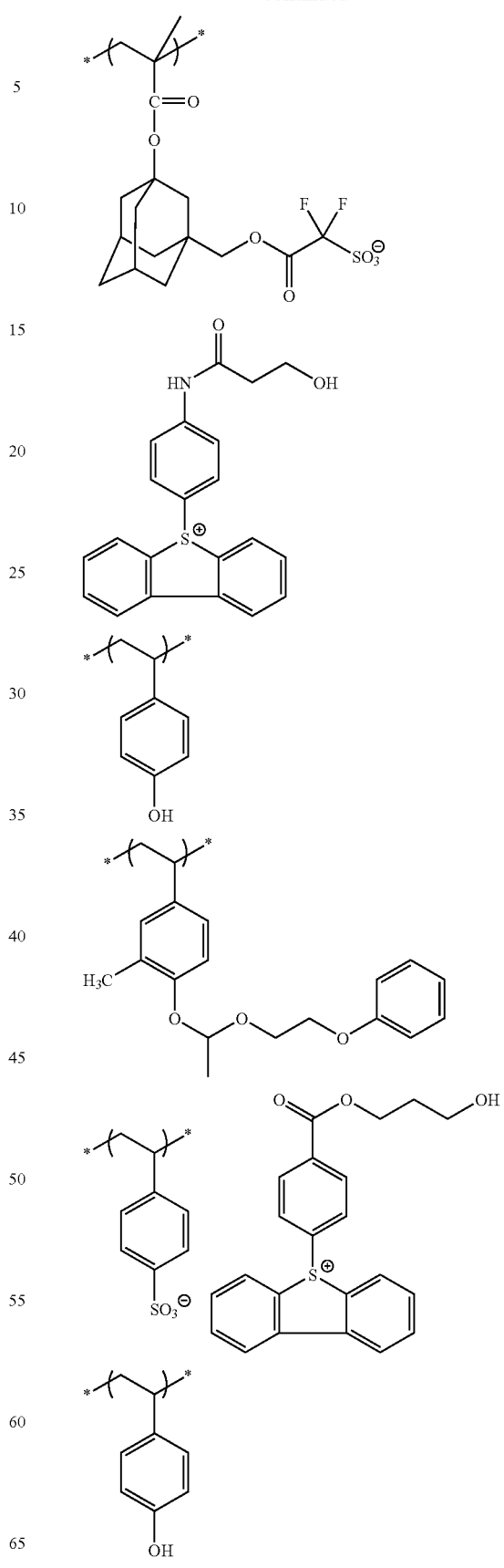

145
-continued
146
-continued
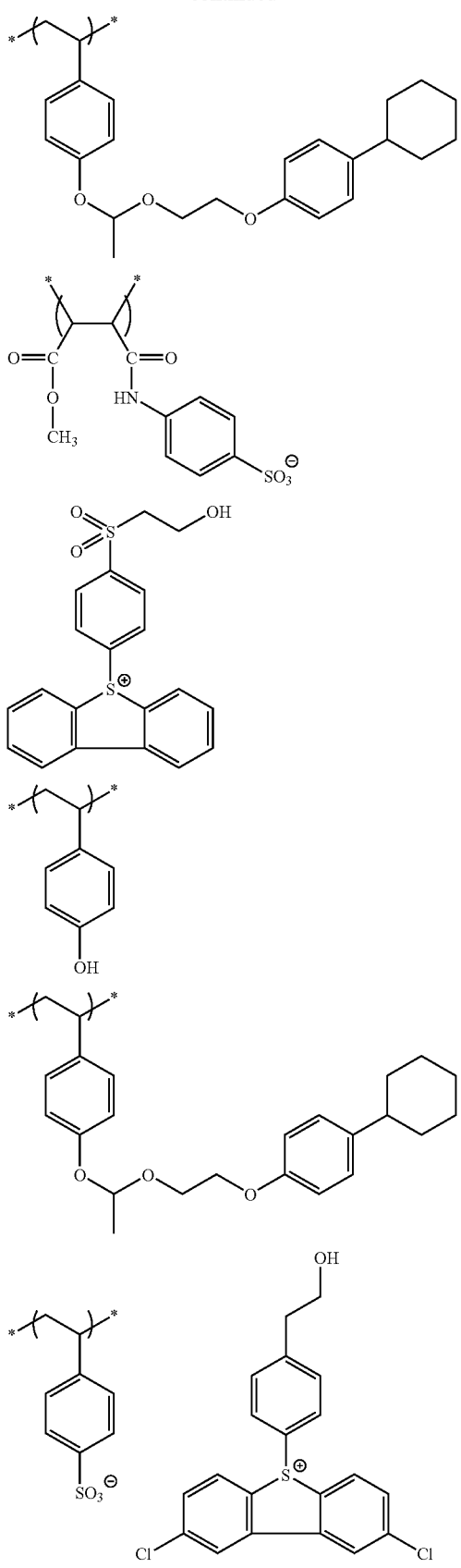
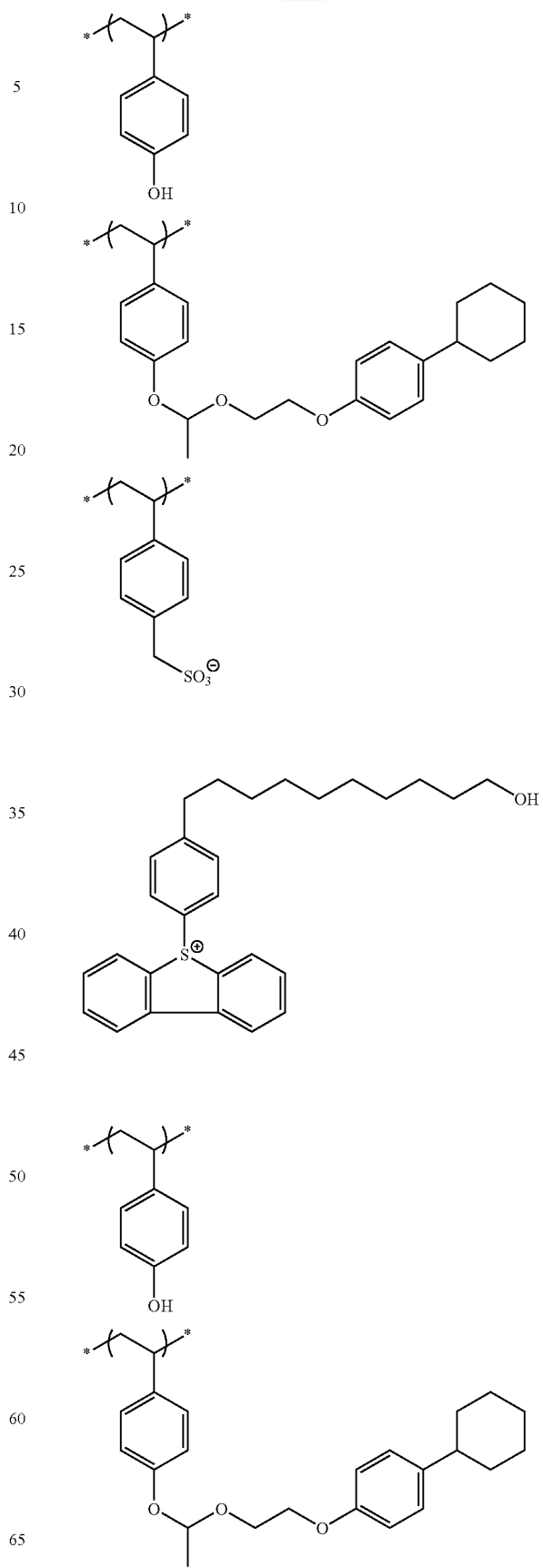

147
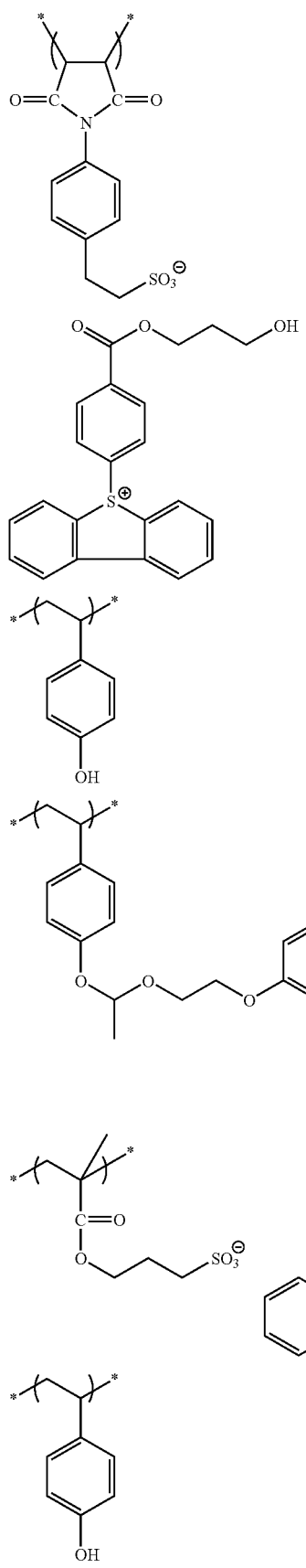
148
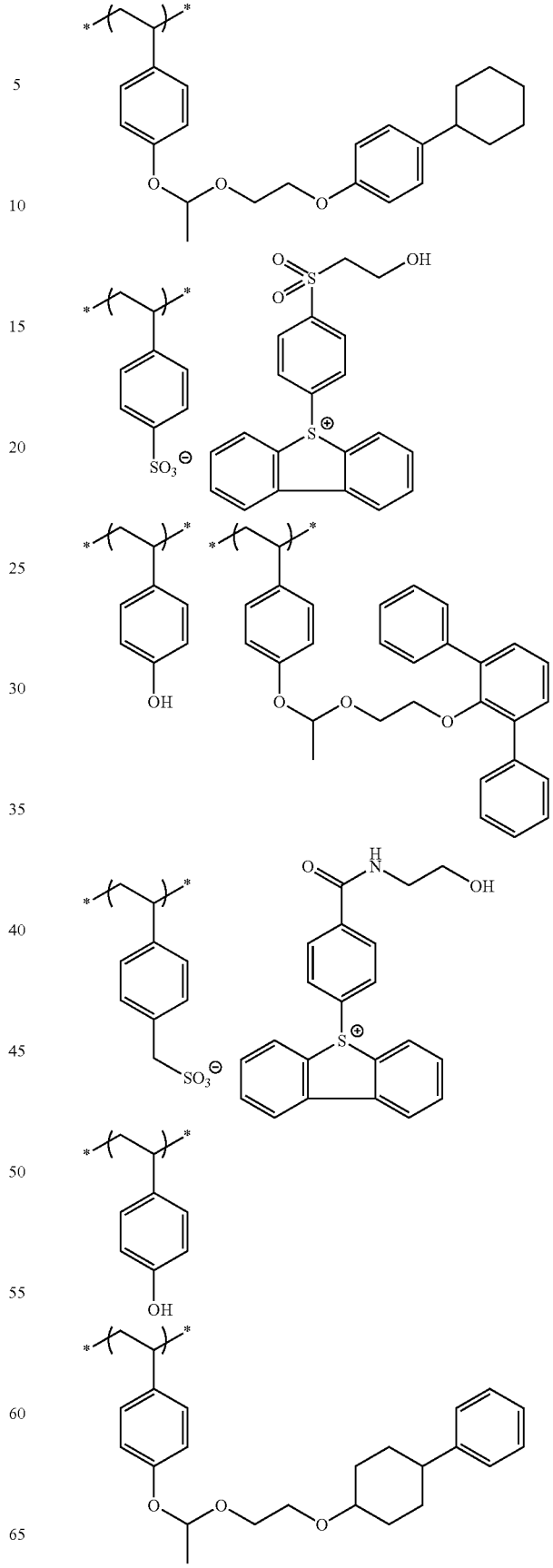

149
-continued
150
-continued
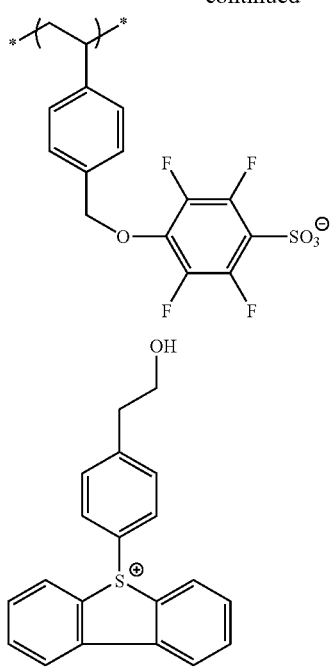
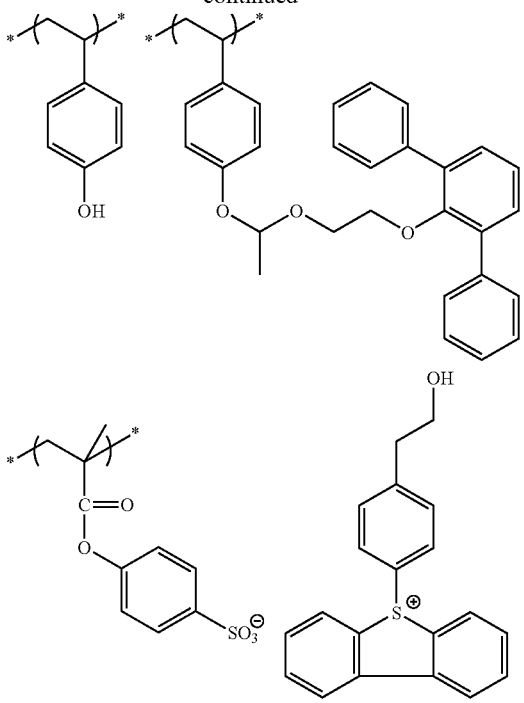
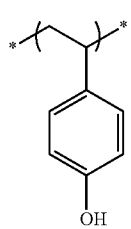
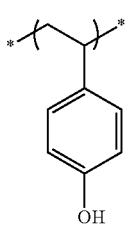
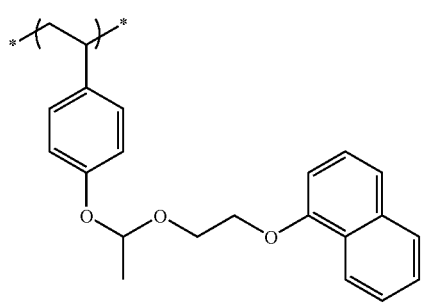
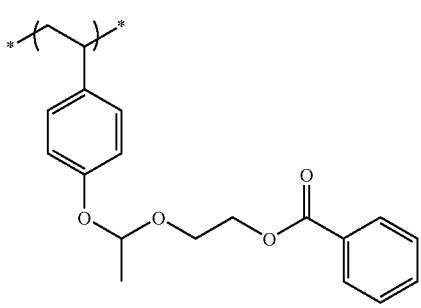
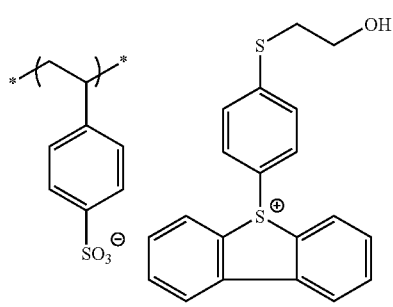
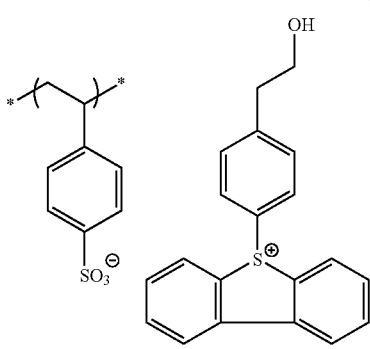

151
-continued
152
-continued
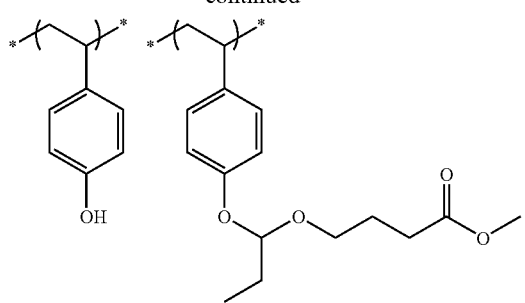
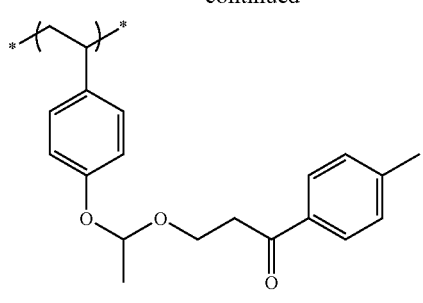
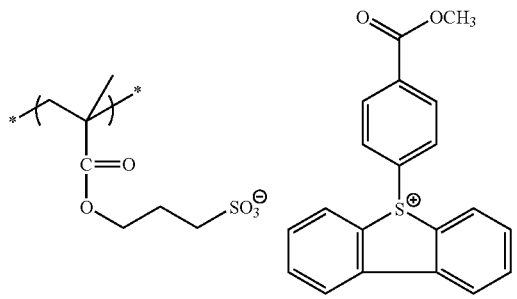
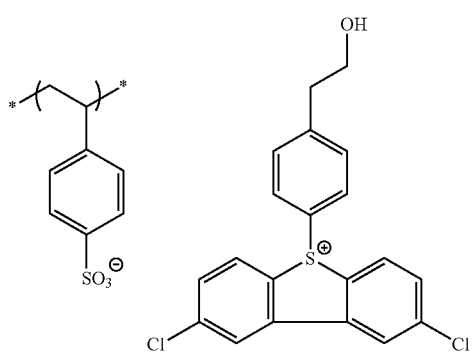
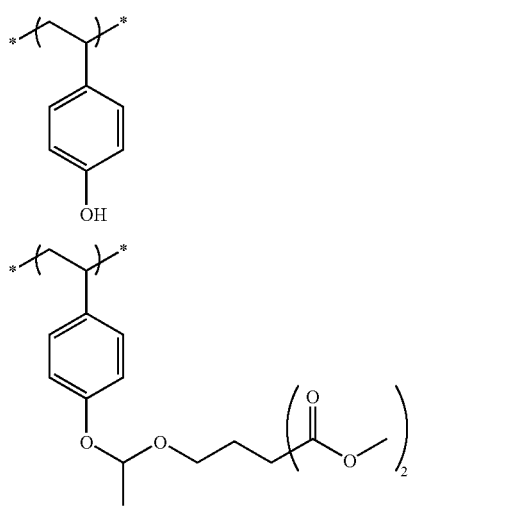
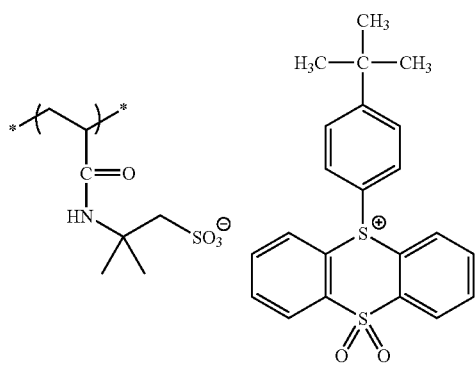
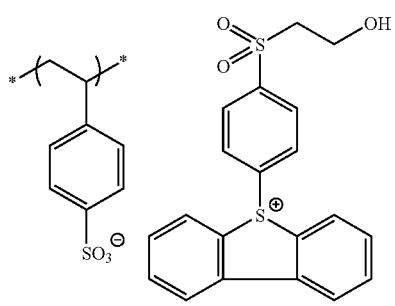
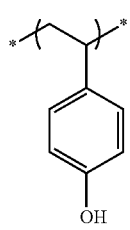
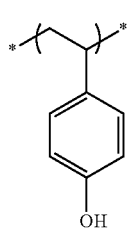

153
-continued
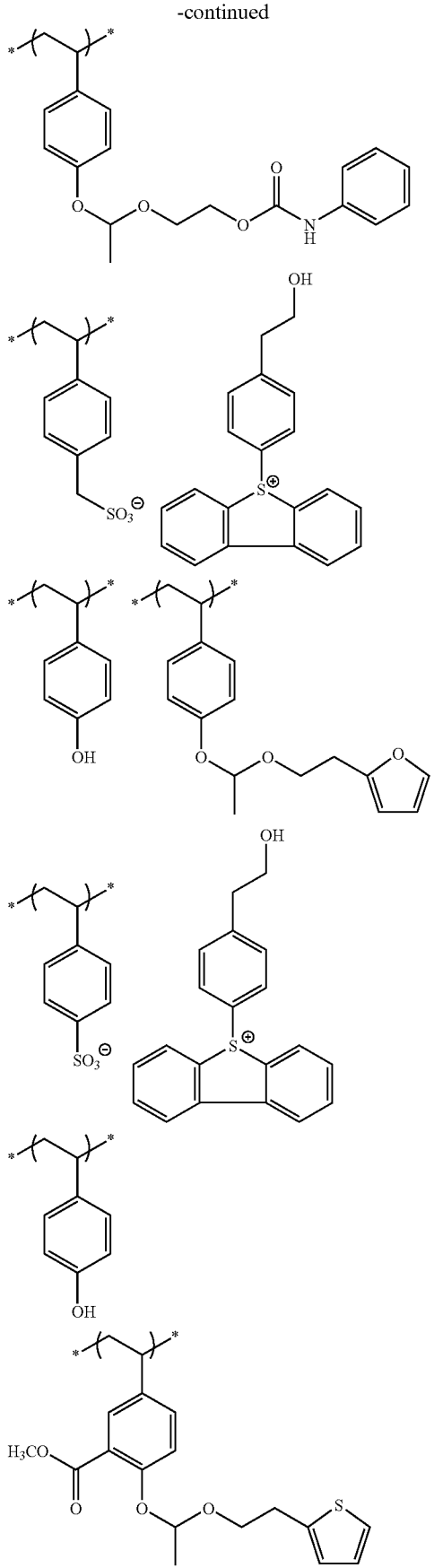
154
-continued
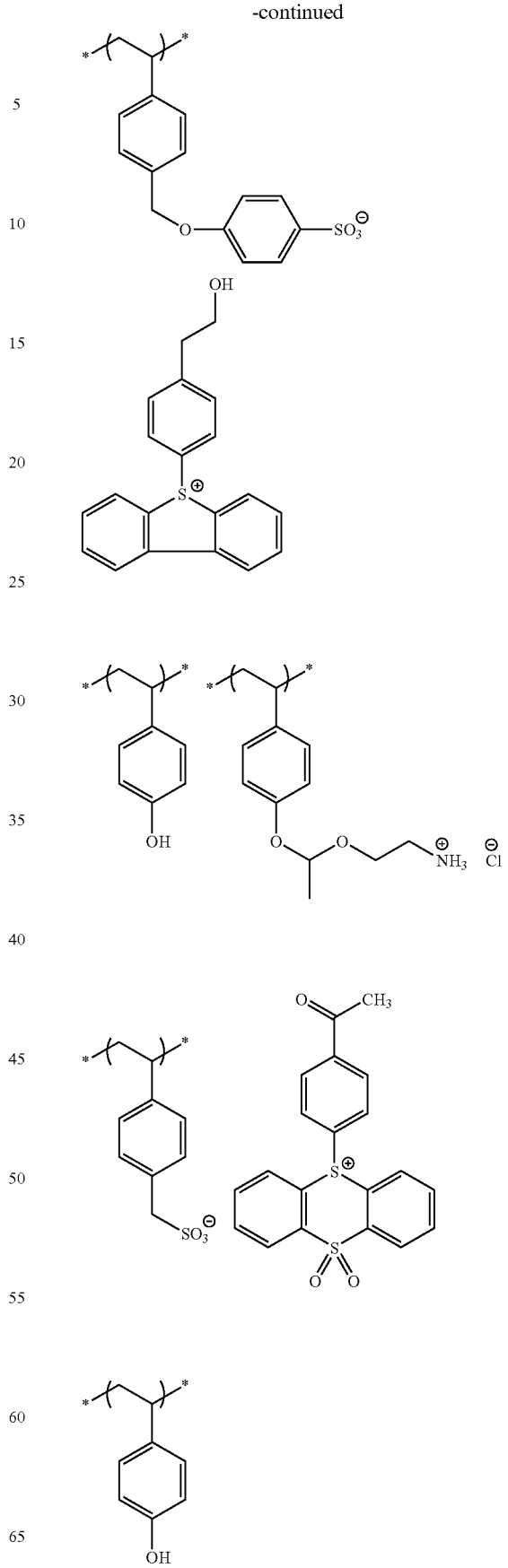

155
-continued
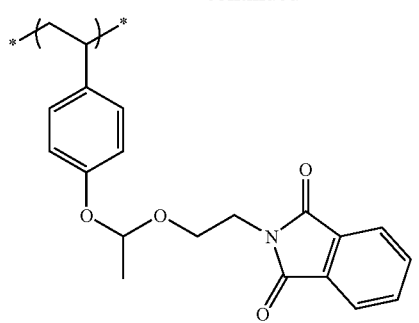
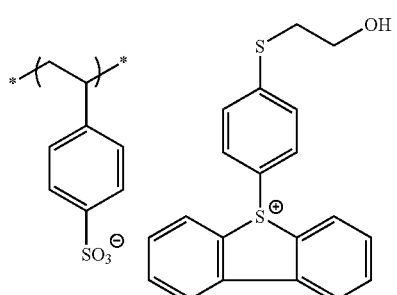
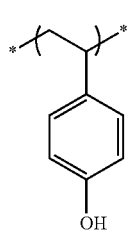
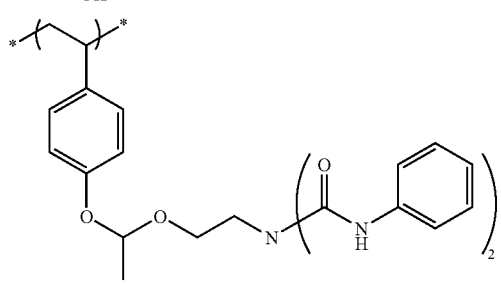
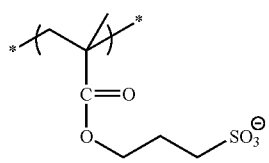
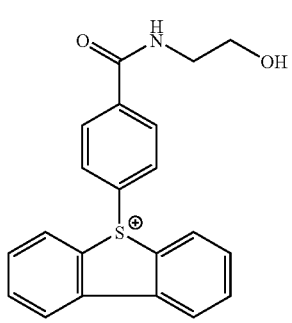
156
-continued
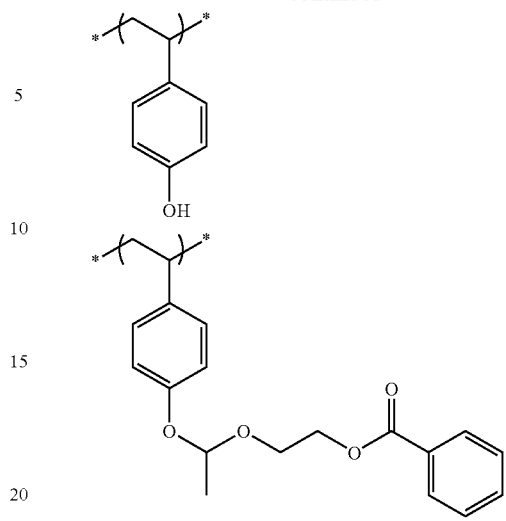
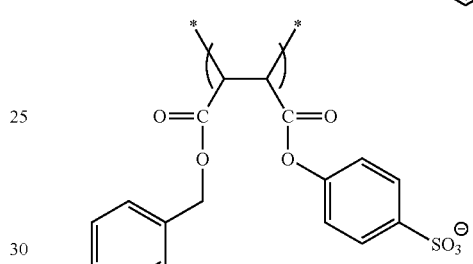
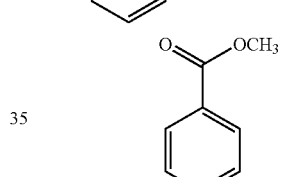
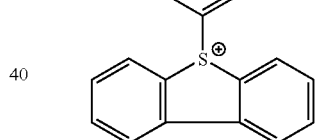
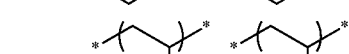
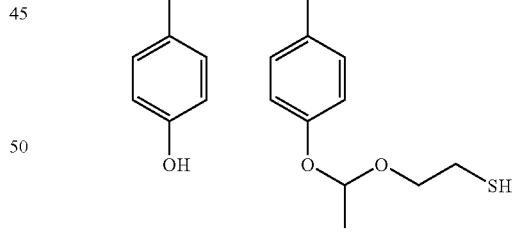
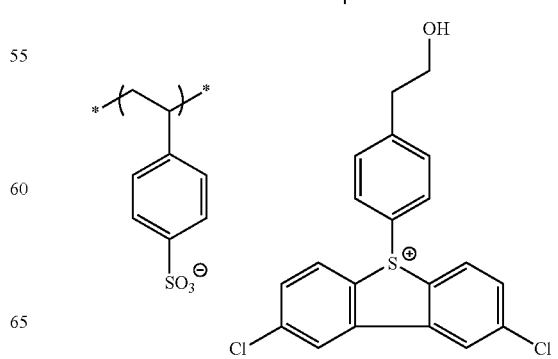

157
-continued
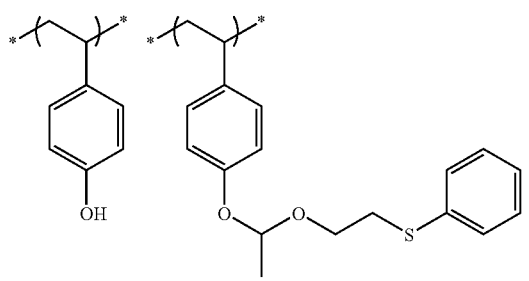
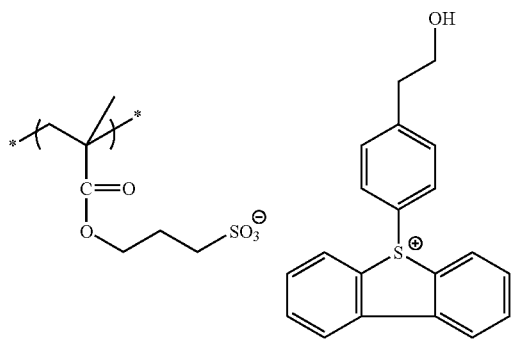
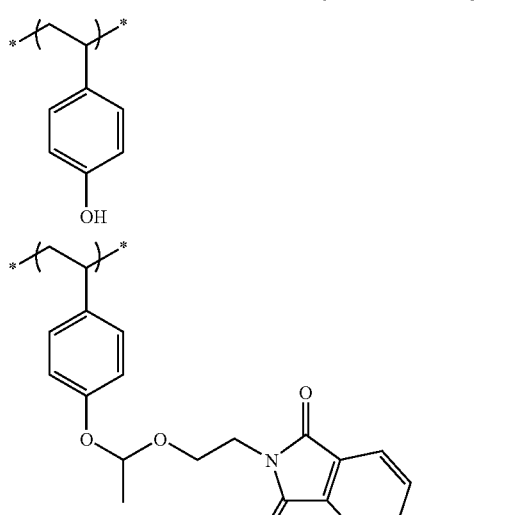
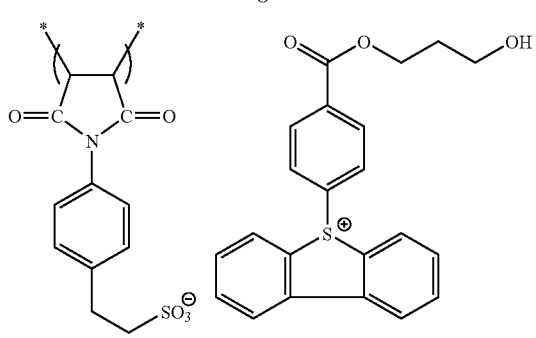
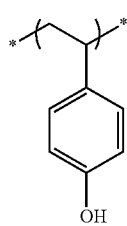
158
-continued
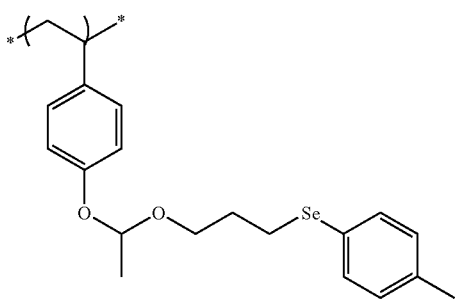
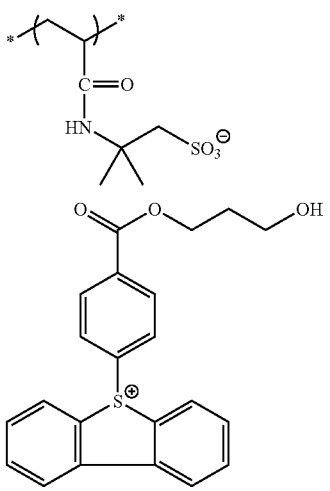
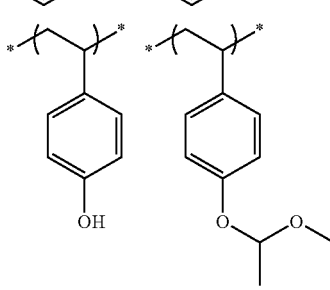
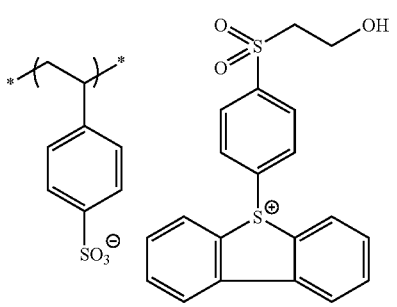
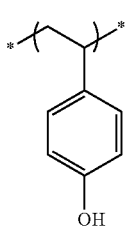

159
-continued
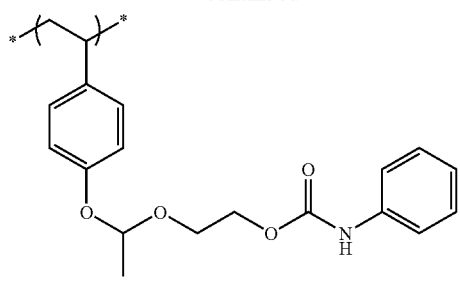
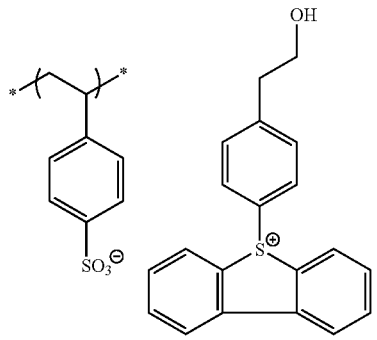
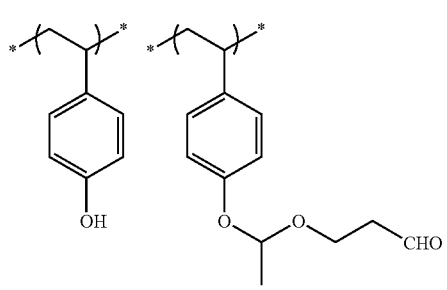
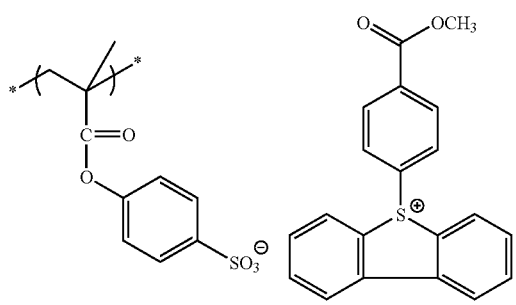
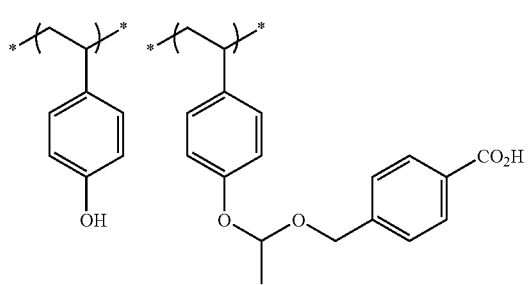
160
-continued
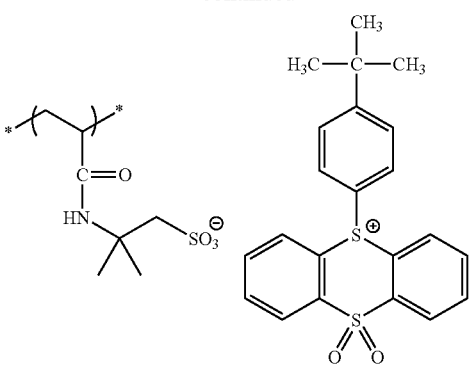
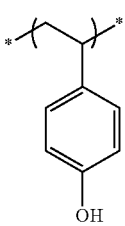
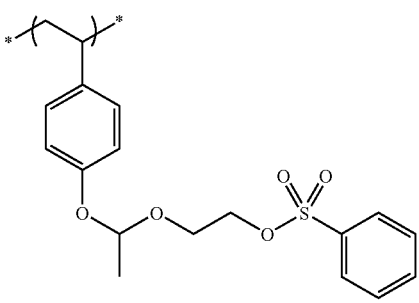
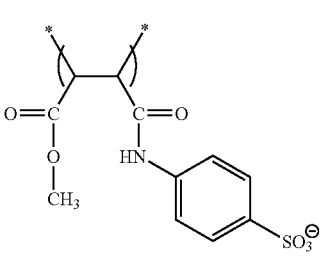
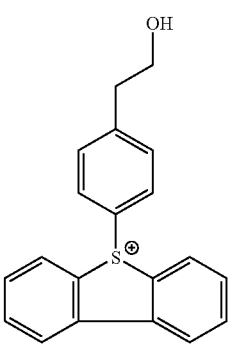 [SMILES: OCCc1ccc(-[s+]2c3ccccc3c3ccccc32)cc1]

161
-continued
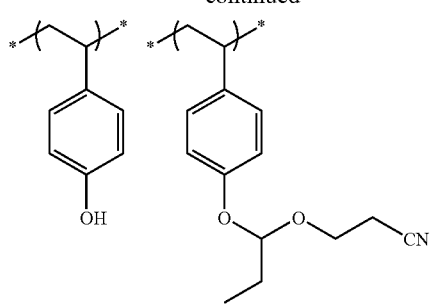
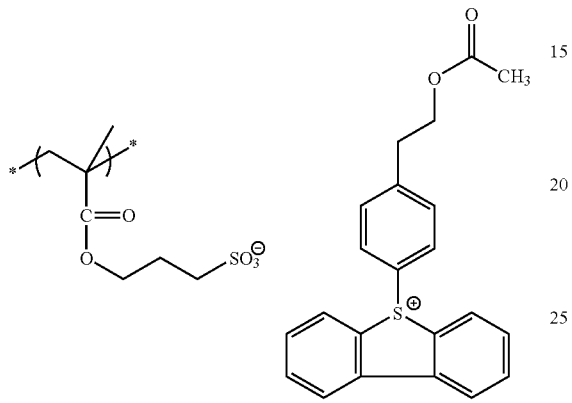
162
-continued
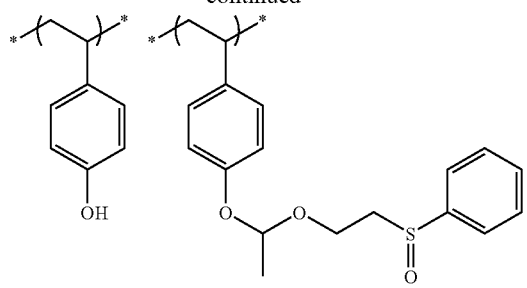
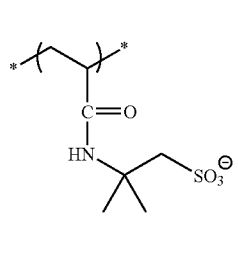
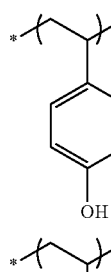
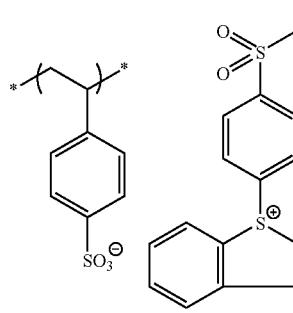
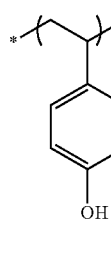

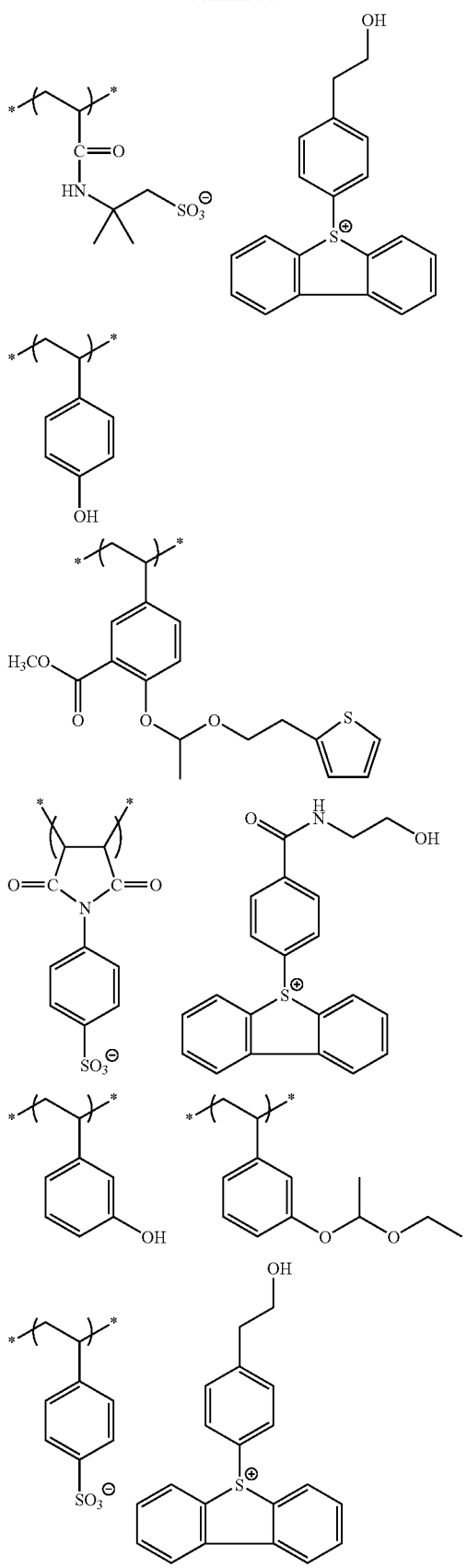
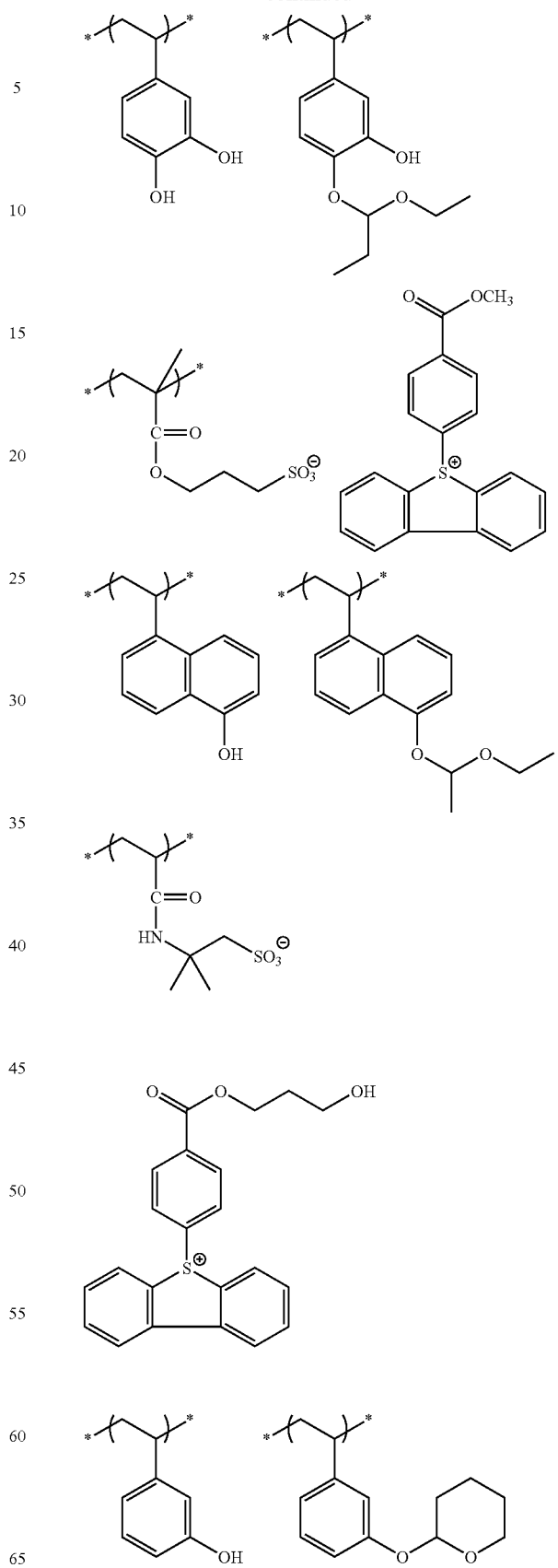

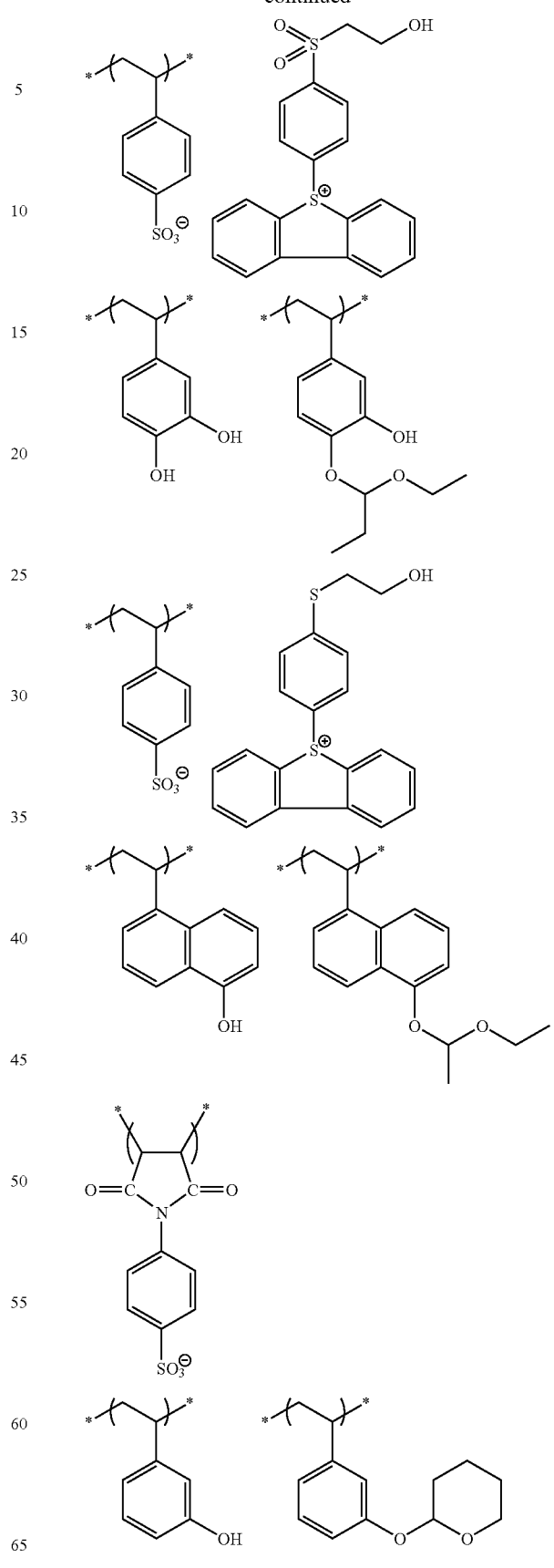

167 -continued
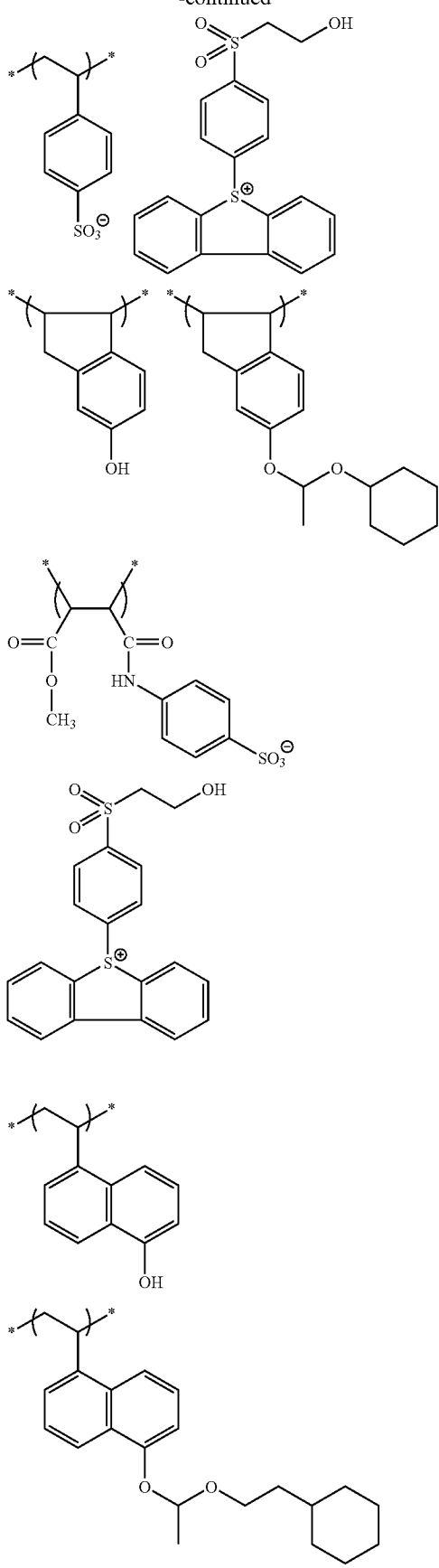
168 -continued
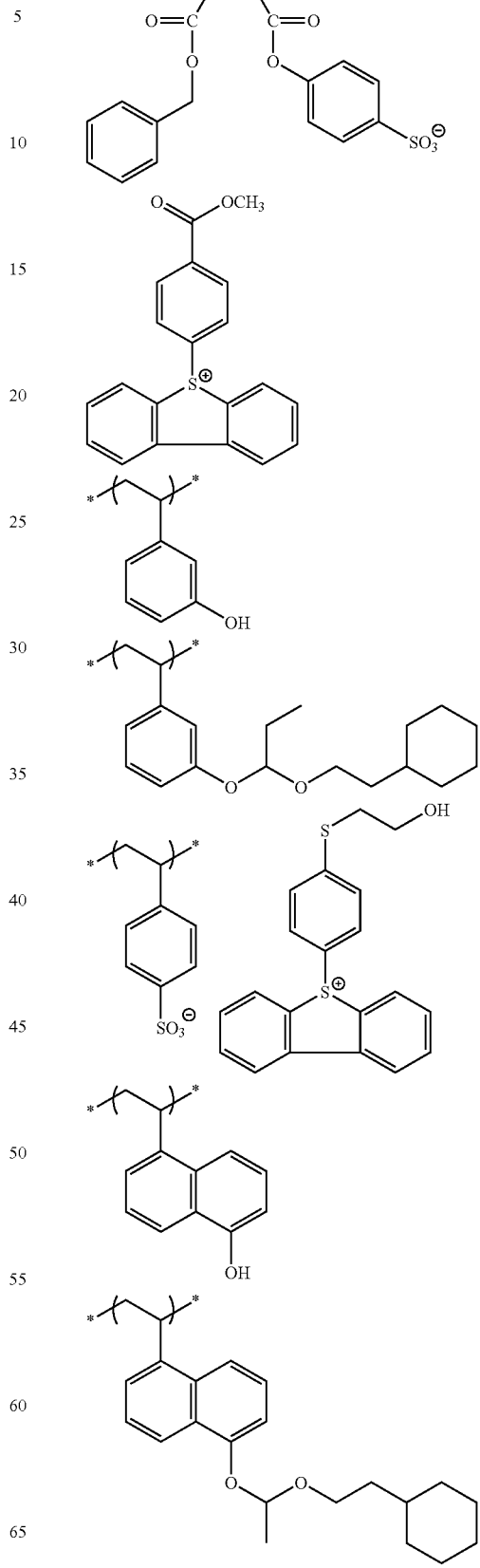

169
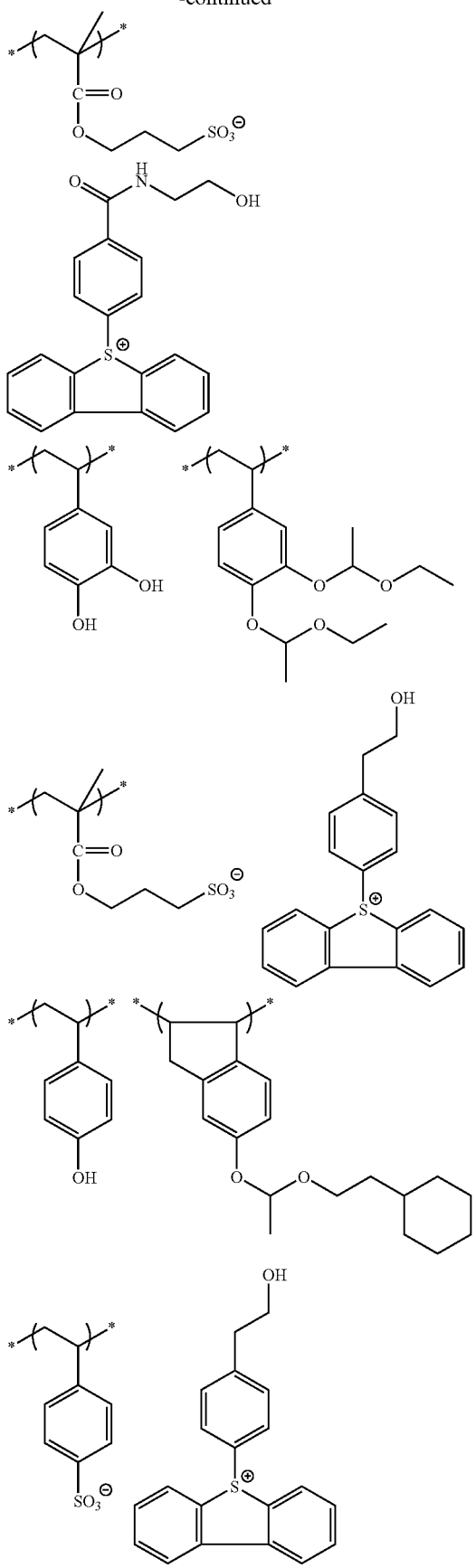
170
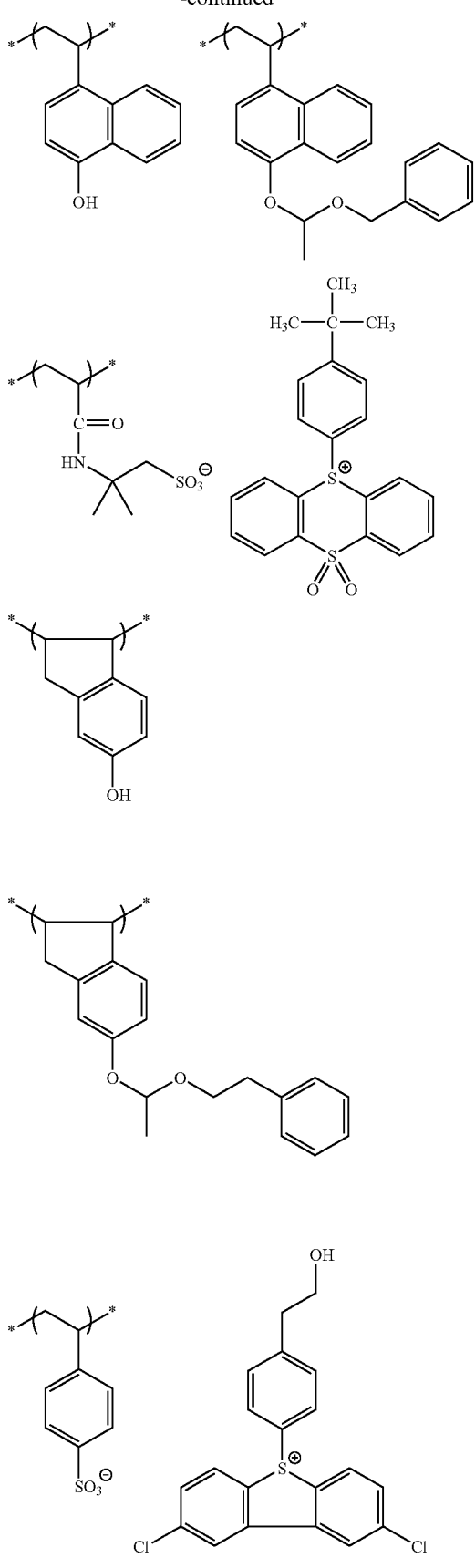

171
-continued
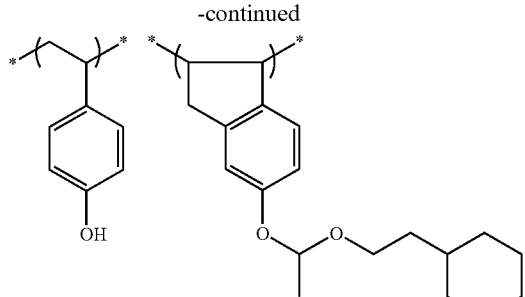
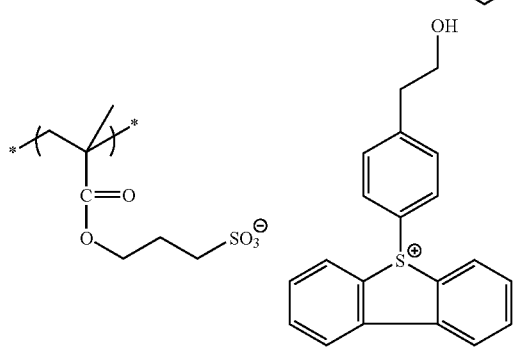
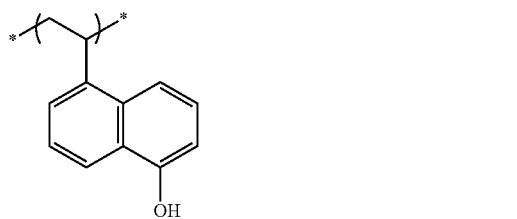
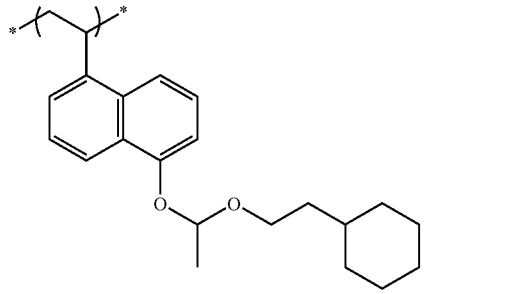
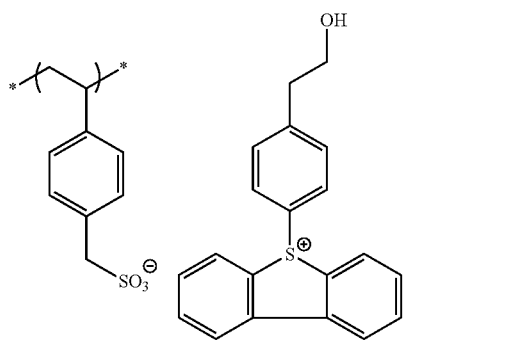
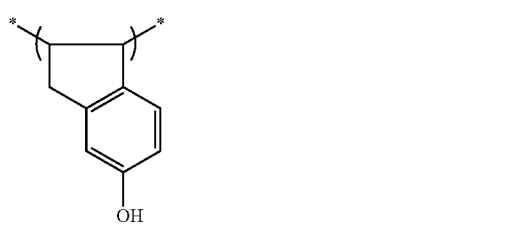
172
-continued
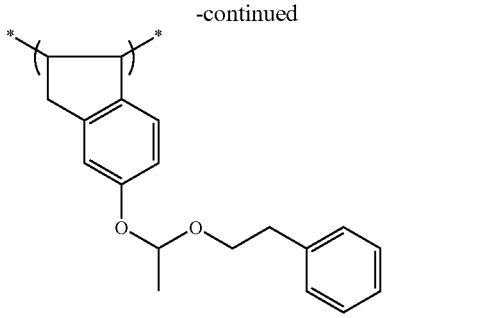
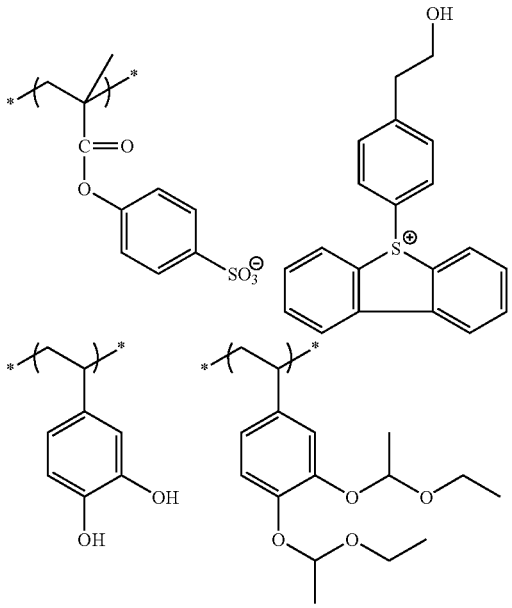
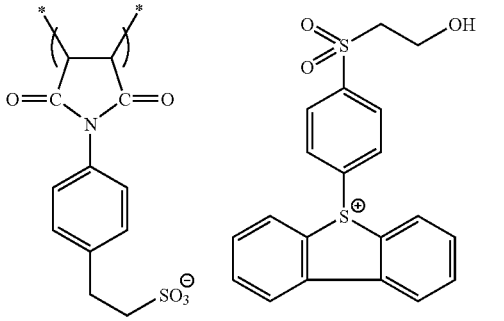
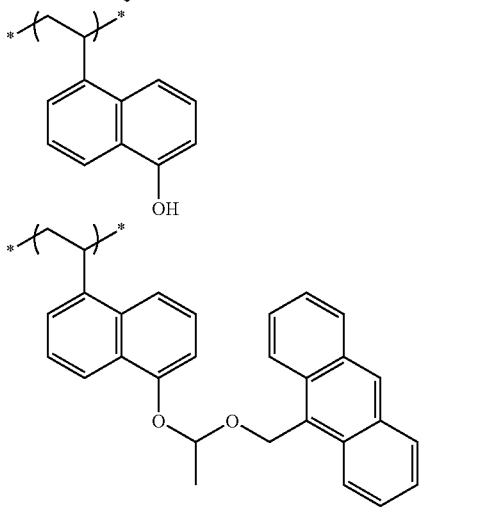

173
-continued
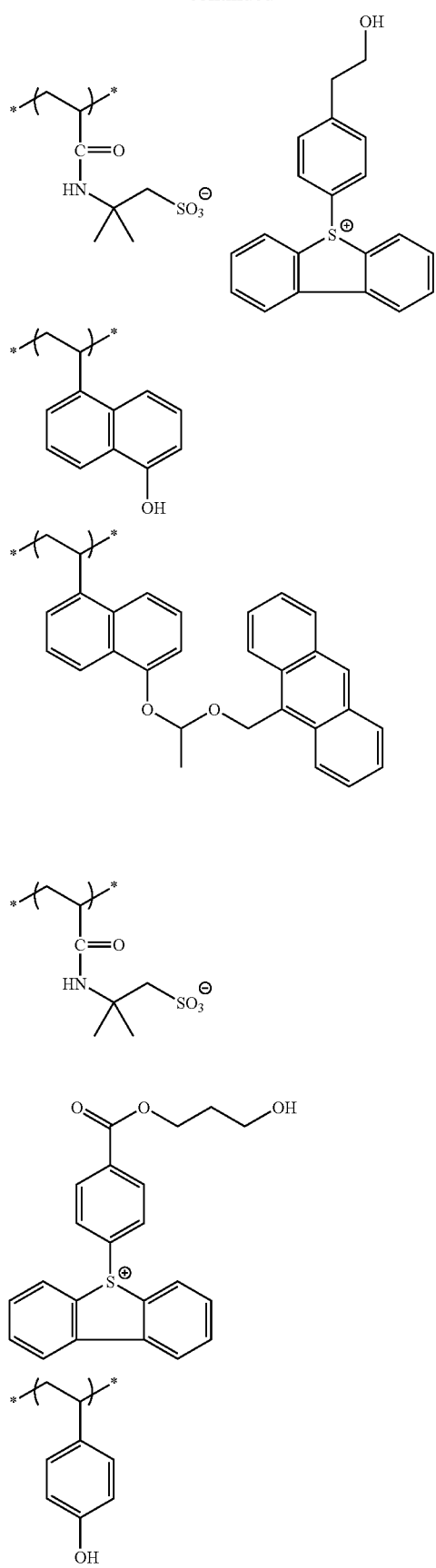
174
-continued
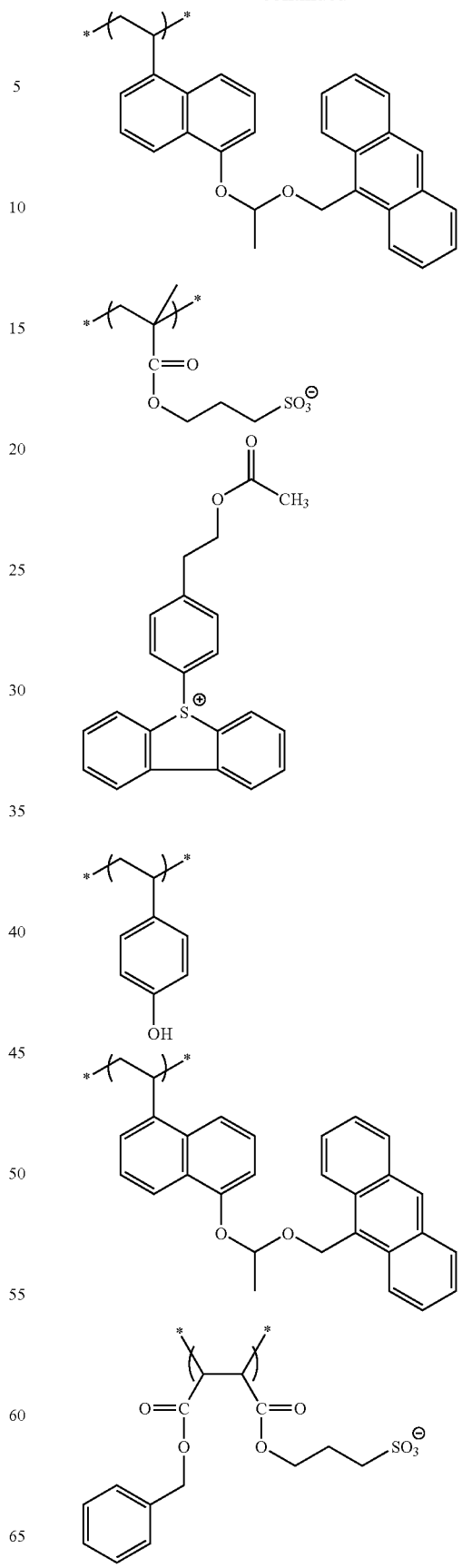

175
-continued
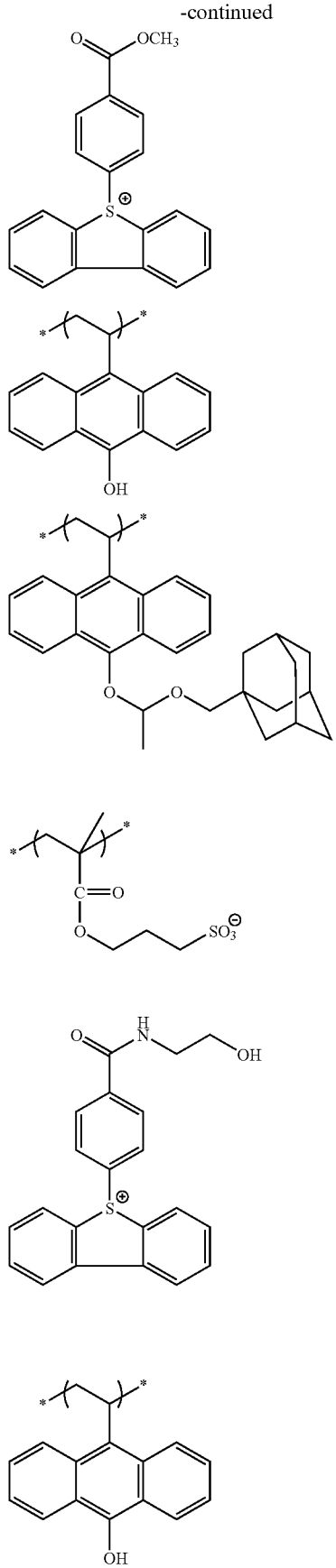
176
-continued
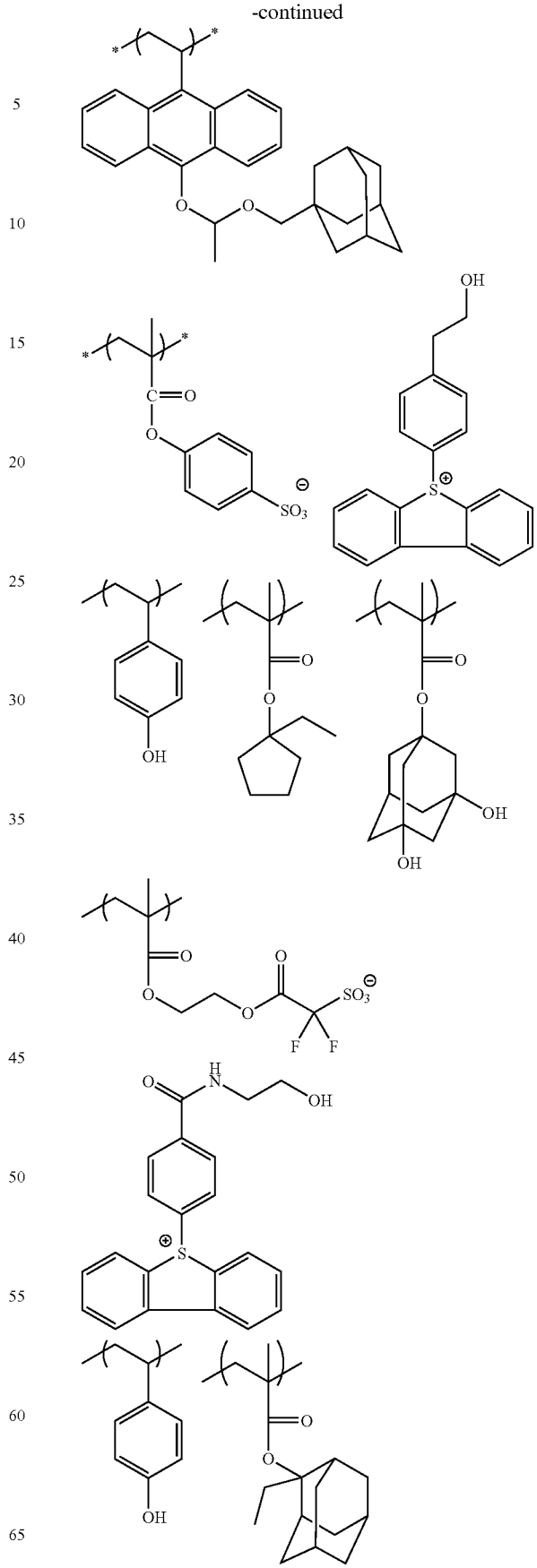

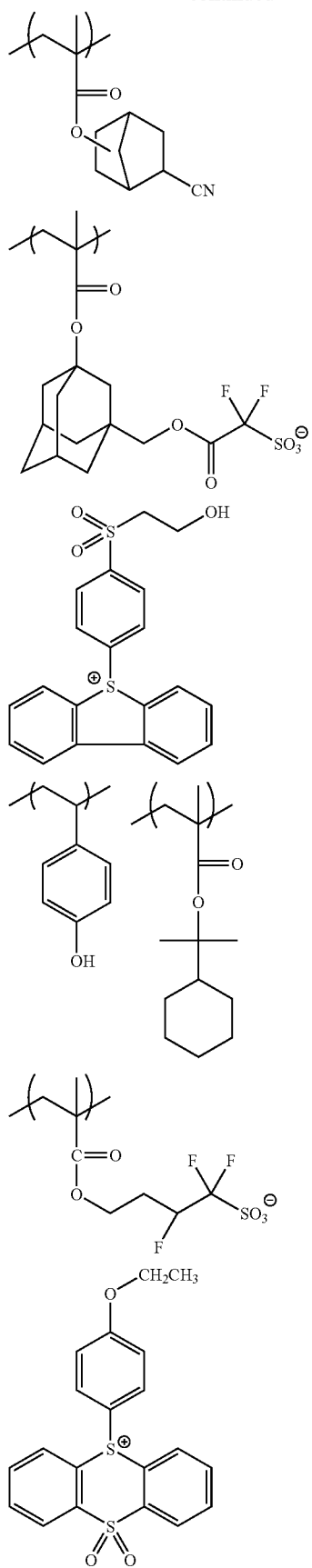
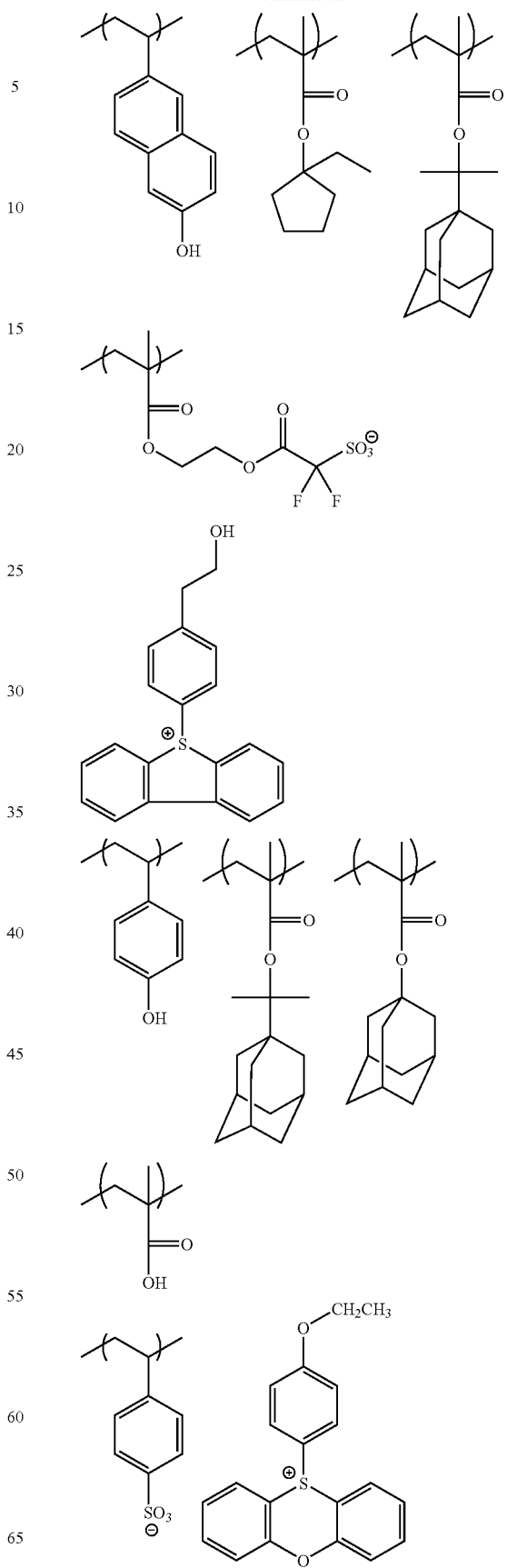

179
-continued
180
-continued
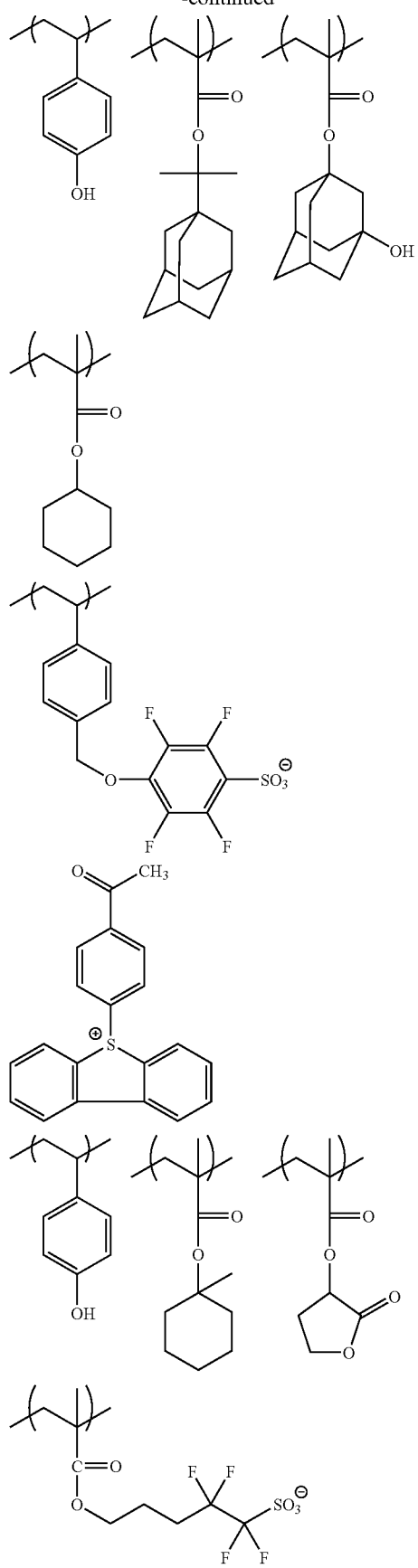
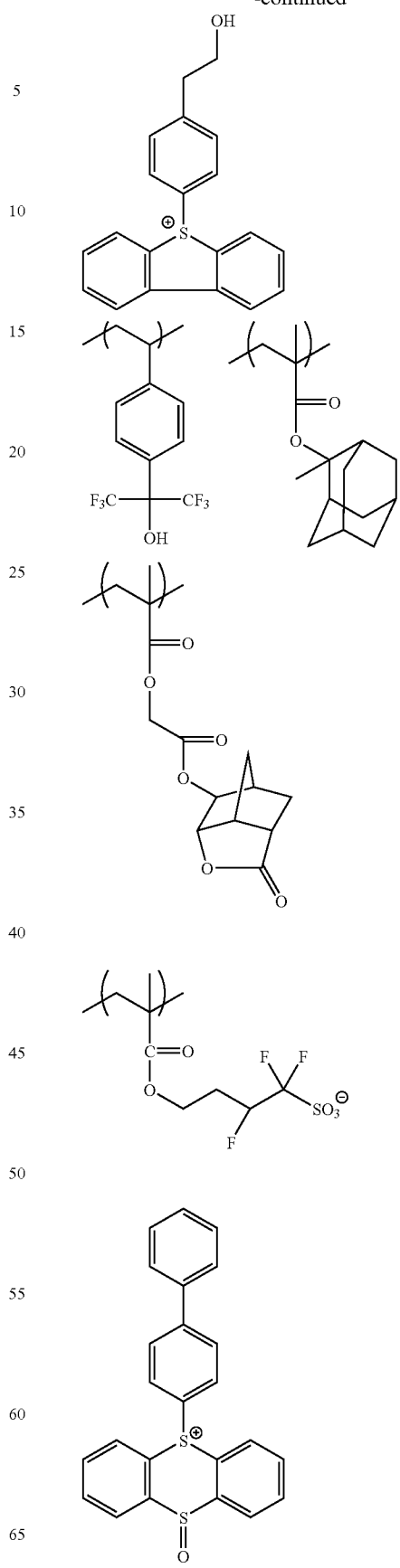

181 182
-continued -continued
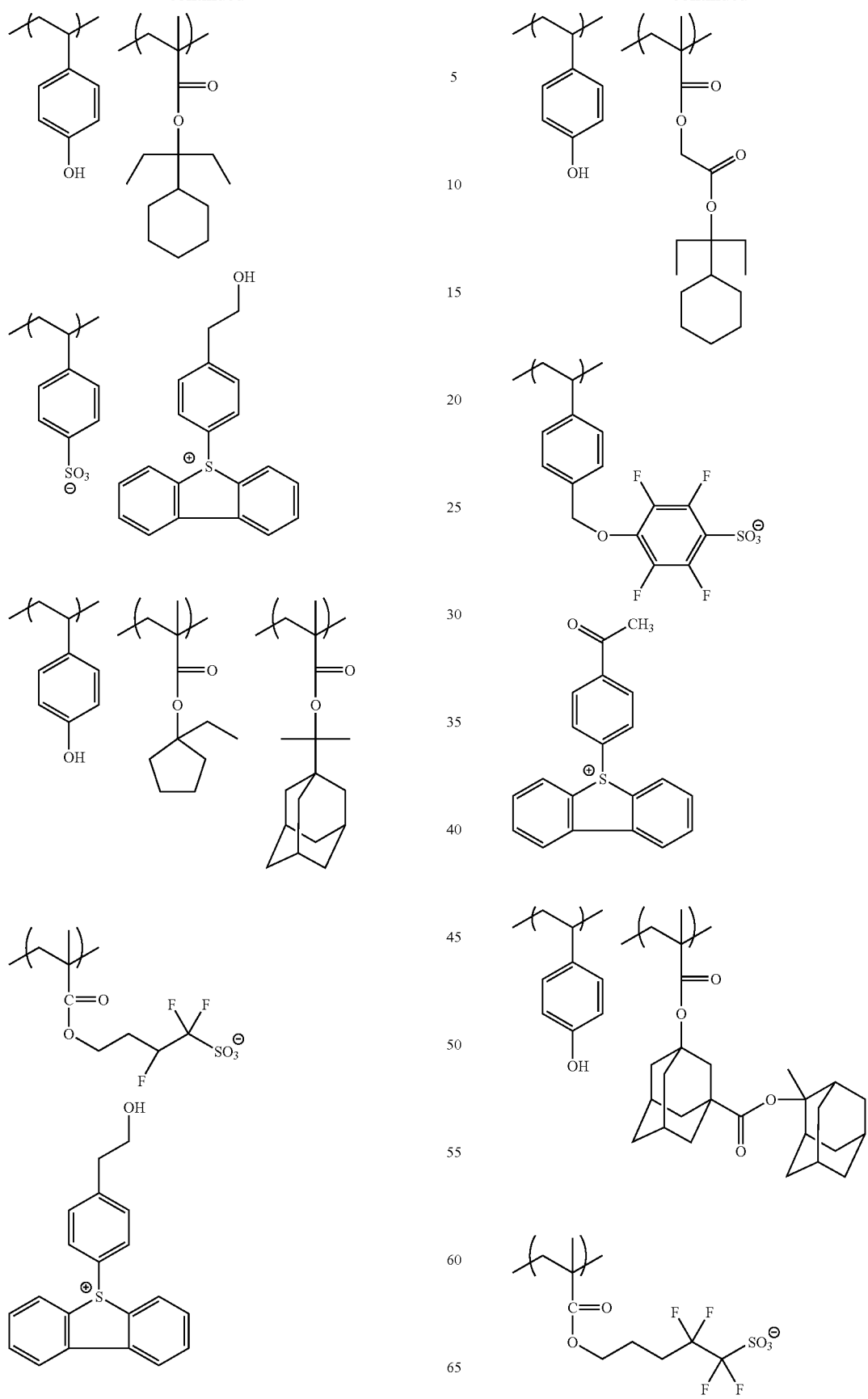

183
-continued
184
-continued
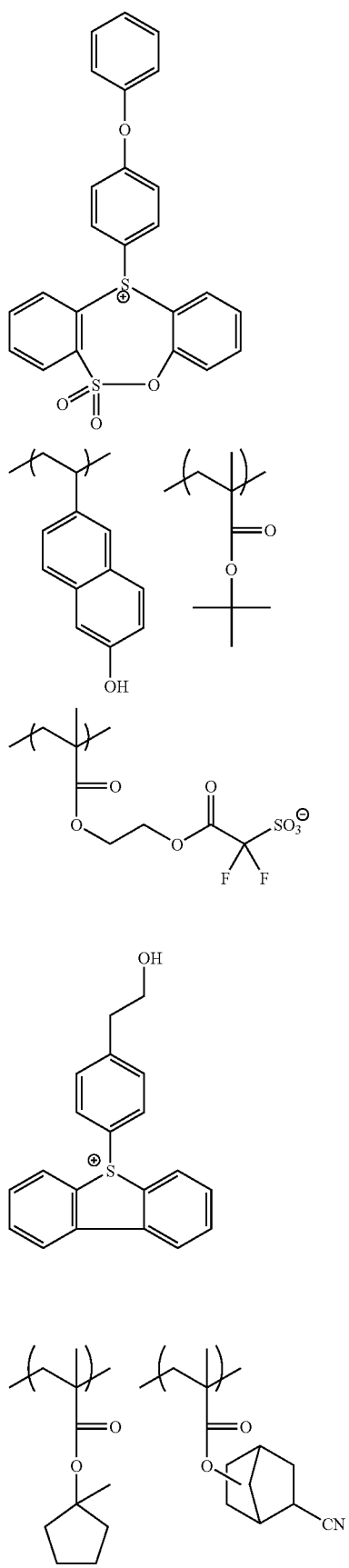
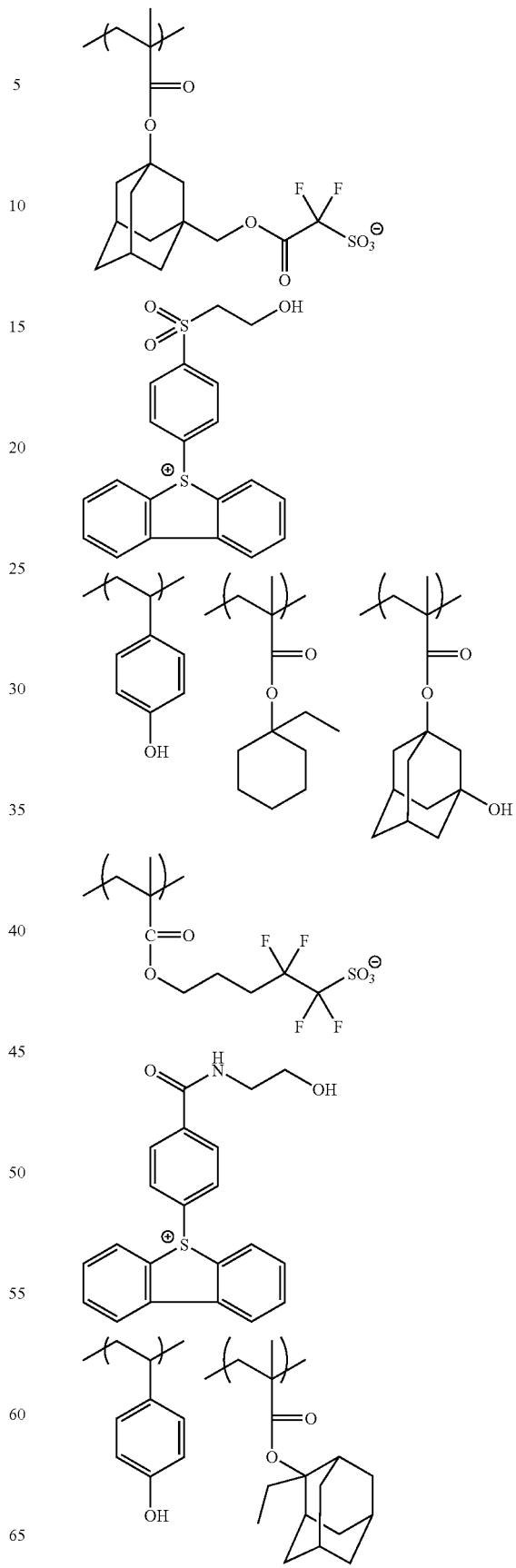

185
-continued
186
-continued
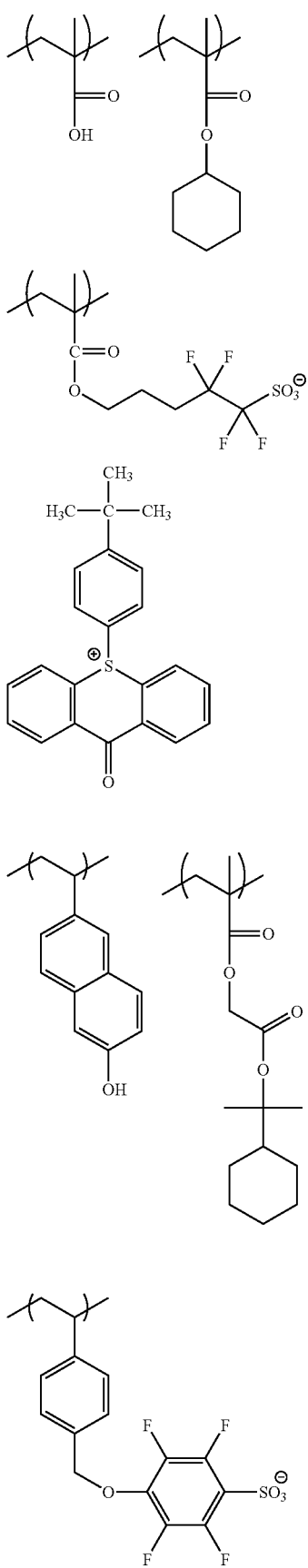
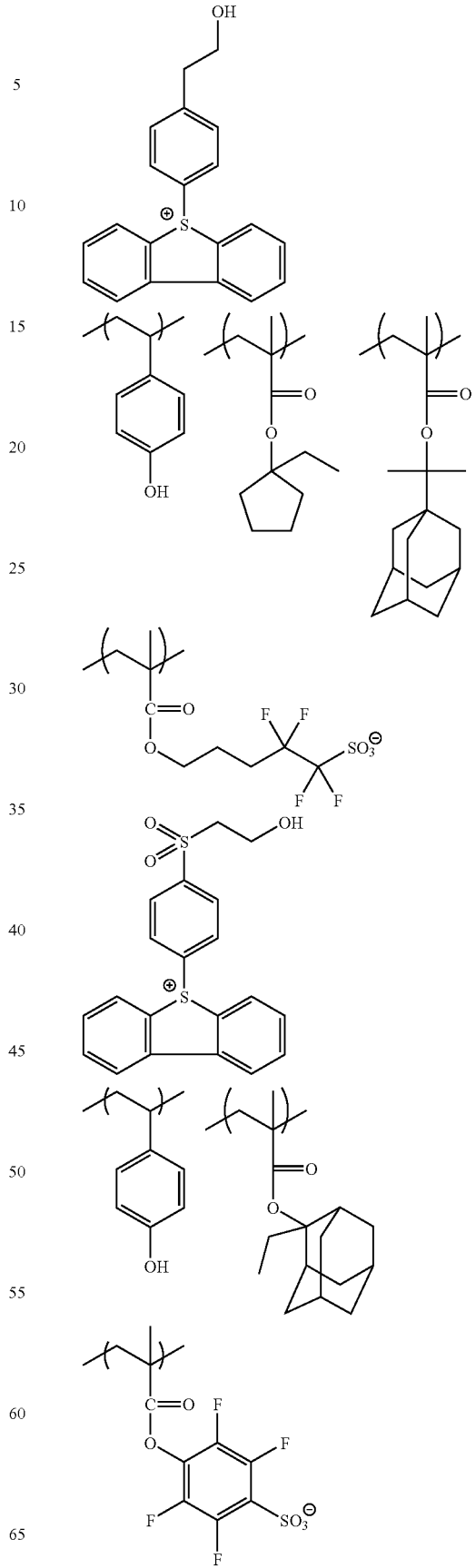

187
-continued
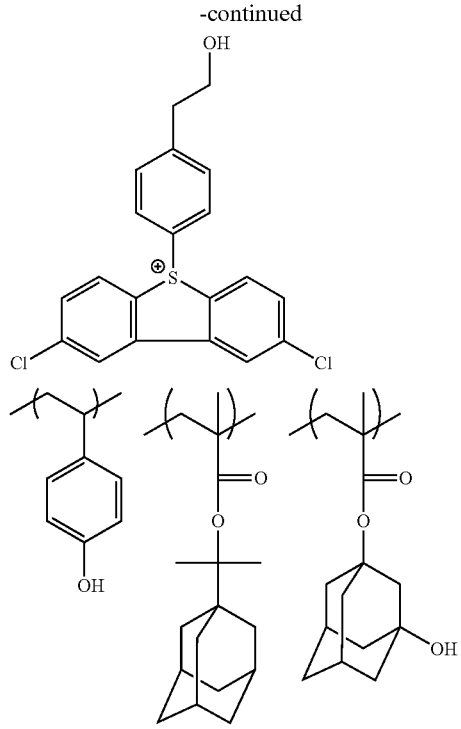
188
-continued
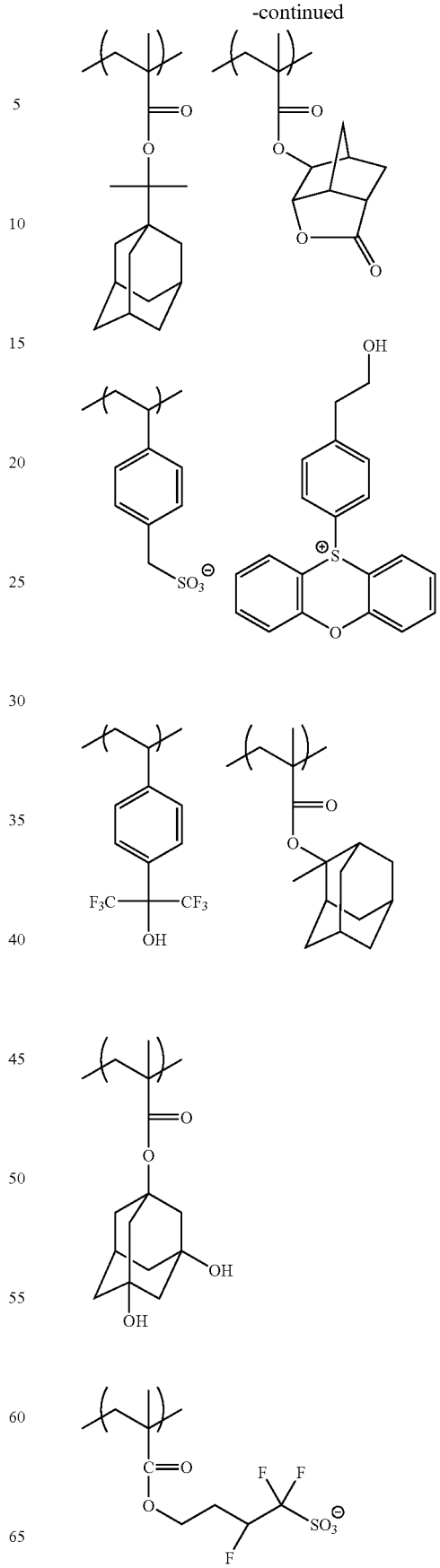

-continued

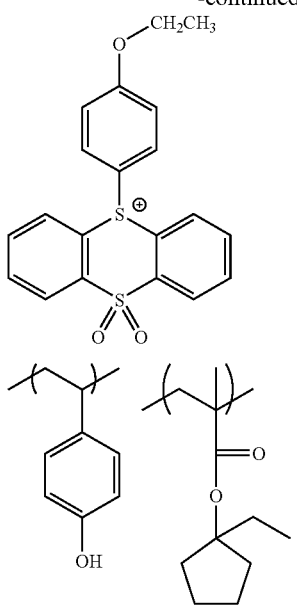

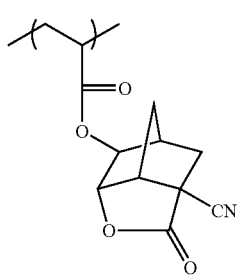

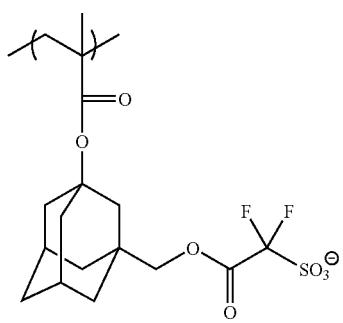

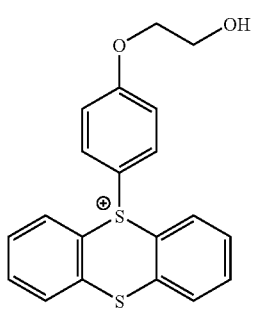

-continued

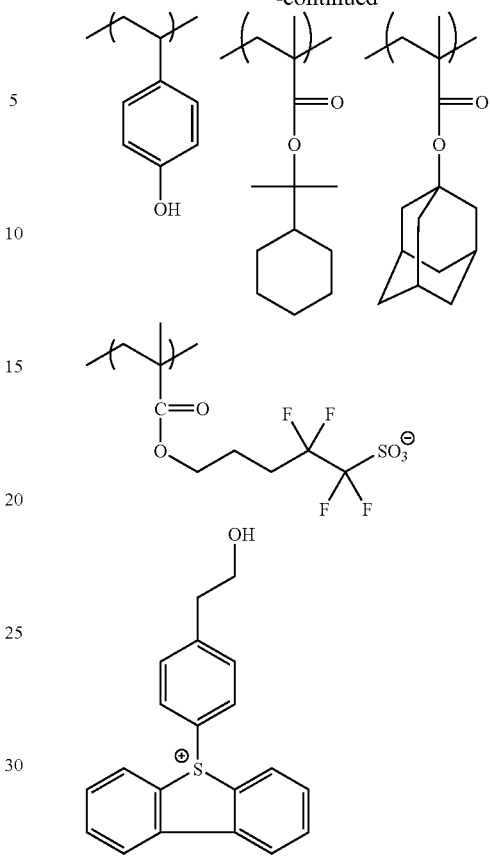

[2] Basic Compound

The actinic ray-sensitive or radiation-sensitive resin composition of the present invention may contain a basic compound for reducing the change of performance with aging from exposure until heating or preventing the acid generated upon exposure from diffusing in the film.

The basic compound is preferably a compound having a structure represented by the following formulae (A) to (E).

(A) $R^{250}-N(R^{251})-R^{252}$ (B) $-N-C(=N-)-$ (C) $=C-N=C-$ (D) $=C-N-$ (E) $R^{253}-C(R^{254})-N-C(R^{255})-R^{256}$

In the formulae, each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20) or an aryl group (preferably having a carbon number of 6 to 20), and $R^{250}$ and $R^{251}$ may combine together to form a ring.

These groups may have a substituent, and the alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

Each of these groups may contain an oxygen atom, a sulfur atom or a nitrogen atom in the alkyl chain.

In the formulae, each of $R^{253}$, $R^{254}$, $R^{255}$ and $R^{256}$ independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these compounds may have a substituent. More preferred examples of the compound include a compound having an imidazole structure, a diazabicyclo structure, an onium hydroxide structure (particularly preferably tetraalkylammonium hydroxide), an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Furthermore, at least one kind of a nitrogen-containing compound selected from a phenoxy group-containing amine compound, a phenoxy group-containing ammonium salt compound, a sulfonic acid ester group-containing amine compound and a sulfonic acid ester group-containing ammonium salt compound is preferred. Examples of these compounds include, but are not limited to, Compounds (C1-1) to (C3-3) illustrated in paragraph [0066] of U.S. Patent Application Publication No. 2007/0224539.

A photosensitive basic compound may also be used as the basic compound. The photosensitive basic compound is not particularly limited, but compounds described, for example, in JP-T-2003-524799 (the term "JP-T" as used herein means a "published Japanese translation of a PCT patent application") and *J. Photopolym. Sci. & Tech.*, Vol. 8, pp. 543-553 (1995), may be used.

The molecular weight of the basic compound is preferably from 250 to 2,000, more preferably from 400 to 1,000.

These basic compounds are used individually or in combination of two or more thereof.

The actinic ray-sensitive or radiation-sensitive resin composition of the present invention may or may not contain a basic compound. In the case of containing a basic compound, the content of the basic compound is preferably from 0.01 to 8.0 mass %, more preferably from 0.05 to 5.0 mass %, still more preferably from 0.1 to 4.0 mass %, based on the entire solid content of the actinic ray-sensitive or radiation-sensitive resin composition.

[3] Resin Capable of Decomposing by the Action of an Acid to Increase the Dissolution Rate in an Aqueous Alkali Solution The actinic ray-sensitive or radiation-sensitive resin composition of the present invention may contain a resin capable of decomposing by the action of an acid to increase the dissolution rate in an aqueous alkali solution, in addition to the resin (P).

The resin capable of decomposing by the action of an acid to increase the dissolution rate in an aqueous alkali solution (hereinafter, sometimes referred to as an "acid-decomposable resin") is a resin having a group capable of decomposing by the action of an acid to produce an alkali-soluble group (acid-decomposable group), in either one or both of the main and side chains of the resin. Of these, a resin having an acid-decomposable group in the side chain is preferred.

The acid-decomposable resin can be obtained, as disclosed in European Patent 254853 and JP-A-2-25850, JP-A-3-223860, JP-A-4-251259 and the like, by reacting an alkali-soluble resin with a precursor of a group capable of decomposing by the action of an acid or copolymerizing various monomers with an alkali-soluble resin monomer having bonded thereto a group capable of decomposing by the action of an acid.

The acid-decomposable group is preferably a group where in a resin having an alkali-soluble group such as —COOH group and —OH group, the hydrogen atom of the alkali-soluble group is substituted by a group capable of leaving by the action of an acid.

Specific preferred examples of the acid-decomposable group are the same as those of the acid-decomposable group described in regard to the resin of the present invention (for example, the acid-decomposable group described as the repeating unit (B) in the resin (P)).

The resin having an alkali-soluble group is not particularly limited, but examples thereof include a resin containing a poly(o-hydroxystyrene), poly(m-hydroxystyrene), a poly(p-hydroxystyrene), a copolymer thereof, a hydrogenated poly(hydroxystyrene) or a poly(hydroxystyrene) having a substituent represented by the following structure and a phenolic hydroxyl group, an alkali-soluble resin containing a hydroxystyrene structure unit, such as styrene-hydroxystyrene copolymer, α-methylstyrene-hydroxystyrene copolymer and hydrogenated novolak resin, and an alkali-soluble resin containing a carboxyl group-containing repeating unit such as (meth)acrylic acid and norbornenecarboxylic acid.

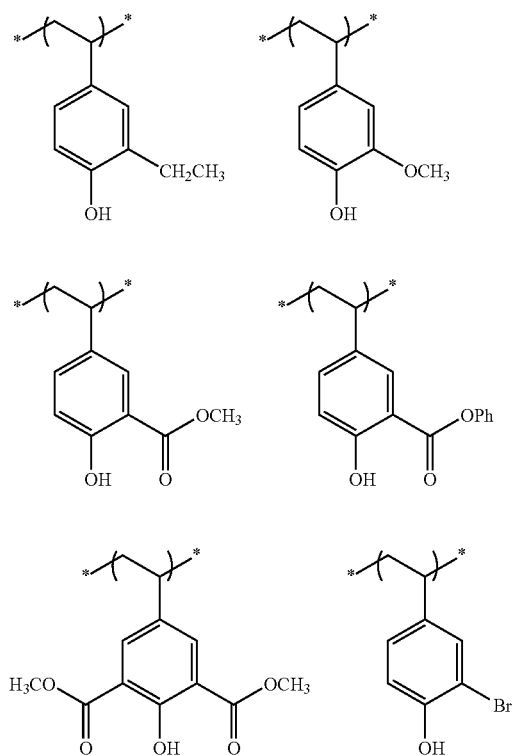

-continued

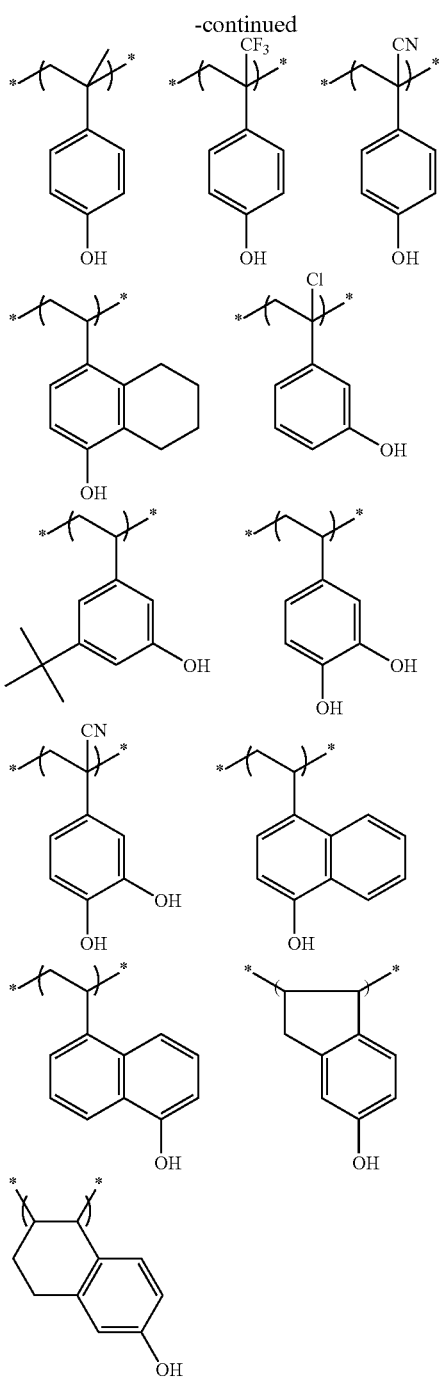

The alkali dissolution rate of the alkali-soluble resin is preferably 170 Å/sec or more, more preferably 330 Å/sec or more, as measured (at 23° C.) in an aqueous 2.38 mass % tetramethylammonium hydroxide (TMAH) solution. More specifically, only the alkali-soluble resin is dissolved in a solvent such as propylene glycol monomethyl ether acetate (PGMEA) to prepare a composition having a solid content concentration of 4 mass %, the composition is coated on a silicon wafer to form a coating (film thickness: 100 nm), and the time (second) until the coating is completely dissolved in the aqueous TMAH solution is measured, whereby the above-described alkali dissolution rate can be obtained.

The alkali-soluble resin monomer is not particularly limited, but examples thereof include an alkylcarbonyloxysty- rene (e.g., tert-butoxycarbonyloxystyrene), an alkoxystyrene (e.g., 1-alkoxyethoxystyrene, tert-butoxystyrene) and a (meth)acrylic acid tertiary alkyl ester (e.g., tert-butyl(meth) acrylate, 2-alkyl-2-adamantyl(meth)acrylate, dialkyl (1-adamantyl)methyl(meth)acrylate).

The content of the group capable of decomposing by the action of an acid is expressed by B/(B+S) using the number (B) of repeating units having a group capable of decomposing by the action of an acid and the number (S) of repeating units having an alkali-soluble group not protected by a group capable of leaving by the action of an acid, in the resin. The content is preferably from 0.01 to 0.7, more preferably from 0.05 to 0.50, still more preferably from 0.05 to 0.40.

The acid-decomposable resin is not particularly limited but is preferably a resin containing a repeating unit having an aromatic group, more preferably an acid-decomposable resin containing hydroxystyrene as a repeating unit (for example, a poly(hydroxystyrene/hydroxystyrene protected by an acid-decomposable group) and a poly(hydroxystyrene/(meth) acrylic acid protected by an acid-decomposable group)).

In particular, the acid-decomposable resin is preferably a resin containing a repeating unit represented by the following formula (VI) and a repeating unit represented by formula (I).

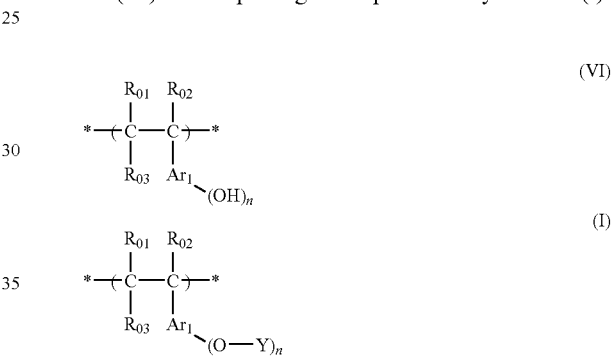

Formula (VI) is the same as the above-described formula (VI), and formula (I) is the same as the above-described formula (I).

Also, the acid-decomposable resin may contain a repeating unit derived from other polymerizable monomers.

The content of the repeating unit derived from other polymerizable monomers in the resin is generally 50 mol % or less, preferably 30 mol % or less, based on all repeating units. The repeating unit derived from other polymerizable monomers, which can be used, includes the same repeating units as the above-described repeating unit derived from other polymerizable monomers.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the acid-decomposable resin.

The content of the repeating unit having an acid-decomposable group is preferably from 3 to 95 mol %, more preferably from 5 to 90 mol %, still more preferably from 10 to 85 mol %, based on all repeating units constituting the acid-decomposable resin.

The weight average molecular weight of the acid-decomposable resin (A) preferably 50,000 or less, more preferably from 1,000 to 20,000, still more preferably from 1,000 to 10,000, in terms of polystyrene by the GPC method.

The polydispersity (Mw/Mn) of the acid-decomposable resin is preferably from 1.0 to 3.0, more preferably from 1.05 to 2.0, still more preferably from 1.1 to 1.7.
Two or more kinds of acid-decomposable resins may be used in combination.
Specific preferred examples of acid-decomposable resin are set forth below, but the present invention is not limited thereto.
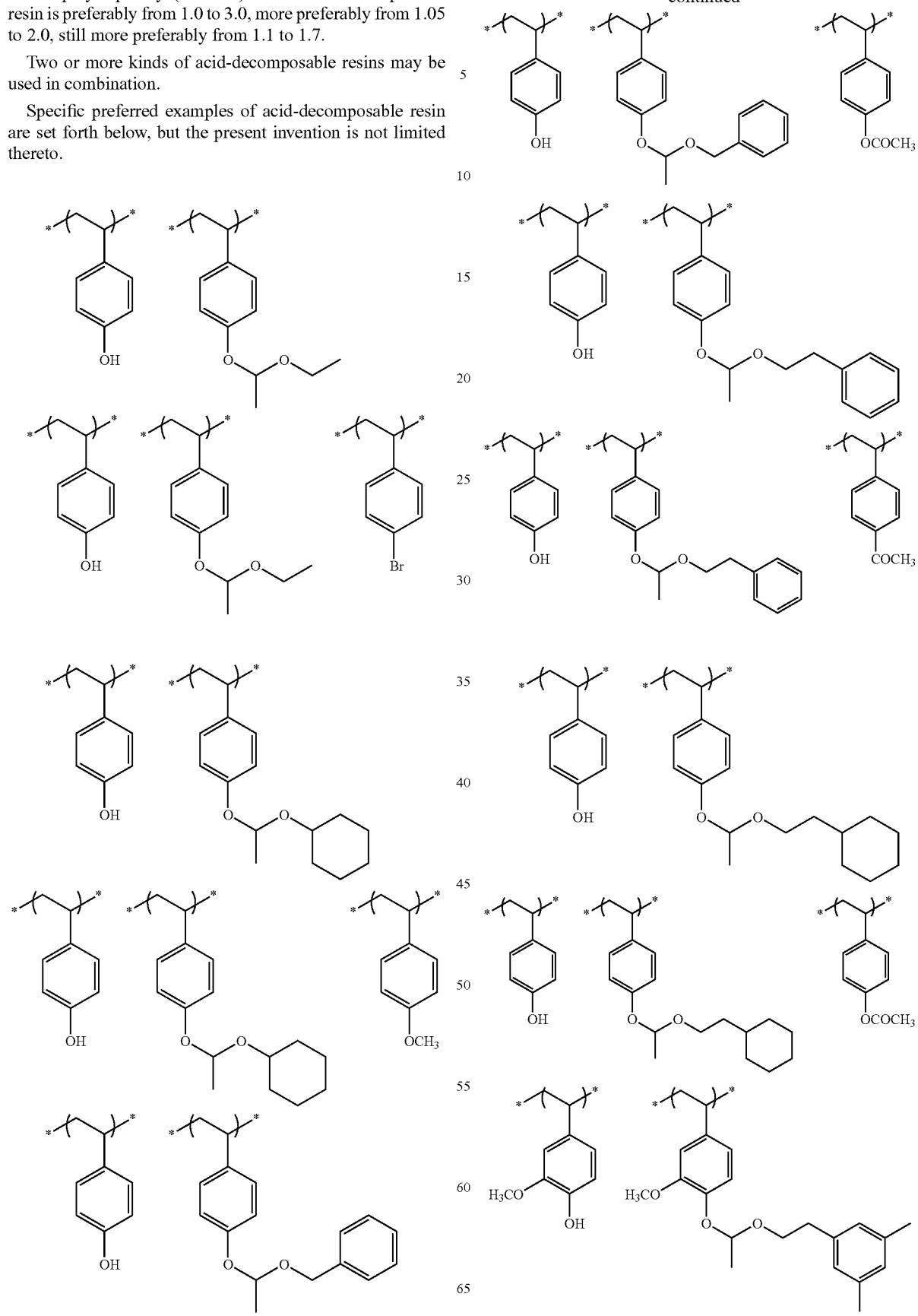

197
-continued
198
-continued
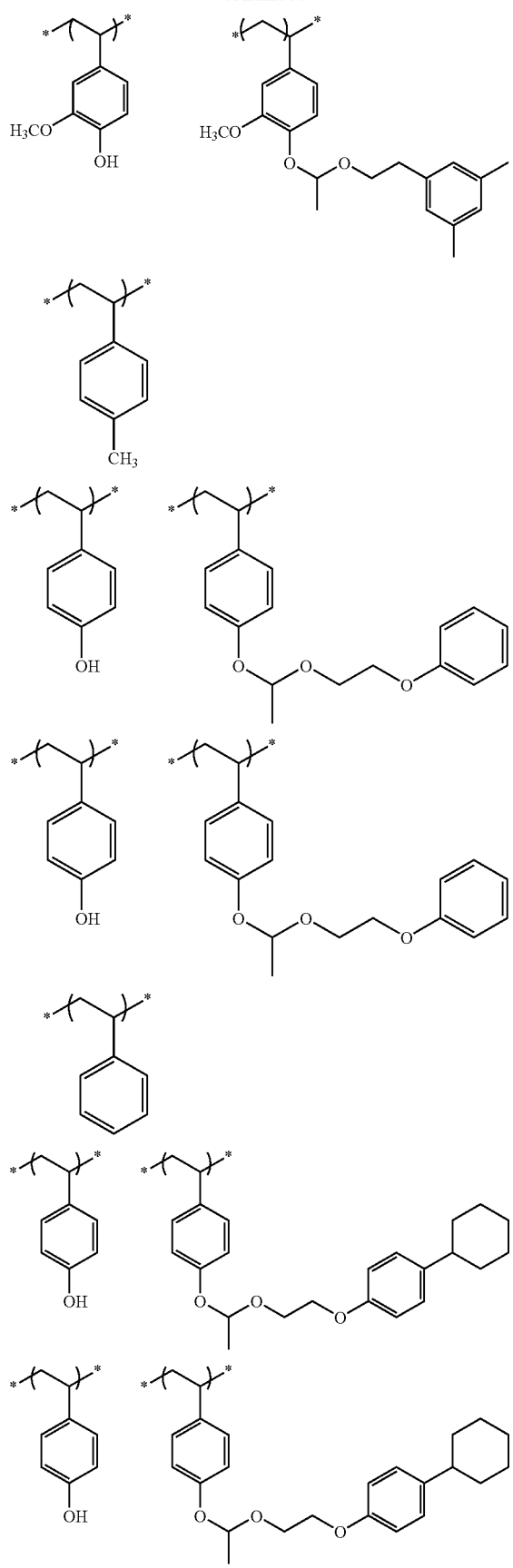
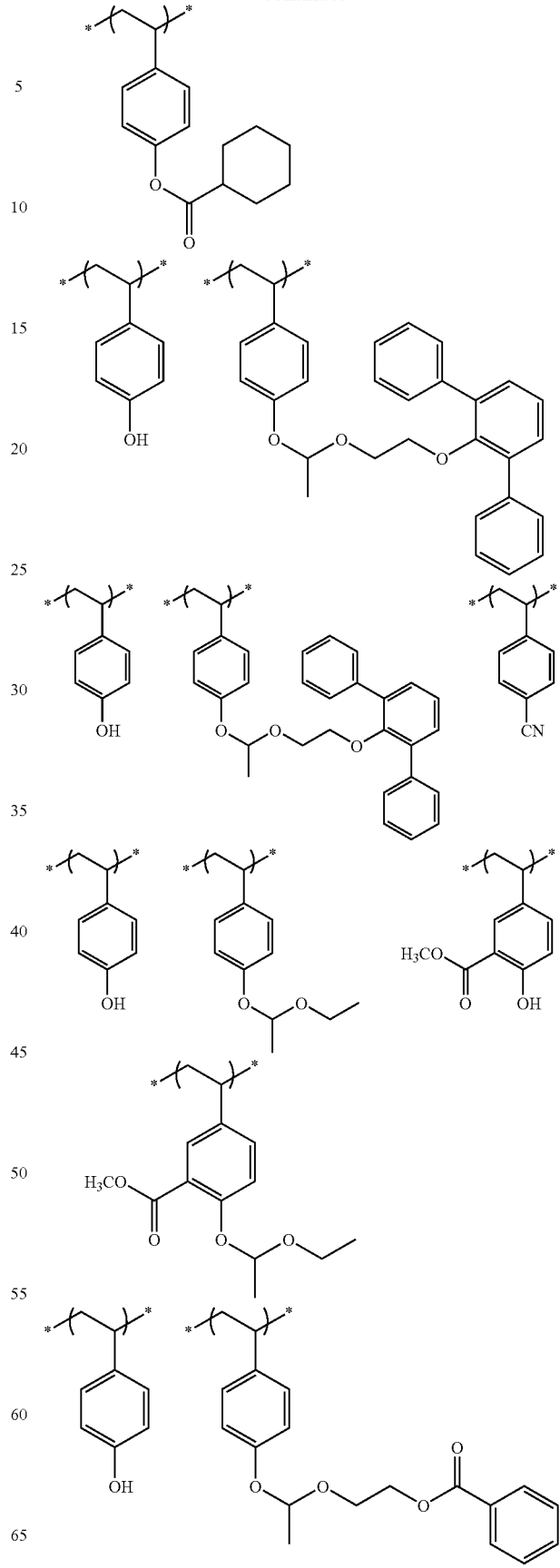

199
-continued
200
-continued
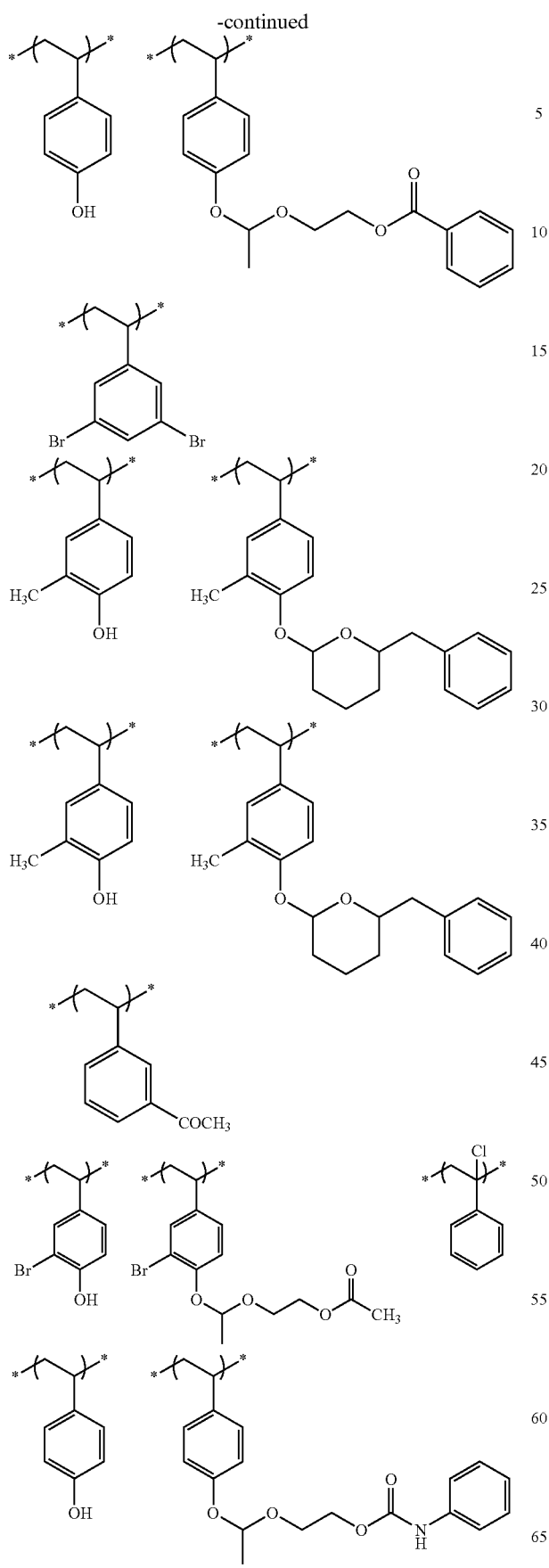
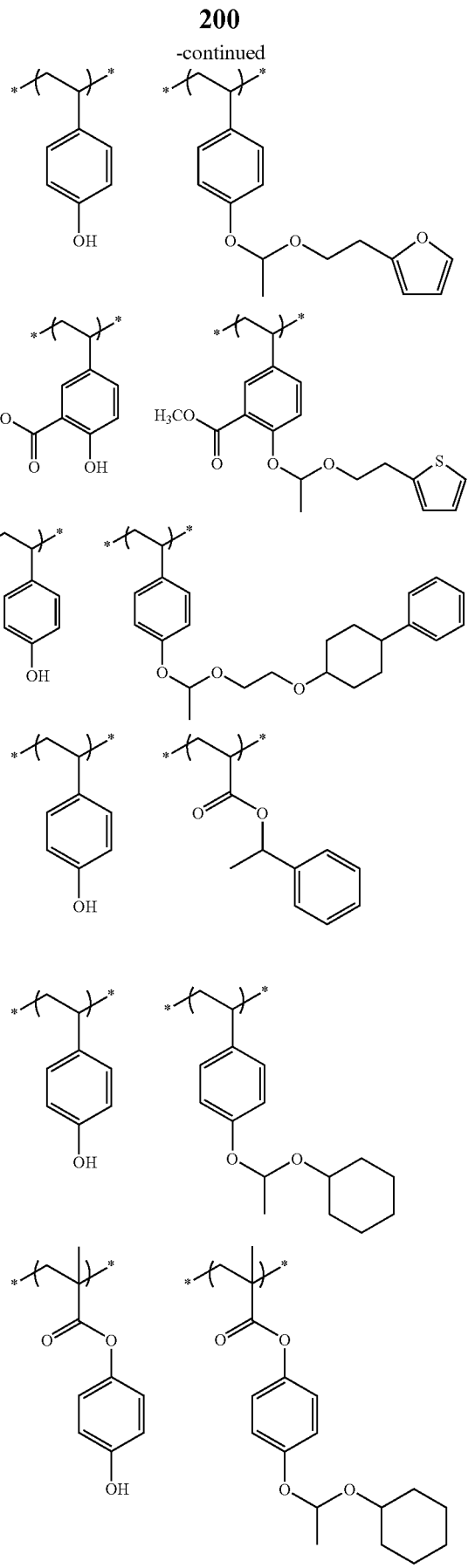

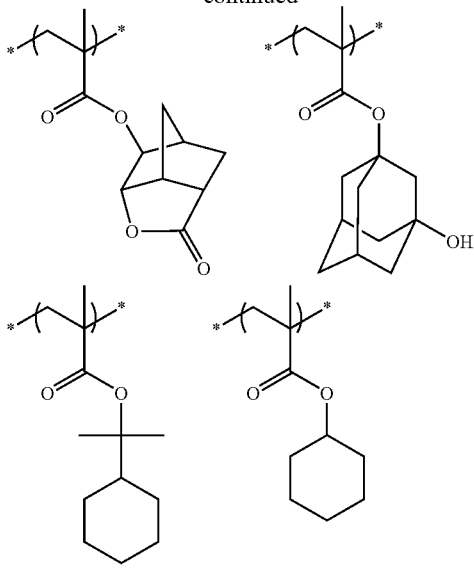

The actinic ray-sensitive or radiation-sensitive resin composition of the present invention may or may not contain an acid-decomposable resin except for the resin (P), but in the case of containing it, the content of the acid-decomposable resin is preferably from 0.1 to 70 mass %, more preferably from 0.5 to 50 mass %, still more preferably from 1.0 to 30 mass %, based on the entire solid content of the composition.

[4] Acid Generator

The actinic ray-sensitive or radiation-sensitive resin composition of the present invention contains (P) a resin having a photo-acid generating structure and, in addition to the resin (P), may contain a low molecular compound capable of generating an acid upon irradiation with an actinic ray or radiation (hereinafter sometimes referred to as an "acid generator").

The molecular weight of the acid generator is preferably from 200 to 1000, more preferably from 300 to 900.

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Out of the compounds capable of decomposing upon irradiation with an actinic ray or radiation to generate an acid, compounds represented by the following formulae (ZI'), (ZII') and (ZIII') are preferred.

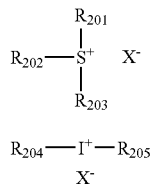
(ZI')

$R_{204}$—I$^+$—$R_{205}$
   X$^-$
(ZII')

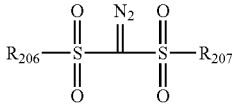
(ZIII')

In formulae (ZI') and (ZII'), each of $R_{201}$, $R_{202}$ and $R_{203}$ independently represents an organic group, and each of $R_{204}$ and $R_{205}$ independently represents an aryl group, an alkyl group or a cycloalkyl group.

The carbon number of the organic group as $R_{201}$, $R_{202}$ and $R_{203}$ is generally from 1 to 30, preferably from 1 to 20, and examples of the organic group include an aryl group, an alkyl group, a cycloalkyl group, an allyl group and a vinyl group.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

The aryl group of $R_{201}$ to $R_{205}$ has a carbon number of generally from 6 to 30, preferably from 6 to 20, and is preferably, for example, a phenyl group or a naphthyl group, more preferably a phenyl group. The aryl group of $R_{201}$ to $R_{205}$ may be an aryl group having a heterocyclic structure containing an oxygen atom, a nitrogen atom, a sulfur atom or the like. Examples of the heterocyclic structure include a pyrrole, a furan, a thiophene, an indole, a benzofuran and a benzothiophene.

The alkyl group and cycloalkyl group of $R_{201}$ to $R_{205}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the groups as $R_{201}$ to $R_{203}$ may be further substituted, for example, by a halogen atom, an alkoxy group (for example, having a carbon number of 1 to 5), a hydroxyl group, a cyano group or a nitro group.

The aryl group, alkyl group and cycloalkyl group as $R_{204}$ to $R_{205}$ may have a substituent. Examples of the substituent which the aryl group, alkyl group and cycloalkyl group as $R_{204}$ to $R_{205}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

X$^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae (AN1) to (AN4):

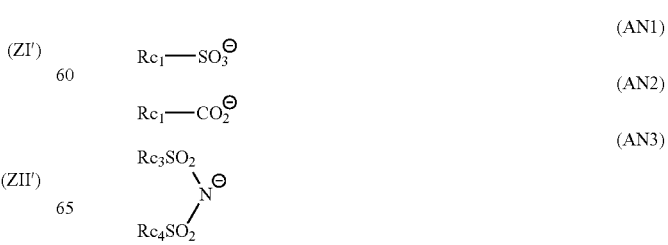

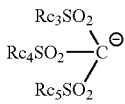

(AN4)

In formulae (AN1) and (AN2), $Rc_1$ represents an organic group.

The organic group of $Rc_1$ includes an organic group having a carbon number of 1 to 30 and is preferably an alkyl or aryl group which may be substituted, or a group where a plurality of these groups are connected through a single bond or a linking group such as —O—, —$CO_2$—, —S—, —$SO_3$— and —$SO_2N(Rd_1)$—.

$Rd_1$ represents a hydrogen atom or an alkyl group and may form a ring structure with the alkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom preferably allows a part of hydrogen atoms to remain without substituting all hydrogen atoms by a fluorine atom, and it is more preferred that the number of hydrogen atoms is larger than the number of fluorine atoms. The absence of a perfluoroalkyl group having a carbon number of 5 or more enables reduction in the toxicity to ecology.

The most preferred embodiment of $Rc_1$ is a group represented by the following formula.

In the formula above, $Rc_6$ represents a perfluoroalkylene group having a carbon number of 4 or less, preferably from 2 to 4, more preferably 2 to 3, or a phenylene group substituted by from 1 to 4 fluorine atoms and/or from 1 to 3 fluoroalkyl groups.

Ax is a linking group (preferably a single bond, —O—, —$CO_2$—, —S—, —$SO_3$— or —$SO_2N(Rd_1)$-). $Rd_1$ represents a hydrogen atom or an alkyl group and may combine with $Rc_7$ to form a ring structure.

$Rc_7$ is a hydrogen atom, a fluorine atom, a linear or branched alkyl group which may be substituted, a monocyclic or polycyclic cycloalkyl group which may be substituted, or an aryl group which may be substituted. Each of the alkyl group, cycloalkyl group and aryl group, which may be substituted, preferably contains no fluorine atom as the substituent.

In formulae (AN3) and (AN4), each of $Rc_3$, $Rc_4$ and $Rc_5$ represents an organic group.

The preferred organic groups for $Rc_3$, $Rc_4$ and $Rc_5$ in formulae (AN3) and (AN4) are the same as the preferred organic groups in $Rc_1$.

$Rc_3$ and $Rc_4$ may combine to form a ring.

The group formed by combining $Rc_3$ and $Rc_4$ includes an alkylene group and an arylene group and is preferably a perfluoroalkylene group having a carbon number of 2 to 4. Combining $Rc_3$ and $Rc_4$ to form a ring is preferred because the acidity of the acid generated upon irradiation with light increases and the sensitivity is enhanced.

The compound may be a compound having a plurality of structures represented by formula (ZI'). For example, the compound may be a compound having a structure where at least one of $R_{201}$ to $R_{203}$ in the compound represented by formula (ZI') is bonded to at least one of $R_{201}$ to $R_{203}$ in another compound represented by formula (ZI').

In formula (ZIII'), each of $R_{206}$ and $R_{207}$ independently represents an aryl group, an alkyl group or a cycloalkyl group.

Specific examples and preferred examples of the aryl group as $R_{206}$ and $R_{207}$ are the same as specific examples and preferred examples of the aryl group in formulae (ZI') and (ZII').

Specific examples and preferred examples of the alkyl group and cycloalkyl group as $R_{206}$ and $R_{207}$ are the same as specific examples and preferred examples of the alkyl group and cycloalkyl group in formulae (ZI') and (ZII').

The aryl group, alkyl group and cycloalkyl group as $R_{206}$ and $R_{207}$ may have a substituent, and specific examples thereof are the same as specific examples described above of the substituent which the aryl group, alkyl group and cycloalkyl group as $R_{204}$ and $R_{205}$ may have.

Out of the compounds capable of generating an acid upon irradiation with an actinic ray or radiation, the compounds represented by the following formulae (ZIV'), (ZV') and (ZVI') are also preferred

(ZIV')

(ZV')

(ZVI')

In formulae (ZIV') to (ZVI'), each of $Ar_3$ and $Ar_4$ independently represents an aryl group.

Each $R_{208}$ independently represents an alkyl group, a cycloalkyl group or an aryl group.

Each of $R_{209}$ and $R_{210}$ represents an alkyl group, a cycloalkyl group, an aryl group or an electron-withdrawing group. $R_{209}$ is preferably an aryl group, and $R_{210}$ is preferably an electron-withdrawing group, more preferably a cyano group or a fluoroalkyl group.

A represents an alkylene group, an alkenylene group or an arylene group.

These groups may have a substituent, and examples of the substituent are the same as those of the substituent which $R_{204}$ to $R_{207}$ may have.

Specific examples of the aryl group of $Ar_3$, $Ar_4$, $R_{208}$, $R_{209}$ and $R_{210}$ are the same as specific examples of the aryl group as $R_{201}$ to $R_{205}$ in formulae (ZI') and (ZII').

Specific examples of the alkyl group and cycloalkyl group of $R_{208}$, $R_{209}$ and $R_{210}$ are the same as specific examples of the alkyl group and cycloalkyl group as $R_{201}$ to $R_{205}$ in formulae (ZI') and (ZII').

Examples of the alkylene group of A include an alkylene group having a carbon number of 1 to 12 (e.g., methylene, ethylene, propylene, isopropylene, butylene, isobutylene); examples of the alkenylene group of A include an alkenylene group having a carbon number of 2 to 12 (e.g., ethynylene, propenylene, butenylene); and examples of the arylene group of A include an arylene group having a carbon number of 6 to 10 (e.g., phenylene, tolylene, naphthylene).

Among the compounds capable of generating an acid upon irradiation with an actinic ray or radiation, the compounds represented by formulae (ZI'), (ZIII') and (ZVI') are preferred, and the compound represented by formula (ZI') is more preferred.

Out of the compounds capable of decomposing upon irradiation with an actinic ray or radiation to generate an acid, particularly preferred examples are set forth below.

(z1)
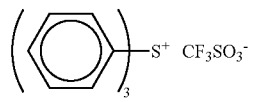

(z2)
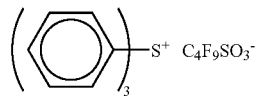

(z3)
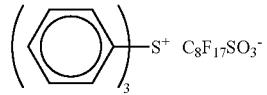

(z4)
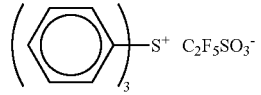

(z5)
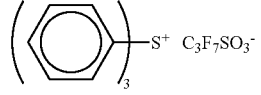

(z6)
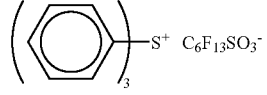

(z7)
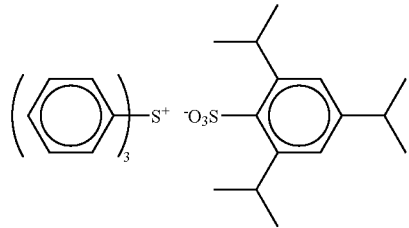

(z8)
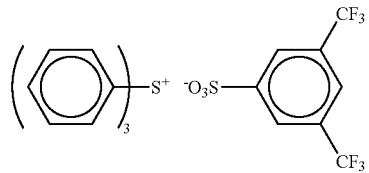

(z9)
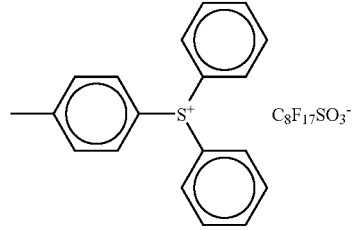

(z10)
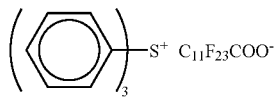

(z11)
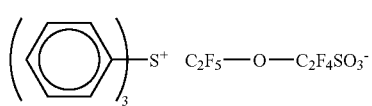

(z12)
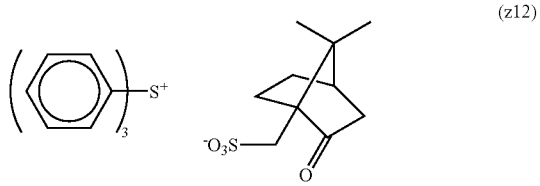

(z13)
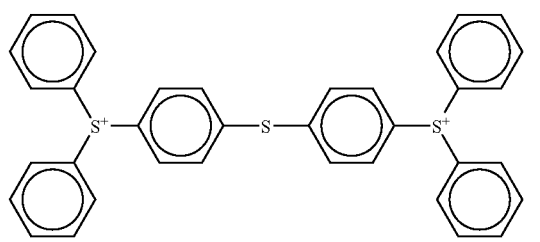

(z14)
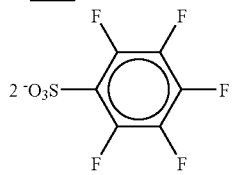

(z15)
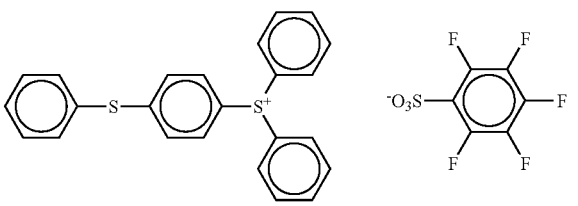

(z16)
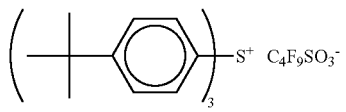

(z17)
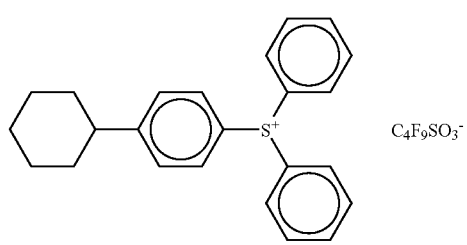

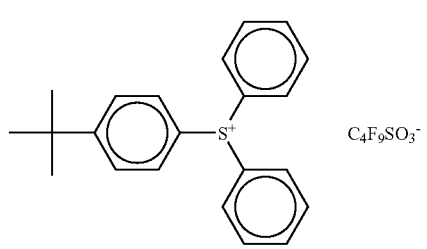

-continued
(z18) 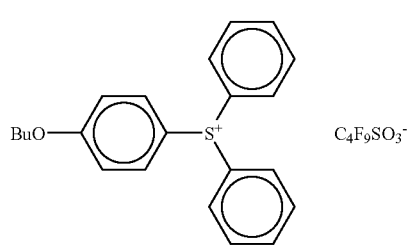
(z19) 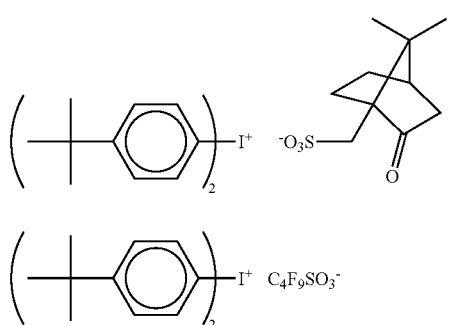
(z20)
(z21) 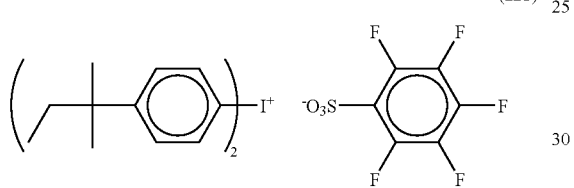
(z22) 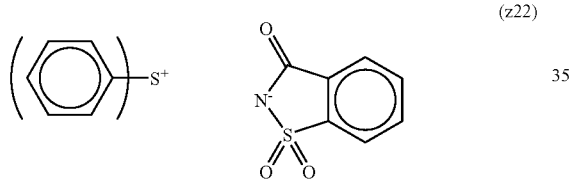
(z23) 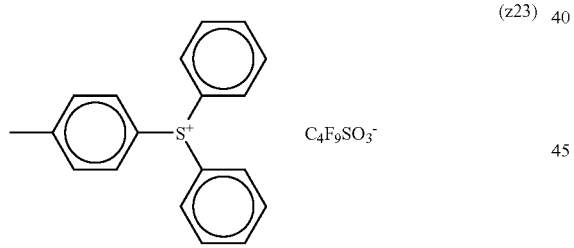
(z24) 
(z25) 
(z26) 
-continued
(z27) 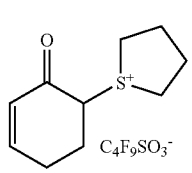
(z28) 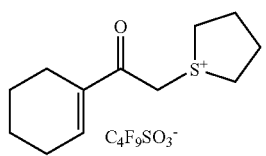
(z29) 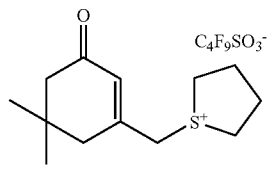
(z30) 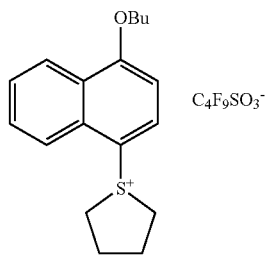
(z31) 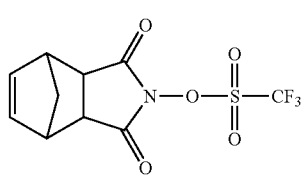
(z32) 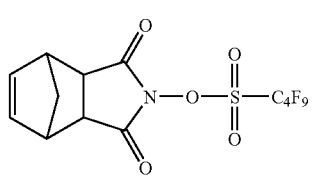
(z33) 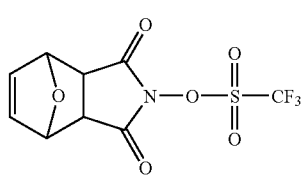
(z34) 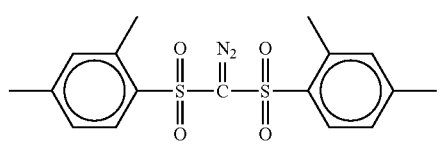
(z35) 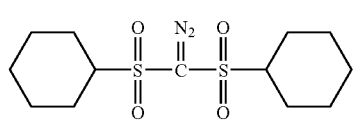

-continued
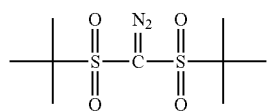 (z36)
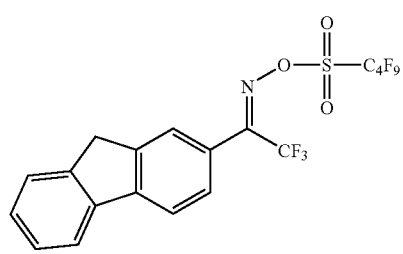 (z37)
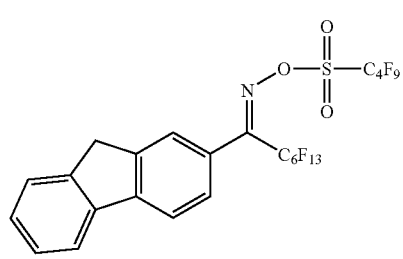 (z38)
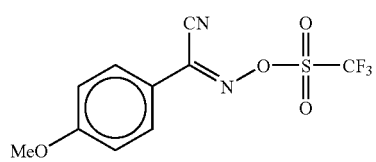 (z39)
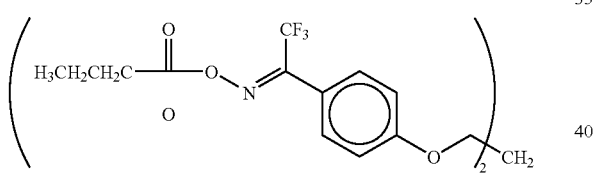 (z40)
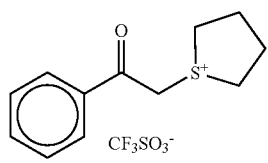 (z41)
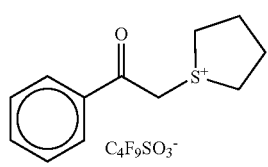 (z42)
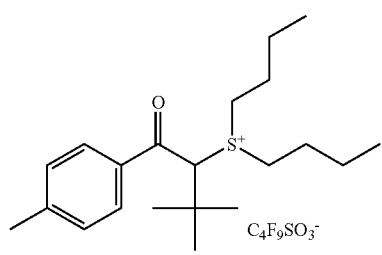 (z43)
-continued
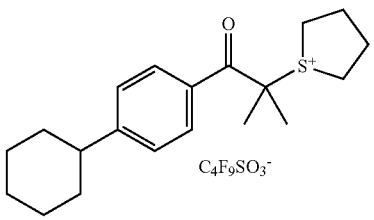 (z44)
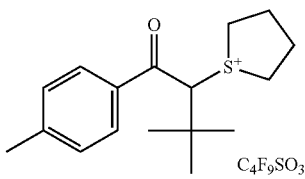 (z45)
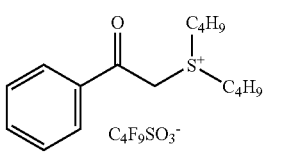 (z46)
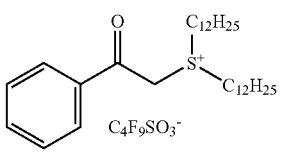 (z47)
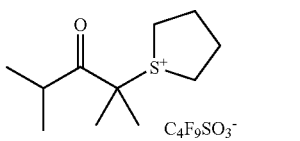 (z48)
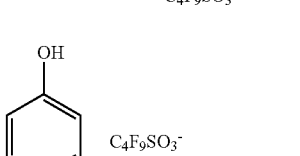 (z49)
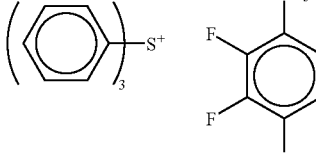 (z50)
 (z51)

211
-continued
(z52)
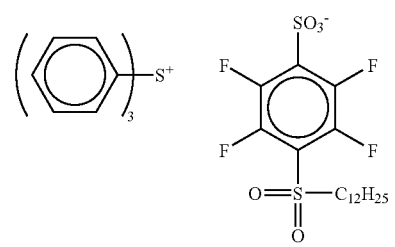
(z53)
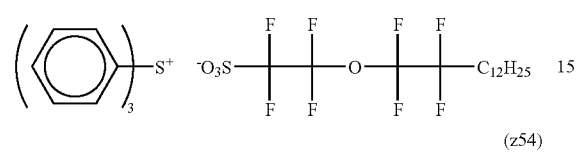
(z54)
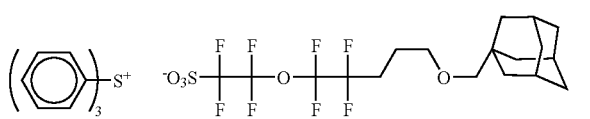
(z55)
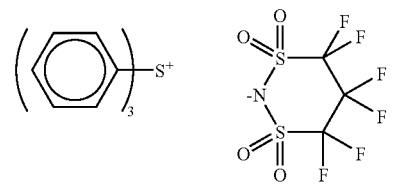
(z56)
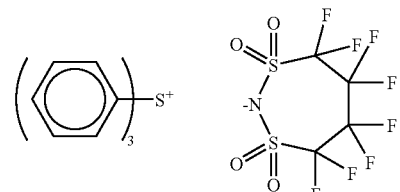
(z57)
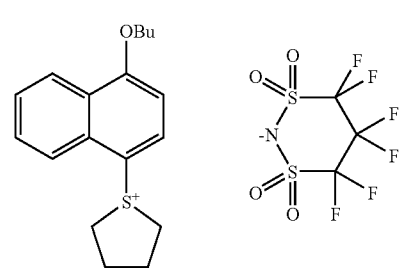
(z58)
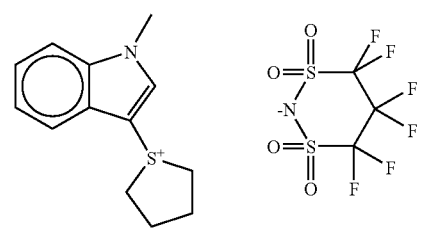
(z59)
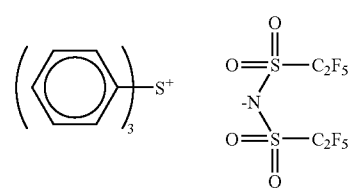
212
-continued
(z60)
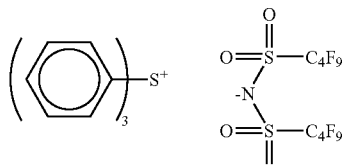
(z61)
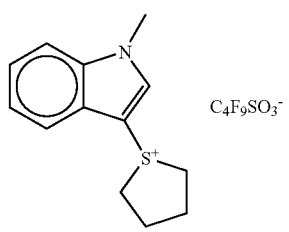
(z62)
(z63)
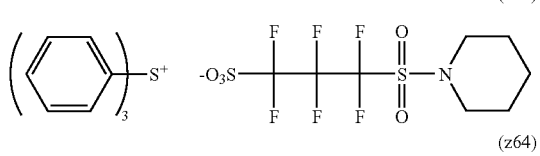
(z64)
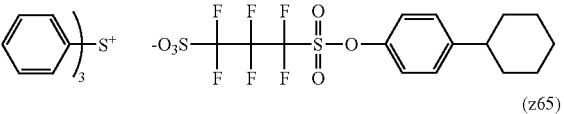
(z65)
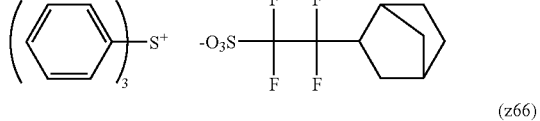
(z66)
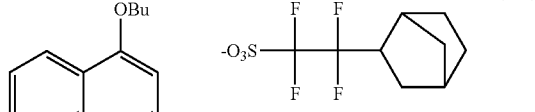
(z67)
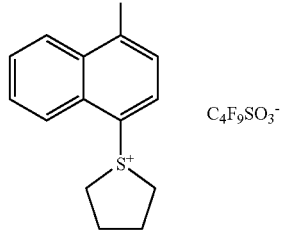

(z68) 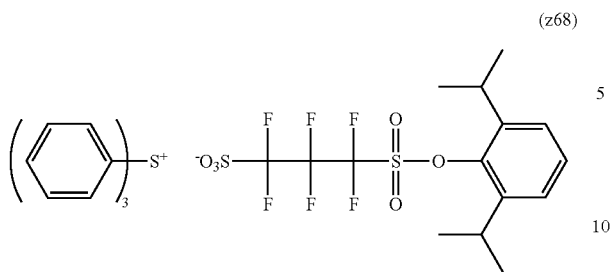
(z69) 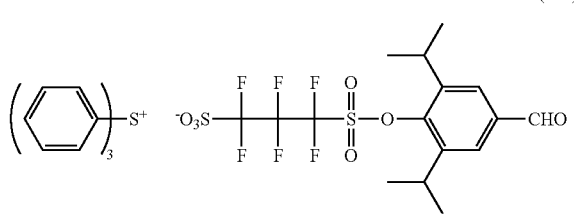
(z70) 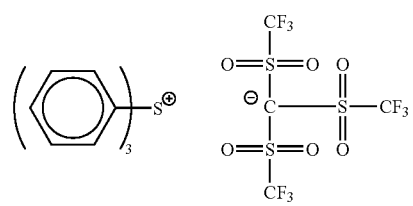
(z71) 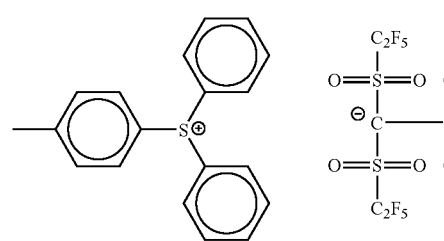
(z72) 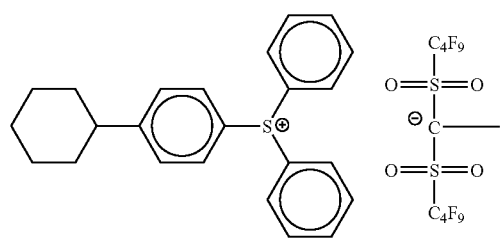
(z73) 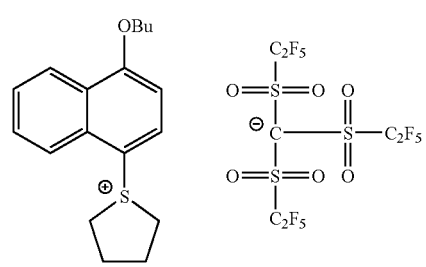
(z74) 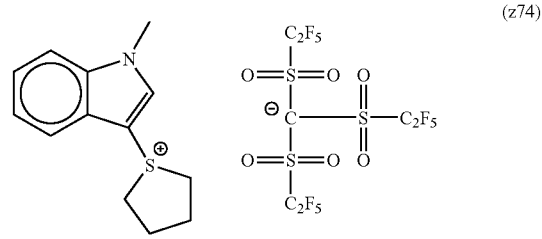
(z75) 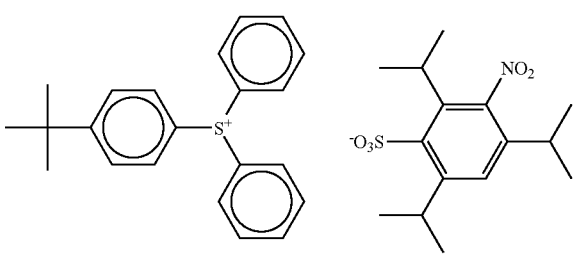
(z76) 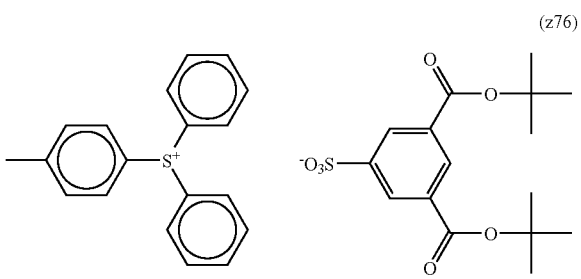
(z77) 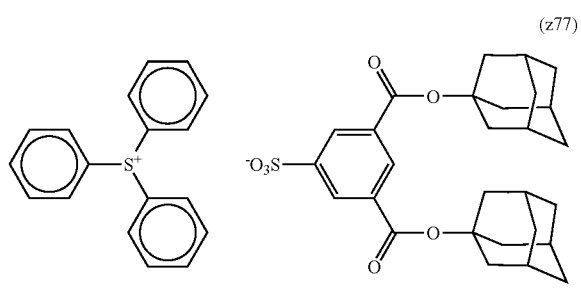
(z78) 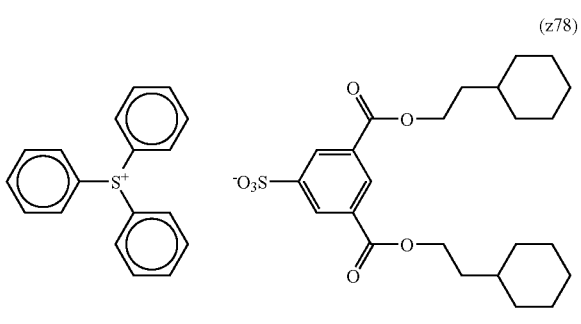
(z79) 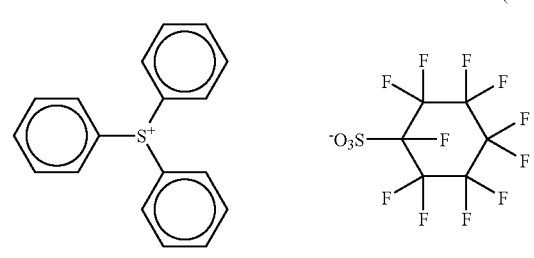

-continued (z80) 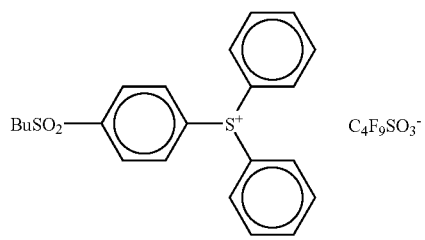 C$_4$F$_9$SO$_3^-$ (z81) 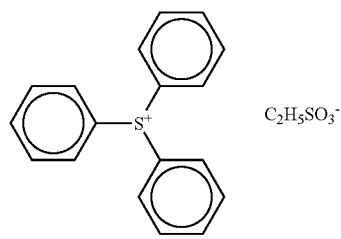 C$_2$H$_5$SO$_3^-$ (z82) 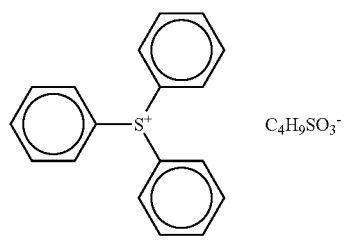 C$_4$H$_9$SO$_3^-$ (z83) 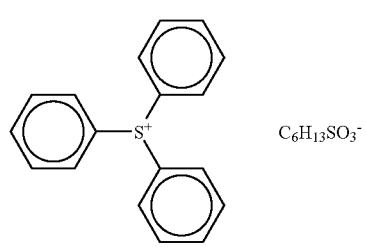 C$_6$H$_{13}$SO$_3^-$ (z84) 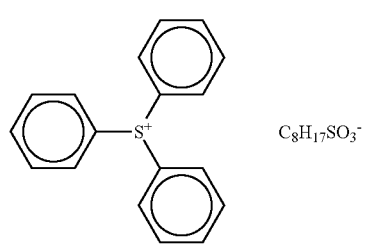 C$_8$H$_{17}$SO$_3^-$ (z85) 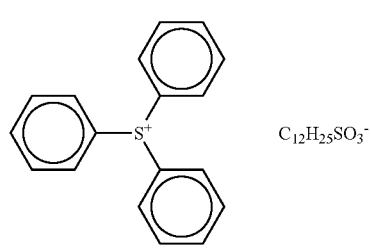 C$_{12}$H$_{25}$SO$_3^-$ -continued (z86) 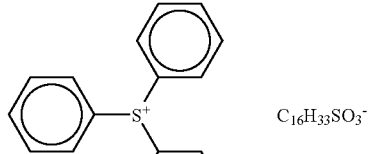 C$_{16}$H$_{33}$SO$_3^-$ (z87) 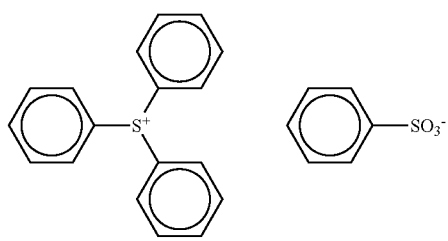

(z88) 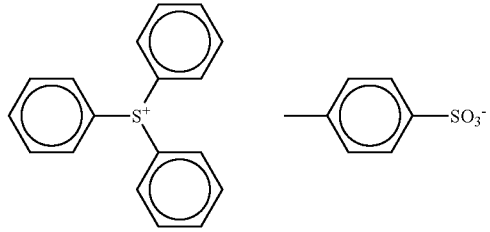

An acid generator where the structure of the cation moiety is represented by formula (Ia) (hereinafter, sometimes referred to as an "acid generator A1") may also be used. As regards preferred substituents and the like in the cation moiety of the acid generator A1, those described as preferred in formula (Ia) apply directly. Also, the structure of the anion moiety of the acid generator A1 includes the same as those represented by formulae (AN1) to (AN4). Specific preferred examples of the acid generator A1 include those having an arbitrary combination of the cation of formulae (B1-45) to (B1-71) with the anion in formulae (z1) to (z88) and include (A1) to (A-36) illustrated in paragraph [0095] of U.S. Patent Application Publication No. 2007/0184384. As for the synthesis method of the acid generator A1, the patent publication above may also be referred to.

In the actinic ray-sensitive or radiation-sensitive resin composition of the present invention, when an acid generator is used in addition to the resin (P) having a photo-acid generating structure, one kind of an acid generator may be used alone, or two or more kinds of acid generators may be used in combination. In using two or more kinds in combination, compounds capable of generating two kinds of organic acids differing in the number of all atoms excluding hydrogen atom by 2 or more are preferably combined.

The actinic ray-sensitive or radiation-sensitive resin composition of the present invention may or may not contain an acid generator but in the case of containing it, the content of the acid generator in the composition is preferably from 0.1 to 20 mass %, more preferably from 0.2 to 10 mass %, still more preferably from 0.5 to 7 mass %, based on the entire solid content of the resist composition.

[5] Organic Solvent

Examples of the solvent that can be used at the time of preparing the actinic ray-sensitive or radiation-sensitive resin composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate (PGMEA, also known as 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether (PGME, also known as 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, 2-ethoxyethyl acetate, 2-(2-ethoxyethoxy) ethyl acetate and propylene carbonate. Above all, propylene glycol monomethyl ether acetate and propylene glycol monomethyl ether are preferred as the solvent.

In the present invention, one of these solvents may be used alone, or two or more kinds thereof may be used in combination.

[6] Surfactant

The actinic ray-sensitive or radiation-sensitive resin composition of the present invention may or may not further contain a surfactant and in the case of containing a surfactant, it is preferred to contain any one of fluorine-containing and/or silicon-containing surfactants (a fluorine-containing surfactant, a silicon-containing surfactant, and a surfactant containing both a fluorine atom and a silicon atom), or two or more thereof.

By incorporating the above-described surfactant into the actinic ray-sensitive or radiation-sensitive resin composition of the present invention, a resist pattern with good sensitivity, resolution and adherence as well as less development defects can be obtained when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate) and a (poly(oxypropylene)) acrylate (or methacrylate).

In the present invention; a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of them may be used in combination.

In the case where the actinic ray-sensitive or radiation-sensitive resin composition contains a surfactant, the amount of the surfactant used is preferably from 0.0001 to 2 mass %, more preferably from 0.001 to 1 mass %, based on the entire amount of the actinic ray-sensitive or radiation-sensitive resin composition (excluding the solvent).

[7] Dissolution Inhibiting Compound Having a Molecular Weight of 3,000 or Less and Being Capable of Decomposing by the Action of an Acid to Increase the Solubility in an Alkali Developer The dissolution inhibiting compound having a molecular weight of 3,000 or less and being capable of decomposing by the action of an acid to increase the solubility in an alkali developer (hereinafter, sometimes referred to as a "dissolution inhibiting compound") is preferably an alicyclic or aliphatic compound containing an acid-decomposable group, such as acid-decomposable group-containing cholic acid derivative described in *Proceeding of SPIE*, 2724, 355 (1996), so as not to reduce the transparency to light at 220 nm or less. Examples of the acid-decomposable group and alicyclic structure are the same as those described above in regard to the resin of the component (B).

In the case where the actinic ray-sensitive or radiation-sensitive resin composition of the present invention is exposed by a KrF excimer laser or irradiated with an electron beam, the dissolution inhibiting compound preferably has a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The amount of the dissolution inhibiting compound added is preferably from 3 to 50 mass %, more preferably from 5 to 40 mass %, based on the solid content of the actinic ray-sensitive or radiation-sensitive resin composition.

Specific examples of the dissolution inhibiting compound are set forth below, but the present invention is not limited thereto.

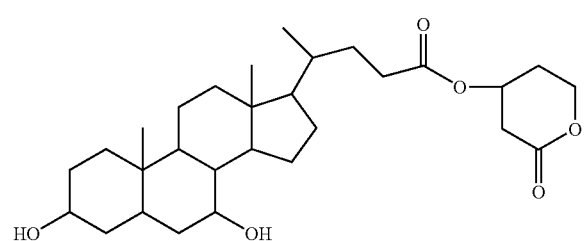

-continued

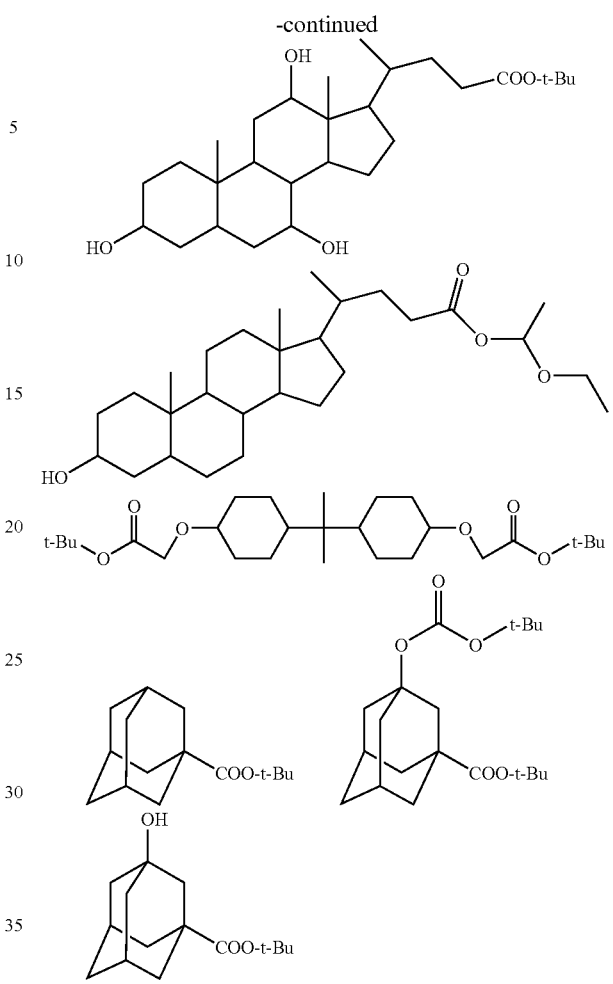

[8] Other Additives

The actinic ray-sensitive or radiation-sensitive resin composition of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

Furthermore, a compound having a proton acceptor functional group described, for example, in JP-A-2006-208781 and JP-A-2007-286574 may also be suitably used in the composition of the present invention.

[9] Pattern Forming Method

The actinic ray-sensitive or radiation-sensitive resin composition of the present invention is coated, for example, on a support such as substrate to form a resist film. The thickness of the resist film is preferably from 0.02 to 0.1 μm.

The method of coating the composition on a substrate is preferably spin coating, and the rotation speed is preferably from 1,000 to 3,000 rpm.

For example, the actinic ray-sensitive or radiation-sensitive resin composition is coated on such a substrate (e.g., silicon/silicon dioxide-coated substrate) as used in the production of a precision integrated circuit device by an appropriate coating method such as spinner or coater and dried to form a resist. Here, it is also possible to previously coat a known anti-reflection film.

The resist film is exposed usually by irradiating preferably electron beam (EB), X-ray or EUV light through a mask, though the light source is not particularly limited. After exposure, the resist film is preferably baked (heated) and then developed, whereby a good pattern can be obtained.

In the development step, an alkali developer is used as follows. The alkali developer which can be used for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Examples

The present invention is described in greater detail below by referring to Examples, but the contents of present invention should not be construed as being limited thereto.

Synthesis Example 1

Synthesis of Monomer (M-1)

10 Parts by mass of p-hydroxystyrene and 0.01 parts by mass of pyridine p-toluenesulfonate were dissolved in 80 parts by mass of ethyl acetate at room temperature. While stirring the resulting solution, a mixed solution containing 13.1 parts by mass of 2-cyclohexylethyl vinyl ether and 20 parts by mass of ethyl acetate was added dropwise at room temperature. After the dropwise addition, the reaction was further allowed to proceed at room temperature for 24 hours.

The reaction solution was made basic by adding triethylamine and washed with ion-exchanged water, and the organic layer was concentrated and then purified by column chromatography with hexane/ethyl acetate to obtain 14.7 parts by mass of Monomer (M-1) shown below.

Synthesis Example 2

Synthesis of Monomer (M-2)

The reaction was performed in the same manner as in Synthesis Example 1 except for using 20.9 parts by mass of 2-(4-cyclohexylphenoxy)ethyl vinyl ether in place of 2-cyclohexylethyl vinyl ether in Synthesis Example 1, whereby 19.3 parts by mass of Monomer (M-2) shown below was obtained.

Synthesis Example 3

Synthesis of Monomer (M-3)

While stirring 50 parts by mass of dibenzothiophene in 250 parts by mass of trifluoroacetic acid at room temperature, 30.8 parts by mass of 30% hydrogen peroxide water was gradually added dropwise. After stirring for 1 hour, the reaction solution was poured in 3,000 parts by mass of water, and the solid precipitated was collected by filtration. The obtained solid was recrystallized in acetonitrile, then filtered and vacuum-dried to obtain 22.5 parts by mass of a sulfoxide form.

2 Parts by mass of phosphorus(V) oxide and 6.7 parts by mass of the sulfoxide form were added to 18 parts by mass of methanesulfonic acid, and 7.1 parts by mass of 2-phenylethyl acetate was added with stirring. After reaction at room temperature for 6 hours, the reaction solution was poured in ice water and filtered. While stirring the filtrate, 15.3 parts by mass of potassium iodide was added to precipitate a solid. The obtained solid was collected by filtration and washed with ethyl acetate to obtain 7.5 parts by mass of sulfonium I salt (A). Furthermore, the obtained sulfonium salt was hydrolyzed in methanol by using sodium hydroxide, whereby sulfonium I salt (B) was obtained.

3.6 Parts by mass of sulfonium I salt (B) was dissolved in 100 parts by mass of methanol. Furthermore, 1.4 parts by mass of silver acetate was added to this solution and after stirring at room temperature for 1 hour, a mixed solution containing 1.7 parts by mass of 4-styrenesulfonic acid Na salt, 3 parts by mass of methanol and 8 parts by mass of ion-exchanged water was added dropwise at room temperature with stirring.

Extraction and washing were performed by adding ion-exchanged water and chloroform. The organic layer was concentrated, and the solid precipitated was reslurried in hexane/ethyl acetate and then filtered to obtain 3.3 parts by mass of Monomer (M-3) shown below.

Synthesis Example 4

Synthesis of Monomer (M-4)

3.6 Parts by mass of sulfonium I salt (A) obtained in the same manner as in Synthesis Example 3 was dissolved in 100 parts by mass of methanol. Furthermore, 1.4 parts by mass of silver acetate was added to this solution and after stirring at room temperature for 1 hour, a mixed solution containing 1.9 parts by mass of potassium 3-sulfopropyl methacrylate, 3 parts by mass of methanol and 3 parts by mass of ion-exchanged water was added dropwise at room temperature with stirring.

Extraction and washing were performed by adding ion-exchanged water and chloroform. The organic layer was concentrated, and the solid precipitated was reslurried in hexane/ethyl acetate and then filtered to obtain 3.1 parts by mass of Monomer (M-4) shown below.

The other Monomers shown below were synthesized in the same manner, or commercially obtained

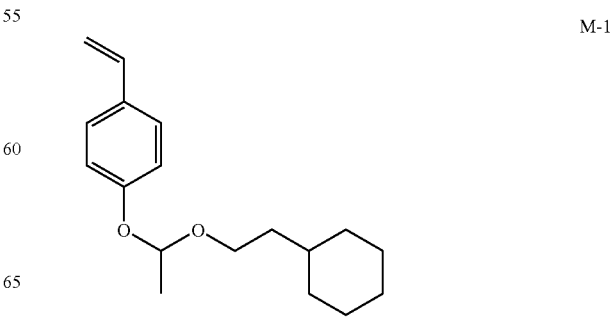

M-1

M-2
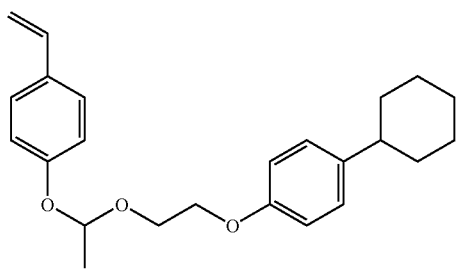
M-3
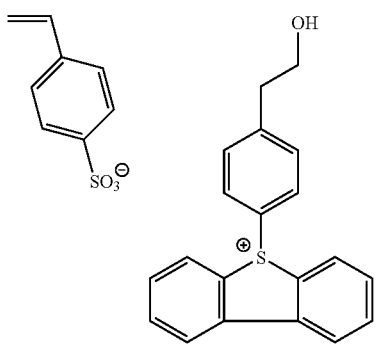
M-4
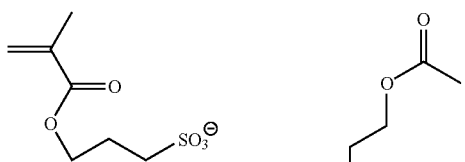
M-5
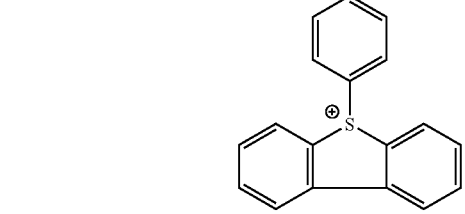
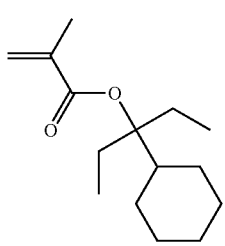
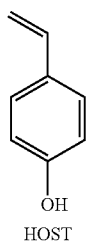
HOST
M-6
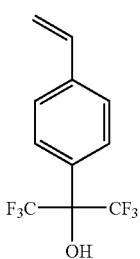
M-7
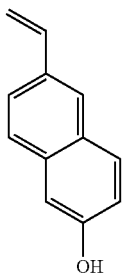
M-8
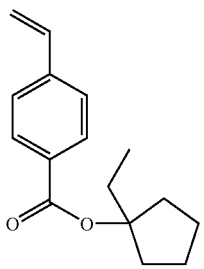
M-9
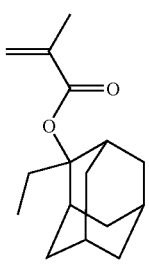
M-10
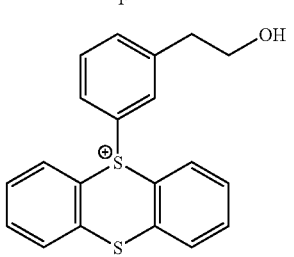

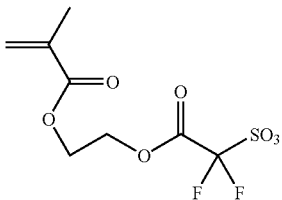

M-11

Synthesis Example 5

Synthesis of Resin (P-1)

4.66 Parts by mass of 1-methoxy-2-propanol was heated at 80° C. under nitrogen flow. While stirring this solution, a mixed solution containing 4.22 parts by mass of 4-hydroxystyrene (hereinafter, sometimes referred to as "HOST"), 4.45 parts by mass of Monomer (M-1) obtained in Synthesis Example 1, 1.32 parts by mass of Monomer (M-3) obtained in Synthesis Example 3, 18.6 parts by mass of 1-methoxy-2-propanol and 1.25 parts by mass of dimethyl 2,2'-azobisisobutyrate [V-601, produced by Wako Pure Chemical Industries, Ltd.] (polymerization initiator) was added dropwise over 2 hours. After the completion of dropwise addition, the solution was stirred at 80° C. for 1 hour. Subsequently, the same amount of dimethyl 2,2'-azobisisobutyrate [V-601, produced by Wako Pure Chemical Industries, Ltd.] as the above addition amount (the first charge amount) was added, and the solution was further stirred at 80° C. for 3 hours. The reaction solution was left standing to cool, then reprecipitated from a large amount of hexane/ethyl acetate and vacuum-dried to obtain 5.0 parts by mass of Resin (P-1) of the present invention.

The weight average molecular weight (Mw, in terms of polystyrene) determined from GPC (carrier: N-methyl-2-pyrrolidone (NMP)) was Mw=17,200, and Mw/Mn (hereinafter, sometimes referred to as "MWD")=1.79.

Synthesis Examples 6 to 14

Synthesis of Resins (P-2) to (P-9)

Resins (P-2) to (P-9) for use in the present invention were synthesized in the same manner as in Synthesis Example 5.

The structure unit used, the charge thereof (parts by mass), the polymerization concentration (concentration of reaction solution, mass %), the first charge amount of polymerization initiator (parts by mass), the compositional ratio of resin produced (ratio by mol), the weight average molecular weight, the number average molecular weight and the polydispersity (MWD) are shown in Table 2 below.

TABLE 2

| Resin | Charged Composition (parts by mass) | | | | | | Polymerization concentration | V-601 (First charge amount) parts by mass | Polymer Composition (mol %) | | | | | | Molecular Weight (NMP GPC) | | |
|---|---|---|---|---|---|---|---|---|---|---|---|---|---|---|---|---|---|
| | Repeating Unit C | | Repeating Unit B | | Repeating Unit A | | | | Repeating Unit C | | Repeating Unit B | | Repeating Unit A | | Mw | Mn | MWD |
| P-1 | HOST | 4.22 | M-1 | 4.45 | M-3 | 1.32 | 30 | 1.25 | HOST | 65 | M-1 | 30 | M-3 | 5 | 17200 | 9600 | 1.79 |
| P-2 | HOST | 3.55 | M-1 | 4.05 | M-3 | 2.40 | 30 | 1.13 | HOST | 60 | M-1 | 30 | M-3 | 10 | 20400 | 11500 | 1.77 |
| P-3 | HOST | 5.38 | M-2 | 3.07 | M-4 | 1.55 | 30 | 1.29 | HOST | 80 | M-2 | 15 | M-4 | 5 | 16800 | 9200 | 1.83 |
| P-4 | HOST | 4.49 | M-2 | 2.74 | M-4 | 2.77 | 30 | 1.15 | HOST | 75 | M-2 | 15 | M-4 | 10 | 21500 | 12100 | 1.78 |
| P-5 | HOST | 4.36 | M-5 | 3.73 | M-3 | 1.91 | 30 | 1.29 | HOST | 65 | M-5 | 28 | M-3 | 7 | 19100 | 10900 | 1.75 |
| P-6 | HOST | 3.55 | M-1 | 4.05 | M-3 | 2.40 | 30 | 1.13 | HOST | 60 | M-1 | 30 | M-3 | 10 | 4600 | 2500 | 1.84 |
| P-7 | HOST | 4.49 | M-2 | 2.74 | M-4 | 2.77 | 30 | 1.15 | HOST | 75 | M-2 | 15 | M-4 | 10 | 5100 | 2800 | 1.82 |
| P-8 | M-6 | 5.83 | M-8 | 3.07 | M-10 | 1.10 | 30 | 0.83 | M-6 | 60 | M-8 | 35 | M-10 | 5 | 10500 | 6100 | 1.72 |
| P-9 | HOST | 2.91 | M-9 | 3.96 | M-11 | 2.31 | 30 | 1.11 | HOST | 50 | M-9 | 33 | M-11 | 7 | 12200 | 7000 | 1.74 |
| | M-7 | 0.82 | | | | | | | M-7 | 10 | | | | | | | |

With respect to Resins (P-1) to (P-9) of the present invention, the structure, compositional ratio, weight average molecular weight and polydispersity of each resin are shown below.
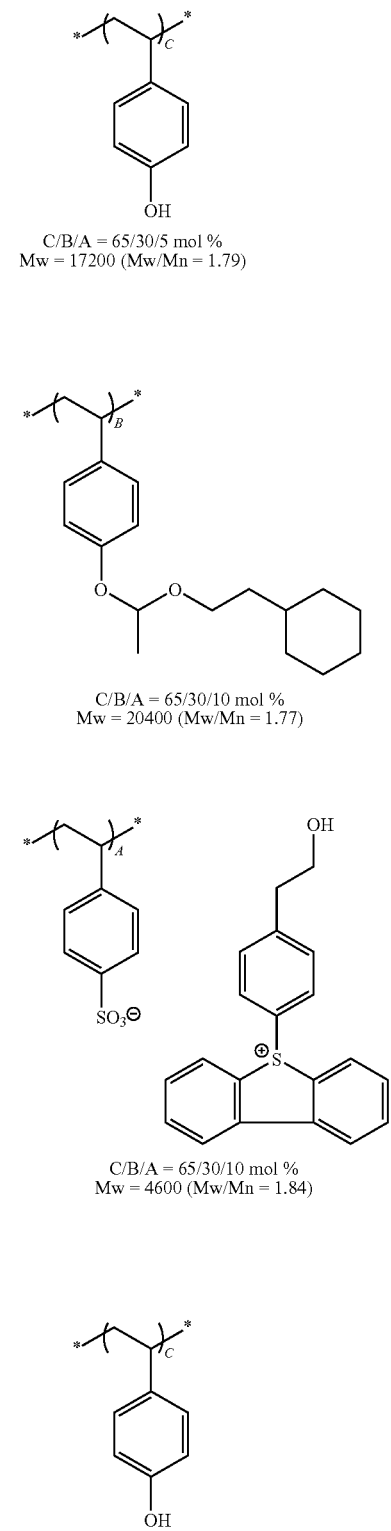
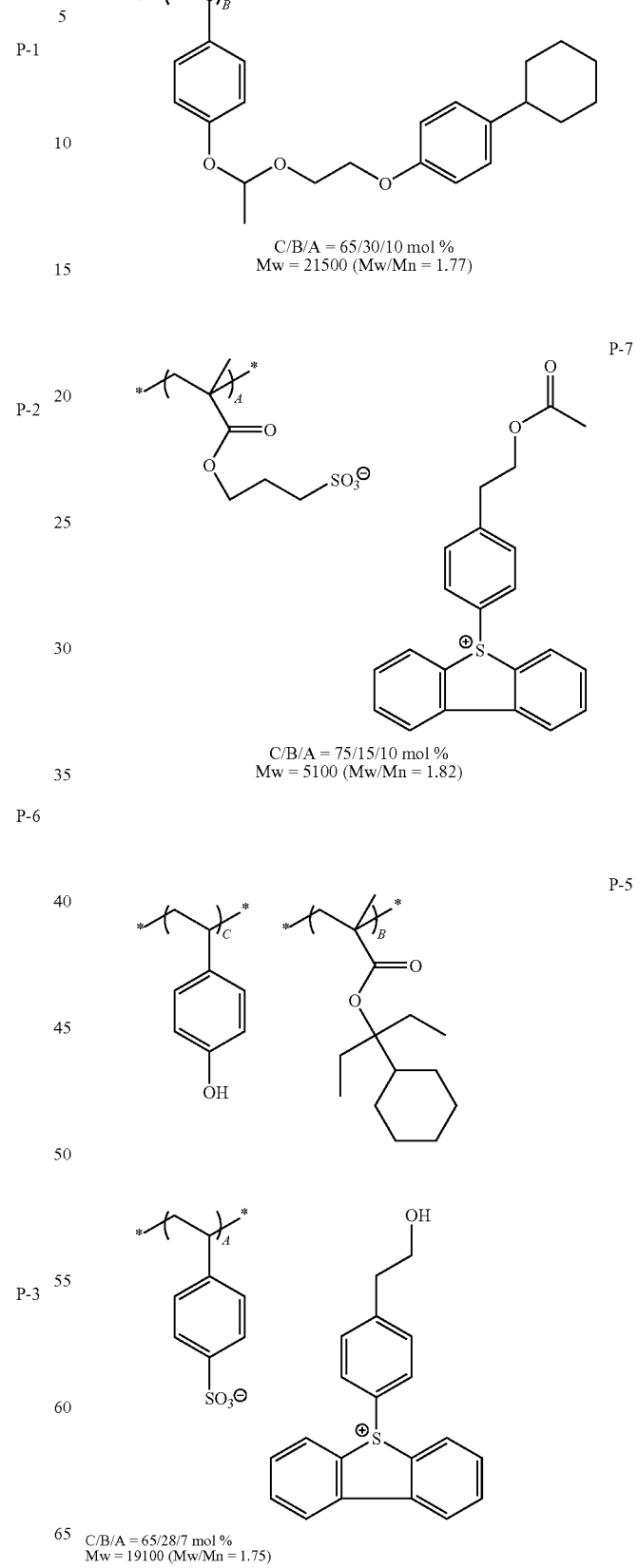

P-8

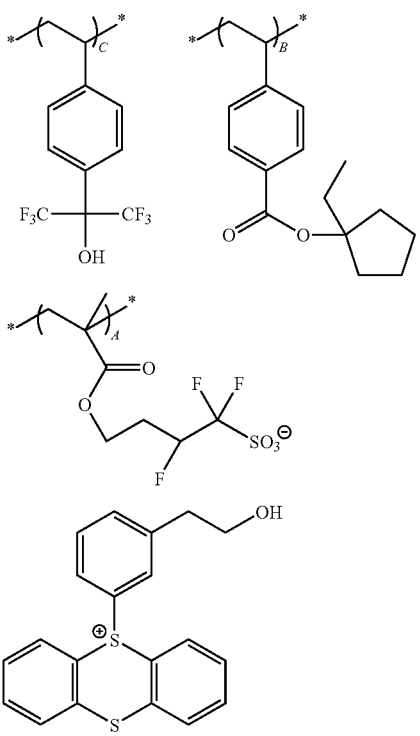

C/B/A = 60/35/5 mol %
Mw = 10500 (Mw/Mn = 1.72)

P-9

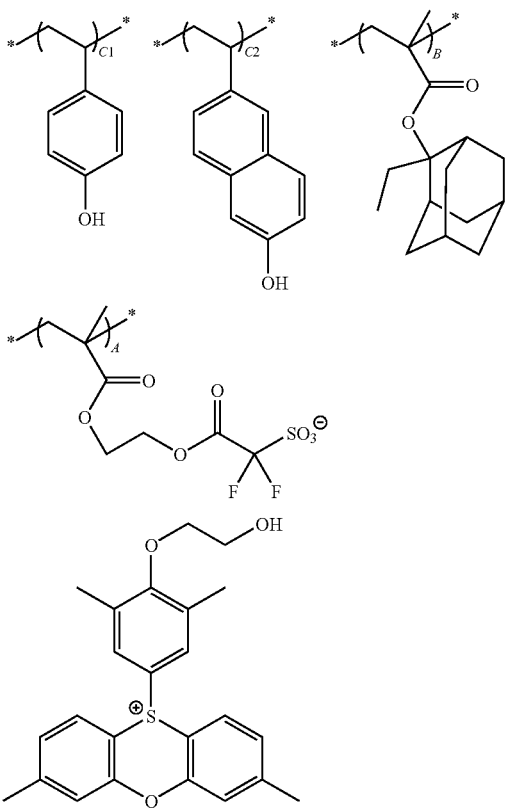

C1/C2/B/A = 50/10/33/7 mol %
Mw = 12200 (Mw/Mn = 1.74)

Examples 1 to 17 and Comparative Examples 1 to 6

Preparation of Resist

The components shown in Table 3 below were dissolved in a mixed solvent shown in Table 3, and the obtained solution was filtered through a polytetrafluoroethylene filter having a pore size of 0.1 μm to prepare a positive resist solution having an entire solid content concentration (mass %) shown in Table 3. The positive resist solutions prepared were evaluated as follows. In Table 3, the concentration (mass %) of each component is based on the entire solid content. The amount of the surfactant added is 0.05 mass % based on the entire solid content of the positive resist solution.

<Evaluation of Resist (EB)>

The prepared positive resist solution was uniformly coated by a spin coater on a silicon substrate treated with hexamethyldisilazane, and dried under heating on a hot plate at 120° C. for 90 seconds to form a 100 nm-thick resist film.

This resist film was irradiated with electron beams by using an electron beam irradiation apparatus (HL750, manufactured by Hitachi Ltd., accelerating voltage: 50 KeV) and immediately after irradiation, heated on a hot plate at 110° C. for 90 seconds. Furthermore, the resist film was developed with an aqueous tetramethylammonium hydroxide solution in a concentration of 2.38 mass % at 23° C. for 60 seconds, rinsed with pure water for 30 seconds and then dried to form a line-and-space pattern. The obtained pattern was evaluated by the following methods.

[Sensitivity]

The cross-sectional profile of the pattern obtained was observed using a scanning electron microscope (S-9220, manufactured by Hitachi, Ltd.). The minimum irradiation energy for resolving a 100-nm line (line:space=1:1) was defined as the sensitivity.

[Resolution]

The limiting resolution (the line and space were separated and resolved) at the irradiation dose of giving the above-described sensitivity was defined as the resolution.

[Line Edge Roughness (LER)]

At arbitrary 30 points in the range of 50 μm in the longitudinal direction of a 100-nm line pattern (line:space=1:1) at the irradiation dose of giving the above-described sensitivity, the distance from the reference line where the edge should be present was measured by a scanning election microscope (S-9220, manufactured by Hitachi Ltd.), and after determining the standard deviation, 3 σ was computed.

[Pattern Profile]

The cross-sectional profile of a 100-nm line pattern (line:space=1:1) at the irradiation dose of giving the above-described sensitivity was observed using a scanning electron microscope (S-4300, manufactured by Hitachi, Ltd.) and evaluated on a three-stage scale of rectangular, slightly tapered and tapered.

[Outgassing (Evaluation of Film Thickness Variation after Exposure)]

The resist film was irradiated at an irradiation dose 2.0 times the irradiation dose of giving the above-described sensitivity, the film thickness after exposure (before post-heating) was measured, and the variation was determined from the thickness at the unexposed time according to the following formula:

Film thickness variation=100×(film thickness at unexposed time−film thickness after exposure)/film thickness at unexposed time A smaller variation of film thickness indicates better performance in terms of outgassing.

TABLE 3

Evaluation Results in EB Exposure

| | Resin of Invention | Concentrations | Other Resin | Concentrations | Conventional Acid Generator | Concentrations | Basic Compound | Concentrations |
|---|---|---|---|---|---|---|---|---|
| Example 1 | P-1 | 99.95 | none | | none | | none | |
| Example 2 | P-2 | 99.95 | none | | none | | none | |
| Example 3 | P-3 | 99.95 | none | | none | | none | |
| Example 4 | P-4 | 99.95 | none | | none | | none | |
| Example 5 | P-5 | 99.95 | none | | none | | none | |
| Example 6 | P-6 | 99.95 | none | | none | | none | |
| Example 7 | P-7 | 99.95 | none | | none | | none | |
| Example 8 | P-2 | 84.95 | P-10 | 15 | none | | none | |
| Example 9 | P-2 | 99.65 | none | | none | | TPI | 0.3 |
| Example 10 | P-2 | 98.65 | none | | PAG-1 | 1 | TPI | 0.3 |
| Example 11 | P-3 | 97.45 | none | | PAG-1 | 2 | TBAH | 0.5 |
| Example 12 | P-8 | 99.95 | none | | none | | none | |
| Example 13 | P-8 | 99.75 | none | | none | | TPI | 0.2 |
| Example 14 | P-9 | 99.95 | none | | none | | none | |
| Example 15 | P-9 | 99.75 | none | | none | | DIA | 0.2 |
| Example 16 | P-1 / P-3 | 49.75 / 50.00 | none | | none | | TBAH | 0.2 |
| Example 17 | P-5 / P-8 | 49.75 / 50.00 | none | | none | | DIA | 0.2 |
| Comparative Example 1 | none | | P-10 | 91.95 | PAG-1 | 8 | none | |
| Comparative Example 2 | none | | P-10 | 90.45 | PAG-1 | 8 | TPI | 1.5 |
| Comparative Example 3 | none | | P-10 | 90.45 | PAG-2 | 8 | TPI | 1.5 |
| Comparative Example 4 | none | | P-10 / P-11 | 50 / 49.95 | none | | none | |
| Comparative Example 5 | none | | P-12 | 99.95 | none | | none | |
| Comparative Example 6 | none | | P-13 | 99.95 | none | | none | |

| | Organic Solvent (D) | Ratio by Mass | Surfactant | Entire Solid Content Concentration | Sensitivity ($\mu C/cm^2$) | Resolution (nm) | Pattern Profile | LER (nm) | Outgassing (%) |
|---|---|---|---|---|---|---|---|---|---|
| Example 1 | S1/S2 | 40/60 | W-1 | 4.0 | 19.6 | 60 | rectangular | 4.1 | 1.5 |
| Example 2 | S1/S2 | 40/60 | W-1 | 4.0 | 17.5 | 55 | rectangular | 4.2 | 1.6 |
| Example 3 | S1/S2 | 40/60 | W-2 | 4.0 | 21.3 | 60 | rectangular | 4.6 | 2.5 |
| Example 4 | S1/S2 | 40/60 | W-3 | 4.0 | 20.0 | 60 | rectangular | 4.5 | 2.6 |
| Example 5 | S1/S2 | 40/60 | W-1 | 4.0 | 23.8 | 60 | rectangular | 4.9 | 2.3 |
| Example 6 | S1/S2 | 40/60 | W-1 | 4.0 | 16.9 | 55 | rectangular | 3.9 | 1.6 |
| Example 7 | S1/S2 | 40/60 | W-1 | 4.0 | 18.2 | 55 | rectangular | 4.1 | 2.7 |
| Example 8 | S1/S2 | 40/60 | W-1 | 4.0 | 25.0 | 70 | rectangular | 5.7 | 1.4 |
| Example 9 | S1/S2 | 40/60 | W-3 | 4.0 | 34.5 | 60 | rectangular | 4.1 | 1.6 |
| Example 10 | S1/S2 | 40/60 | W-2 | 4.0 | 29.6 | 65 | rectangular | 5.2 | 2.2 |
| Example 11 | S1/S2 | 40/60 | W-1 | 4.0 | 13.8 | 55 | rectangular | 4.7 | 3.1 |
| Example 12 | S1/S2/S3 | 35/60/5 | none | 4.0 | 23.9 | 65 | rectangular | 5.3 | 2.4 |
| Example 13 | S1/S2 | 40/60 | W-1 | 4.0 | 30.5 | 60 | rectangular | 4.9 | 2.5 |
| Example 14 | S1/S2 | 40/60 | W-2 | 4.0 | 22.1 | 60 | rectangular | 4.8 | 2.3 |
| Example 15 | S1/S2/S3 | 30/60/10 | W-1 | 4.0 | 29.8 | 55 | rectangular | 4.4 | 2.4 |
| Example 16 | S1/S2 | 40/60 | W-3 | 4.0 | 25.6 | 55 | rectangular | 4.5 | 1.9 |
| Example 17 | S1/S3 | 70/30 | W-1 | 4.0 | 27.4 | 55 | rectangular | 4.6 | 2.3 |
| Comparative Example 1 | S1/S2 | 40/60 | W-1 | 4.0 | A 100-nm L/S pattern could not be formed. | | | | 8.8 |
| Comparative Example 2 | S1/S2 | 40/60 | W-1 | 4.0 | 22.8 | 90 | tapered | 12.6 | 9.1 |
| Comparative Example 3 | S1/S2 | 40/60 | W-1 | 4.0 | 23.5 | 75 | tapered | 8.5 | 2.8 |
| Comparative Example 4 | S1/S2 | 40/60 | W-1 | 4.0 | 27.6 | 85 | tapered | 10.2 | 15.1 |
| Comparative Example 5 | S1/S2 | 40/60 | W-1 | 4.0 | A 100-nm L/S pattern could not be formed. | | | | 9.8 |
| Comparative Example 6 | S1/S2 | 40/60 | W-1 | 4.0 | 25.0 | 75 | tapered | 6.8 | 10.3 |

Concentration of each component indicates the concentration (mass %) based on the entire solid content concentration.

Structures of materials (other resin, conventional acid generator, basic compound) used in Examples and Comparative Examples are shown below.

P-10

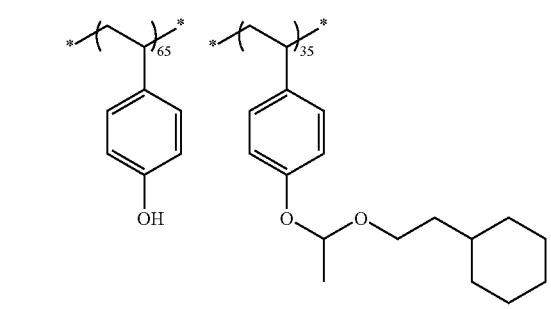

Mw = 20000 (Mw/Mn = 1.15)

P-11

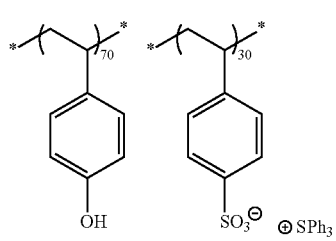

Mw = 21000 (Mw/Mn = 1.85)

P-12

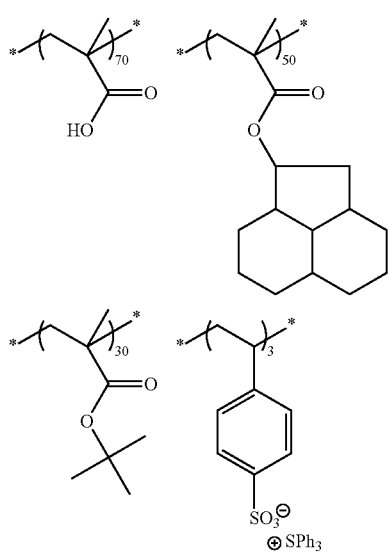

Mw = 38500 (Mw/Mn = 2.55)

P-13

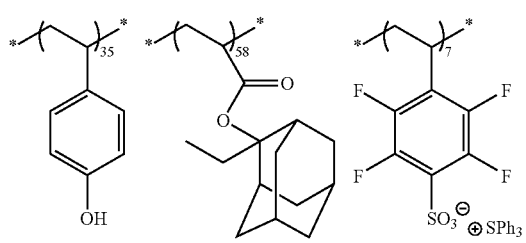

Mw = 4000 (Mw/Mn = 1.69)

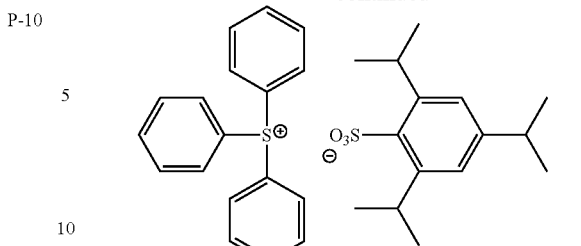

PAG-1

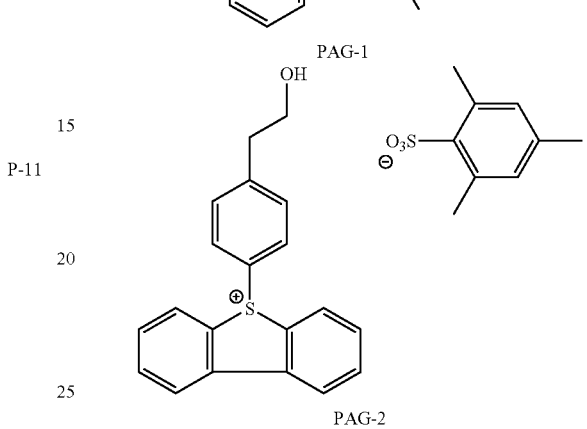

PAG-2

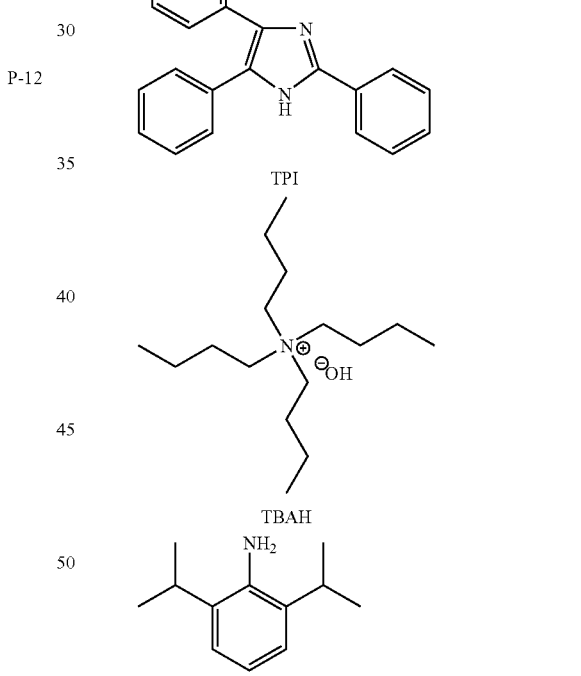

Surfactants and solvents used in Examples and Comparative Examples are as follows.

W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: polysiloxane polymer (produced by Shin-Etsu Chemical Co., Ltd.) (silicon-containing)
S1: Propylene glycol monomethyl ether acetate (PGMEA)
S2: Propylene glycol monomethyl ether (PGME)

S3: Cyclohexanone

In Comparative Examples 1 and 5, a 100-nm line-and-space pattern (L/S=1/1) could not be formed.

As apparent from Table 3, the actinic ray-sensitive or radiation-sensitive resin composition of the present invention can satisfy all of high sensitivity, high resolution, good pattern profile, good line edge roughness and low outgassing.

Examples 18 to 20

Evaluation of Resist (EUV Light)

The components shown in Table 3 below were dissolved in a mixed solvent shown in Table 3, and the obtained solution was filtered through a polytetrafluoroethylene filter having a pore size of 0.1 μm to prepare a positive resist solution having an entire solid content concentration (mass %) shown in Table 3. The positive resist solutions prepared were evaluated as follows. In Table 3, the concentration (mass %) of each component is based on the entire solid content. The amount of the surfactant added is 0.05 mass % based on the entire solid content of the positive resist solution. In Table 4, the denotations of compounds are the same as in Table 3.

The prepared positive resist solution was uniformly coated by a spin coater on a silicon substrate treated with hexamethyldisilazane, and dried under heating on a hot plate at 120° C. for 90 seconds to form a 100 nm-thick resist film.

This resist film was irradiated by an EUV exposure apparatus (manufactured by Litho Tech Japan Corp., wavelength: 13 nm) and immediately after irradiation, heated on a hot plate at 110° C. for 90 seconds. Furthermore, the resist film was developed with an aqueous tetramethylammonium hydroxide solution in a concentration of 2.38 mass % at 23° C. for 60 seconds, rinsed with pure water for 30 seconds and then dried to form a line-and-space pattern (line:space=1:1). The obtained pattern was evaluated by the following methods.

[Sensitivity]

The cross-sectional profile of the pattern obtained was observed using a scanning electron microscope (S-9220, manufactured by Hitachi, Ltd.). The minimum irradiation energy for resolving a 100-nm line (line:space=1:1) was defined as the sensitivity.

[Pattern Profile]

The cross-sectional profile of a 100-nm line pattern (line:space=1:1) at the irradiation dose of giving the above-described sensitivity was observed using a scanning electron microscope (S-4300, manufactured by Hitachi, Ltd.) and evaluated on a three-stage scale of rectangular, slightly tapered and tapered.

[Outgassing (Evaluation of Film Thickness Variation after Exposure)]

The resist film was irradiated at an irradiation dose 2.0 times the irradiation dose of giving the above-described sensitivity, the film thickness after exposure (before post-heating) was measured, and the variation was determined from the thickness at the unexposed time according to the following formula:

Film thickness variation=100×(film thickness at unexposed time−film thickness after exposure)/film thickness at unexposed time A smaller variation of film thickness indicates better performance in terms of outgassing.

TABLE 4

Evaluation Results in EUV Exposure

| | Resin of Invention | Concentration | Other Resin | Concentration | Conventional Acid Generator | Concentration | Basic Compound | Concentration |
|---|---|---|---|---|---|---|---|---|
| Example 18 | P-2 | 99.95 | none | | none | | none | |
| Example 19 | P-4 | 99.95 | none | | none | | none | |
| Example 20 | P-6 | 99.95 | none | | none | | none | |

| | Organic Solvent (D) | Ratio by Mass | Surfactant | Entire Solid Content Concentration | Sensitivity (mJ/cm$^2$) | Pattern Profile | Outgassing (%) |
|---|---|---|---|---|---|---|---|
| Example 18 | S1/S2 | 40/60 | W-1 | 4.0 | 26.7 | rectangular | 1.7 |
| Example 19 | S1/S2 | 40/60 | W-1 | 4.0 | 26.0 | rectangular | 2.7 |
| Example 20 | S1/S2 | 40/60 | W-1 | 4.0 | 25.6 | rectangular | 1.9 |

As apparent from Table 4, also when exposed to EUV light, the actinic ray-sensitive or radiation-sensitive resin composition of the present invention can satisfy all of high sensitivity, good pattern profile and low outgassing.

According to the present invention, an actinic ray-sensitive or radiation-sensitive resin composition satisfying all of high sensitivity, high resolution, good pattern profile and good line edge roughness in the ultrafine region, particularly in the electron beam, X-ray or EUV light lithography, and causing no outgassing problem at the exposure, a pattern forming method using the composition, and a resin suitable for the composition can be provided.

The entire disclosure of Japanese Patent Application No. 2008-322678 filed on Dec. 18, 2008, from which the benefit of foreign priority has been claimed in the present application, is incorporated herein by reference, as if fully set forth.

What is claimed is:

1. An actinic ray-sensitive or radiation-sensitive resin composition comprising:

(P) a resin containing (A) a repeating unit having an ionic structure moiety that contains a cation represented by formula (Ia) and is capable of producing an acid upon irradiation with an actinic ray or radiation:

(Ia)

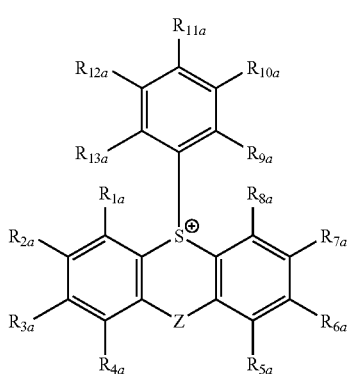

wherein
each of $R_{1a}$ to $R_{13a}$ independently represents a hydrogen atom or a monovalent substituent and may combine together to form a ring, and Z represents a single bond or a divalent linking group, provided that an anionic moiety of the ionic structure moiety is bonded to a main chain of the resin (P) via a covalent bond, and the cationic moiety represented by formula (Ia) is free as a counter cation;

wherein the repeating unit (A) is a repeating unit represented by any one of the following formulae (III) to (V):

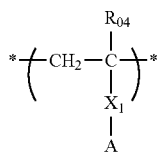
(III)

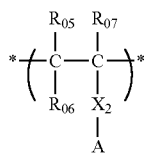
(IV)

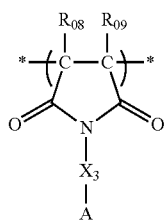
(V)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, provided that $R_{26}$ and $R_{27}$ may combine to form a ring together with the nitrogen atom;

each of $X_1$ to $X_2$ independently represents an arylene group-containing divalent linking group formed by combining a plurality of an arylene group, an alkylene group, a cycloalkylene group, —O—, —$SO_2$—, —CO—, and —$N(R_{33})$—;

$X_3$ represents a single bond, an arylene group, an alkylene group, a cycloalkylene group, —O—, —$SO_2$—, —CO—, —$N(R_{33})$— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents a group of the following formula (ZI) which is an ionic structure moiety capable of decomposing upon irradiation with an actinic ray or radiation:

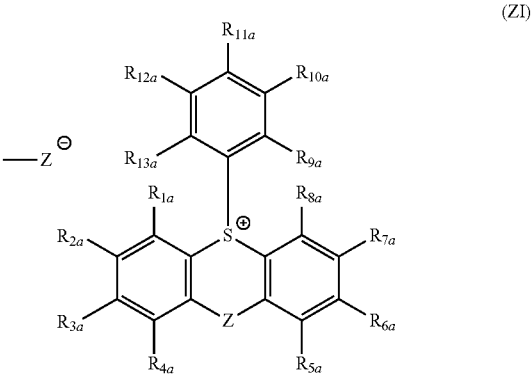
(ZI)

wherein in formula (ZI), $R_{1a}$ to $R_{13a}$ and Z are the same as $R_{1a}$ to $R_{13a}$ and Z in formula (Ia);

$Z^-$ represents an acid anion generated as a result of decomposition upon irradiation with an actinic ray or radiation; and the straight line extending from $Z^-$ indicates a bond extending toward the main chain of the repeating unit (A);

wherein the resin (P) further contains (B) a repeating unit containing a group capable of decomposing by the action of an acid to produce an alkali-soluble group;

wherein the repeating unit (B) is a repeating unit represented by the following formula (I) or (X):

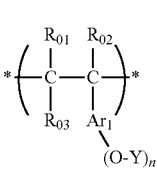
(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, each of n Ys independently represents a hydrogen atom or a group capable of leaving by the action of an acid, provided that at least one Y represents a group capable of leaving by the action of and acid, and n represents an integer of 1 to 4;

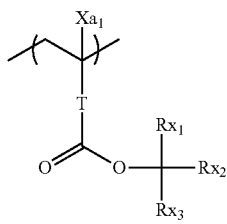
(X)

wherein $Xa_1$ represents a hydrogen atom, a methyl group, a trifluoromethyl group or a hydroxymethyl group, T represents a single bond or a divalent linking group, each of $Rx_1$ to $Rx_3$ independently represents a hydrogen atom, an alkyl group, a cycloalkyl group or a monovalent aromatic ring group, and two members out of $Rx_1$ to $Rx_3$ may combine to form a cycloalkyl group, provided that two or more of $Rx_1$ to $Rx_3$ are not a hydrogen atom at the same time.

2. The actinic ray-sensitive or radiation-sensitive resin composition as claimed in claim 1, wherein Y in formula (I) is represented by the following formula (II):

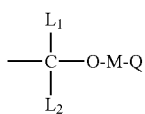
(II)

wherein
each of $L_1$ and $L_2$ independently represents a hydrogen atom, an alkyl group, a cycloalkyl group, an aryl group or an aralkyl group, M represents a single bond or a divalent linking group, Q represents an alkyl group, a cycloalkyl group, an alicyclic group that may contain a heteroatom, an aromatic ring group that may contain a heteroatom, an amino group, an ammonium group, a mercapto group, a cyano group or an aldehyde group, and at least two members of Q, M and $L_1$ may combine to form a 5- or 6-membered ring.

3. The actinic ray-sensitive or radiation-sensitive resin composition as claimed in claim 1, wherein the resin (P) has a weight average molecular weight of from 1,000 to 100,000.

4. The actinic ray-sensitive or radiation-sensitive resin composition as claimed in claim 1, further comprising:

a basic compound.

5. The actinic ray-sensitive or radiation-sensitive resin composition as claimed in claim 1, which is exposed to an electron beam, X-ray or EUV light.

6. The actinic ray-sensitive or radiation-sensitive resin composition according to claim 1, wherein the repeating unit (A) is a repeating unit represented by formula (III).

7. The actinic ray-sensitive or radiation-sensitive resin composition according to claim 1, wherein the composition further contains tetraalkylammonium hydroxide.

8. A resin comprising:

(A) a repeating unit having an ionic structure moiety and being capable of decomposing upon irradiation with an actinic ray or radiation to generate an acid;

(B) a repeating unit containing a group capable of decomposing by the action of an acid to produce an alkali-soluble group, and (C) a repeating unit represented by the following formula (VI):

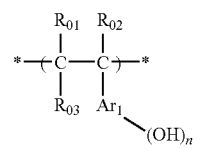
(VI)

wherein
each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, and n represents an integer of 1 to 4, wherein
the ionic structure moiety of the repeating unit (A) is a structure capable of producing an acid upon irradiation with an actinic ray or radiation and the counter cation is represented by the following formula (Ia):

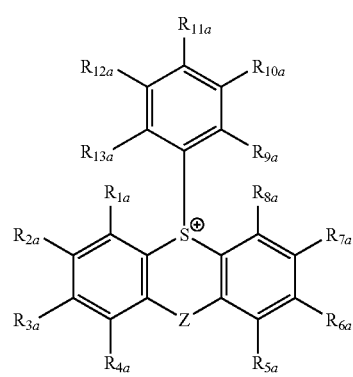
(Ia)

wherein
each of $R_{1a}$ to $R_{13a}$ independently represents a hydrogen atom or a monovalent substituent and may combine together to form a ring, and Z represents a single bond or a divalent linking group, provided that an anionic moiety of the ionic structure moiety is bonded to a main chain of the resin (P) via a covalent bond, and the cationic moiety represented by formula (Ia) is free as a counter cation;

wherein the repeating unit (A) is a repeating unit represented by any one of the following formulae (III) to (V):

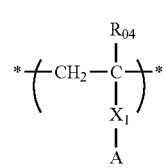
(III)

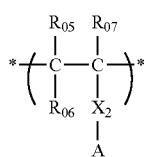

(IV)

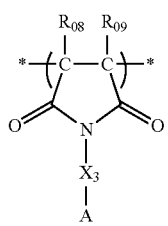

(V)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—$N(R_{26})(R_{27})$, provided that $R_{26}$ and $R_{27}$ may combine to form a ring together with the nitrogen atom;

each of $X_1$ to $X_2$ independently represents an arylene group-containing divalent linking group formed by combining a plurality of an arylene group, an alkylene group, a cycloalkylene group, —O—, —$SO_2$—, —CO—, and —$N(R_{33})$—;

$X_3$ represents a single bond, an arylene group, an alkylene group, a cycloalkylene group, —O—, —$SO_2$—, —CO—, —$N(R_{33})$— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents a group of the following formula (ZI) which is an ionic structure moiety capable of decomposing upon irradiation with an actinic ray or radiation:

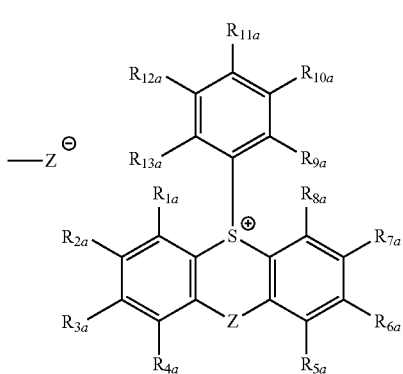

(ZI)

wherein in formula (ZI), $R_{1a}$ to $R_{13a}$ and Z are the same as $R_{1a}$ to $R_{13a}$ and Z in formula (Ia);

$Z^-$ represents an acid anion generated as a result of decomposition upon irradiation with an actinic ray or radiation; and the straight line extending from $Z^-$ indicates a bond extending toward the main chain of the repeating unit (A).

9. The actinic ray-sensitive or radiation-sensitive resin composition as claimed in claim 8, wherein the repeating unit (B) is a repeating unit represented by the following formula (I) or (X):

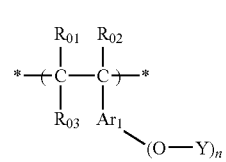

(I)

wherein each of $R_{01}$, $R_{02}$ and $R_{03}$ independently represents a hydrogen atom, an alkyl group, a cycloalkyl group, a halogen atom, a cyano group or an alkoxycarbonyl group, or $R_{03}$ may represent an alkylene group and combine with $Ar_1$ to form a 5- or 6-membered ring, $Ar_1$ represents an aromatic ring group, each of n Ys independently represents a hydrogen atom or a group capable of leaving by the action of an acid, provided that at least one Y represents a group capable of leaving by the action of and acid, and n represents an integer of 1 to 4;

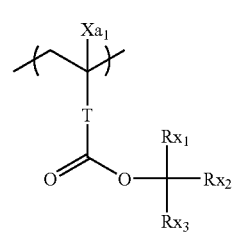

(X)

wherein $Xa_1$ represents a hydrogen atom, a methyl group, a trifluoromethyl group or a hydroxymethyl group, T represents a single bond or a divalent linking group, each of $Rx_1$ to $Rx_3$ independently represents a hydrogen atom, an alkyl group, a cycloalkyl group or a monovalent aromatic ring group, and two members out of $Rx_1$ to $Rx_3$ may combine to form a cycloalkyl group, provided that two or more of $Rx_1$ to $Rx_3$ are not a hydrogen atom at the same time.

10. An actinic ray-sensitive or radiation-sensitive resin composition comprising:

(P) a resin containing (A) a repeating unit having an ionic structure moiety that contains a cation represented by formula (Ia) and is capable of producing an acid upon irradiation with an actinic ray or radiation:

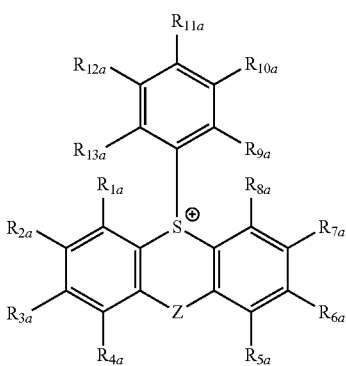

(Ia)

wherein each of $R_{1a}$ to $R_{13a}$ independently represents a hydrogen atom or a monovalent substituent and may combine together to form a ring, and Z represents a single bond or a divalent linking group, provided that an anionic moiety of the ionic structure moiety is bonded to a main chain of the resin (P) via a covalent bond, and the cationic moiety represented by formula (Ia) is free as a counter cation;

wherein the repeating unit (A) is a repeating unit represented by any one of the following formulae (III) to (V):

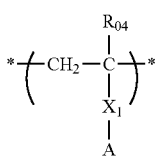

(III)

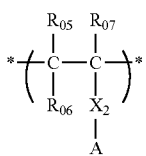

(IV)

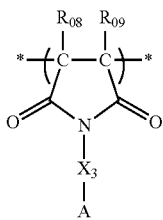

(V)

wherein each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group;

$R_{06}$ represents a cyano group, a carboxyl group, —CO—$OR_{25}$ or —CO—N($R_{26}$)($R_{27}$), provided that $R_{26}$ and $R_{27}$ may combine to form a ring together with the nitrogen atom;

each of $X_1$ to $X_2$ independently represents an arylene group-containing divalent linking group formed by combining a plurality of an arylene group, an alkylene group, a cycloalkylene group, —O—, —SO$_2$—, —CO—, and —N($R_{33}$)—;

$X_3$ represents a single bond, an arylene group, an alkylene group, a cycloalkylene group, —O—, —SO$_2$—, —CO—, —N($R_{33}$)— or a divalent linking group formed by combining a plurality of these groups;

$R_{25}$ represents an alkyl group, a cycloalkyl group, an alkenyl group, an aryl group or an aralkyl group;

each of $R_{26}$, $R_{27}$ and $R_{33}$ independently represents a hydrogen atom, an alkyl group, a cycloalkyl group, an alkenyl group, an aryl group or an aralkyl group; and A represents a group of the following formula (ZI) which is an ionic structure moiety capable of decomposing upon irradiation with an actinic ray or radiation:

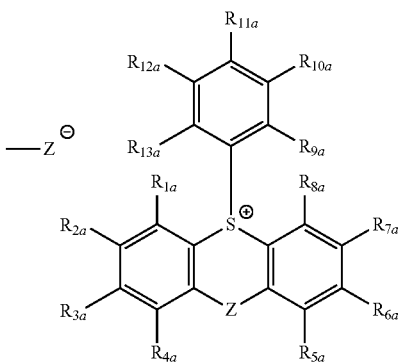

(ZI)

wherein in formula (ZI), $R_{1a}$ to $R_{13a}$ and Z are the same as $R_{1a}$ to $R_{13a}$ and Z in formula (Ia);

$Z^-$ represents an acid anion generated as a result of decomposition upon irradiation with an actinic ray or radiation; and the straight line extending from $Z^-$ indicates a bond extending toward the main chain of the repeating unit (A); and wherein the composition further contains tetraalkylammonium hydroxide.

* * * * *